US005543663A

United States Patent [19]
Takubo

[11] Patent Number: 5,543,663
[45] Date of Patent: Aug. 6, 1996

[54] SEMICONDUCTOR DEVICE AND BGA PACKAGE

[75] Inventor: Chiaki Takubo, Yokohama, Japan

[73] Assignee: Kabushiki Kaisha Toshiba, Kawasaki, Japan

[21] Appl. No.: 362,978

[22] Filed: Dec. 23, 1994

[30] Foreign Application Priority Data

Dec. 27, 1993 [JP] Japan .................................. 5-332735
Dec. 27, 1993 [JP] Japan .................................. 5-332736
Nov. 9, 1994 [JP] Japan .................................. 6-299048

[51] Int. Cl.$^6$ .......................... H01L 23/02; H01L 23/12
[52] U.S. Cl. .................... 257/720; 257/707; 257/730; 257/738; 257/706; 257/723; 257/704
[58] Field of Search .................................. 257/707, 706, 257/704, 722, 708–712, 720, 723, 737, 738, 735, 725, 730, 717

[56] References Cited

U.S. PATENT DOCUMENTS

| 4,922,324 | 5/1990 | Sudo ........................................ 257/700 |
| 5,006,922 | 4/1991 | McShane et al. ......................... 257/704 |
| 5,018,004 | 5/1991 | Okinaga et al. .......................... 257/697 |
| 5,367,193 | 11/1994 | Malladi .................................... 257/707 |
| 5,438,216 | 8/1995 | Juskey et al. ............................. 257/704 |

FOREIGN PATENT DOCUMENTS

| 0091257 | 4/1991 | Japan ..................................... 257/706 |
| 0266453 | 11/1991 | Japan ..................................... 257/706 |
| 0163765 | 6/1994 | Japan ..................................... 257/706 |
| 0232287 | 8/1994 | Japan ..................................... 257/707 |

*Primary Examiner*—Robert P. Limanek
*Assistant Examiner*—Alexander Oscar Williams
*Attorney, Agent, or Firm*—Finnegan, Henderson, Farabow, Garrett & Dunner, L.L.P.

[57] ABSTRACT

A first thermal conductive member and a plurality of second thermal conductive members are formed on one major surface of an insulating board. A TCP is mounted on the first thermal conductive member. A heat sink is mounted on the plurality of second thermal conductive members. A third thermal conductive member is formed on the other major surface of the insulating board. A plurality of through holes are formed in the insulating board between the first and third thermal conductive members and between the second and third thermal conductive members. Fourth thermal conductive members are formed in the plurality of through holes. Heat generated by the semiconductor chip of the TCP is conducted to the heat sink through the first to fourth thermal conductive members. Therefore, a semiconductor device with excellent heat dissipation without damaging a semiconductor element can be provided.

66 Claims, 64 Drawing Sheets

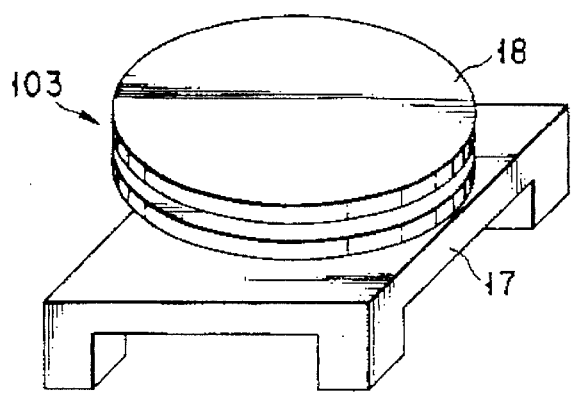
F I G. 13
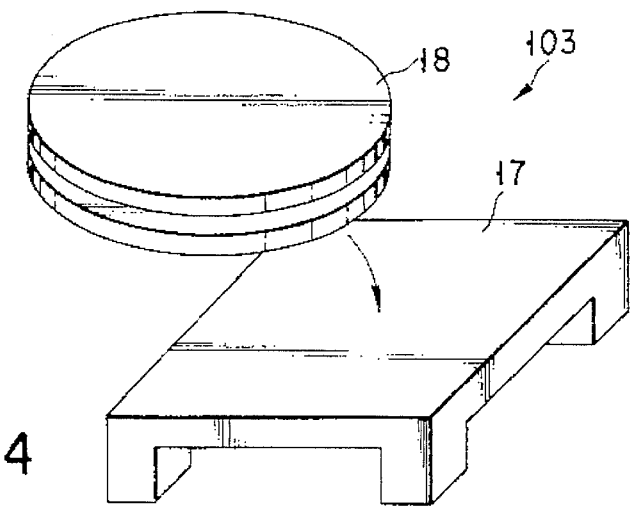
F I G. 14
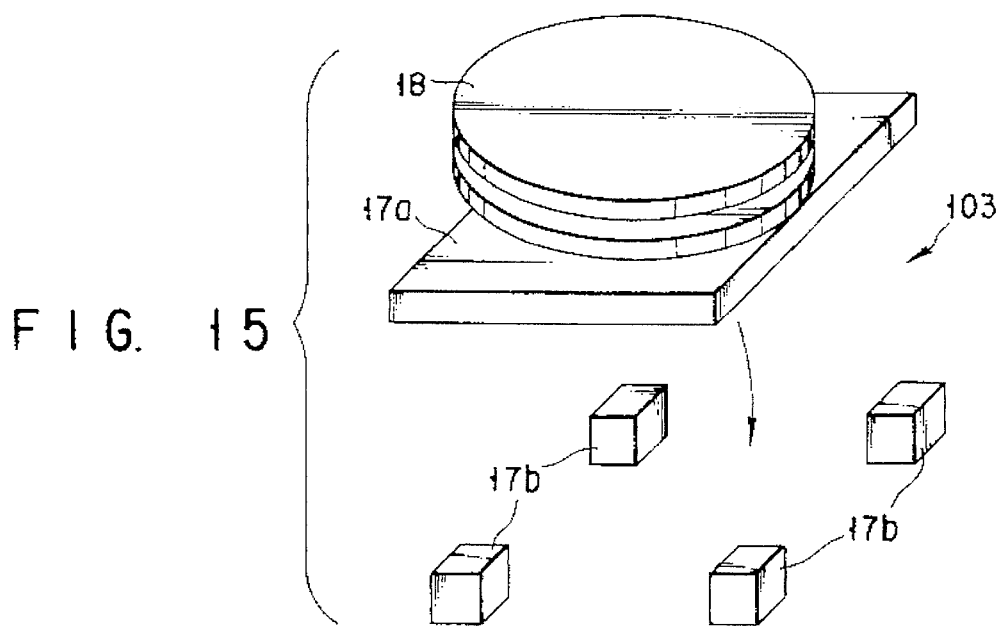
F I G. 15

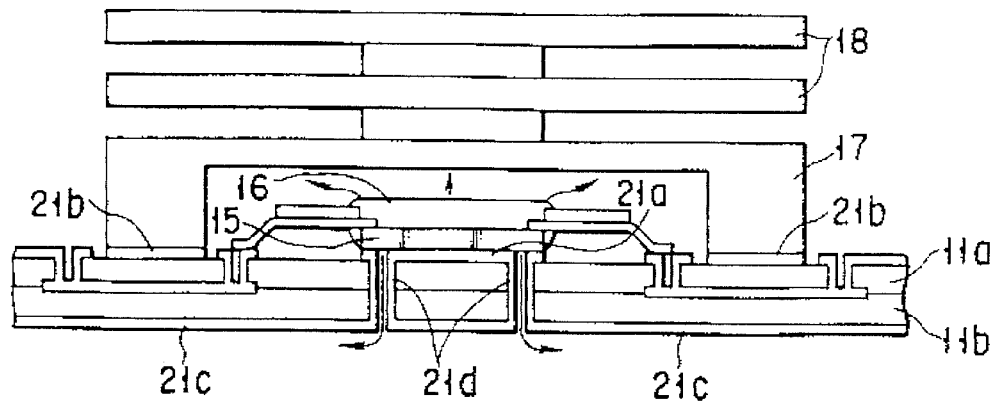
F I G. 31
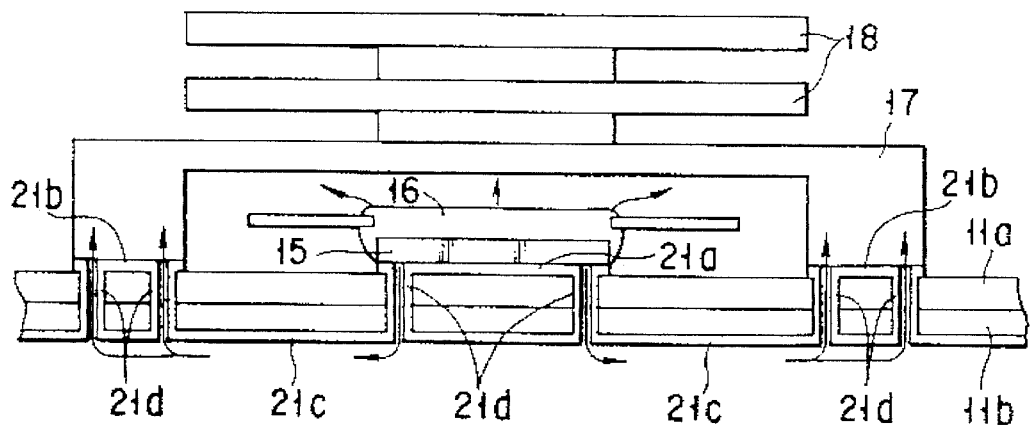
F I G. 32

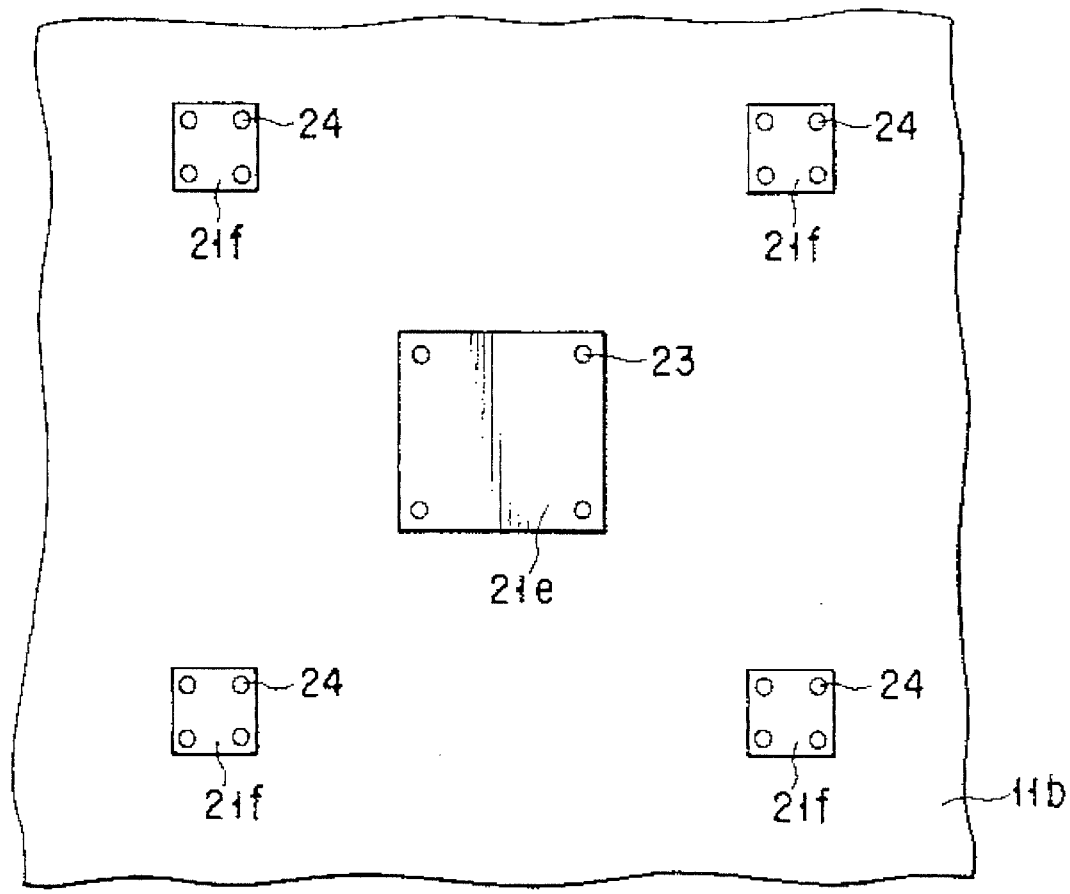
F I G. 39

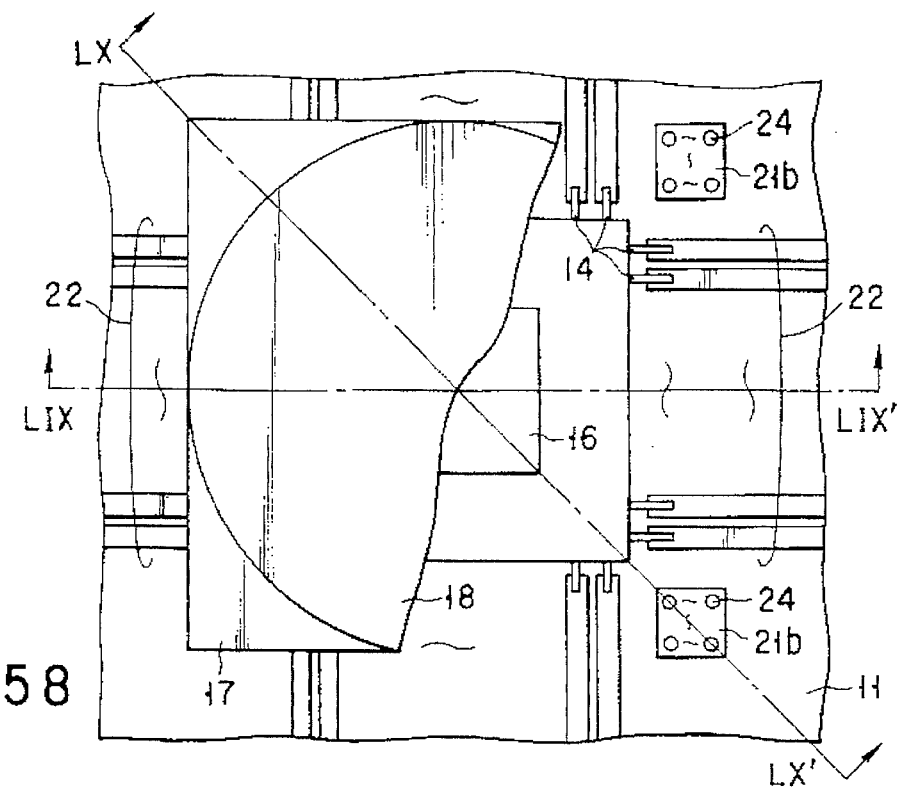
F I G. 58
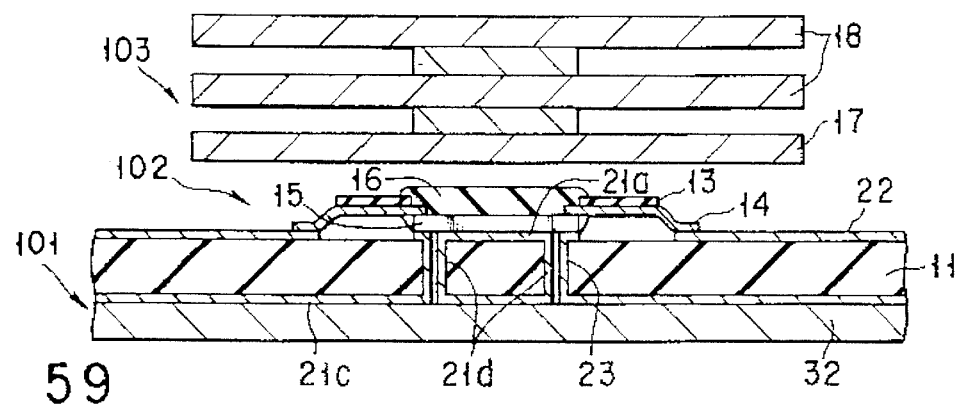
F I G. 59
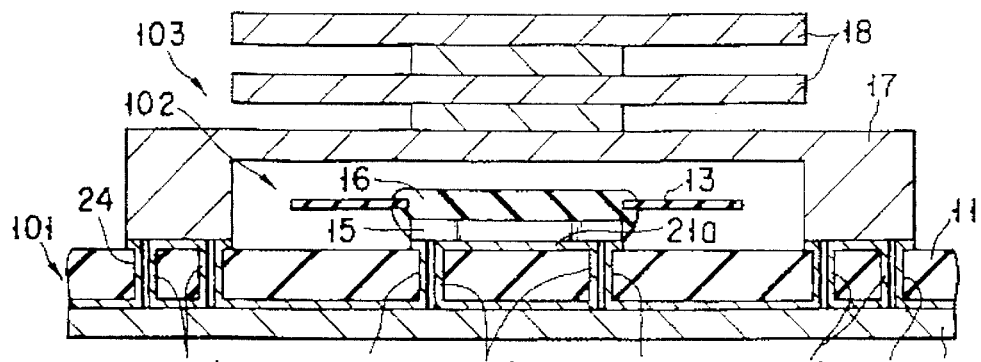
F I G. 60

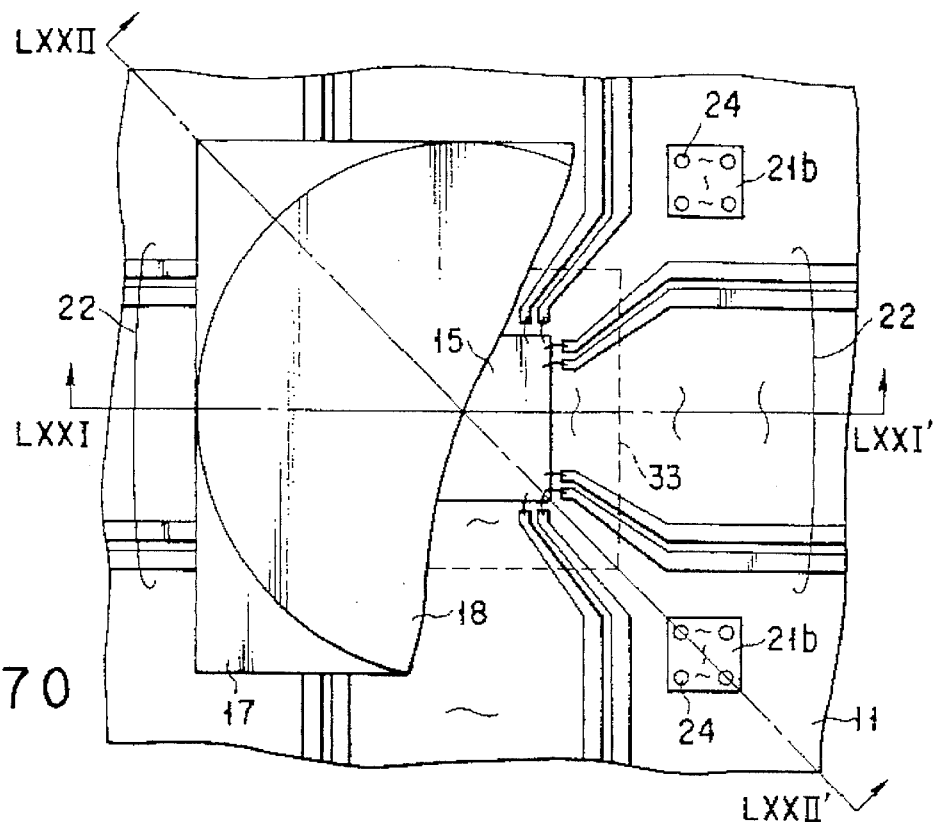
F I G. 70
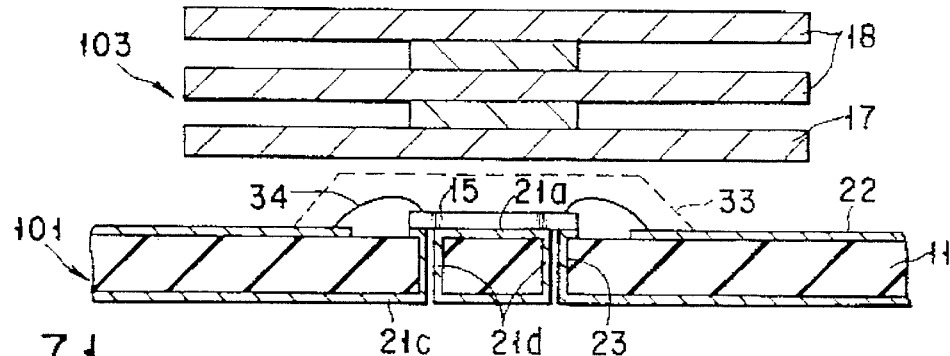
F I G. 71
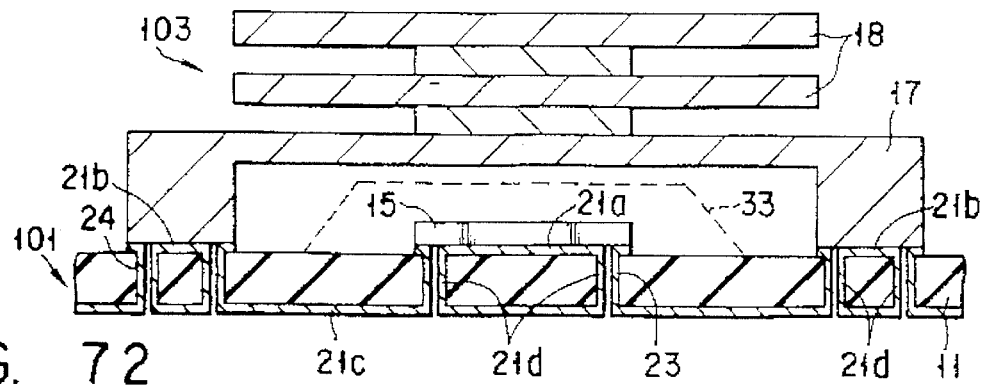
F I G. 72

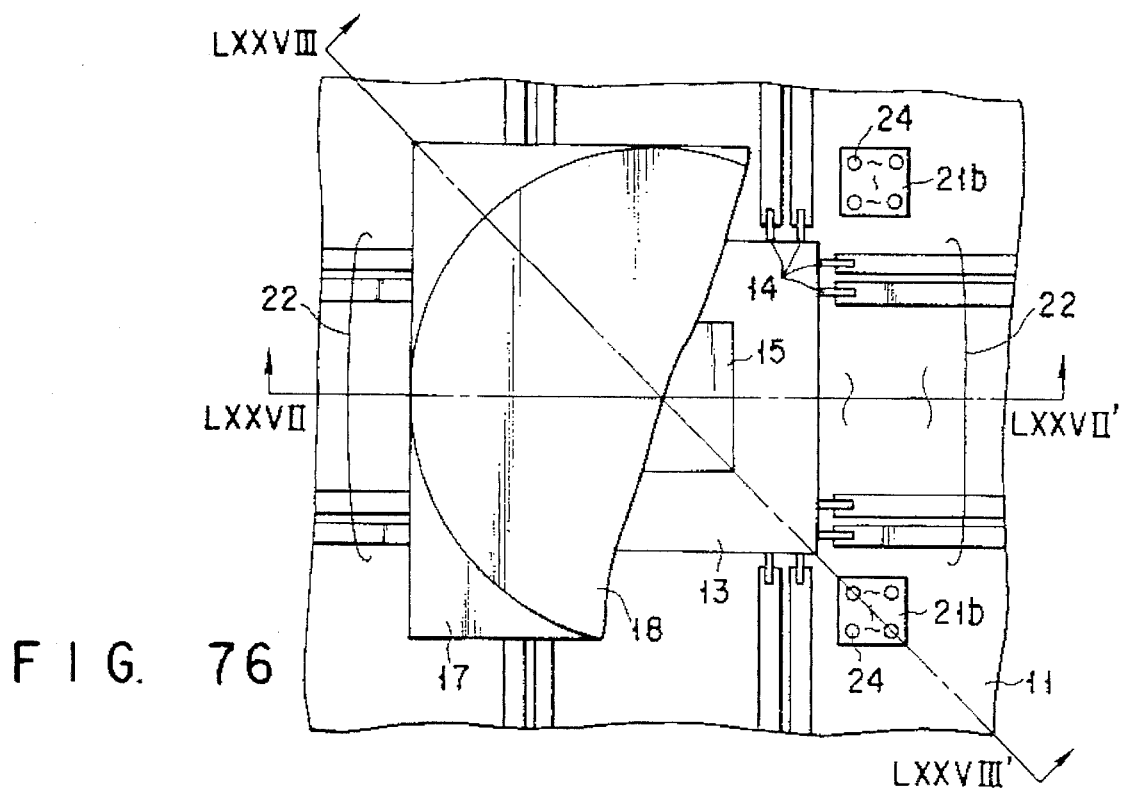
F I G. 76
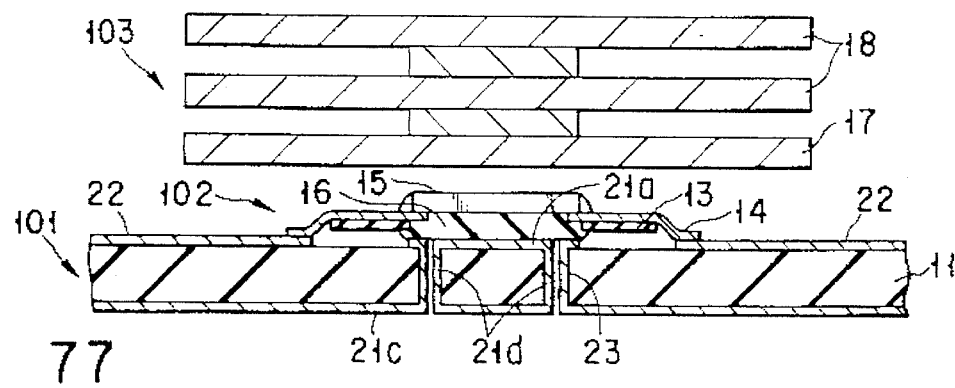
F I G. 77
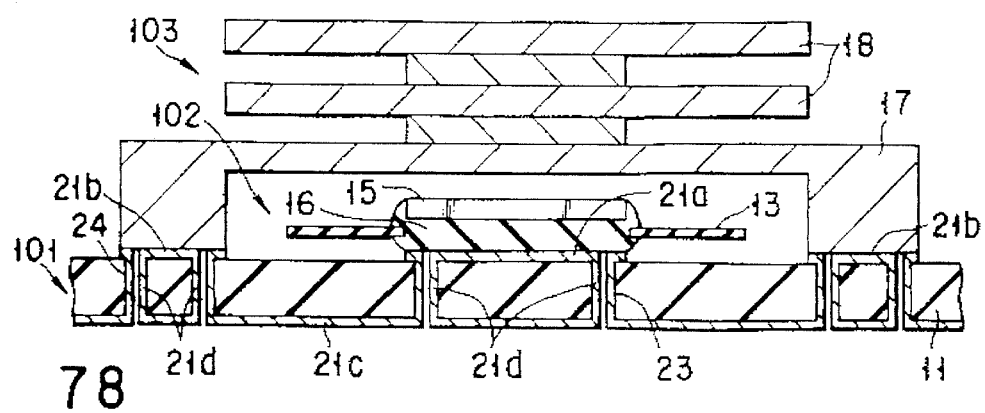
F I G. 78

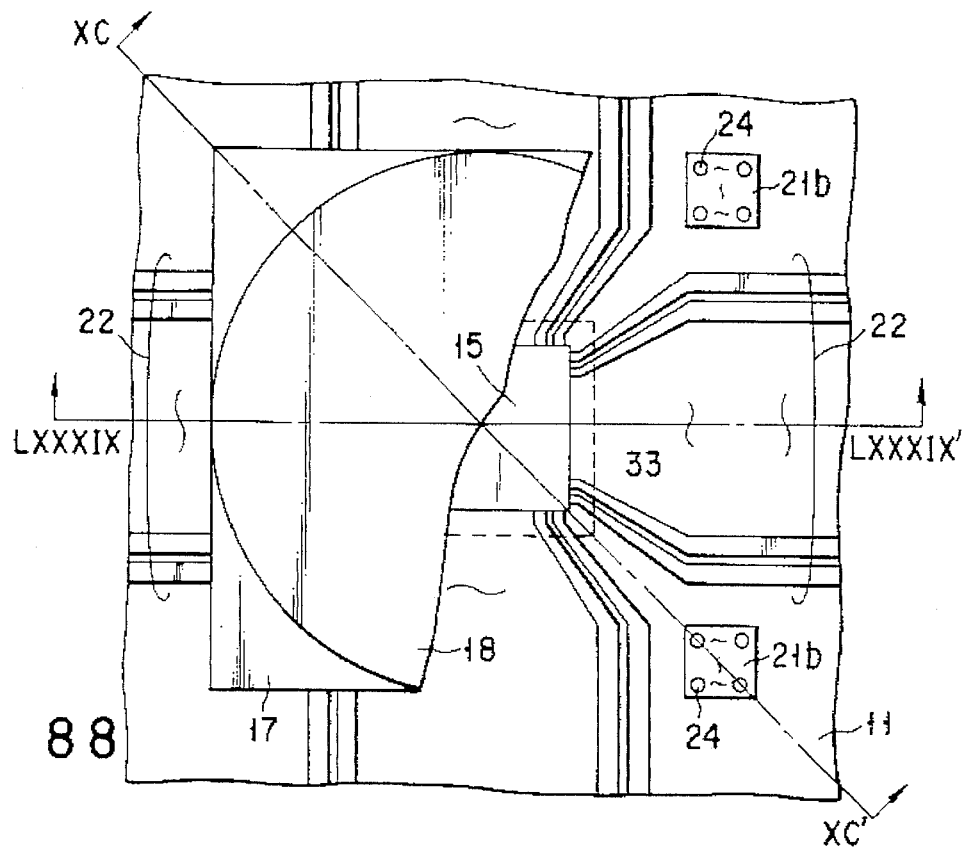
F I G. 88
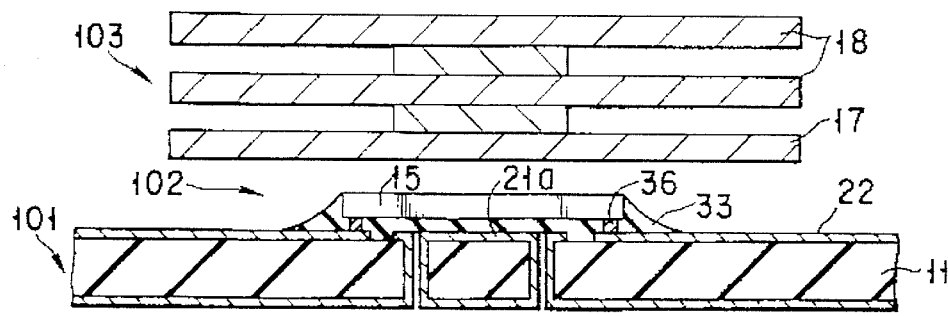
F I G. 89
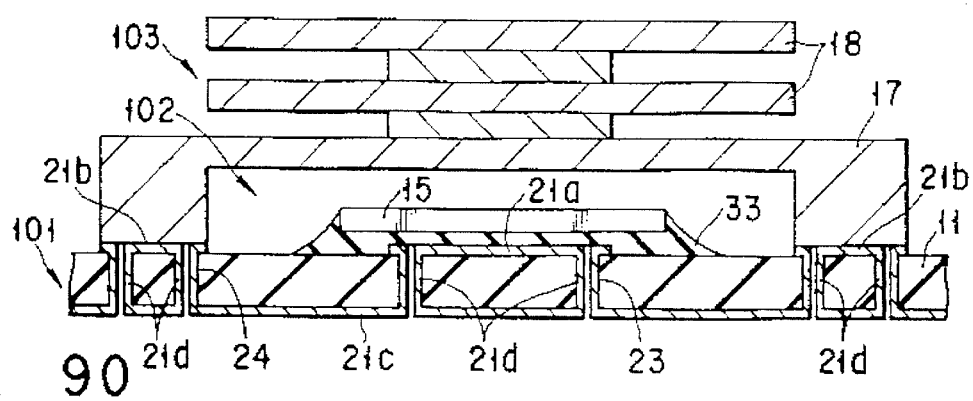
F I G. 90

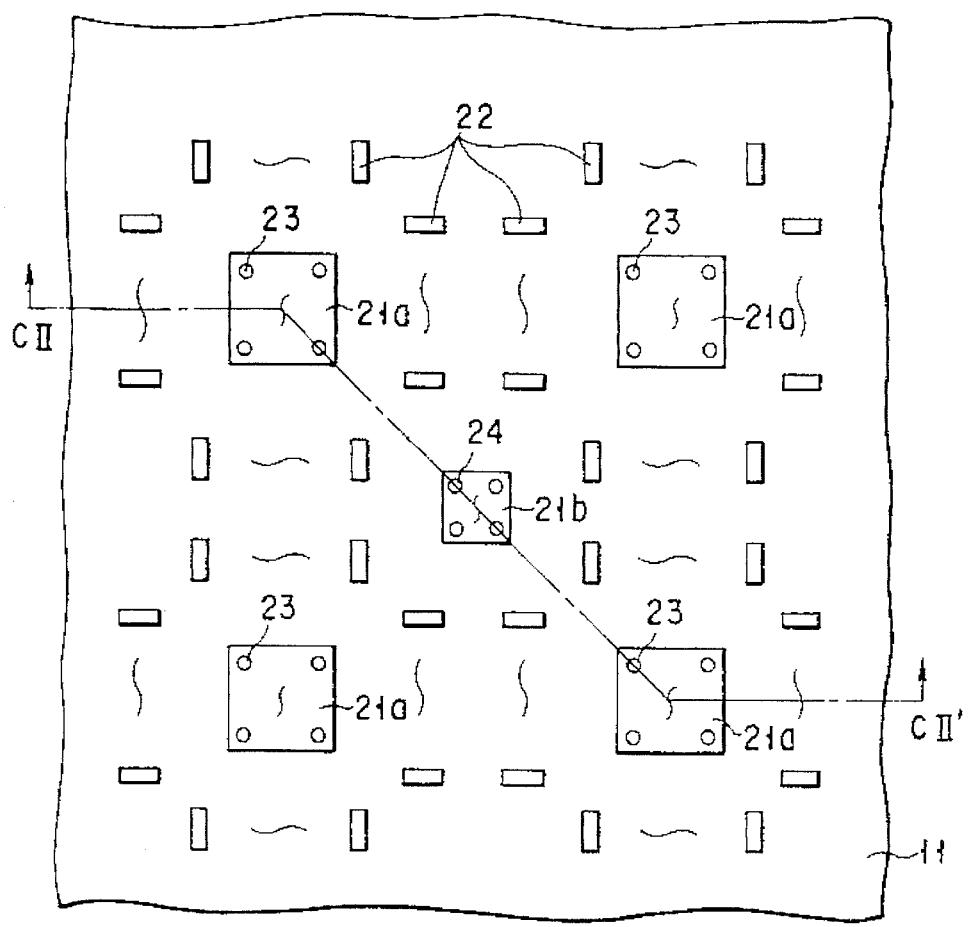
F I G. 101
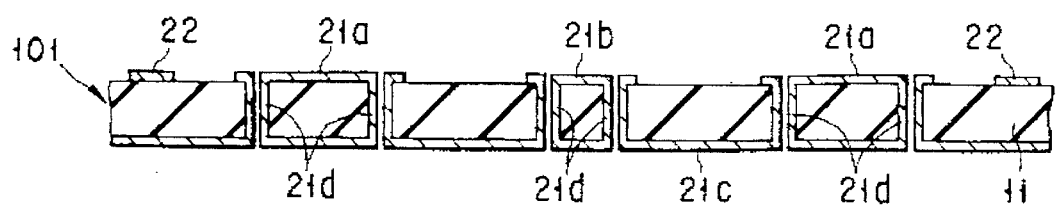
F I G. 102

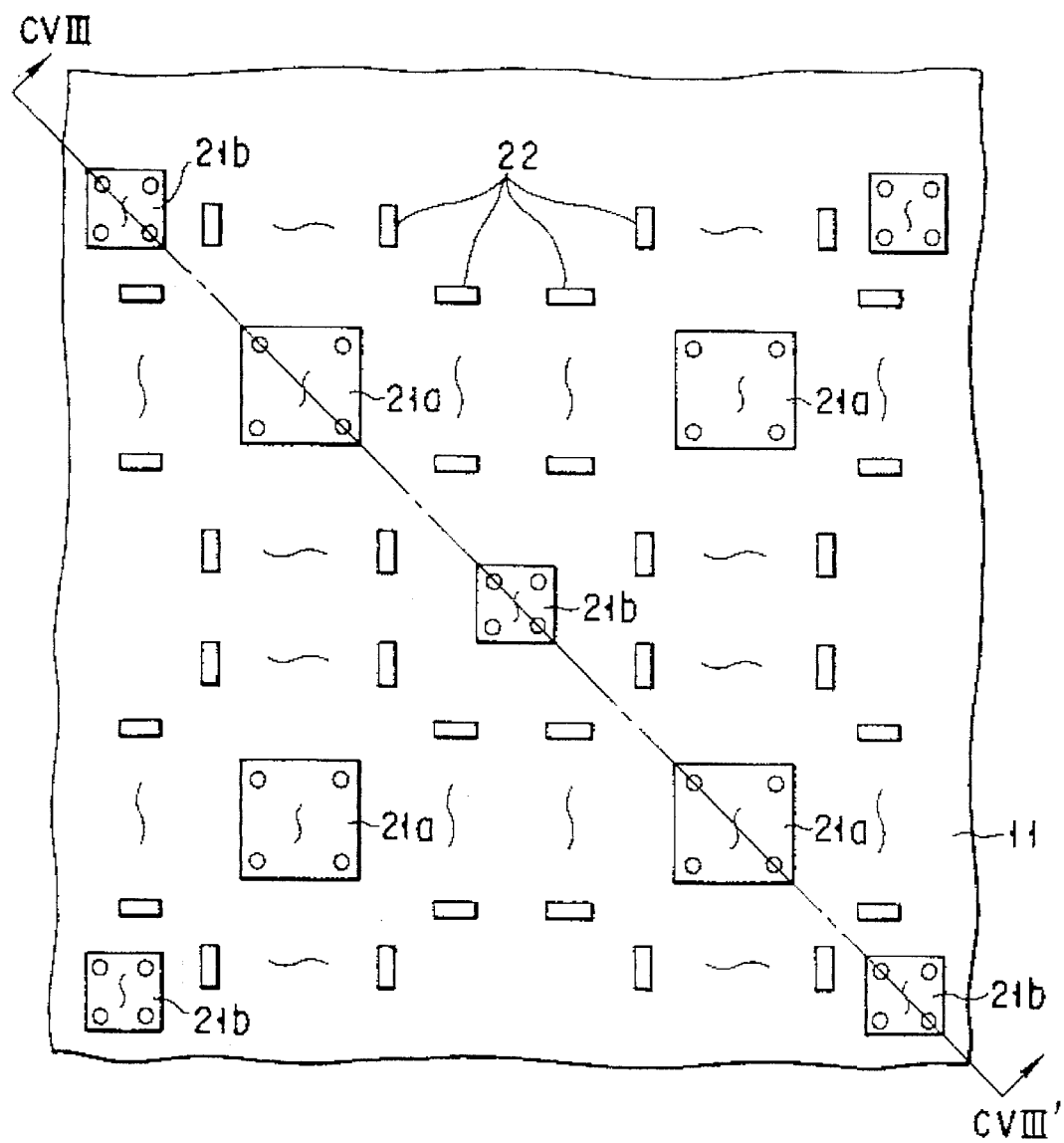
F I G. 107

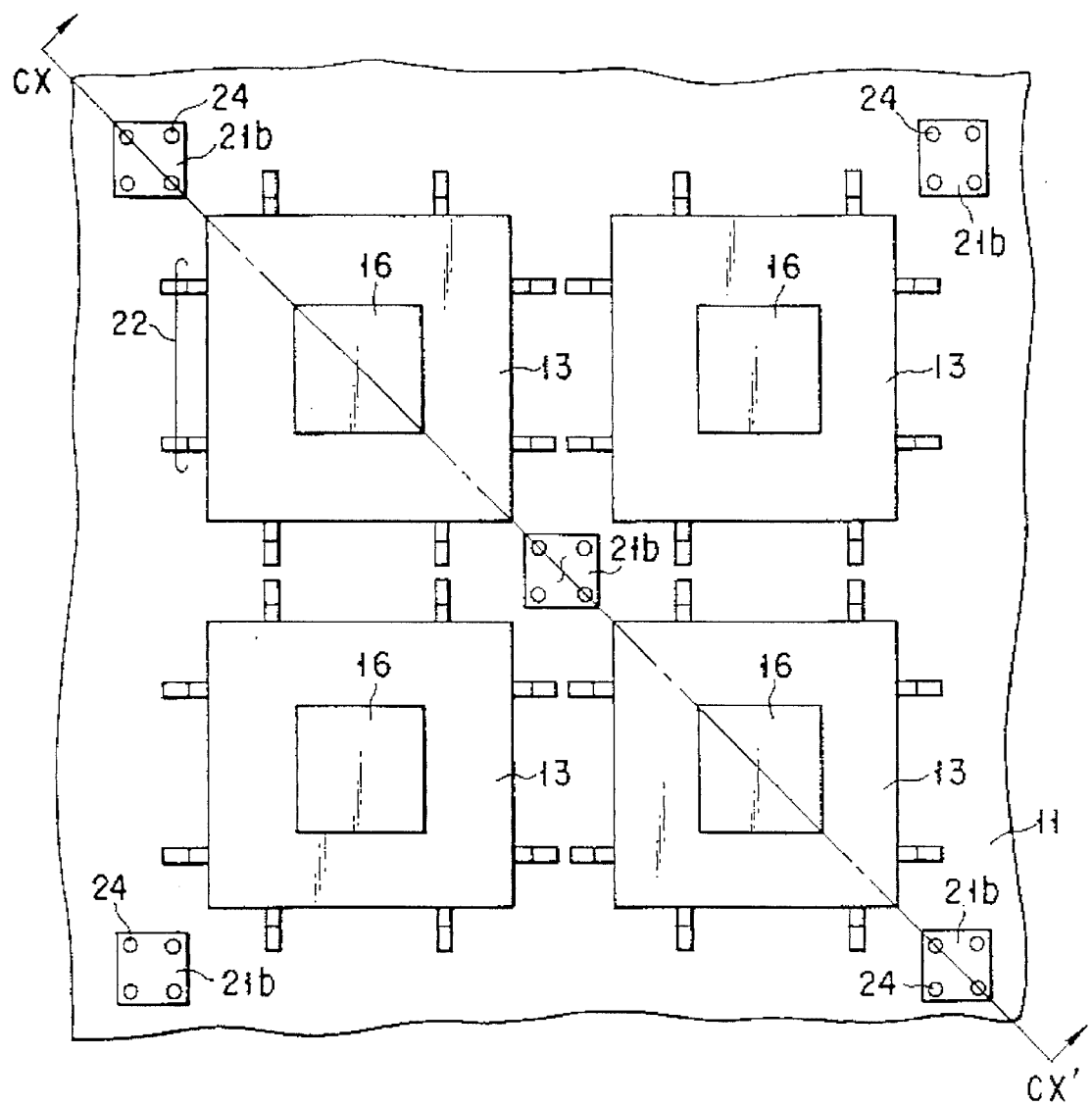
F I G. 109

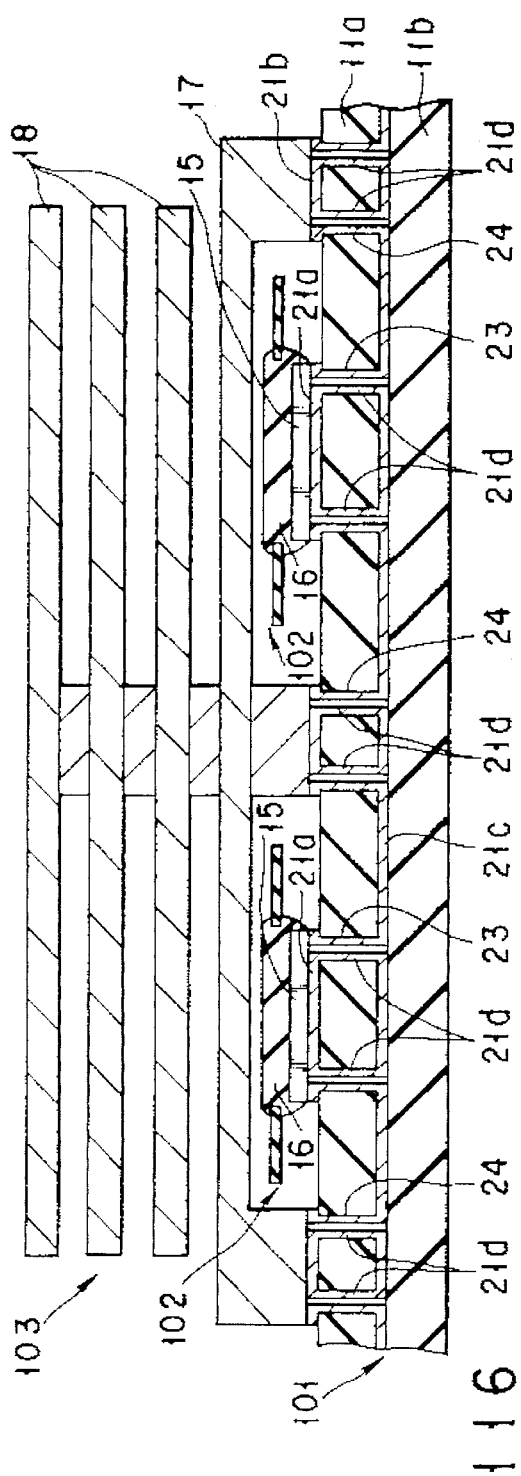
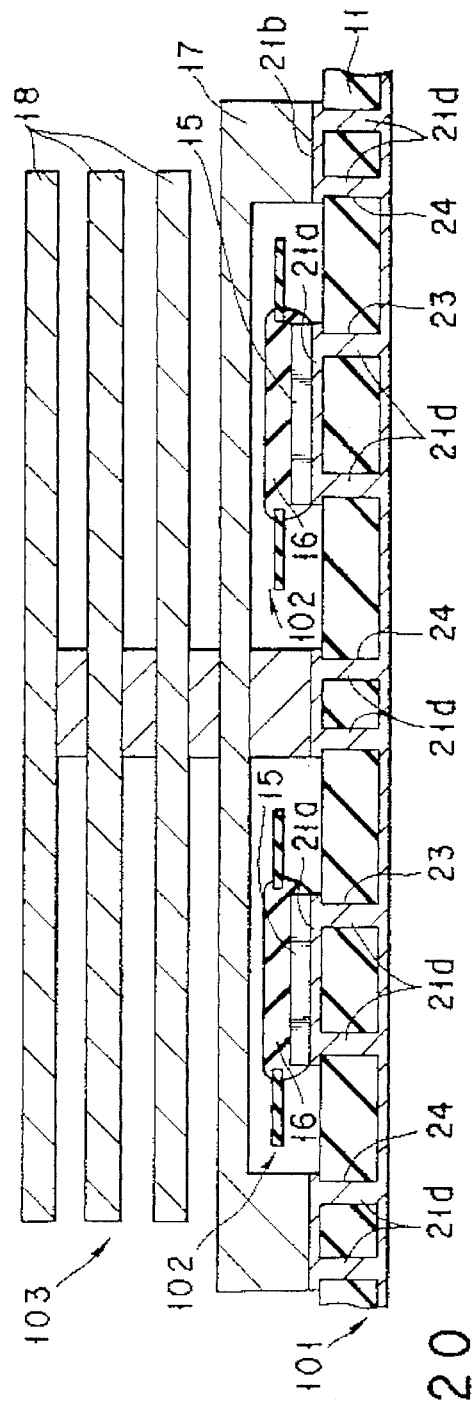
FIG. 116
FIG. 120

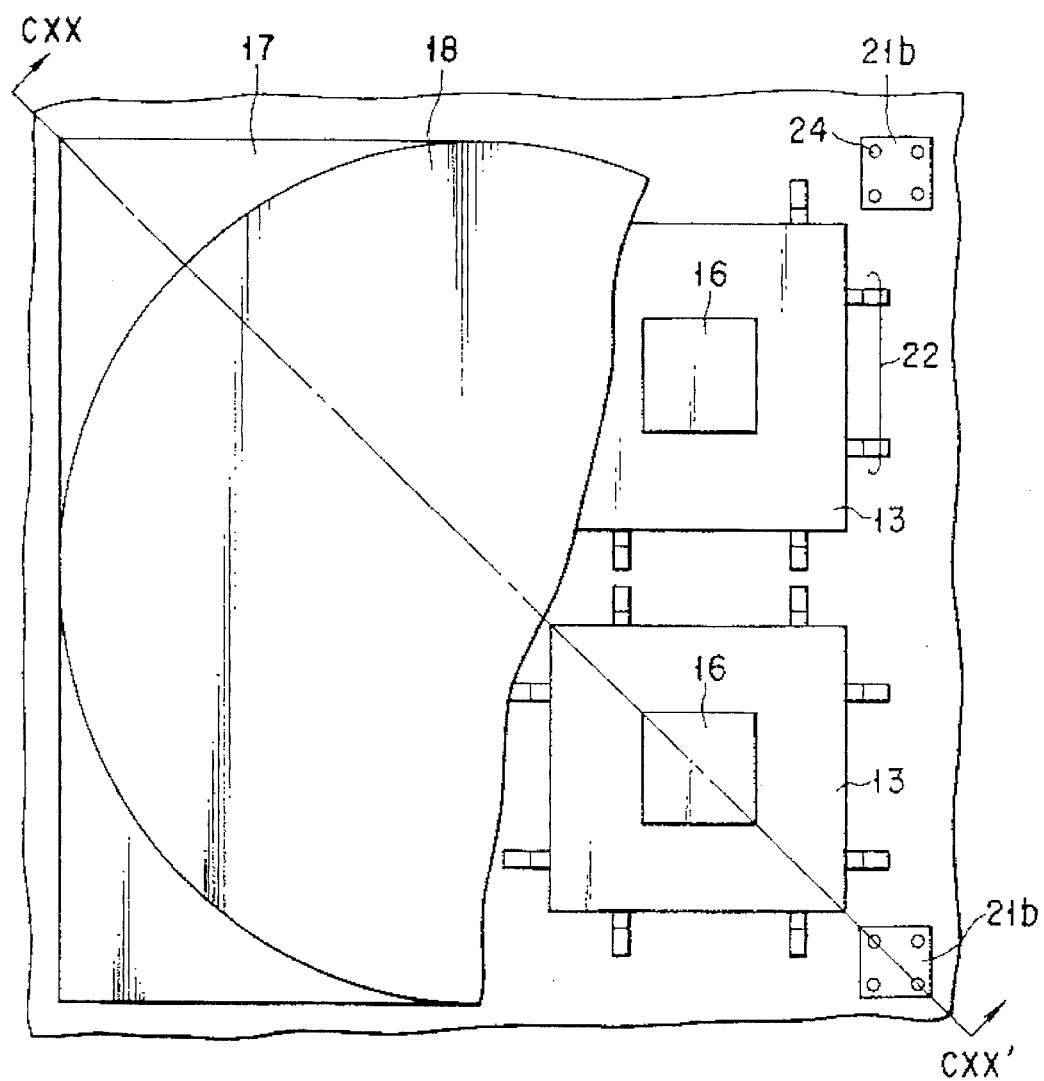
F I G. 119

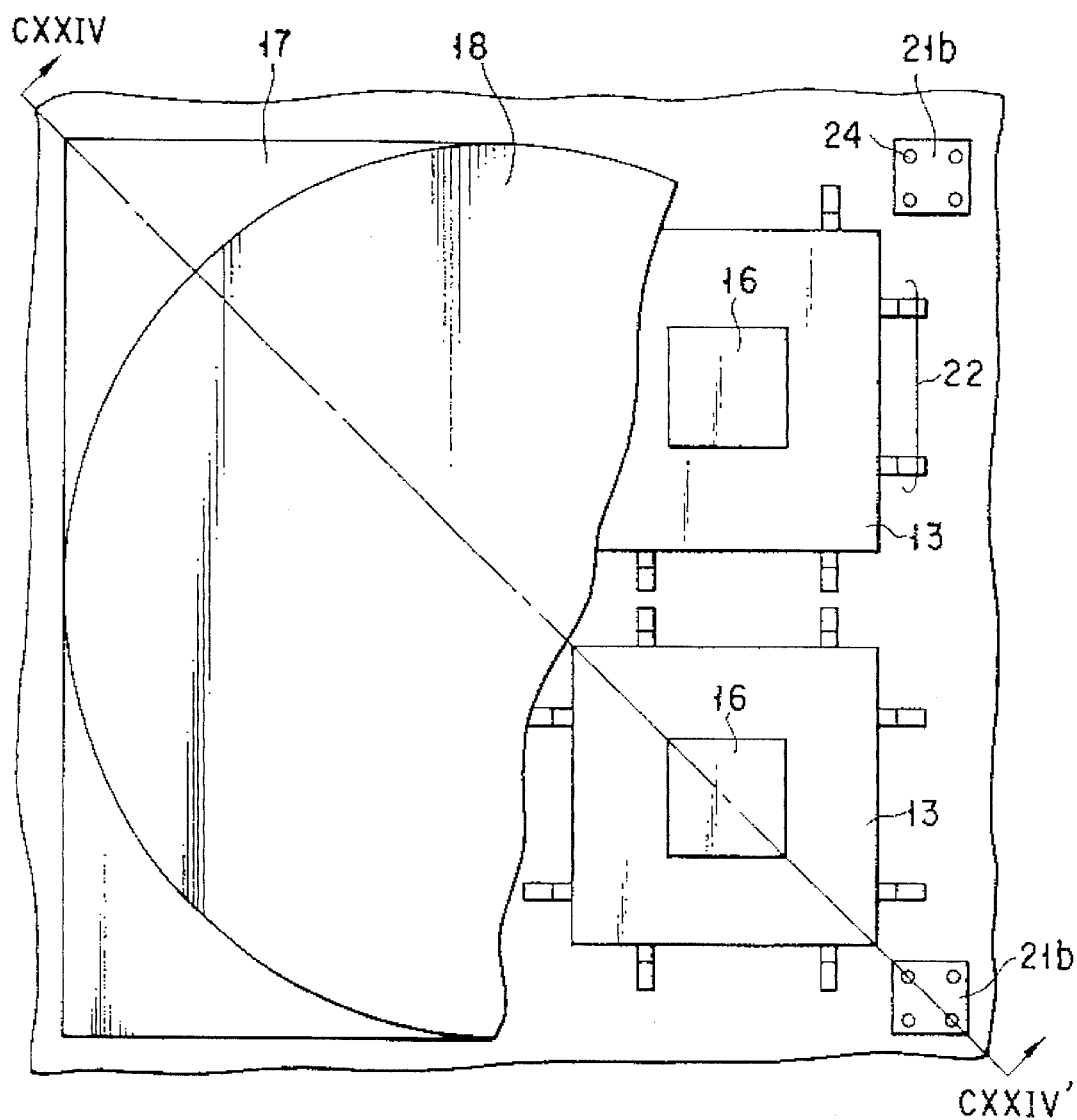
F I G. 123

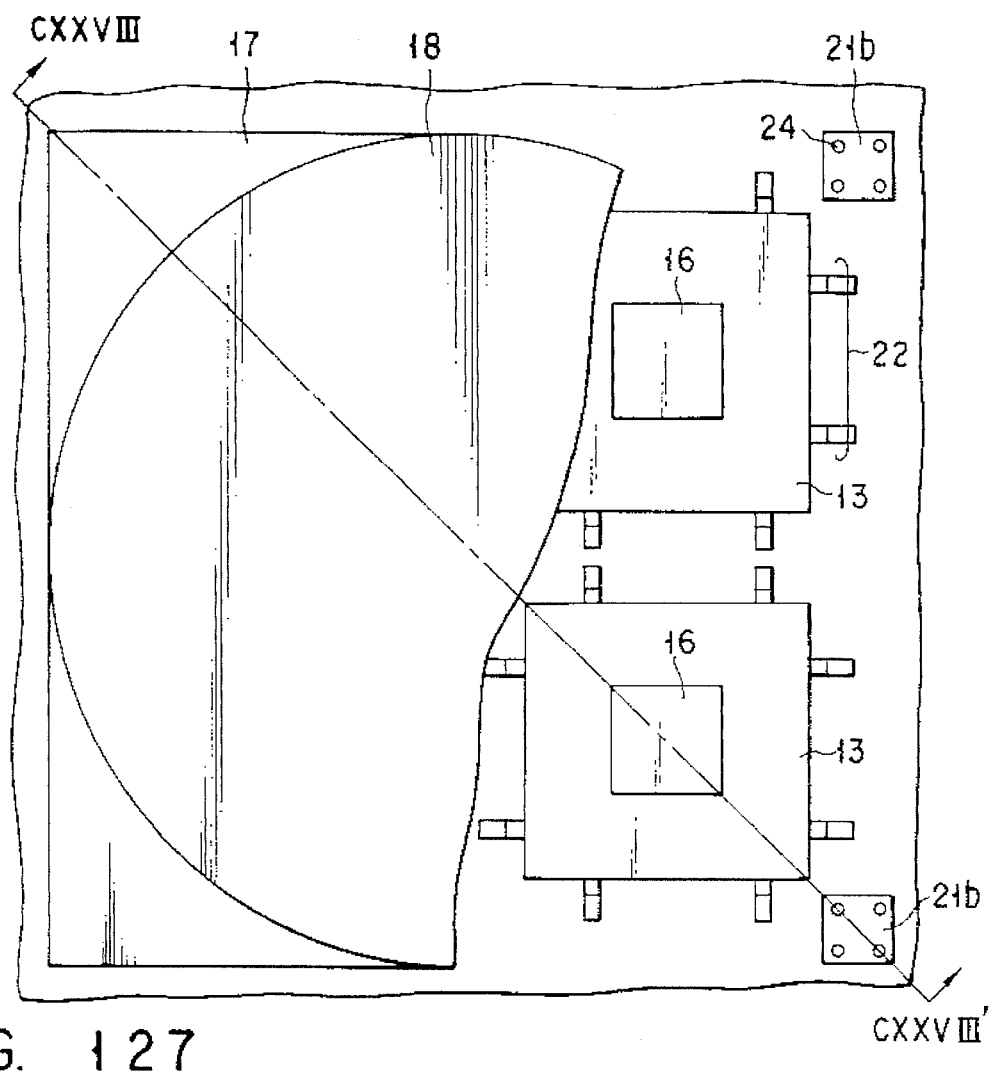
F I G. 127
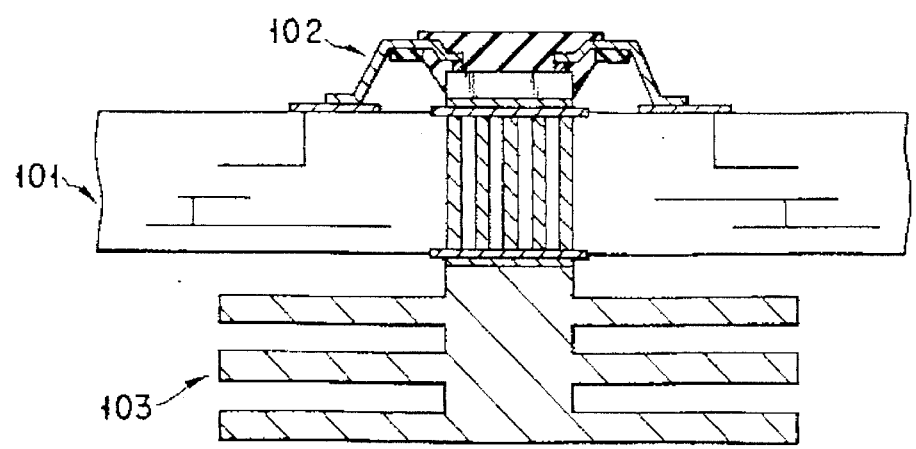
F I G. 130

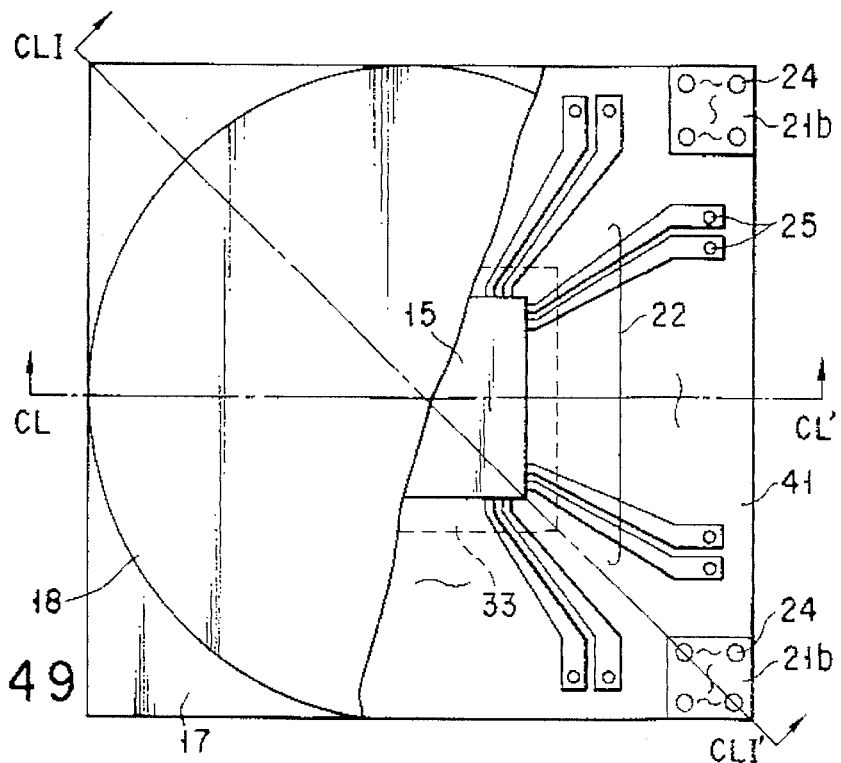
F I G. 149
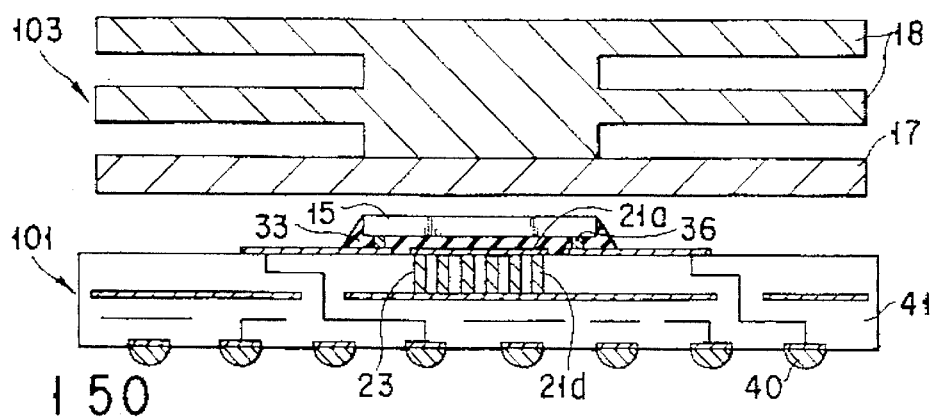
F I G. 150
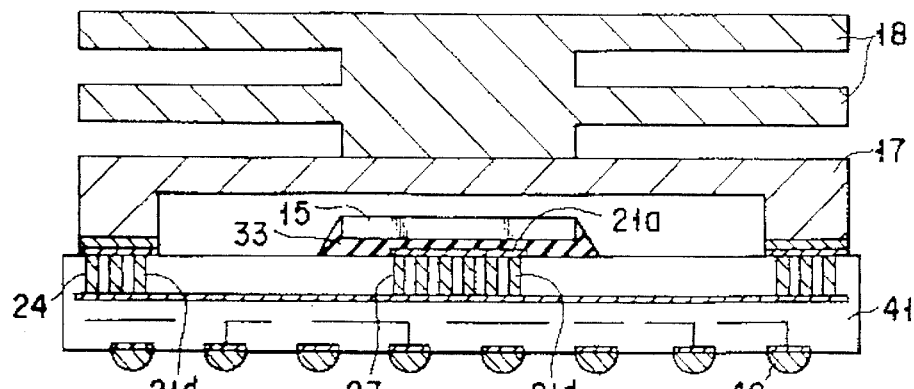
F I G. 151

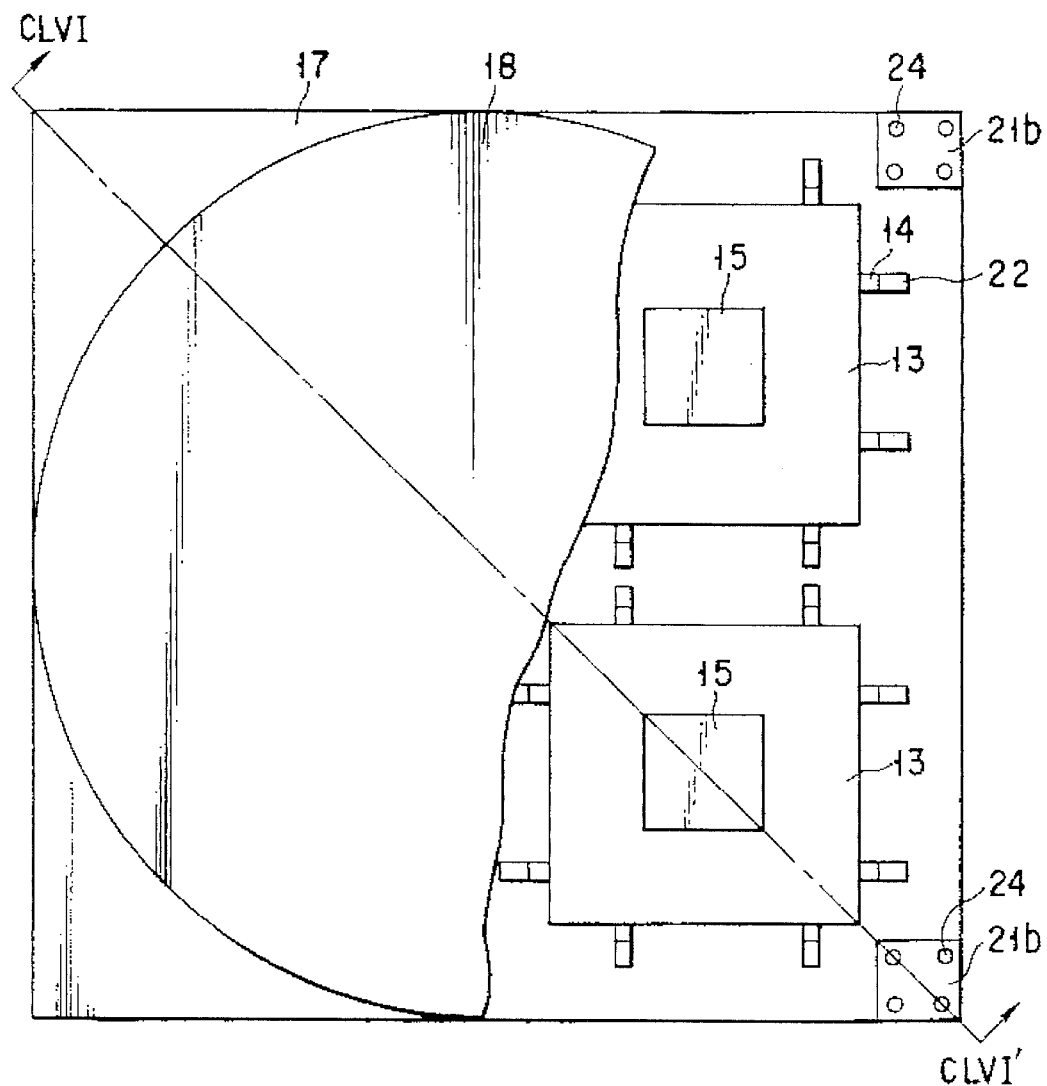
F I G. 155

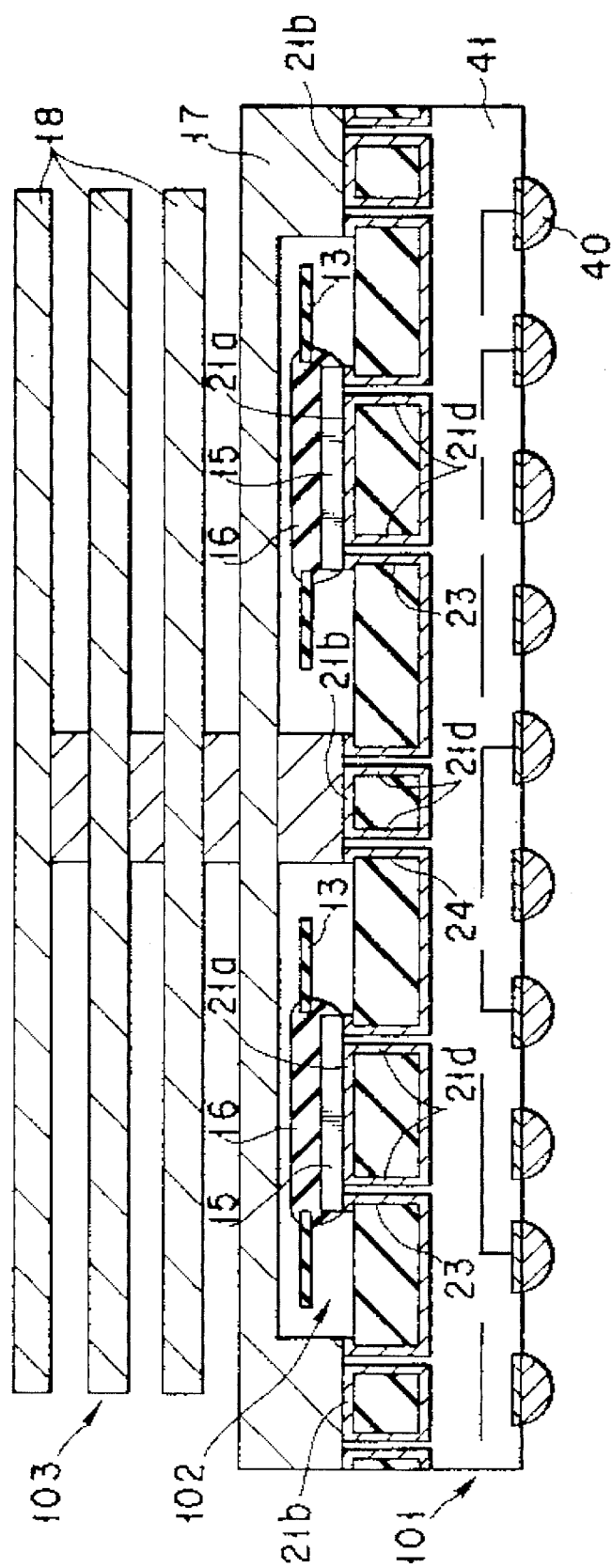
F I G. 156

5,543,663

SEMICONDUCTOR DEVICE AND BGA PACKAGE

BACKGROUND OF THE INVENTION

1. Field of the Invention

The present invention relates to a positional relationship between a semiconductor device (e.g., a TCP) and a heat sink on a printed circuit board, and a BGA package.

2. Description of the Related Art

Conventionally, when a TCP (tape carrier package) with a high power consumption is mounted on a printed circuit board, a heat sink is required to diffuse heat generated by this TCP.

FIGS. 157 and 158 show a semiconductor device using a conventional printed circuit board. FIG. 158 is a sectional view along the line CLVIII—CLVIII in FIG. 157.

The structure of this semiconductor device will be described.

A printed circuit board 101 comprises an insulating board 11 and wiring patterns 12 formed on the insulating board 11.

A TCP 102 and a heat sink 103 are mounted on the printed circuit board 101.

The TCP 102 comprises a TAB (Tape Automated Bonding) tape constituted by a polyimide tape 13 and leads 14, and a semiconductor chip 15 connected to one end of each of the leads 14.

The other end of each lead 14 of the TCP 102 is connected to the corresponding wiring pattern 12 of the printed circuit board 101 by a solder or the like.

The heat sink 103 consists of a metal such as aluminum, and has a fin-like shape.

The bottom portion of the heat sink 103 is adhered on a surface of the semiconductor chip 15 opposite to an element formation surface thereof with an adhesive or the like.

In the semiconductor device in FIGS. 157 and 158, the heat sink is directly mounted on the semiconductor chip 15 of the TCP 102.

Recently, in order to efficiently dissipate heat generated by the semiconductor chip 15, the size of the heat sink 103 has been increased. For this reason, it is difficult for the leads 14 of the TCP 102 to support the mass of the heat sink 103.

Therefore, no lead 14 has a strength with which it can bear a vibration test of the TCP, and if the heat sink 103 is forcibly mounted, the TCP 102 itself is undesirably damaged.

The present invention has been made to eliminate such a drawback, and has as its object to efficiently diffuse heat generated by a semiconductor device without damaging the semiconductor element (e.g., a TCP) mounted on a printed circuit board.

SUMMARY OF THE INVENTION

In order to achieve the above object, a printed circuit board, a semiconductor device using the same, and a BGA package according to the present invention have the following arrangements.

A printed circuit board of the present invention comprises: an insulating board having upper and lower surfaces; a first thermal conductive member, formed on the upper surface of the insulating board, for locating at least a semiconductor chip thereon; a plurality of second thermal conductive members, formed around the first thermal conductive member on the upper surface of the insulating board, for locating a heat sink thereon; a third thermal conductive member formed on the lower surface of the insulating board in a region including at least portions immediately below the first and second thermal conductive members; at least one first through hole formed in the insulating board between the first and third thermal conductive members; at least one second through hole formed in the insulating board between the second and third thermal conductive members; and fourth thermal conductive members, formed in the first and second through holes, for respectively connecting the first thermal conductive member to the third thermal conductive member, and the second thermal conductive members to the third thermal conductive member.

A printed circuit board of the present invention comprises: a multilayered insulating board having upper and lower surfaces; a first thermal conductive member, formed on the upper surface of the insulating board, for locating at least a semiconductor chip thereon; a plurality of second thermal conductive members, formed around the first thermal conductive member on the upper surface of the insulating board, for locating a heat sink thereon; a third thermal conductive member formed on the lower surface or between adjacent layers of the insulating board in a region including at least portions immediately below the first and second thermal conductive members; at least one first through hole formed in the insulating board between the first and third thermal conductive members; at least one second through hole formed in the insulating board between the second thermal conductive members and the third thermal conductive member; and fourth thermal conductive members, formed in the first and second through holes, for respectively connecting the first thermal conductive member to the third thermal conductive member, and the second thermal conductive members to the third thermal conductive member.

The second thermal conductive members are preferably formed at an equal interval, and the printed circuit board preferably further comprises a plurality of wiring patterns formed between the second thermal conductive members on the upper surface of the insulating board.

When the third thermal conductive member is formed between the adjacent layers of the insulating board, the first and second through holes extend from the upper surface to the lower surface of the insulating board, and the printed circuit board further comprises a fifth thermal conductive member formed on the lower surface of the insulating board in a region wherein the fifth thermal conductive member overlaps the first through hole, and sixth thermal conductive members formed on the lower surface of the insulating board in a region wherein the sixth thermal conductive members overlap the second through hole.

A printed circuit board of the present invention comprises: a multilayered insulating board having upper and lower surfaces; a first thermal conductive member, formed on the upper surface of the insulating board, for locating at least a semiconductor chip thereon; a second thermal conductive member, formed on the upper surface of the insulating board so as to surround the first thermal conductive member, for locating a heat sink thereon; a third thermal conductive member, formed on the lower surface or between adjacent layers of the insulating board in a region including at least portions immediately below the first and second thermal conductive members; at least one first through hole formed in the insulating board between the first and third thermal conductive members; at least one second through hole formed in the insulating board between the second and third thermal conductive members; and fourth thermal conductive members, formed in the first and second through holes, for respectively connecting the first thermal conductive member to the third thermal conductive member, and the second thermal conductive member to the third thermal conductive member.

Further, the printed circuit board comprises: a plurality of first wiring patterns formed inside the second thermal conductive member on the upper surface of the insulating board; a plurality of second wiring patterns formed outside the second thermal conductive member on the upper surface of the insulating board; a plurality of third wiring patterns formed between the adjacent layers of the insulating board; third through holes formed in the insulating board between the first and second wiring patterns and the third wiring patterns; and fourth wiring patterns, formed in the third through holes, for connecting the first and second wiring patterns to the third wiring patterns.

When the third thermal conductive member is formed between the adjacent layers of the insulating board, the first and second through holes extend from the upper surface to the lower surface of the insulating board, and the printed circuit board further comprises a fifth thermal conductive member formed on the lower surface of the insulating board in a region wherein the fifth thermal conductive member overlaps the first through hole, and a sixth thermal conductive member formed on the lower surface of the insulating board in a region wherein the sixth thermal conductive member overlaps the second through hole.

The fourth thermal conductive members are formed only on side surfaces of the first and second through holes. The fourth thermal conductive members may be formed only on side surfaces of the first and second through holes, and the printed circuit board may further comprise a material with a high heat conductivity for filling the first and second through holes. The fourth thermal conductive members may be filled in the first and second through holes.

In order to achieve the above object, a semiconductor device of the present invention comprises: an insulating board having upper and lower surfaces; a first thermal conductive member formed on the upper surface of the insulating board; a plurality of second thermal conductive members formed around the first thermal conductive member on the upper surface of the insulating board; a third thermal conductive member formed on the lower surface of the insulating board in a region including at least portions immediately below the first and second thermal conductive members; at least one first through hole formed in the insulating board between the first and third thermal conductive members; at least one second through hole formed in the insulating board between the second thermal conductive members and the third thermal conductive member; fourth thermal conductive members, formed in the first and second through holes, for respectively connecting the first thermal conductive member to the third thermal conductive member, and the second thermal conductive members to the third thermal conductive member; a semiconductor chip located on the first thermal conductive member; and a heat sink mounted on the second thermal conductive members so as to cover the semiconductor chip.

A semiconductor device of the present invention comprises: a multilayered insulating board having upper and lower surfaces; a first thermal conductive member formed on the upper surface of the insulating board; a plurality of second thermal conductive members formed around the first thermal conductive member on the upper surface of the insulating board; a third thermal conductive member formed on the lower surface or between adjacent layers of the insulating board in a region including at least portion immediately below the first and second thermal conductive members; at least one first through hole formed in the insulating board between the first and third thermal conductive members; at least one second through hole formed in the insulating board between the second thermal conductive members and the third thermal conductive member; fourth thermal conductive members, formed in the first and second through holes, for respectively connecting the first thermal conductive member to the third thermal conductive member, and the second thermal conductive members to the third thermal conductive member; a semiconductor chip located on the first thermal conductive member; and a heat sink mounted on the second thermal conductive members so as to cover the semiconductor chip.

The second thermal conductive members are preferably formed at an equal interval, and the semiconductor device preferably further comprises a plurality of wiring patterns formed between the second thermal conductive members on the upper surface of the insulating board.

When the third thermal conductive member is formed between the adjacent layers of the insulating board, the first and second through holes extend from the upper surface to the lower surface of the insulating board, and the semiconductor device further comprises a fifth thermal conductive member formed on the lower surface of the insulating board in a region wherein the fifth thermal conductive member overlaps the first through hole, and sixth thermal conductive members formed on the lower surface of the insulating board in a region wherein the sixth thermal conductive members overlap the second through hole.

The heat sink is constituted by a lid portion and a fin portion, the lid portion has projecting portions located on the second thermal conductive members, and the fin portion is mounted on the lid portion.

A semiconductor device of the present invention comprises: a multilayered insulating board having upper and lower surfaces; a first thermal conductive member formed on the upper surface of the insulating board; a second thermal conductive member formed on the upper surface of the insulating board so as to surround the first thermal conductive member; a third thermal conductive member formed on the lower surface or between adjacent layers of the insulating board in a region including at least portions immediately below the first and second thermal conductive members; at least one first through hole formed in the insulating board between the first and third thermal conductive members; at least one second through hole formed in the insulating board between the second and third thermal conductive members; fourth thermal conductive members, formed in the first and second through holes, for respectively connecting the first thermal conductive member to the third thermal conductive member, and the second thermal conductive member to the third thermal conductive member; a semiconductor chip located on the first thermal conductive member; and a heat sink mounted on the second thermal conductive member so as to cover the semiconductor chip.

Further, the semiconductor device comprises: a plurality of first wiring patterns formed inside the second thermal conductive member on the upper surface of the insulating board; a plurality of second wiring patterns formed outside the second thermal conductive member on the upper surface of the insulating board; a plurality of third wiring patterns formed between the adjacent layers of the insulating board; third through holes formed in the insulating board between the first and second wiring patterns and the third wiring patterns; and fourth wiring patterns, formed in the third through holes, for connecting the first and second wiring patterns to the third wiring patterns.

When the third thermal conductive member is formed between the adjacent layers of the insulating board, the first and second through holes extend from the upper surface to the lower surface of the insulating board, and the semiconductor device further comprises a fifth thermal conductive member formed on the lower surface of the insulating board in a region wherein the fifth thermal conductive member overlaps the first through hole, and a sixth thermal conductive member formed on the lower surface of the insulating board in a region wherein the sixth thermal conductive member overlaps the second through hole.

The heat sink is constituted by a lid portion and a fin portion, the lid portion comprises a frame-like projecting portion located on the second thermal conductive member, and the fin portion is mounted on the lid portion.

The fourth thermal conductive members are formed only on side surfaces of the first and second through holes. The fourth thermal conductive members may be formed only on side surfaces of the first and second through holes, and the semiconductor device may further comprise a material with a high heat conductivity for filling the first and second through holes. The fourth thermal conductive members may be filled in the first and second through holes.

A semiconductor device of the present invention comprises: an insulating board having upper and lower surfaces; a first thermal conductive member formed on the upper surface of the insulating board; a plurality of second thermal conductive members formed around the first thermal conductive member on the upper surface of the insulating board; a third thermal conductive member formed on the lower surface of the insulating board in a region including at least portions immediately below the first and second thermal conductive members; at least one first through hole formed in the insulating board between the first and third thermal conductive members; a threaded hole formed in the insulating board between each of the second thermal conductive members and the third thermal conductive member; a fourth thermal conductive member, formed in the first through hole, for connecting the first thermal conductive member to the third thermal conductive member; a semiconductor chip located on the first thermal conductive member; a heat sink mounted on the second thermal conductive members so as to cover the semiconductor chip and having a threaded hole in a surface opposite to each of the second thermal conductive members; and a screw, inserted in the threaded holes of the insulating board and the heat sink, for fixing the heat sink on the insulating board.

A semiconductor device of the present invention comprises: a multilayered insulating board having upper and lower surfaces; a first thermal conductive member formed on the upper surface of the insulating board; a plurality of second thermal conductive members formed around the first thermal conductive member on the upper surface of the insulating board; a third thermal conductive member formed on the lower surface or between adjacent layers of the insulating board in a region including at least portions immediately below the first and second thermal conductive members; at least one first through hole formed in the insulating board between the first and third thermal conductive members; a threaded hole formed in the insulating board between each of the second thermal conductive members and the third thermal conductive members; a fourth thermal conductive member, formed in the first through hole, for connecting the first thermal conductive member to the third thermal conductive member; a semiconductor chip located on the first thermal conductive member; a heat sink mounted on the second thermal conductive members so as to cover the semiconductor chip and having a threaded hole in a surface opposite to each of the second thermal conductive members; and a screw, inserted in the threaded holes of the insulating board and the heat sink, for fixing the heat sink on the insulating board.

A semiconductor device of the present invention comprises: a multilayered insulating board having upper and lower surfaces; a first thermal conductive member formed on the upper surface of the insulating board; a second thermal conductive member formed on the upper surface of the insulating board so as to surround the first thermal conductive member; a third thermal conductive member formed on the lower surface or between adjacent layers of the insulating board in a region including at least portions immediately below the first and second thermal conductive members; at least one first through hole formed in the insulating board between the first and third thermal conductive members; threaded holes formed in the insulating board between the second and third thermal conductive members; a fourth thermal conductive member, formed in the first through hole, for connecting the first thermal conductive member to the third thermal conductive member; a semiconductor chip located on the first thermal conductive member; a heat sink mounted on the second thermal conductive member so as to cover the semiconductor chip and having threaded holes in a surface opposite to the second thermal conductive members; screws, inserted in the threaded holes of the insulating board and the heat sink, for fixing the heat sink on the insulating board.

The semiconductor device preferably further comprises a highly thermal conductive member having a high thermal conductivity to be mounted on the third thermal conductive member.

When the third thermal conductive member is formed on the lower surface of the insulating board, the semiconductor device preferably further comprises a highly thermal conductive member having a high thermal conductivity to be mounted on the third thermal conductive member.

A semiconductor device of the present invention comprises: an insulating board having upper and lower surfaces; a first thermal conductive member formed on the upper surface of the insulating board; a plurality of second thermal conductive members formed around the first thermal conductive member on the upper surface of the insulating board; a third thermal conductive member formed on the lower surface of the insulating board in a region including at least portions immediately below the first and second thermal conductive members; at least one first through hole formed in the insulating board between the first and third thermal conductive members; a threaded hole formed in the insulating board between each of the second thermal conductive members and the third thermal conductive member; a fourth thermal conductive member, formed in the first through hole, for connecting the first thermal conductive member to the third thermal conductive member; a semiconductor chip located on the first thermal conductive member; a heat sink mounted on the second thermal conductive members so as to cover the semiconductor chip and having a threaded hole in a surface opposite to the second thermal conductive members; a highly thermal conductive member with a high thermal conductivity mounted on the third thermal conductive member and having a threaded hole; and a screw, inserted in the threaded holes of the insulating board, the heat sink, and the highly thermal conductive member, for fixing the heat sink and the highly thermal conductive member on the insulating board.

A semiconductor device of the present invention comprises: a multilayered insulating board having upper and lower surfaces; a first thermal conductive member formed on the upper surface of the insulating board; a plurality of second thermal conductive members formed around the first thermal conductive member on the upper surface of the insulating board; a third thermal conductive member formed on the lower surface of the insulating board in a region including at least portions immediately below the first and second thermal conductive members; at least one first through hole formed in the insulating board between the first and third thermal conductive members; a threaded hole formed in the insulating board between each of the second thermal conductive members and the third thermal conductive member; a fourth thermal conductive member, formed in the first through hole, for connecting the first thermal conductive member to the third thermal conductive member; a semiconductor chip located on the first thermal conductive member; a heat sink mounted on the second thermal conductive members so as to cover the semiconductor chip and having a threaded hole in a surface opposite to each of the second thermal conductive members; a highly thermal conductive member with a high thermal conductivity mounted on the third thermal conductive member and having a threaded hole; and a screw, inserted in the threaded holes of the insulating board, the heat sink, and the highly thermal conductive member, for fixing the heat sink and the highly thermal conductive member on the insulating board.

A semiconductor device of the present invention comprises: a multilayered insulating board having upper and lower surfaces; a first thermal conductive member formed on the upper surface of the insulating board; a second thermal conductive member formed on the upper surface of the insulating board so as to surround the first thermal conductive member; a third thermal conductive member formed on the lower surface of the insulating board in a region including at least portions immediately below the first and second thermal conductive members; at least one first through hole formed in the insulating board between the first and third thermal conductive members; threaded holes formed in the insulating board between the second and third thermal conductive members; a fourth thermal conductive member, formed in the first through hole, for connecting the first thermal conductive member to the third thermal conductive member; a semiconductor chip located on the first thermal conductive member; a heat sink mounted on the second thermal conductive member so as to cover the semiconductor chip and having threaded holes in a surface opposite to the second thermal conductive member; a highly thermal conductive member with a high thermal conductivity mounted on the third thermal conductive member and having threaded holes; and screws, inserted in the threaded holes of the insulating board, the heat sink, and the highly thermal conductive member, for fixing the heat sink and the highly thermal conductive member on the insulating board.

The semiconductor device may further comprise a TAB tape for mounting the semiconductor chip, and leads formed on the TAB tape, the semiconductor chip may be directly located on the first thermal conductive member with an adhesive, and one end of each lead may be connected to one end of the corresponding wiring pattern.

The semiconductor chip may be directly mounted on the first thermal conductive member with an adhesive, and the semiconductor device may further comprise bonding wires for connecting the semiconductor chip to the wiring patterns.

The semiconductor chip may be directly mounted on the first thermal conductive member with an adhesive, the semiconductor device may further comprise a bonding wire for connecting the semiconductor chip to one end of the corresponding wiring pattern, and a resin for covering at least the semiconductor chip and the bonding wire.

The semiconductor device may further comprise a TAB tape for mounting the semiconductor chip, leads formed on the TAB tape, and a resin for covering at least one surface of the semiconductor chip, the semiconductor chip may be directly located on the first thermal conductive member through the resin, and one end of each lead may be connected to one end of the corresponding wiring pattern.

The semiconductor device may further comprise first bumps formed on one surface of the semiconductor chip, and a resin filled between one surface of the semiconductor chip and the first thermal conductive member, and each first bump may be connected to one end of the corresponding wiring pattern.

The other surface of the semiconductor chip is preferably coupled to the heat sink with an adhesive.

The semiconductor device preferably further comprises a second bump for heat dissipation for connecting one surface of the semiconductor chip to the first thermal conductive member.

In order to achieve the above object, a printed circuit board of the present invention comprises: an insulating board having upper and lower surfaces; a plurality of first thermal conductive members, formed on the upper surface of the insulating board, for locating a plurality of semiconductor chips; at least one second thermal conductive member, formed on the upper surface of the insulating board, for locating a heat sink thereon; a third thermal conductive member formed on the lower surface of the insulating board in a region including at least portions immediately below the first and second thermal conductive members; at least one first through hole formed in the insulating board between each of the first thermal conductive members and the third thermal conductive member; at least one second through hole formed in the insulating board between the second thermal conductive member and the third thermal conductive member; and fourth thermal conductive members, formed in the first and second through holes, for respectively connecting the first thermal conductive members to the third thermal conductive member, and the second thermal conductive member to the third thermal conductive member.

In order to achieve the above object, a printed circuit board of the present invention comprises: a multilayered insulating board having upper and lower surfaces; a plurality of first thermal conductive members, formed on the upper surface of the insulating board, for locating a plurality of semiconductor chips; at least one second thermal conductive member, formed on the upper surface of the insulating board, for locating a heat sink thereon; a third thermal conductive member formed on the lower surface or between adjacent layers of the insulating board in a region including at least portions immediately below the first and second thermal conductive members; at least one first through hole formed in the insulating board between each of the first thermal conductive members and the third thermal conductive member; at least one second through hole formed in the insulating board between the second thermal conductive member and the third thermal conductive member; and fourth thermal conductive members, formed in the first and second through holes, for respectively connecting the first thermal conductive members to the third thermal conductive member, and the second thermal conductive member to the third thermal conductive member.

The second thermal conductive member may be located at a position with an equal distance at least from the first thermal conductive members.

In order to achieve the above object, a printed circuit board of the present invention comprises: a multilayered insulating board having upper and lower surfaces; a plurality of first thermal conductive members, respectively, formed on the upper and lower surfaces of the insulating board, for locating at least semiconductor chips thereon; a plurality of second thermal conductive members, formed around the plurality of first thermal conductive members, for locating a heat sink thereon; a third thermal conductive member formed between adjacent layers of the insulating board in a region including at least portions immediately below the first and second thermal conductive members; at least one first through hole formed in the insulating board between each of the first thermal conductive members and the third thermal conductive member; at least one second through hole formed in the insulating board between each of the second thermal conductive members and the third thermal conductive member; and fourth thermal conductive members, formed in the first and second through holes, for respectively connecting the first thermal conductive members to the third thermal conductive member, and each of the second thermal conductive members to the third thermal conductive member.

In order to achieve the above object, a semiconductor device of the present invention comprises: an insulating board having upper and lower surfaces; a plurality of first thermal conductive members formed on the upper surface of the insulating board; at least one second thermal conductive member formed on the upper surface of the insulating board; a third thermal conductive member formed on the lower surface of the insulating board in a region including at least portions immediately below the first and second thermal conductive members; at least one first through hole formed in the insulating board between each of the first thermal conductive members and the third thermal conductive member; at least one second through hole formed in the insulating board between the second thermal conductive member and the third thermal conductive member; fourth thermal conductive members, formed in the first and second through holes, for respectively connecting the first thermal conductive members to the third thermal conductive member, and the second thermal conductive member to the third thermal conductive member; a semiconductor chip mounted on each of the first thermal conductive members; and a heat sink mounted on the second thermal conductive member so as to cover the semiconductor chip.

A semiconductor device of the present invention comprises: a multilayered insulating board having upper and lower surfaces; a plurality of first thermal conductive members formed on the upper surface of the insulating board; at least one second thermal conductive member formed on the upper surface of the insulating board; a third thermal conductive member formed on the lower surface or between adjacent layers of the insulating board in a region including at least portions immediately below the first and second thermal conductive members; at least one first through hole formed in the insulating board between each of the first thermal conductive members and the third thermal conductive member; at least one second through hole formed in the insulating board between the second thermal conductive member and the third thermal conductive member; fourth thermal conductive members, formed in the first and second through holes, for respectively connecting the first thermal conductive members to the third thermal conductive member, and the second thermal conductive member to the third thermal conductive member; a semiconductor chip mounted on each of the first thermal conductive members; and a heat sink mounted on the second thermal conductive member so as to cover the semiconductor chip.

The second thermal conductive member may be located at a position with an equal distance at least from the first thermal conductive members.

A semiconductor device of the present invention comprises: a multilayered insulating board having upper and lower surfaces; a plurality of first thermal conductive members respectively formed on the upper and lower surfaces of the insulating board; a plurality of second thermal conductive members formed around the plurality of first thermal conductive members; a third thermal conductive member formed between adjacent layers of the insulating board in a region including at least portions immediately below the first and second thermal conductive members; at least one first through hole formed in the insulating board between each of the first thermal conductive members and the third thermal conductive member; at least one second through hole formed in the insulating board between each of the second thermal conductive members and the third thermal conductive member; fourth thermal conductive members, formed in the first and second through holes, for respectively connecting the first thermal conductive members to the third thermal conductive member, and the second thermal conductive members to the third thermal conductive member; a semiconductor chip mounted on each of the first thermal conductive members; and a heat sink mounted on the second thermal conductive members so as to cover the semiconductor chip.

In order to achieve the above object, a BGA package of the present invention comprises: a multilayered wiring board having upper and lower surfaces; a first thermal conductive member formed on the upper surface of the wiring board; a plurality of second thermal conductive members formed around the first thermal conductive member on the upper surface of the wiring board; a third thermal conductive member formed between adjacent layers of the wiring board in a region including at least portions immediately below the first and second thermal conductive members; at least one first through hole formed in the wiring board between the first and third thermal conductive members; at least one second through hole formed in the wiring board between each of the second thermal conductive members and the third thermal conductive member; fourth thermal conductive members, formed in the first and second through holes, for respectively connecting the first thermal conductive member to the third thermal conductive member, and the second thermal conductive members to the third thermal conductive member; a semiconductor chip located on the first thermal conductive member; a heat sink mounted on the second thermal conductive members so as to cover the semiconductor chip; and a plurality of spherical conductive members formed on the lower surface of the wiring board and electrically connected to the semiconductor chip.

A BGA package of the present invention comprises: a multilayered wiring board having upper and lower surfaces; a first thermal conductive member formed on the upper surface of the wiring board; a second thermal conductive member formed on the upper surface of the wiring board so as to surround the first thermal conductive member; a third thermal conductive member formed between adjacent layers of the wiring board in a region including at least portions immediately below the first and second thermal conductive members; at least one first through hole formed in the wiring board between the first and third thermal conductive members; at least one second through hole formed in the wiring board between the second and third thermal conductive members; fourth thermal conductive members, formed in the first and second through holes, for respectively connecting the first thermal conductive member to the third thermal conductive member, and the second thermal conductive member to the third thermal conductive member; a semiconductor chip located on the first thermal conductive member; a heat sink mounted on the second thermal conductive member so as to cover the semiconductor chip; and a plurality of spherical conductive members formed on the lower surface of the wiring board and electrically connected to the semiconductor chip.

Each of the second thermal conductive members is preferably formed at one of corner portions of the wiring board, and the BGA package preferably further comprises a plurality of wiring patterns, located around the second thermal conductive members, for electrically connecting the semiconductor chip to the plurality of spherical conductive members.

The heat sink is preferably constituted by a lid portion and a fin portion, the lid portion preferably has a projecting portion located on the second thermal conductive members, and the fin portion is preferably mounted on the lid portion.

The fourth thermal conductive members are formed only on side surfaces of the first and second through holes. The fourth thermal conductive members may be formed only on side surfaces of the first and second through holes, and the BGA package may further comprise a material with a high heat conductivity for filling the first and second through holes. The fourth thermal conductive members may be filled in the first and second through holes.

The BGA package may further comprise a TAB tape for mounting the semiconductor chip, and leads formed on the TAB tape, the semiconductor chip may be directly located on the first thermal conductive member with an adhesive, and one end of each lead may be connected to one end of the corresponding wiring pattern.

The semiconductor chip may be directly mounted on the first thermal conductive member with an adhesive, and the BGA package may further comprise a bonding wire for connecting the semiconductor chip to one end of the corresponding wiring pattern.

The semiconductor chip may be directly mounted on the first thermal conductive member with an adhesive, and the BGA package may further comprise a bonding wire for connecting the semiconductor chip to one end of the corresponding wiring pattern, and a resin for covering at least the semiconductor chip and the bonding wire.

The BGA package may further comprise a TAB tape for mounting the semiconductor chip, leads formed on the TAB tape, and a resin for covering at least one surface of the semiconductor chip, the semiconductor chip may be located on the first thermal conductive member through the resin, and one end of each lead may be connected to one end of the corresponding wiring pattern.

The BGA package may further comprise first bumps formed on one surface of the semiconductor chip, and a resin filled between one surface of the semiconductor chip and the first thermal conductive member, and each first bump may be connected to one end of the corresponding wiring pattern.

The other surface of the semiconductor chip is preferably coupled to the heat sink with an adhesive.

The BGA package preferably further comprises a second bump for heat dissipation for connecting one surface of the semiconductor chip to the first thermal conductive member.

A BGA package of the present invention comprises: a multilayered wiring board having upper and lower surfaces; a plurality of first thermal conductive members formed on the upper surface of the wiring board; at least one second thermal conductive member formed on the upper surface of the wiring board; a third thermal conductive member formed between adjacent layers of the wiring board in a region including at least portions immediately below the first and second thermal conductive members; at least one first through hole formed in the wiring board between each of the first thermal conductive members and the third thermal conductive member; at least one second through hole formed in the wiring board between the second thermal conductive member and the third thermal conductive member; fourth thermal conductive members, formed in the first and second through holes, for respectively connecting the first thermal conductive members to the third thermal conductive member, and the second thermal conductive member to the third thermal conductive member; a semiconductor chip located on each of the first thermal conductive members; a heat sink mounted on the second thermal conductive member so as to cover the semiconductor chip; and a plurality of spherical conductive members formed on the lower surface of the wiring board and electrically connected to the semiconductor chip.

Each of the second thermal conductive members is preferably formed at one of corner portions of the wiring board.

A BGA package of the present invention comprises: a multilayered wiring board having upper and lower surfaces; a plurality of first thermal conductive members respectively formed on the upper and lower surfaces of the wiring board; a plurality of second thermal conductive members formed around the wiring board; a third thermal conductive member formed between adjacent layers of the wiring board in a region including at least portions immediately below the first and second thermal conductive members; at least one first through hole formed in the wiring board between each of the first thermal conductive members and the third thermal conductive member; at least one second through hole formed in the wiring board between each of the second thermal conductive members and the third thermal conductive member; fourth thermal conductive members, formed in the first and second through holes, for respectively connecting the first thermal conductive members to the third thermal conductive member, and each of the second thermal conductive members to the third thermal conductive member; a semiconductor chip located on each of the first thermal conductive members; a heat sink mounted on the second thermal conductive members so as to cover the semiconductor chip; and a plurality of spherical conductive members formed on the lower surface of the wiring board and electrically connected to the semiconductor chip.

According to the printed circuit board having the above arrangements, the first thermal conductive member for mounting a TCP and the semiconductor chip, and the second thermal conductive member for mounting the heat sink are formed on one major surface of the insulating board.

Heat generated by the semiconductor chip is directly conducted to the heat sink and at the same time from the first thermal conductive member to the heat sink through the fourth thermal conductive members in the through holes, the third thermal conductive member on the other major surface of the insulating board, and the second thermal conductive member.

Therefore, the heat sink may not be directly mounted on the TCP or the semiconductor chip to increase the heat dissipation without damaging the leads of the TCP.

According to the semiconductor device having the above arrangements, the TCP or the semiconductor chip is mounted on the first thermal conductive member on one major surface of the insulating board, and the heat sink is mounted on the second thermal conductive member. Therefore, the heat sink may not be directly mounted on the TCP or the semiconductor chip to be free from damage to the leads of the TCP.

The heat generated by the semiconductor chip is directly conducted to the heat sink and at the same time from the first thermal conductive member to the heat sink through the fourth thermal conductive members in the through holes, the third thermal conductive member on the other major surface of the insulating board, and the second thermal conductive member. Therefore, the semiconductor device with excellent heat dissipation and a simple arrangement can be provided.

According to the BGA package having the above arrangements, the semiconductor chip is mounted on the first thermal conductive member on one major surface of the multilayered wiring board, the heat sink is mounted on the second thermal conductive member, and the plurality of spherical solder members are formed on the other major surface of the multilayered board. Therefore, the strong BGA package with excellent heat dissipation and a simple arrangement can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 13 is a perspective view showing a heat sink in FIG. 10;

FIG. 14 is a perspective view showing the heat sink in FIG. 10;

FIG. 15 is a perspective view showing the heat sink in FIG. 10;

FIG. 31 is a sectional view showing dissipation paths of the semiconductor device in FIG. 24;

FIG. 32 is a sectional view showing the dissipation paths of the semiconductor device in FIG. 24;

FIG. 39 is a plan view showing the lower surface of the seiconductor device in FIG. 36;

FIG. 58 is a plan view showing a semiconductor device according to the 11th embodiment of the present invention;

FIG. 59 is a sectional view of the semiconductor device along the line LIX—LIX in FIG. 58;

FIG. 60 is a sectional view of the semiconductor device along the line LX—LX in FIG. 58;

FIG. 70 is a plan view showing a semiconductor device according to the 15th embodiment of the present invention;

FIG. 71 is a sectional view of the semiconductor device along the line LXXI—LXXI in FIG. 70;

FIG. 72 is a sectional view of the semiconductor device along the line LXXII—LXXII in FIG. 70;

FIG. 76 is a plan view showing a semiconductor device according to the 17th embodiment of the present invention;

FIG. 77 is a sectional view of the semiconductor device along the line LXXVII—LXXVII in FIG. 76;

FIG. 78 is a sectional view of the semiconductor device along the line LXXVIII—LXXVIII in FIG. 76;

FIG. 88 is a plan view showing a semiconductor device according to the 19th embodiment of the present invention;

FIG. 89 is a sectional view of the semiconductor device along the line LXXXIX—LXXXIX in FIG. 88;

FIG. 90 is a sectional view of the semiconductor device along the line XC—XC in FIG. 88;

FIG. 101 is a plan view showing a semiconductor device according to the 21st embodiment of the present invention;

FIG. 102 is a sectional view of the semiconductor device along the line CII—CII in FIG. 101;

FIG. 107 is a plan view showing a semiconductor device according to the 22nd embodiment of the present invention;

FIG. 109 is a plan view showing the semiconductor device according to the 22nd embodiment of the present invention;

FIG. 116 is a sectional view of the semiconductor device along the line CXVI—CXVI in FIG. 115;

FIG. 119 is a plan view showing the semiconductor device according to the 24th embodiment of the present invention;

FIG. 120 is a sectional view of the semiconductor device along the line CXX—CXX in FIG. 119;

FIG. 121 is a plan view showing a semiconductor device according to the 25th embodiment of the present invention;

FIG. 122 is a sectional view of the semiconductor device along the line CXXII—CXXII in FIG. 121;

FIG. 123 is a plan view showing the semiconductor device according to the 25th embodiment of the present invention;

FIG. 124 is a sectional view of the semiconductor device along the line CXXIV—CXXIV in FIG. 123;

FIG. 125 is a plan view showing a semiconductor device according to the 26th embodiment of the present invention;

FIG. 126 is a sectional view of the semiconductor device along the line CXXVI—CXXVI in FIG. 125;

FIG. 127 is a plan view showing the semiconductor device according to the 26th embodiment of the present invention;

FIG. 128 is a sectional view of the semiconductor device along the line CXXVIII—CXXVIII in FIG. 127;

FIG. 129 is a sectional view showing a semiconductor device according to the 27th embodiment of the present invention;

FIG. 130 is a sectional view showing a semiconductor device to be compared with the semiconductor in FIG. 129;

Figure 131:
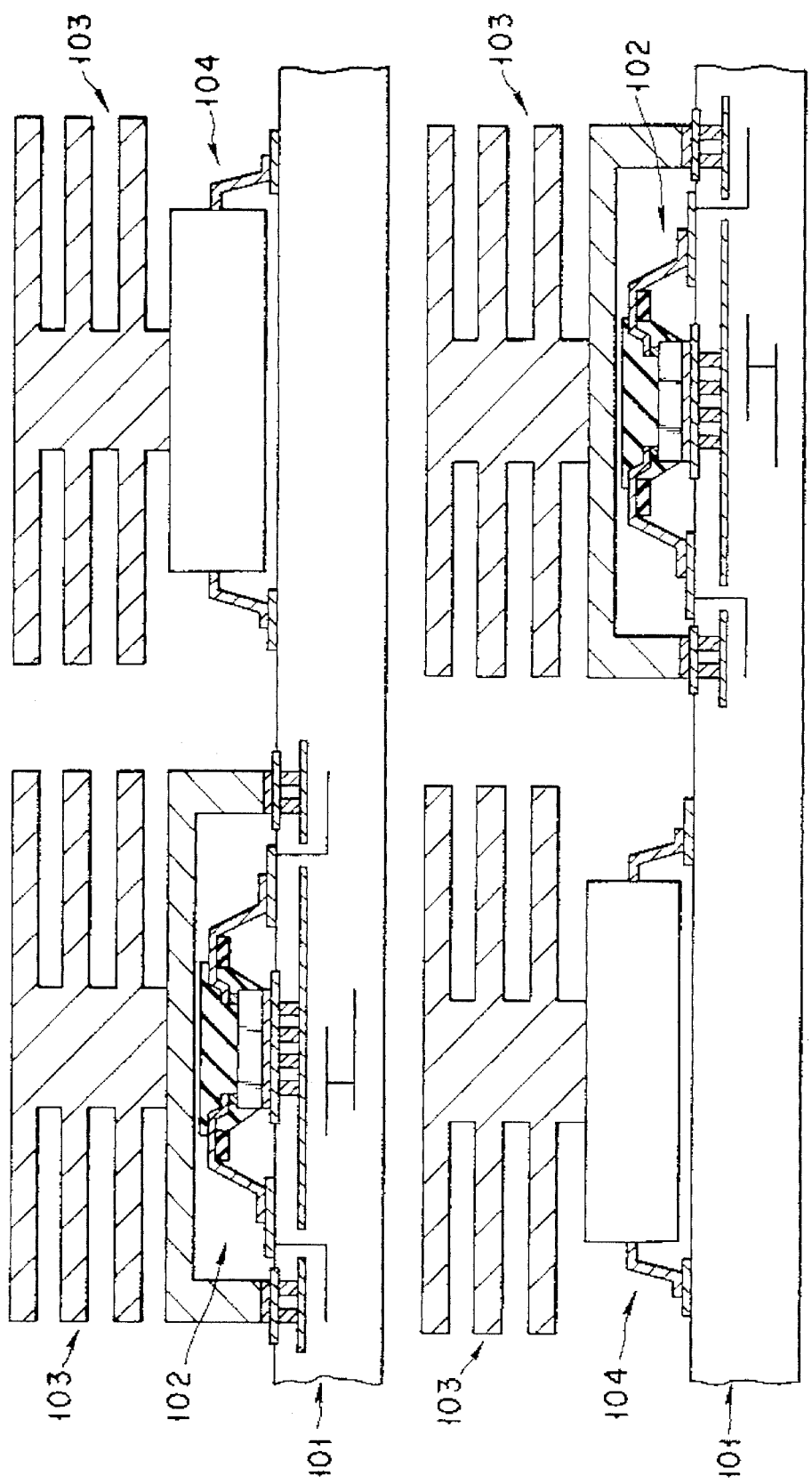
Figure 132:
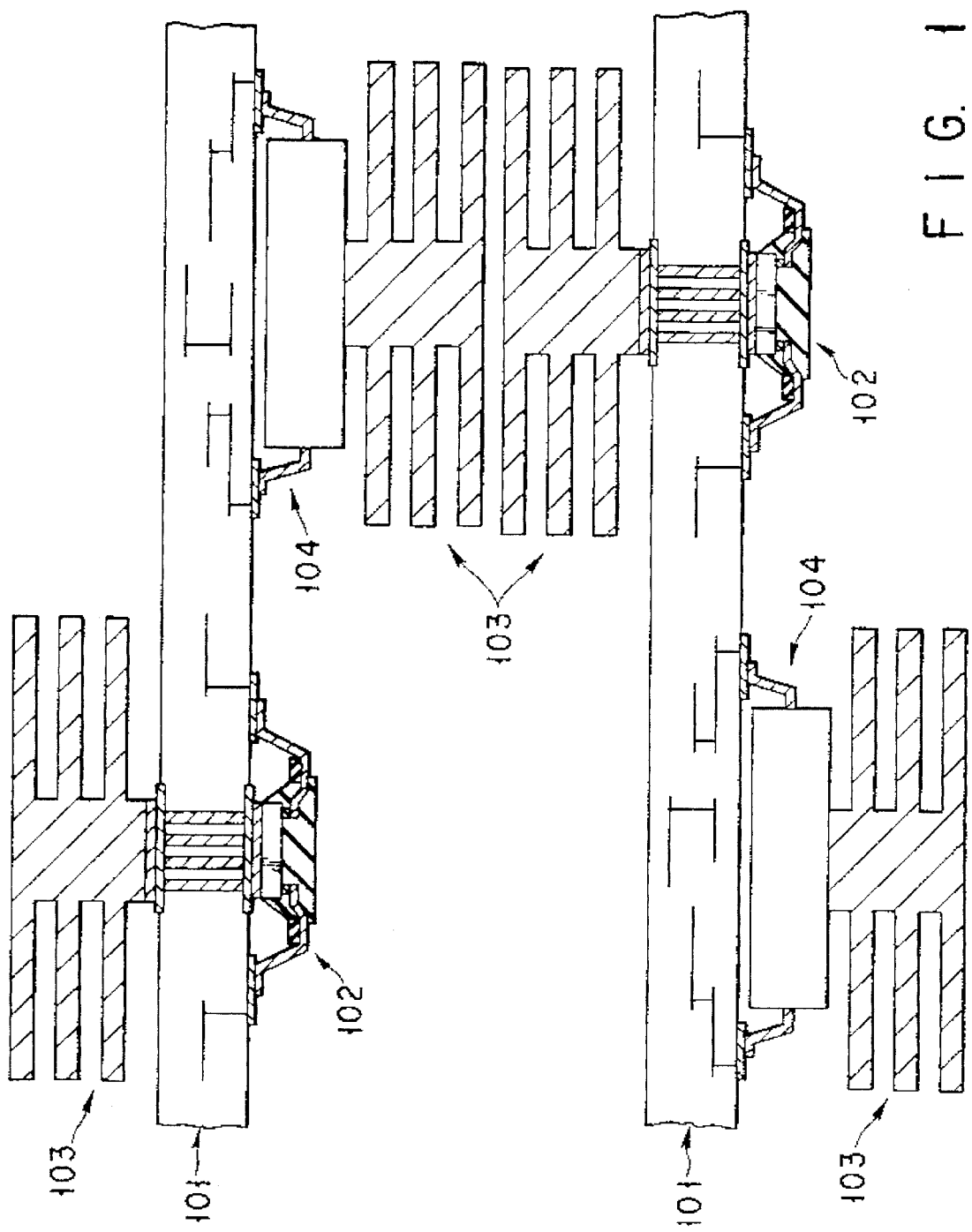
Figure 133:
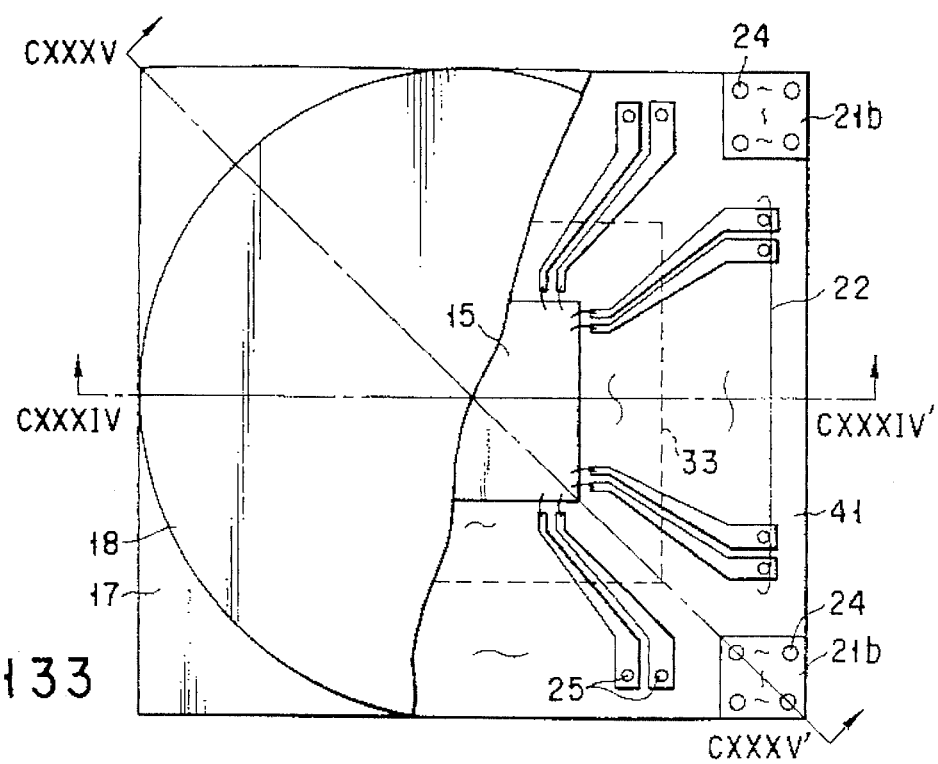
Figure 134:
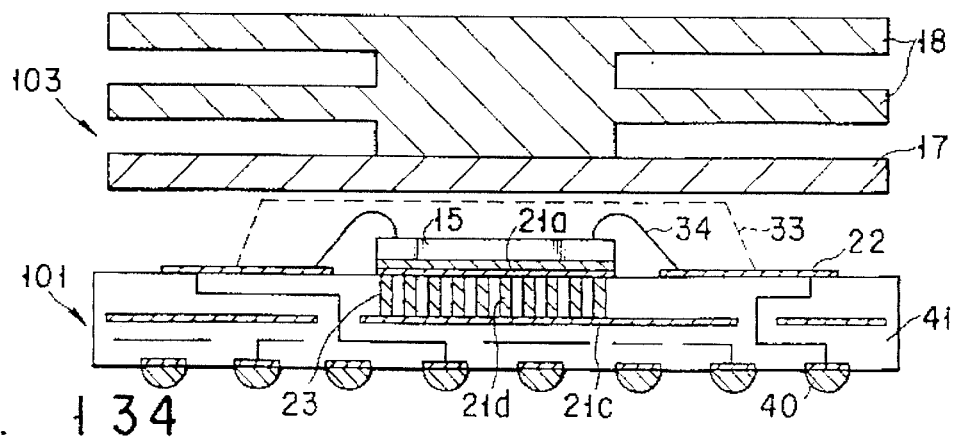
Figure 135:
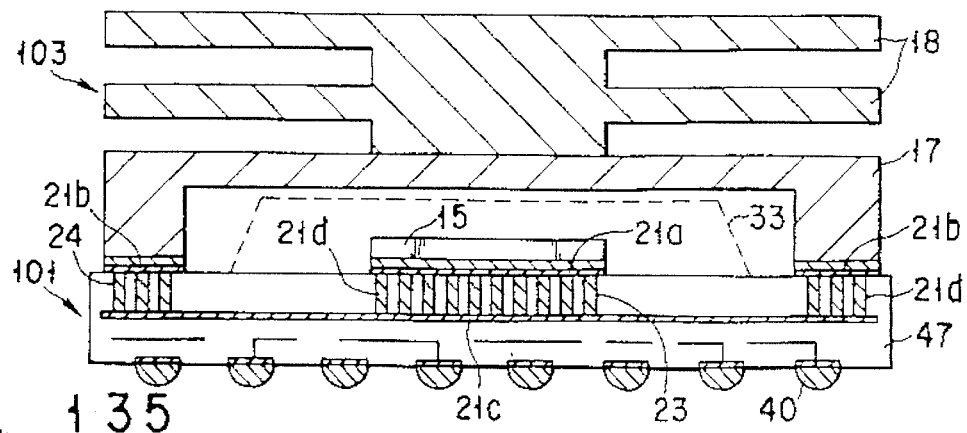
Figure 136:
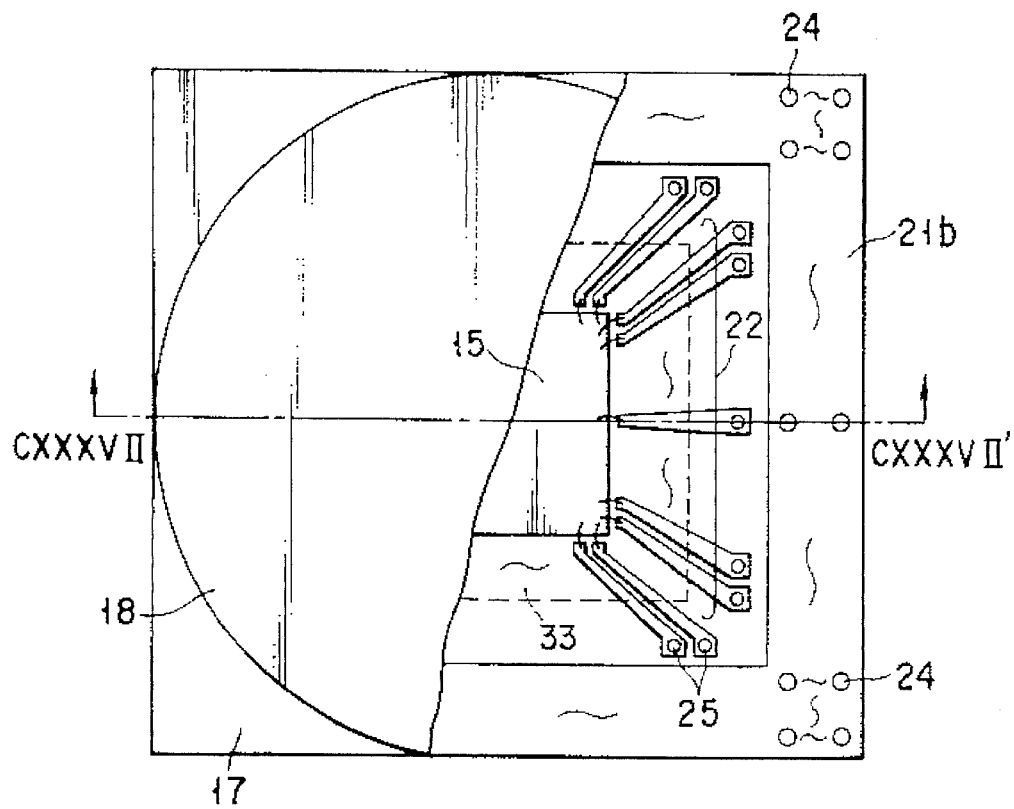
Figure 137:
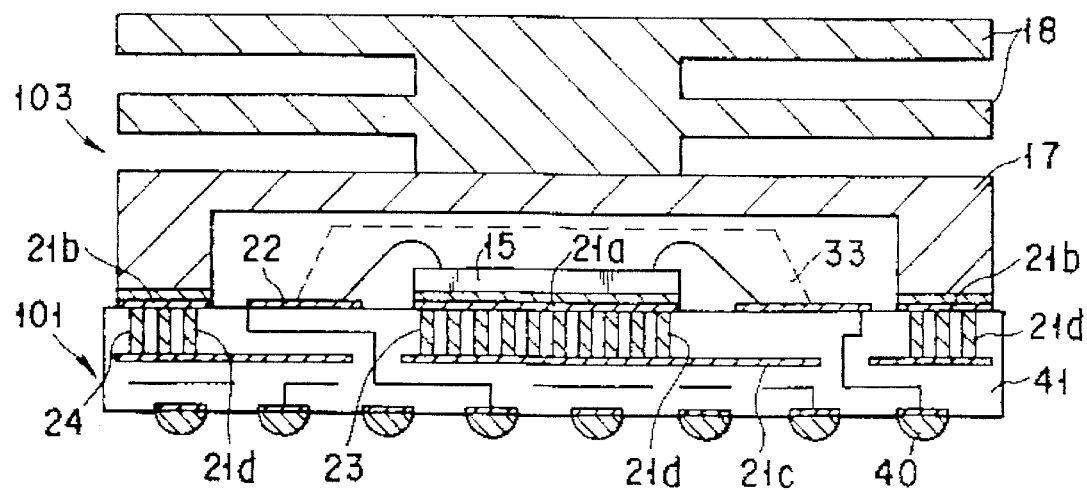
Figure 138:
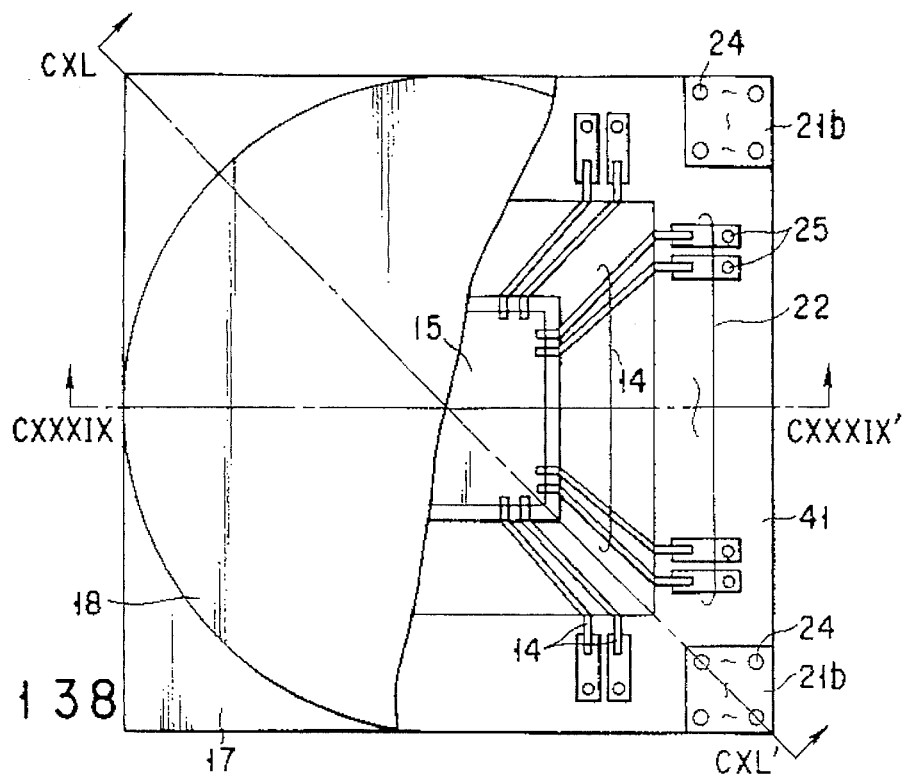
Figure 139:
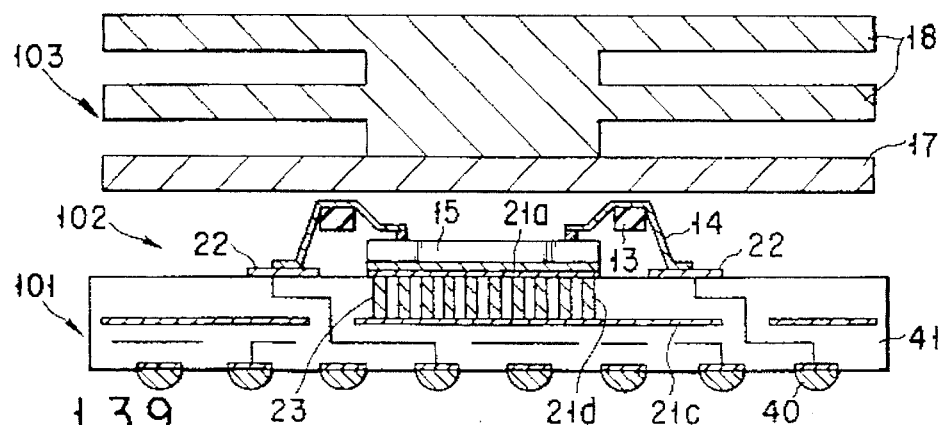
Figure 140:
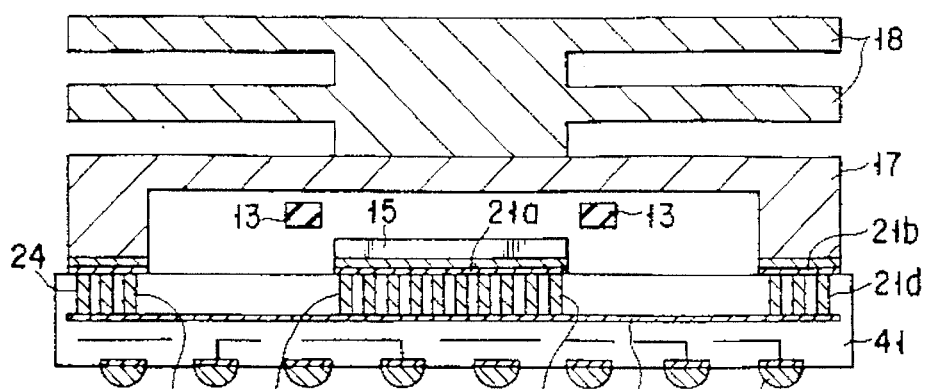
Figure 141:
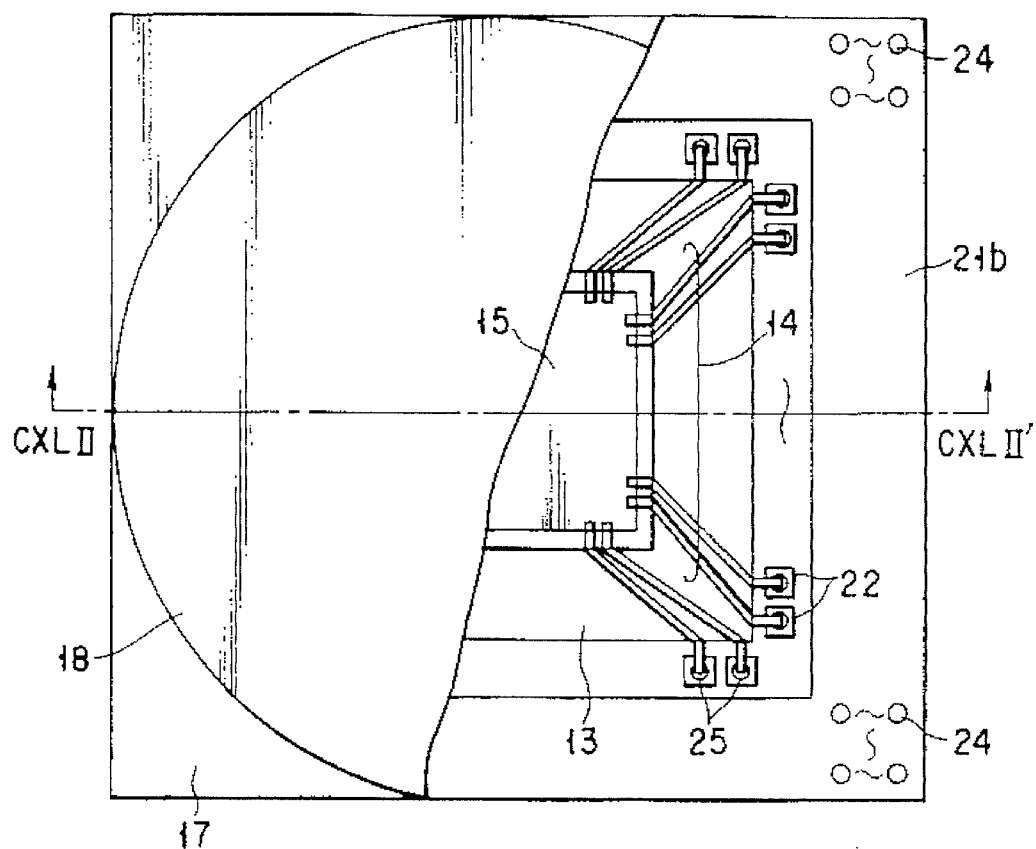
Figure 142:
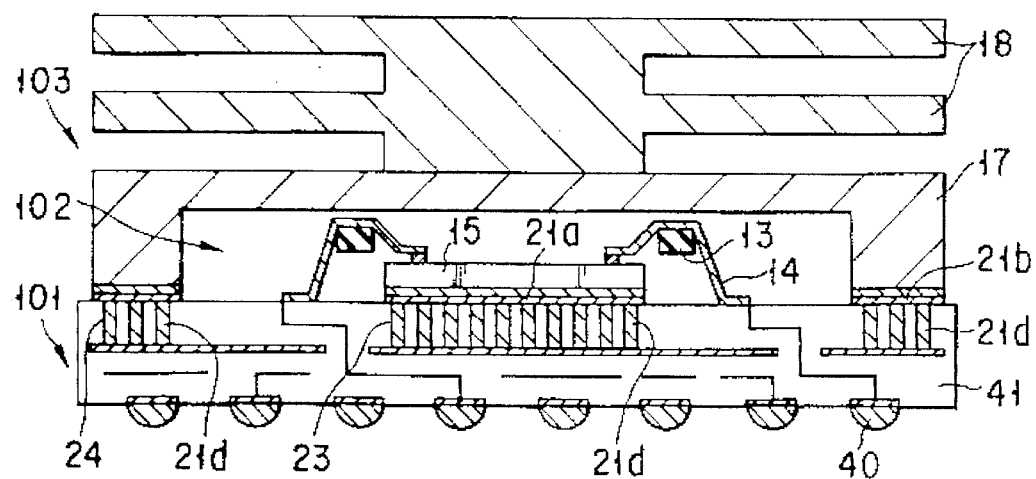
Figure 143:
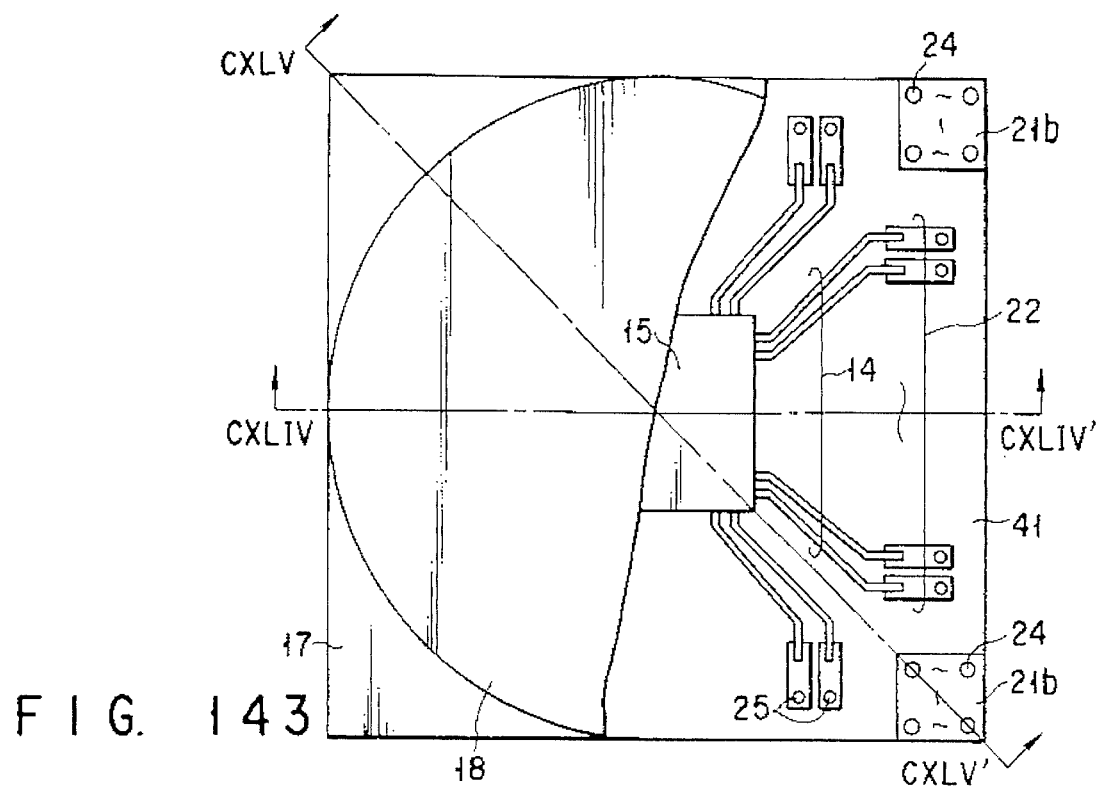
Figure 144:
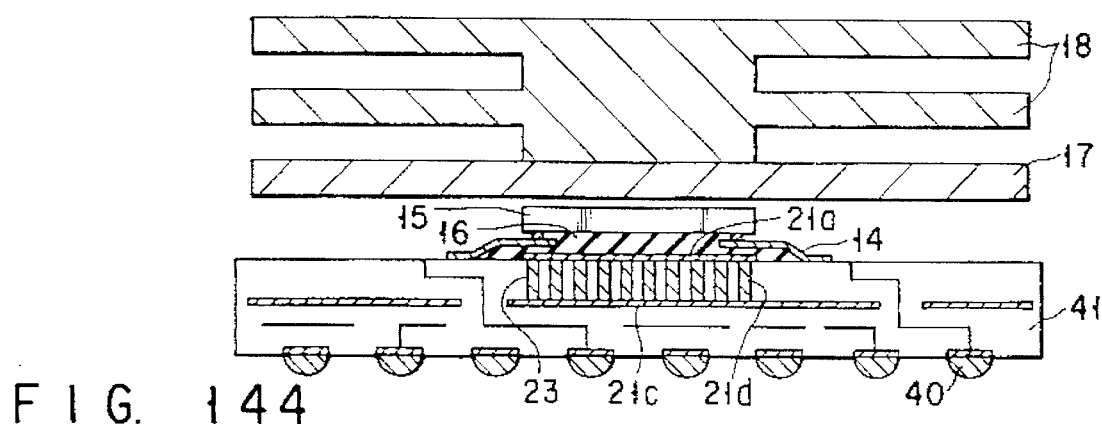
Figure 145:
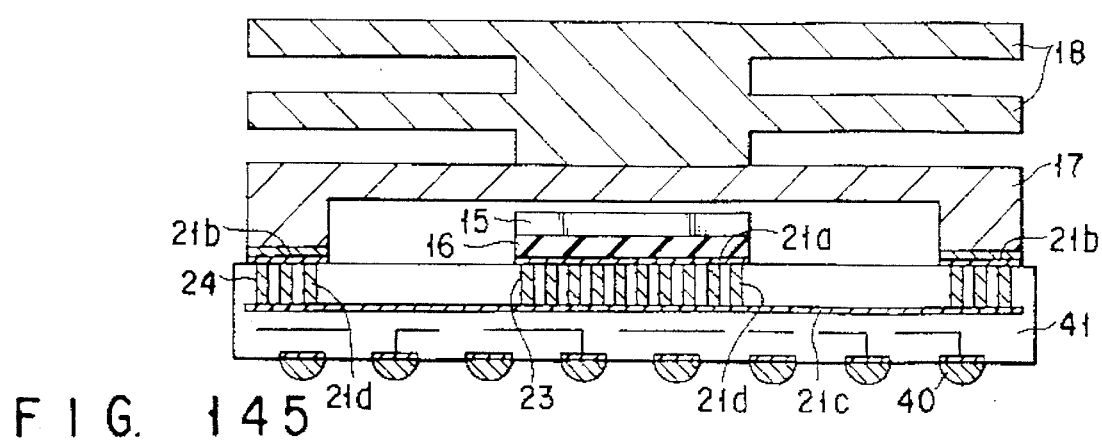
Figure 146:
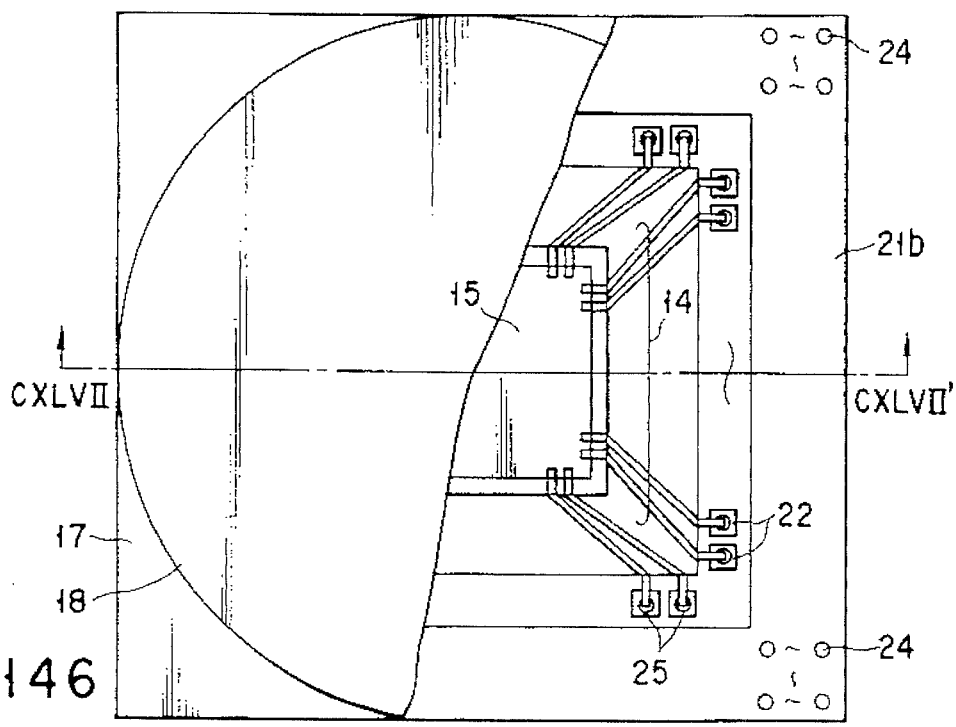
Figure 147:
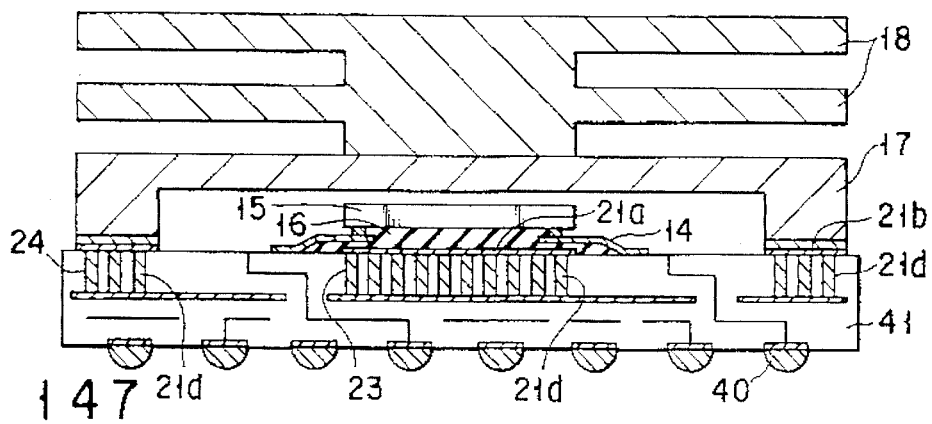
Figure 148:
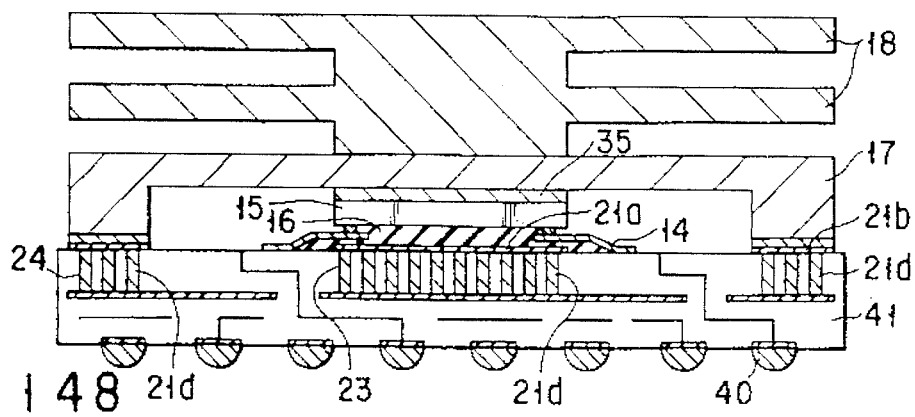
Figure 152:
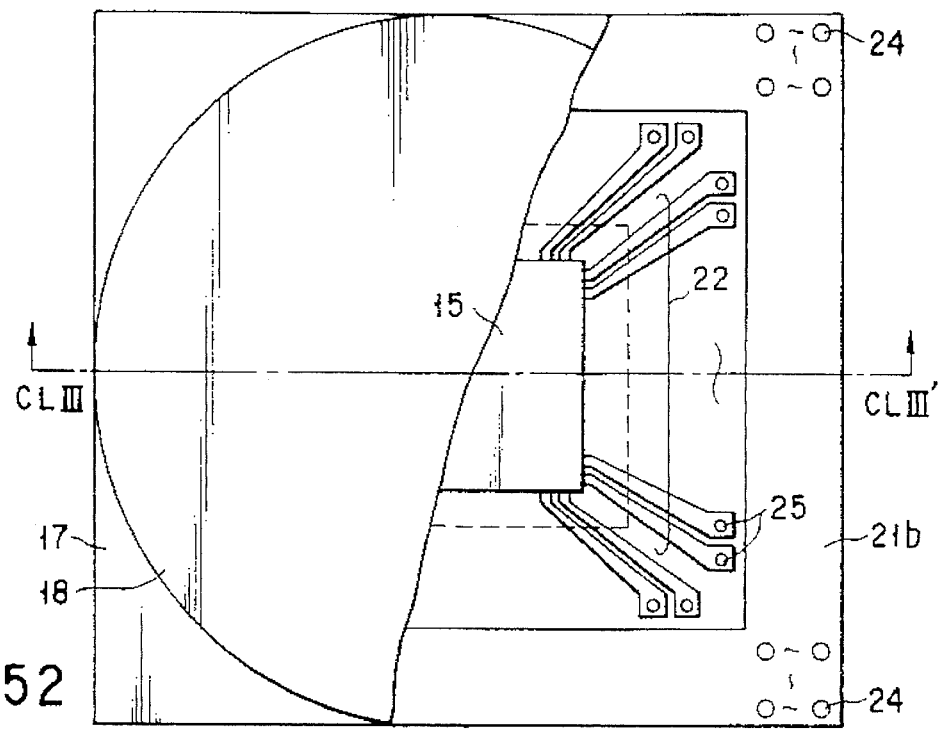
Figure 153:
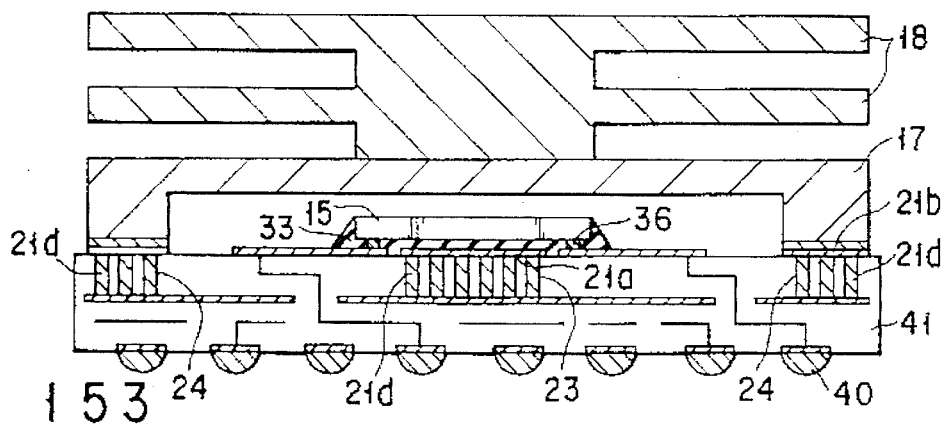
Figure 154:
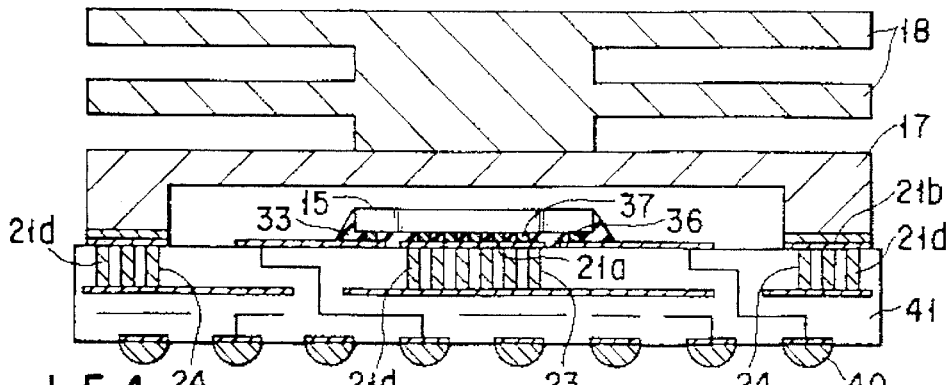
Figure 157:
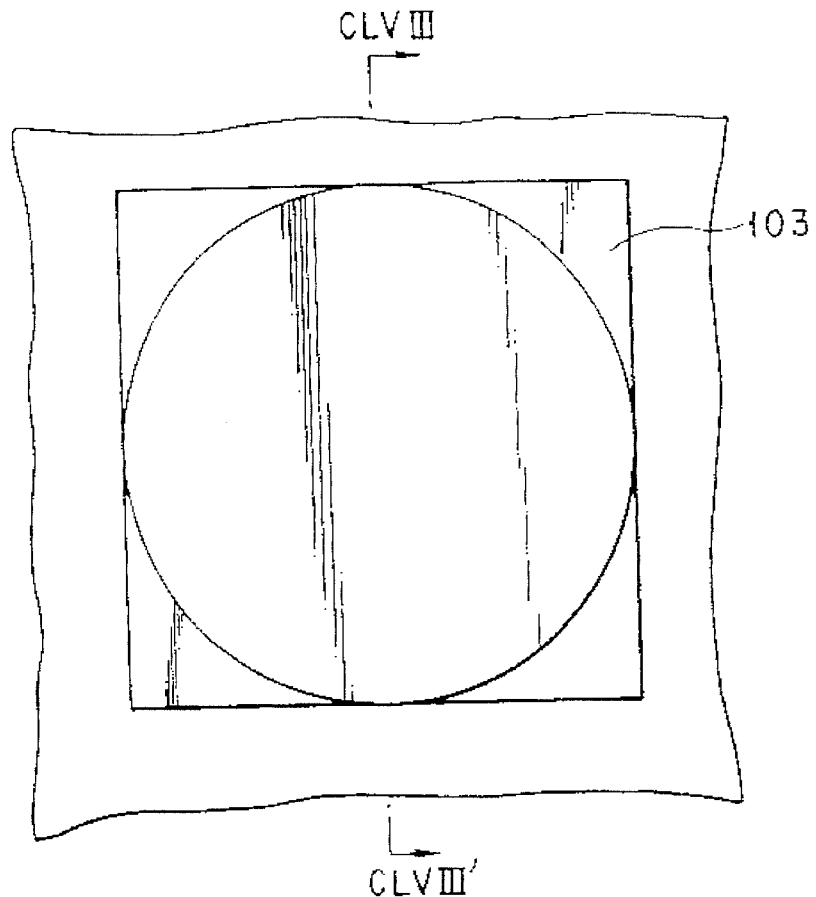

FIG. 131 is a sectional view showing a semiconductor device according to the 28th embodiment of the present invention;

FIG. 132 is a sectional view showing a semiconductor device to be compared with the semiconductor device in FIG. 131;

FIG. 133 is a plan view showing a BGA package according to the 29th embodiment of the present invention;

FIG. 134 is a sectional view of the BGA package along the line CXXXIV—CXXXIV in FIG. 133;

FIG. 135 is a sectional view of the BGA package along the line CXXXV—CXXXV in FIG. 133;

FIG. 136 is a plan view showing a BGA package according to the 30th embodiment of the present invention;

FIG. 137 is a sectional view of the BGA package along the line CXXXVII—CXXXVII in FIG. 136;

FIG. 138 is a plan view showing a BGA package invention;

FIG. 139 is a sectional view of the BGA package along the line CXXXIX—CXXXIX in FIG. 138;

FIG. 140 is a sectional view of the BGA package along the line CXL—CXL in FIG. 138;

FIG. 141 is a plan view showing a BGA package according to the 32nd embodiment of the present invention;

FIG. 142 is a sectional view of the BGA package along the line CXLII—CXLII in FIG. 141;

FIG. 143 is a plan view showing a BGA package according to the 33rd embodiment of the present invention;

FIG. 144 is a sectional view of the BGA package along the line CXLIV—CXLIV in FIG. 143;

FIG. 145 is a sectional view of the BGA package along the line CXLV—CXLV in FIG. 143;

FIG. 146 is a plan view showing a BGA package according to the 34th embodiment of the present invention;

FIG. 147 is a sectional view of the BGA package along the line CXLVII—CXLVII in FIG. 146;

FIG. 148 is a sectional view showing the BGA package according to the 34th embodiment of the present invention;

FIG. 149 is a plan view showing a BGA package according to the 35th embodiment of the present invention;

FIG. 150 is a sectional view of the BGA package along the line CL—CL in FIG. 149;

FIG. 151 is a sectional view of the BGA package along the line CLI—CLI in FIG. 149;

FIG. 152 is a plan view showing a BGA package according to the 36th embodiment of the present invention;

FIG. 153 is a sectional view of the BGA package along the line CLIII—CLIII in FIG. 152;

FIG. 154 is a sectional view showing the BGA package according to the 36th embodiment of the present invention;

FIG. 155 is a plan view showing a BGA package according to the 37th embodiment of the present invention;

FIG. 156 is a sectional view of the BGA package along the line CLVI—CLVI in FIG. 155;

FIG. 157 is a plan view showing a conventional semiconductor device; and

Figure 158:
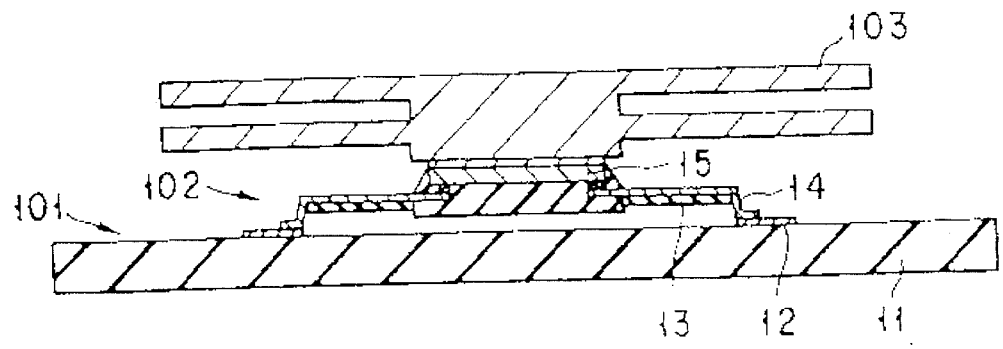

FIG. 158 is a sectional view of the semiconductor device along the line CLVIII—CLVIII in FIG. 157.

DETAILED DESCRIPTION OF THE PREFERRED EMBODIMENTS

A printed circuit board, a semiconductor device using the same, and a BGA package according to the present invention will be described in detail with reference to the accompanying drawings.

[A] First of all, a printed circuit board according to the first embodiment of the present invention and a semiconductor device using the same will be described below.

Figure 1:
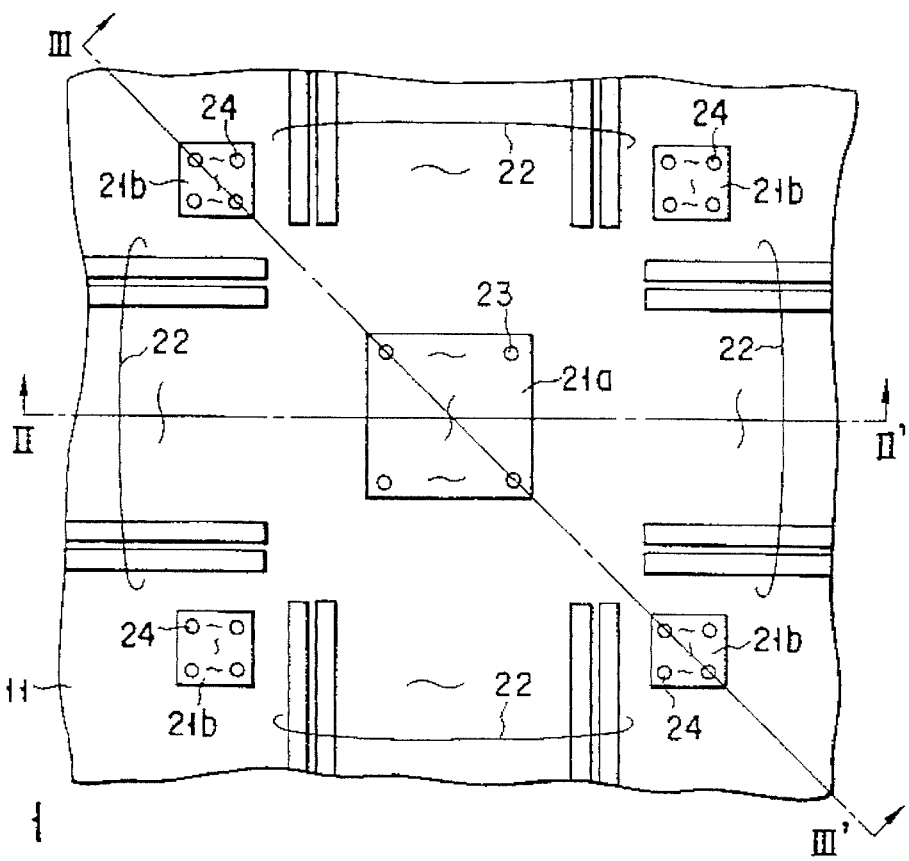
FIG. 1 is a plan view showing a printed circuit board of the present invention.
Figure 2:
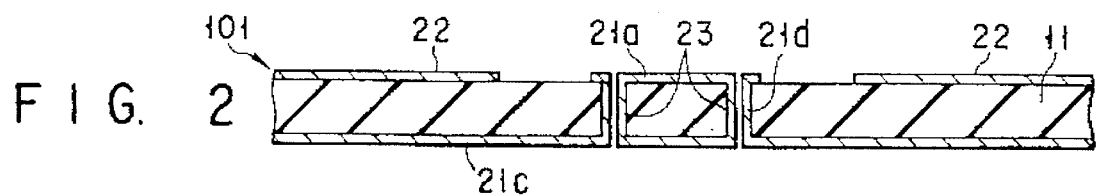
FIG. 2 is a sectional view of the printed circuit board along the line II—II in FIG. 1.
Figure 3:
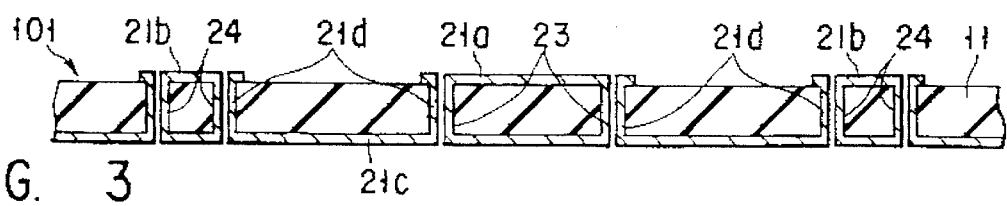
FIG. 3 is a sectional view of the printed circuit board along the line III—III in FIG. 1.

(a) FIGS. 1 to 3 show the printed circuit board according to the first embodiment of the present invention. FIG. 1 is a plan view of the printed circuit board, FIG. 2 is a sectional view thereof along the line II—II in FIG. 1, and FIG. 3 is a sectional view thereof along the line III—III in FIG. 1.

A printed circuit board 101 comprises an insulating board (e.g., epoxy glass) 11, first to fourth thermal conductive members 21a to 21d, wiring patterns 22, and through holes 23 and 24.

The first thermal conductive member 21a is formed on one major surface of the insulating board 11. The first thermal conductive member 21a consists of a material having a high thermal conductivity, such as copper (thickness: about 35 μm).

For example, a TCP semiconductor chip is to be mounted on the first thermal conductive member 21a. The first thermal conductive member 21a conforms to the shape of the semiconductor chip. The shape of the first thermal conductive member 21a is formed to be, e.g., a square having one side of about 12 mm when viewed from one major surface of the insulating board 11.

The plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 μm).

A heat sink is to be mounted on the second thermal conductive members 21b. For this reason, the second thermal conductive members 21b are formed to facilitate mounting of the heat sink. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11. The fourth thermal conductive member 21d is formed on the side surface of each through hole 23. The fourth thermal conductive member 21d consists of a material having a high thermal conductivity, such as copper (thickness: about 35 μm).

Similarly, at least one through hole 24 is formed in the insulating board 11 between the second and third thermal conductive members 21b and 21c. Forty-nine (7 columns×7 rows) through holes 24 each having a diameter of about 200 μm are formed in the insulating board 11. The fourth thermal conductive member 21d is formed on the side surface of each through hole 24. The fourth thermal conductive member 21d consists of a material having a high thermal conductivity, such as copper (thickness: about 35 μm).

Figure 4:
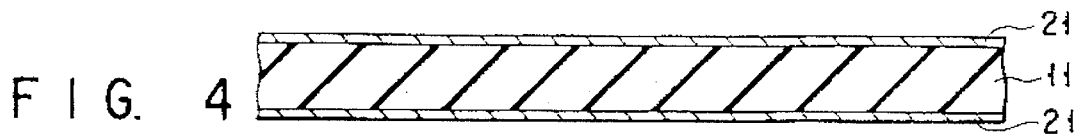
FIG. 4 is a sectional view showing one step of a method of manufacturing the printed circuit board in FIG. 1.
Figure 5:
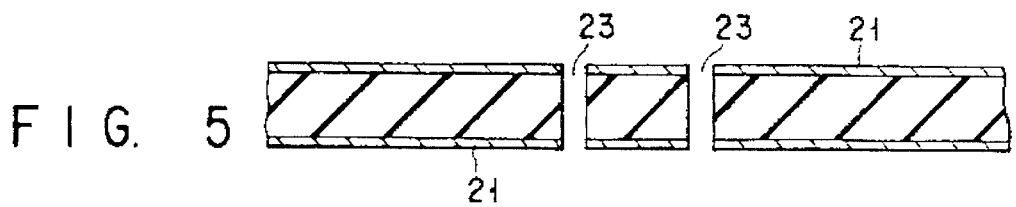
FIG. 5 is a sectional view showing another step of a methods of manufacturing the printed circuit board in FIG. 1.
Figure 6:
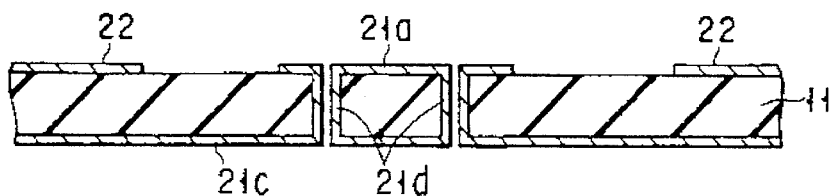
FIG. 6 is a sectional view showing still another step of the method of manufacturing the printed circuit board in FIG. 1.

A method of manufacturing the printed circuit board shown in FIGS. 1 to 3 is shown in FIGS. 4 to 6.

As shown in FIG. 4, copper films 21 are formed entirely on both the major surfaces of the insulating board 11. As shown in FIG. 5, the through holes 23 extending from one major surface to the other major surface of the insulating board 11 are formed at predetermined positions.

As shown in FIG. 6, the copper films 21 on both the major surfaces of the insulating board 11 are patterned to form the first and second thermal conductive members 21a and 21b on one major surface of the insulating board 11 and the third thermal conductive member 21c on the other major surface of the insulating board 11. The side surfaces of the through holes 23 are plated with a copper film to form the fourth thermal conductive members 21d.

According to the printed circuit board having the above arrangement, a semiconductor chip is mounted on the first thermal conductive member 21a, and a heat sink is mounted on the second thermal conductive members. Therefore, the leads of a package and the like will not be damaged by the weight of a heat sink because the heat sink need not be directly mounted on the semiconductor chip.

Heat generated by the semiconductor chip is conducted from the first thermal conductive member 21a to the heat sink through the fourth thermal conductive members 21d, the third thermal conductive members 21c, the fourth thermal conductive members, and the second thermal conductive members 21b. Therefore, the heat generated by the semiconductor chip can be efficiently dissipated.

Figure 7:
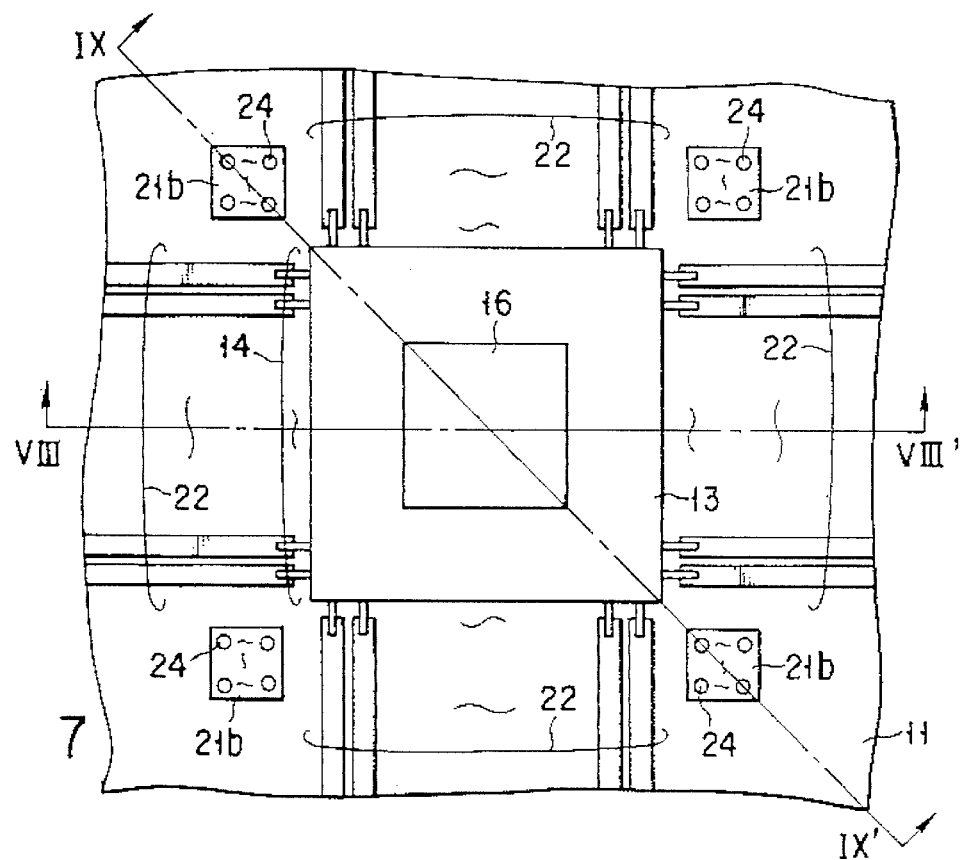
FIG. 7 is a plan view showing a semiconductor device according to the first embodiment of the present invention.
Figure 8:
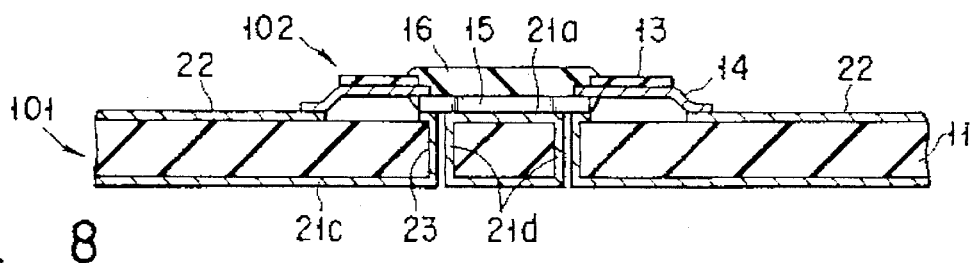
FIG. 8 is a sectional view of the semiconductor device along the line VIII—VIII in FIG. 7.
Figure 9:
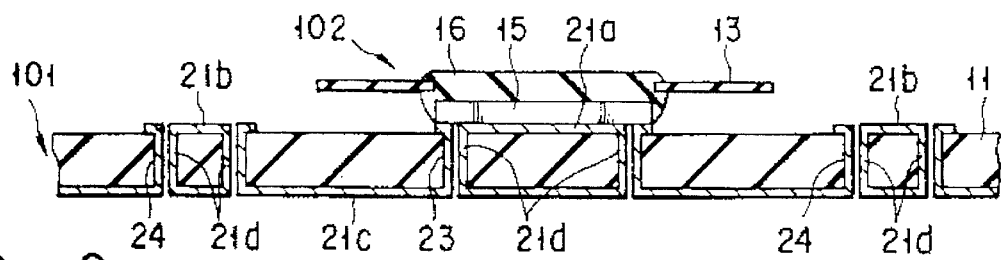
FIG. 9 is a sectional view of the semiconductor device along the line IX—IX in FIG. 7.

(b) FIGS. 7 to 9 show a state in which a TCP is mounted on the printed circuit board shown in FIGS. 1 to 3. FIG. 7 is a plan view of the printed circuit board on which the TCP is mounted, FIG. 8 is a sectional view thereof along the line VIII—VIII in FIG. 7, and FIG. 9 is a sectional view thereof along the line IX—IX in FIG. 7.

A TCP 102 comprises a TAB tape constituted by a polyimide tape 13 and leads 14, a semiconductor chip 15 connected to one end of each of the leads 14, and a potting resin 16 which covers the semiconductor chip 15.

The lower surface (i.e., a surface on which a semiconductor element is not formed) of the semiconductor chip 15 of the TCP 102 is adhered to the first thermal conductive member 21a with an adhesive. If this adhesive consists of a material having a high thermal conductivity (e.g., a conductive paste containing silver), the heat resistance from the semiconductor chip 15 to the first thermal conductive member 21a can be reduced.

The leads 14 of the TCP 102 are connected to the corresponding wiring patterns 22 on the insulating board 11 by a solder or the like.

Note that, although this TCP 102 is mounted on the insulating board 11 such that the lower surface of the semiconductor chip 15 is adhered to the first thermal conductive member 21a, the upper surface (i.e., a surface on which a semiconductor element is formed) of the semiconductor chip may face the first thermal conductive member 21a side (such an embodiment will be described later). In this case, an adhesive should not chemically corrode the polyimide tape 13.

Figure 10:
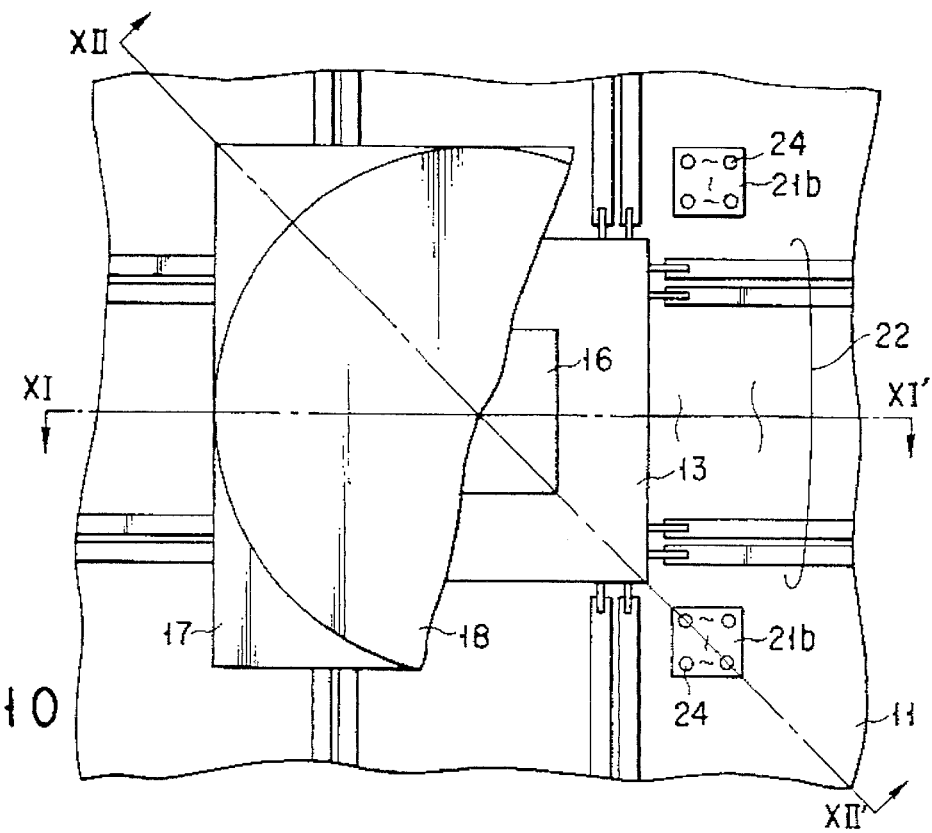
FIG. 10 is a plan view showing the semiconductor device according to the first embodiment of the present invention.
Figure 11:
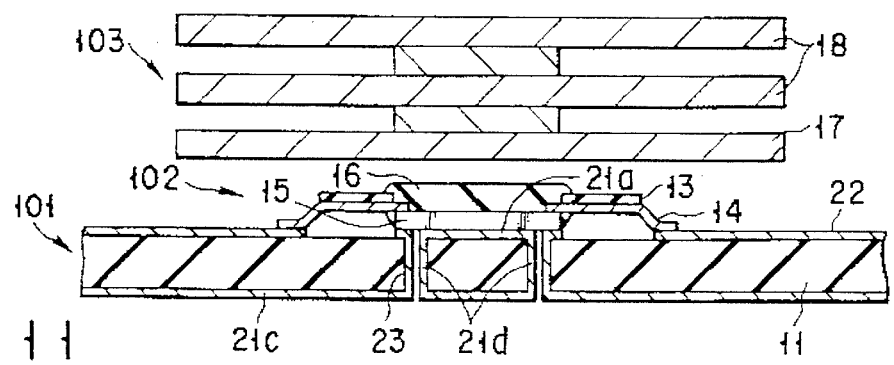
FIG. 11 is a sectional view of the semiconductor device along the line XI—XI in FIG. 10.
Figure 12:
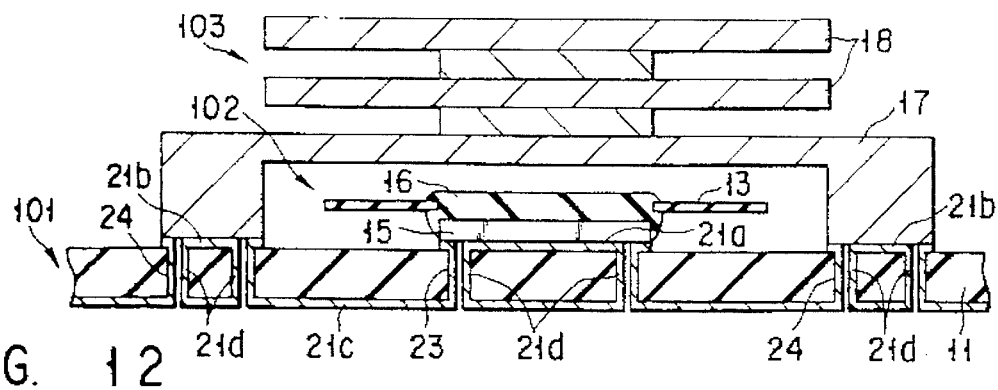
FIG. 12 is a sectional view of the semiconductor device along the line XII—XII in FIG. 10.

(c) FIGS. 10 to 12 show a semiconductor device in a state wherein a heat sink is mounted on the semiconductor device shown in FIGS. 7 to 9. FIG. 10 is a plan view of the semiconductor device, FIG. 11 is a sectional view thereof along the line XI—XI in FIG. 10, and FIG. 12 is a sectional view thereof along the line XII—XII in FIG. 10.

A heat sink 103 comprises a lid portion 17 and fin portions 18.

This lid portion 17 is mounted on the insulating board 11 so as to cover the TCP 102. More specifically, the lid portion 17 comprises a square plate portion having one side of about 50 mm and projecting portions formed at the four corners of the plate portion. Each projecting portion of the lid portion 17 comprises a prism having one side of about 5 mm. The lid portion 17 consists of a material having a high thermal conductivity, such as aluminum.

The projecting portions of the lid portion 17 are adhered to the second thermal conductive members 21b of the insulating board 11 with an adhesive. If this adhesive consists of a material having a high thermal conductivity (e.g., a conductive paste containing silver), the heat resistance from the second thermal conductive members 21b to the heat sink can be reduced.

The lid portion 17 may be or need not be in contact with the TCP 102. However, if they are in contact with each other, heat generated by the semiconductor chip of the TCP 102 can be efficiently dissipated (to be described later).

The fin portions 18 are mounted on the plate portion of the lid portion 17. The total surface area of the fin portions 18 must be maximized to facilitate heat diffusion. The fin portions 18 consist of a material having a high thermal conductivity, such as aluminum.

As shown in FIG. 13, the lid portion 17 and the fin portions 18 of the heat sink 103 may be integrally formed using one material. Alternatively, as shown in FIG. 14, the lid portion 17 and the fin portions 18 of the heat sink 103 may be independently formed. In this case, the material of the lid portion 17 may be the same as or different from that of the fin portions 18. As shown in FIG. 15, projecting portions 17b of the lid portion 17 may be formed independently of each other, and a plate portion 17a of the lid portion 17 and the fin portions 18 may be integrally formed.

According to the semiconductor device having the above arrangement, the semiconductor chip 15 of the TCP 102 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15, and the leads and the like of the TCP 102 will not be damaged by the weight of the heat sink.

Figure 16:
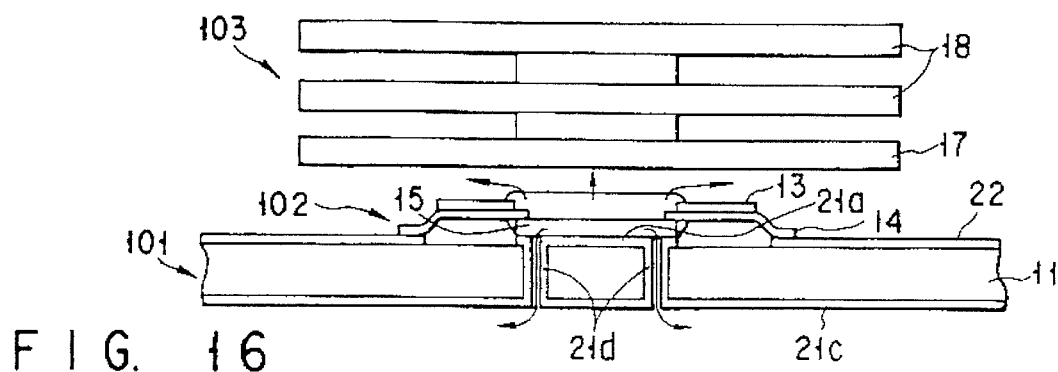
FIG. 16 is a sectional view showing dissipation paths of the semiconductor device in FIG. 10.
Figure 17:
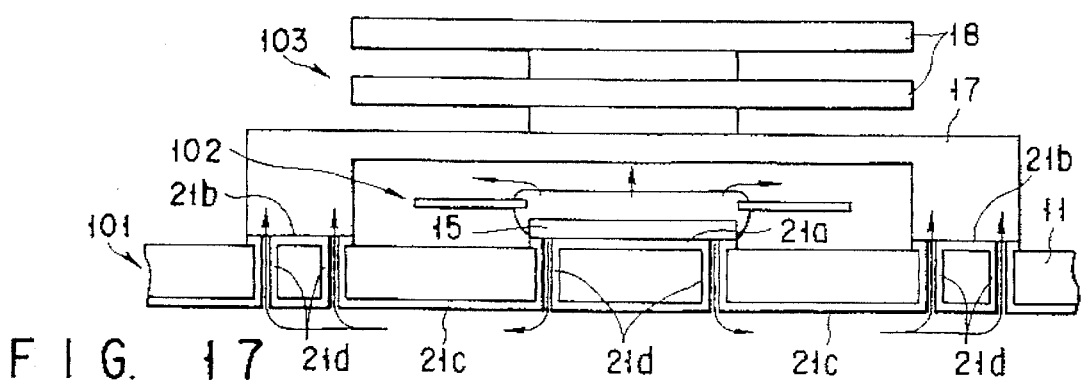
FIG. 17 is a sectional view showing the dissipation paths of the semiconductor device in FIG. 10.

As shown in FIGS. 16 and 17, heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b. Therefore, the heat generated by the semiconductor chip 15 can be efficiently dissipated.

Since almost all the heat generated by the semiconductor chip 15 can be absorbed by the heat sink 103, the semiconductor chip 15 will not adversely affect the adjacent chips.

[B] Next, a printed circuit board according to the second embodiment of the present invention and a semiconductor device using the same will be described below.

Figure 18:
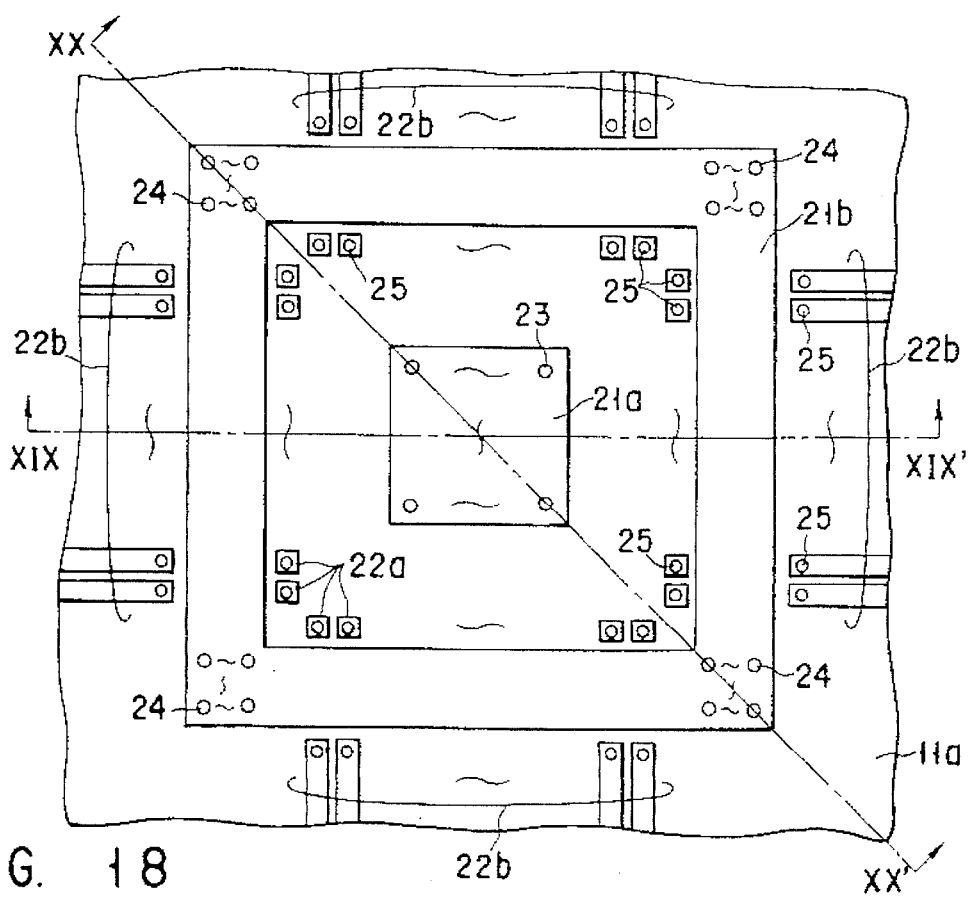
FIG. 18 is a plan view showing a printed circuit board of the present invention.
Figure 19:
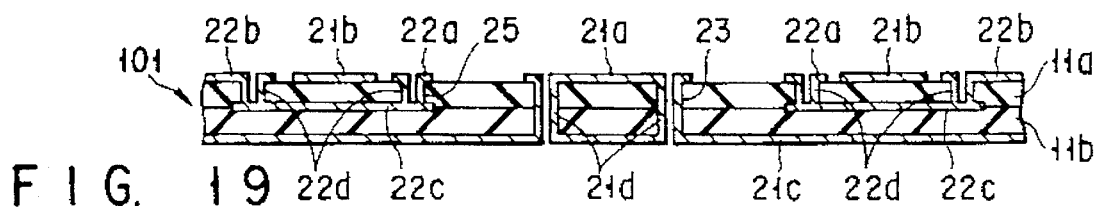
FIG. 19 is a sectional view of the printed circuit along the line XIX—XIX in FIG. 18.
Figure 20:
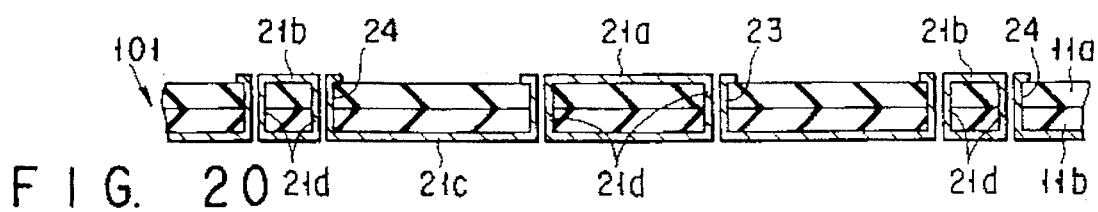
FIG. 20 is a sectional view of the printed circuit along the line XX—XX in FIG. 18.

(a) FIGS. 18 to 20 show the multilayered printed circuit board according to the second embodiment of the present invention. FIG. 18 is a plan view of the multilayered printed circuit board, FIG. 19 is a sectional view thereof along the line XIX—XIX in FIG. 18, and FIG. 20 is a sectional view thereof along the line XX—XX in FIG. 18.

A multilayered printed circuit board 101 comprises a plurality (e.g., two) of insulating boards (e.g., epoxy glass) 11a and 11b, first to fourth thermal conductive members 21a to 21d, wiring patterns 22a to 22d, and through holes 23 to 25.

The first thermal conductive member 21a is formed on one major surface of the insulating board 11a. The first thermal conductive member 21a consists of a material having a high thermal conductivity, such as copper (thickness: about 35 µm).

For example, a semiconductor chip of a TCP is to be mounted on the first thermal conductive member 21a. The first thermal conductive member 21a conforms to the shape of the semiconductor chip. The shape of the first thermal conductive member 21a is formed to be, e.g., a square having one side of about 12 mm when viewed from one major surface of the insulating board 11a.

The annular second thermal conductive member 21b is formed around the first thermal conductive member 21a on one major surface of the insulating board 11a. The second thermal conductive member 21b consists of a material having a high thermal conductivity, such as copper (thickness: about 35 µm).

A heat sink is to be mounted on the second thermal conductive member 21b. For this reason, the second thermal conductive member 21b is formed to facilitate mounting of the heat sink. For example, the second thermal conductive member 21b is formed to be a frame-like square shape having a width of about 5 mm when viewed from one major surface of the insulating board 11a.

The plurality of wiring patterns 22a and 22b to surround the four sides of the first thermal conductive member 21a are formed on one major surface of the insulating board 11a. The wiring patterns 22a are located inside the frame-like second thermal conductive member 21b, and the wiring patterns 22b are located outside the frame-like second thermal conductive member 21b.

The plurality of wiring patterns 22c are formed on the other major surface of the insulating board 11a. The through holes 25 are formed in the insulating board 11a between the wiring patterns 22a and 22b and the wiring patterns 22c.

Each through hole 25 is formed to have a diameter of, e.g., about 200 µm. The wiring pattern 22d is formed on the side surface of each through hole 25. The wiring pattern 22d consists of, e.g., copper (thickness: about 35 µm).

The other major surface of the insulating board 11a and the one major surface of the insulating board 11b are coupled to each other.

The third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 μm are formed in the insulating boards 11a and 11b. The fourth thermal conductive member 21d is formed on the side surface of each through hole 23. The fourth thermal conductive member 21d consists of a material having a high thermal conductivity, such as copper (thickness: about 35 μm).

Similarly, at least one through hole 24 is formed in the insulating boards 11a and 11b between the corners of the second conductive member 21b and the third thermal conductive member 21c. Forty-nine (7 columns×7 rows) through holes 24 each having a diameter of about 200 μm are formed in the insulating boards 11a and 11b. The fourth thermal conductive member 21d is formed on the side surface of each through hole 24. The fourth thermal conductive member 21d consists of a material having a high thermal conductivity, such as copper (thickness: about 35 μm).

According to the multilayered printed circuit board having the above arrangement, the semiconductor chip is mounted on the first thermal conductive member 21a, and the heat sink is mounted on the second thermal conductive member 21b. Therefore, a heat sink need not be directly mounted on the semiconductor chip, and the leads of a package and the like will not be damaged by the weight of the heat sink.

Heat generated by the semiconductor chip is conducted from the first thermal conductive member 21a to the heat sink through the fourth thermal conductive members 21d, the third thermal conductive members 21c, the fourth thermal conductive members 21d, and the second thermal conductive member 21b. Therefore, the heat generated by the semiconductor chip can be efficiently dissipated.

Figure 21:
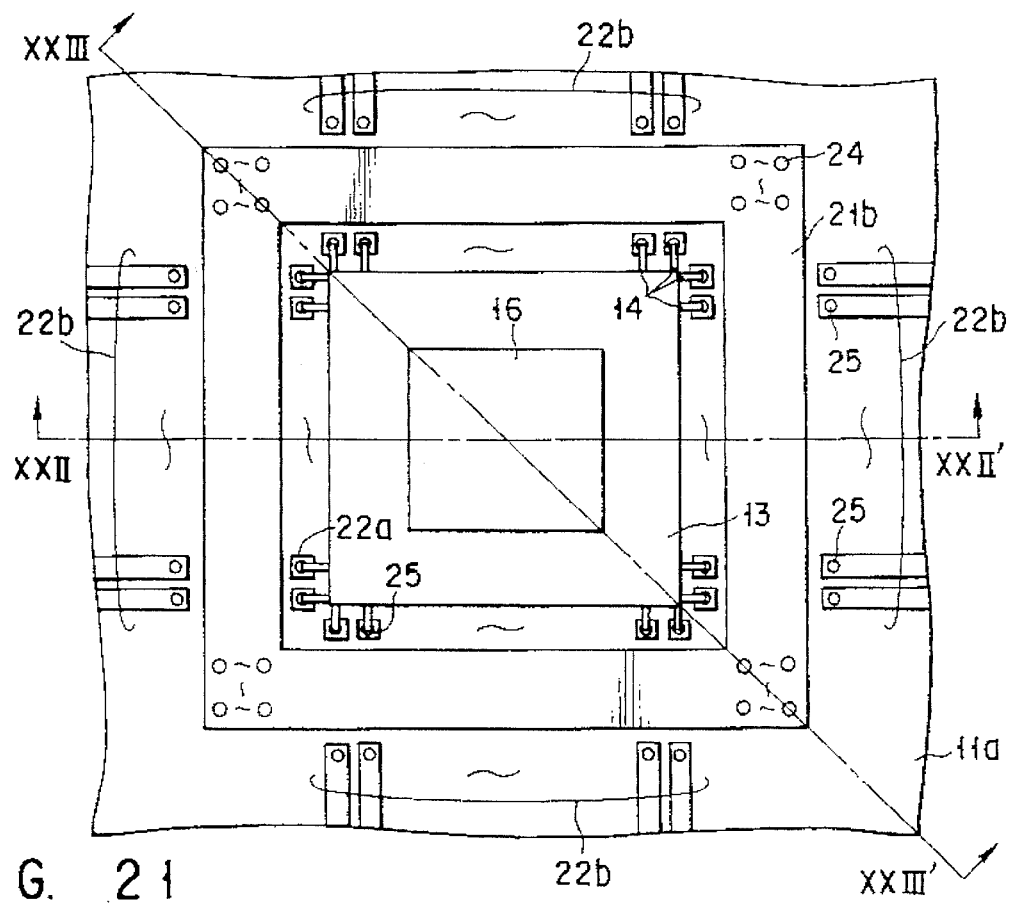
FIG. 21 is a plan view showing a semiconductor device according to the second embodiment of the present invention.
Figure 22:
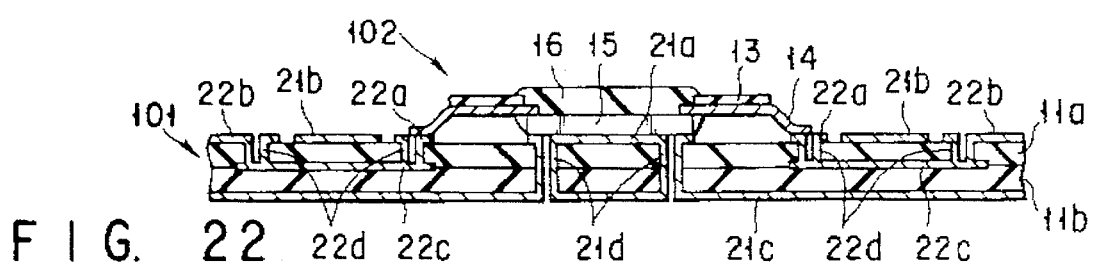
FIG. 22 is a sectional view of the semiconductor device along the line XXII—XXII in FIG. 21.
Figure 23:
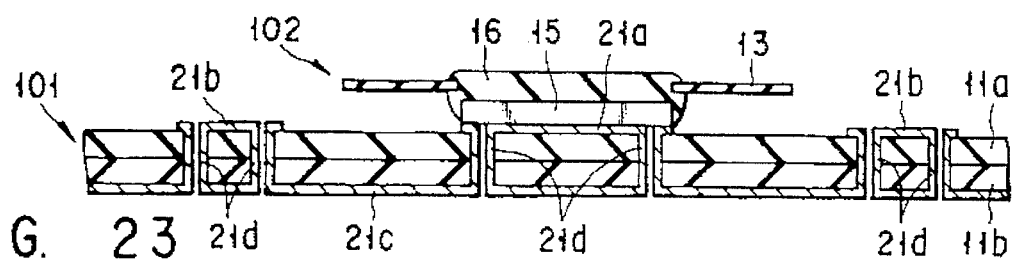
FIG. 23 is a sectional view of the semiconductor device along the line XXIII—XXIII in FIG. 21.

(b) FIGS. 21 to 23 show a state in which a TCP is mounted on the multilayered printed circuit board shown in FIGS. 18 to 20. FIG. 21 is a plan view of the multilayered printed circuit board on which the TCP is mounted, FIG. 22 is a sectional view thereof along the line XXII—XXII in FIG. 21, and FIG. 23 is a sectional view thereof along the line XXIII—XXIII in FIG. 21.

A TCP 102 comprises a TAB tape constituted by a polyimide tape 13 and leads 14, a semiconductor chip 15 connected to one end of each of the leads 14, and a potting resin 16 which covers the semiconductor chip 15.

The lower surface (i.e., a surface on which a semiconductor element is not formed) of the semiconductor chip 15 of the TCP 102 is adhered to the first thermal conductive member 21a with an adhesive. If this adhesive consists of a material having a high thermal conductivity (e.g., a conductive paste containing silver), the heat resistance from the semiconductor chip 15 to the first thermal conductive member 21a can be reduced.

The leads 14 of the TCP 102 are connected to the corresponding wiring patterns 22a on the insulating board 11a by a solder or the like.

Note that, although this TCP 102 is mounted on the insulating board 11a such that the lower surface of the semiconductor chip 15 is adhered to the first thermal conductive member 21a, the upper surface (i.e., a surface on which a semiconductor element is formed) of the semiconductor chip may face the first thermal conductive member 21a side (such an embodiment will be described later). In this case, an adhesive should not chemically corrode the polyimide tape 13.

Figure 24:
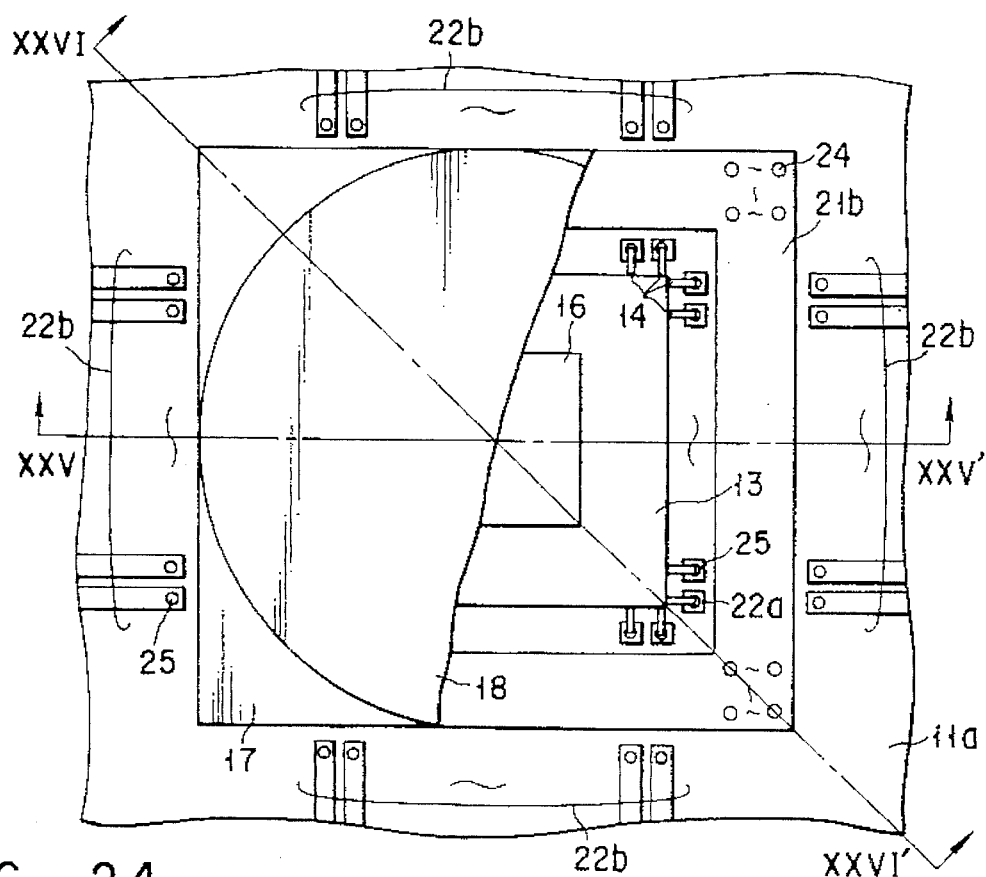
FIG. 24 is a plan view showing the semiconductor device according to the second embodiment of the present invention.
Figure 25:
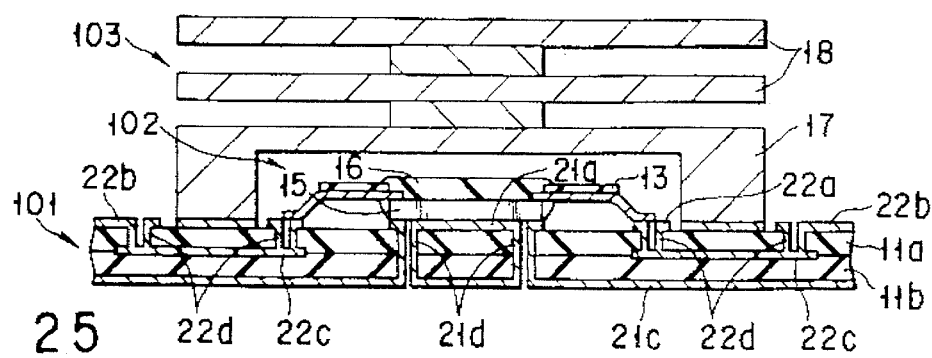
FIG. 25 is a sectional view of the semiconductor device along the line XXV—XXV in FIG. 24.
Figure 26:
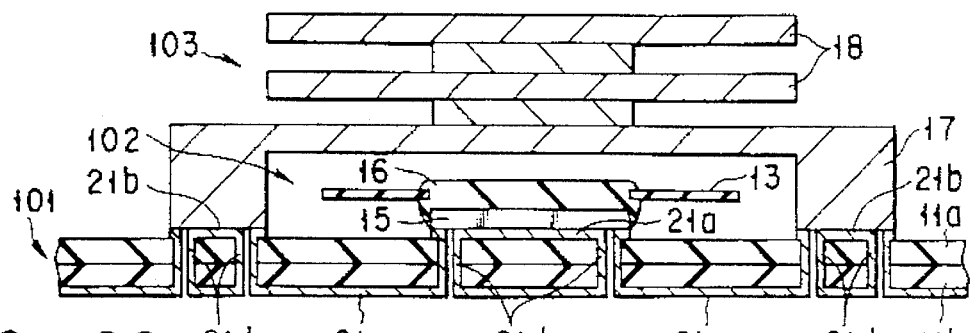
FIG. 26 is a sectional view of the semiconductor device along the line XXVI—XXVI in FIG. 24.

(c) FIGS. 24 to 26 show a semiconductor device in a state wherein a heat sink is mounted on the semiconductor device shown in FIGS. 21 to 23. FIG. 24 is a plan view of the semiconductor device, FIG. 25 is a sectional view thereof along the line XXV—XXV in FIG. 24, and FIG. 26 is a sectional view thereof along the line XXVI—XXVI in FIG. 24.

A heat sink 103 comprises a lid portion 17 and fin portions 18.

This lid portion 17 is mounted on one major surface of the insulating board 11a so as to cover the TCP 102. More specifically, the lid portion 17 comprises a square plate portion having one side of about 50 mm and a projecting portion formed along the sides of the plate portion. The projecting portion of the lid portion 17 has a frame-like shape having, e.g., a width of about 5 mm, a height of about 5 mm, and one side of about 50 mm. The lid portion 17 consists of a material having a high thermal conductivity, such as aluminum.

The projecting portion of the lid portion 17 is adhered to the second thermal conductive member 21b of the insulating board 11a with an adhesive. If this adhesive consists of a material having a high thermal conductivity (e.g., a conductive paste containing silver), the heat resistance from the second thermal conductive member 21b to the heat sink can be reduced.

The lid portion 17 may be or need not be in contact with the TCP 102. However, if they are in contact with each other, heat generated by the semiconductor chip of the TCP 102 can be efficiently dissipated (to be described later).

The fin portions 18 are mounted on the plate portion of the lid portion 17. The total surface area of the fin portions 18 must be maximized to facilitate heat diffusion. The fin portions 18 consist of a material having a high thermal conductivity, such as aluminum.

Figure 27:
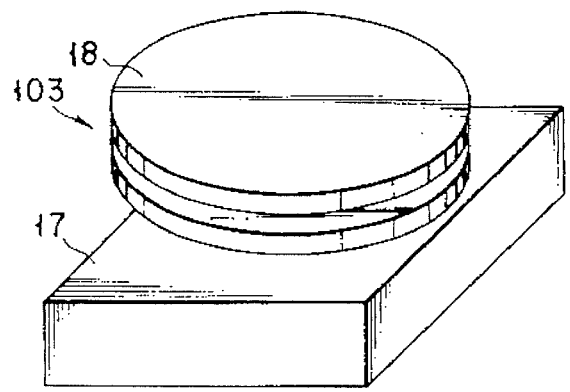
FIG. 27 is a perspective view showing a heat sink in FIG. 24.
Figure 28:
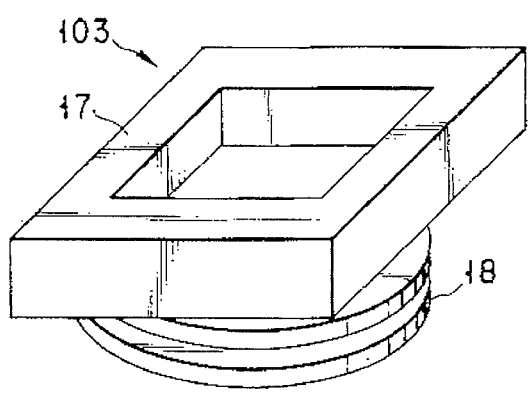
FIG. 28 is a perspective view showing the heat sink in FIG. 24.
Figure 29:
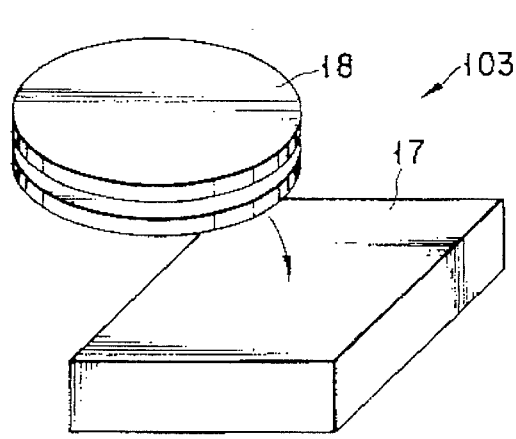
FIG. 29 is a perspective view showing the heat sink in FIG. 24.
Figure 30:
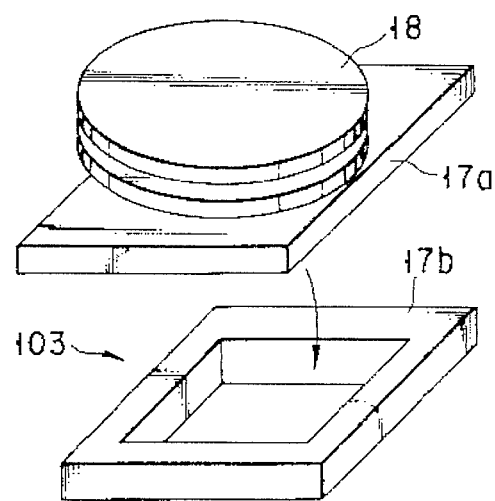
FIG. 30 is a perspective view showing the heat sink in FIG. 24.

As shown in FIGS. 27 and 28, the lid portion 17 and the fin portions 18 of the heat sink 103 may be integrally formed using one material. Alternatively, as shown in FIG. 29, the lid portion 17 and the fin portions 18 of the heat sink 103 may be independently formed. In this case, the material of the lid portion 17 may be the same as or different from that of the fin portions 18. As shown in FIG. 30, a plate portion 17a of the lid portion 17 and the fin portions 18 may be integrally formed, and the integrated structure may be formed independently of a frame-like projecting portion 17b of the lid portion 17.

According to the semiconductor device having the above arrangement, the semiconductor chip of the TCP 102 is mounted on the first thermal conductive member 21a of the insulating board 11a, and the heat sink 103 is mounted on the second thermal conductive member 21b of the insulating board 11a. Therefore, a heat sink need not be directly mounted on the semiconductor chip 15, and the leads of the TCP 102 and the like will not be damaged by the weight of the heat sink.

As shown in FIGS. 31 and 32, heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b. Therefore, the heat generated by the semiconductor chip 15 can be efficiently dissipated.

Since almost all the heat generated by the semiconductor chip 15 can be absorbed by the heat sink 103, the semiconductor chip 15 will not adversely affect the adjacent chips.

Since the heat sink 103 surrounds the semiconductor chip 15, the semiconductor chip 15 can be protected from an external shock.

[C] Next, a printed circuit board according to the third embodiment of the present invention and a semiconductor device using the same will be described below.

Figure 33:
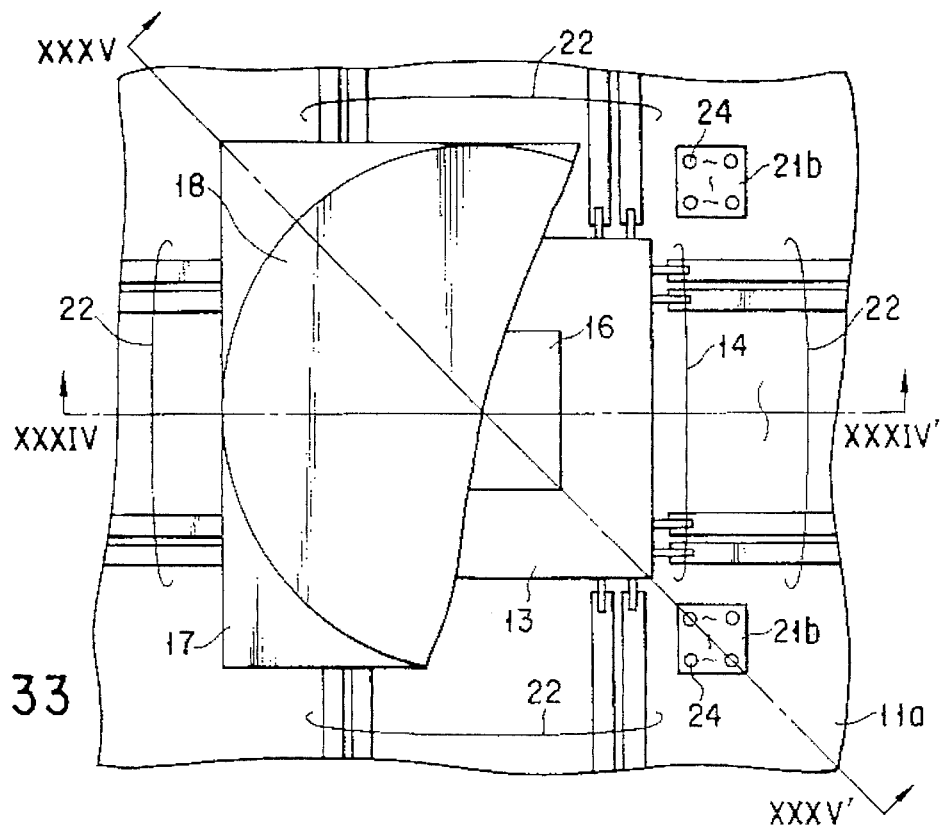
FIG. 33 is a plan view showing a semiconductor device according to the third embodiment of the present invention.
Figure 34:
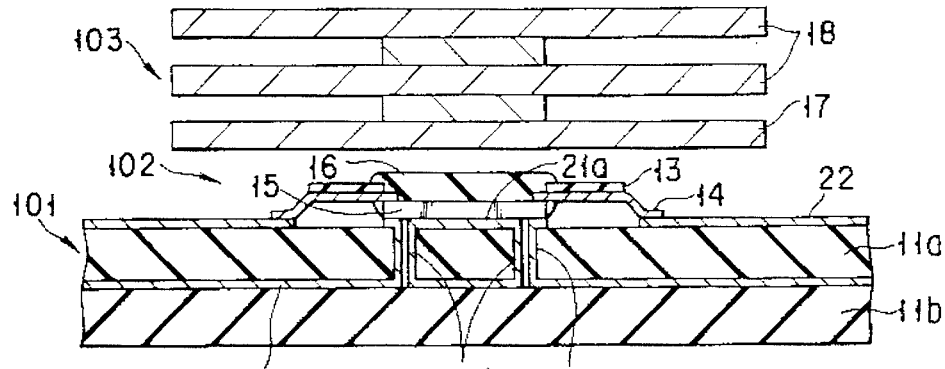
FIG. 34 is a sectional view of the semiconductor device along the line XXXIV—XXXIV in FIG. 33.
Figure 35:
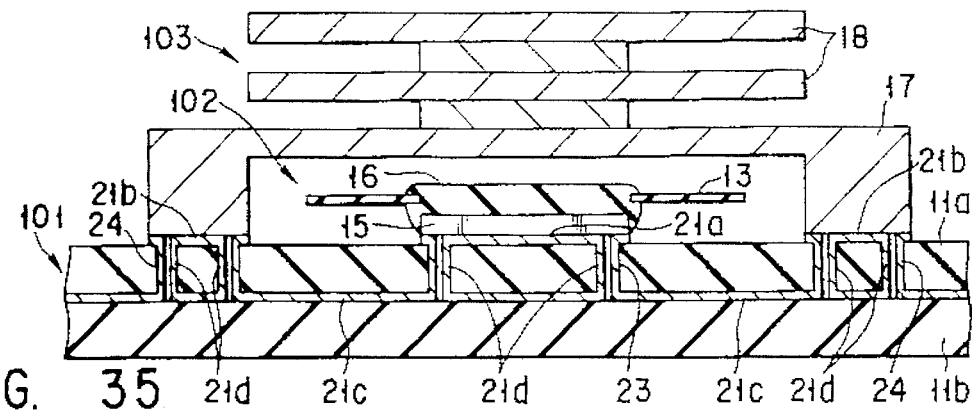
FIG. 35 is a sectional view of the semiconductor device along the line XXXV—XXXV in FIG. 33.

FIGS. 33 to 35 show the semiconductor device using the multilayered printed circuit board according to the third embodiment of the present invention. FIG. 33 is a plan view of the semiconductor device, FIG. 34 is a sectional view thereof along the line XXXIV—XXXIV in FIG. 33, and FIG. 35 is a sectional view thereof along the line XXXV—XXXV in FIG. 34.

A multilayered printed circuit board 101 comprises a plurality (e.g., two) of insulating boards (e.g., epoxy glass) 11a and 11b, first to fourth thermal conductive members 21a to 21d, wiring patterns 22, and through holes 23 and 24.

The first thermal conductive member 21a is formed on one major surface of the insulating board 11a. The first thermal conductive member 21a consists of a material having a high thermal conductivity, such as copper (thickness: about 35 µm).

A semiconductor chip 15 of a TCP 102 is to be mounted on the first thermal conductive member 21a. The first thermal conductive member 21a conforms to the shape of the semiconductor chip 15 to have a shape of a square having one side of about 12 mm when viewed from one major surface of the insulating board 11a.

The plurality of second thermal conductive members 21b are formed around the first thermal conductive member 21a on one major surface of the insulating board 11a. Each second thermal conductive member 21b consists of a material having a high thermal conductivity, such as copper (thickness: about 35 µm).

A heat sink 103 is to be mounted on the second thermal conductive members 21b. For this reason, the four second thermal conductive members 21b are located around the first thermal conductive member 21a to facilitate mounting of the heat sink 103. Each second thermal conductive member 21b is formed to be a square having a width of about 5 mm when viewed from one major surface of the insulating board 11a.

The plurality of wiring patterns 22 to surround the four sides of the first thermal conductive member 21a are formed on one major surface of the insulating board 11a.

The third thermal conductive members 21c are formed on the other major surface of the insulating board 11a at positions including at least portions immediately below the first and second thermal conductive members 21a and 21b. Each third thermal conductive member 21c consists of a material having a high thermal conductivity, such as copper (thickness: about 35 µm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating board 11a between the first and third thermal conductive members 21a and 21c. For example, 121 (11 columns×11 rows) through holes 23 each having a diameter of, e.g., about 200 µm are formed in the insulating board 11a. The fourth thermal conductive member 21d is formed on the side surface of each through hole 23. The fourth thermal conductive member 21d consists of a material having a high thermal conductivity, such as copper (thickness: about 35 µm).

Similarly, at least one through hole 24 is formed in the insulating board 11a between the second and third thermal conductive members 21b and 21c. Forty-nine (7 columns×7 rows) through holes 24 each having a diameter of about 200 µm are formed in the insulating board 11a. The fourth thermal conductive member 21d is formed on the side surface of each through hole 24. The fourth thermal conductive member 21d consists of a material having a high thermal conductivity, such as copper (thickness: about 35 µm).

The other major surface of the insulating board 11a and one major surface of the insulating board 11b are coupled to each other. Each of the insulating boards 11a and 11b is formed to have a thickness of about 0.8 mm.

According to the multilayered printed circuit board having the above arrangement and the semiconductor device using the same, the semiconductor chip 15 is mounted on the first thermal conductive member 21a, and the heat sink 103 is mounted on the second thermal conductive members 21b. Therefore, a heat sink need not be directly mounted on the semiconductor chip 15, and leads 14 of a package and the like will not be damaged by the weight of the heat sink.

Heat generated by the semiconductor chip 15 is conducted from the first thermal conductive member 21a to the heat sink 103 through the fourth thermal conductive members 21d, the third thermal conductive members 21c, the fourth thermal conductive members 21d, and the second thermal conductive members 21b. Therefore, the heat generated by the semiconductor chip 15 can be efficiently dissipated.

[D] Next, a printed circuit board according to the fourth embodiment of the present invention and a semiconductor device using the same will be described below.

Figure 36:
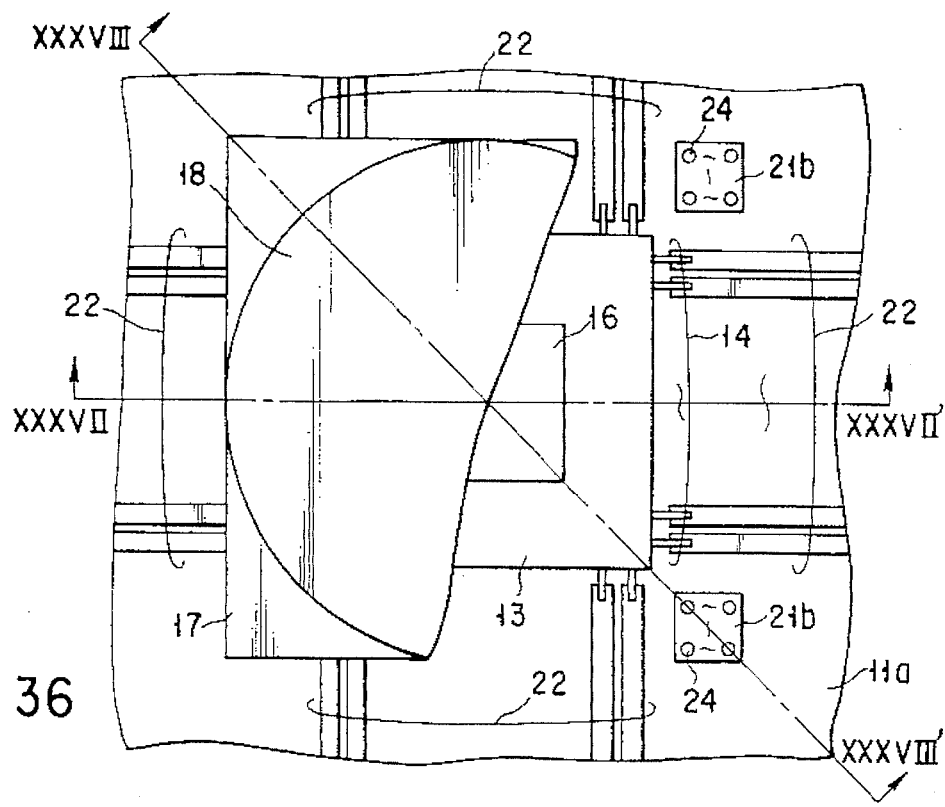
FIG. 36 is a plan view showing a semiconductor device according to the fourth embodiment of the present invention.
Figure 37:
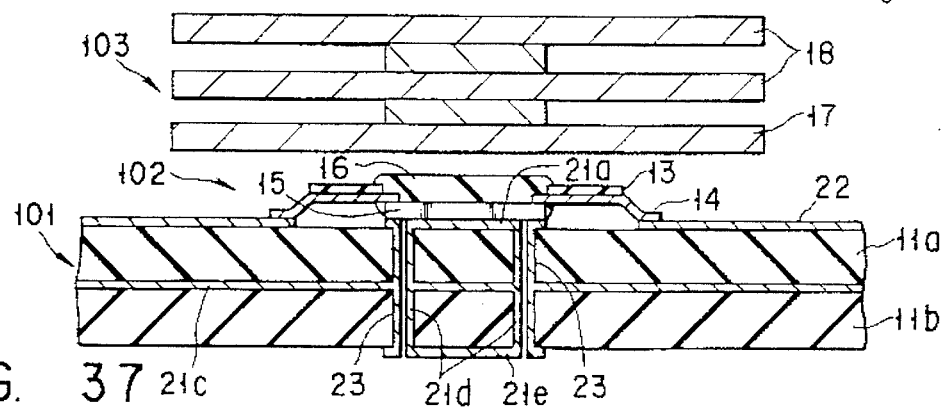
FIG. 37 is a sectional view of the semiconductor device along the line XXXVII—XXXVII in FIG. 36.
Figure 38:
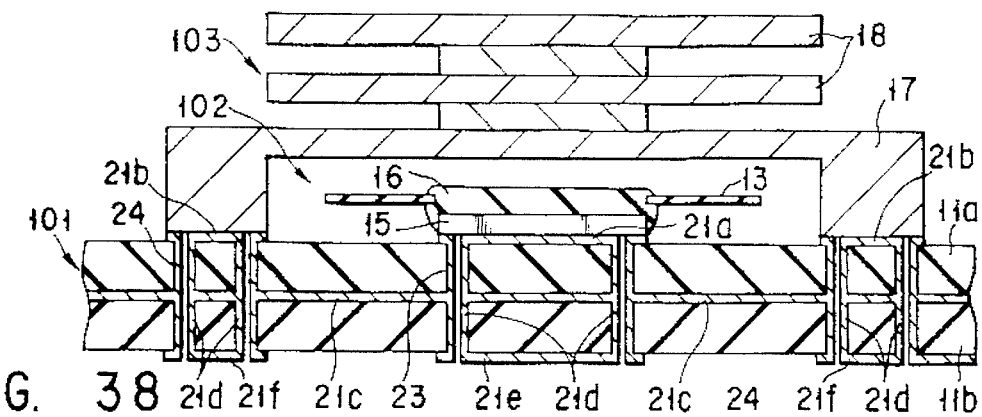
FIG. 38 is a sectional view of the semiconductor device along the line XXXVIII—XXXVIII in FIG. 36.

FIGS. 36 to 39 show the semiconductor device using the multilayered printed circuit board according to the fourth embodiment of the present invention. FIG. 36 is a plan view of the upper surface of the semiconductor device, FIG. 37 is a sectional view thereof along the line XXXVII—XXXVII in FIG. 36, and FIG. 38 is a sectional view thereof along the line XXXVIII—XXXVIII in FIG. 36.

A multilayered printed circuit board 101 comprises a plurality (e.g., two) of insulating boards (e.g., epoxy glass) 11a and 11b, first to sixth thermal conductive members 21a to 21f, wiring patterns 22, and through holes 23 and 24.

That is, the multilayered printed circuit board 101 of this embodiment is different from that of the above third embodiment in that the through holes 23 and 24 extend from one major surface of the insulating board 11a to the other major surface of the insulating board 11b, and the fifth and sixth thermal conductive members 21e and 21f are formed on the other major surface of the insulating board 11b.

The fifth conductive member 21e has the same pattern as, e.g., that of the first thermal conductive member 21a, and each sixth conductive member 21f has the same pattern as, e.g., that of each second thermal conductive member 21b.

According to the multilayered printed circuit board having the above arrangement and the semiconductor device using the same, a semiconductor chip 15 is mounted on the first thermal conductive member 21a, and a heat sink 103 is mounted on the second thermal conductive members 21b. Therefore, a heat sink need not be directly mounted on the semiconductor chip 15, and leads 14 of a package and the like will not be damaged by the weight of the heat sink.

Heat generated by the semiconductor chip 15 is conducted from the first thermal conductive member 21a to the heat sink 103 through the fourth thermal conductive members 21d, the third thermal conductive members 21c, the fourth thermal conductive members 21d, and the second thermal conductive members 21b. Therefore, the heat generated by the semiconductor chip 15 can be efficiently dissipated.

[E] Next, a printed circuit board according to the fifth embodiment of the present invention and a semiconductor device using the same will be described below.

Figure 40:
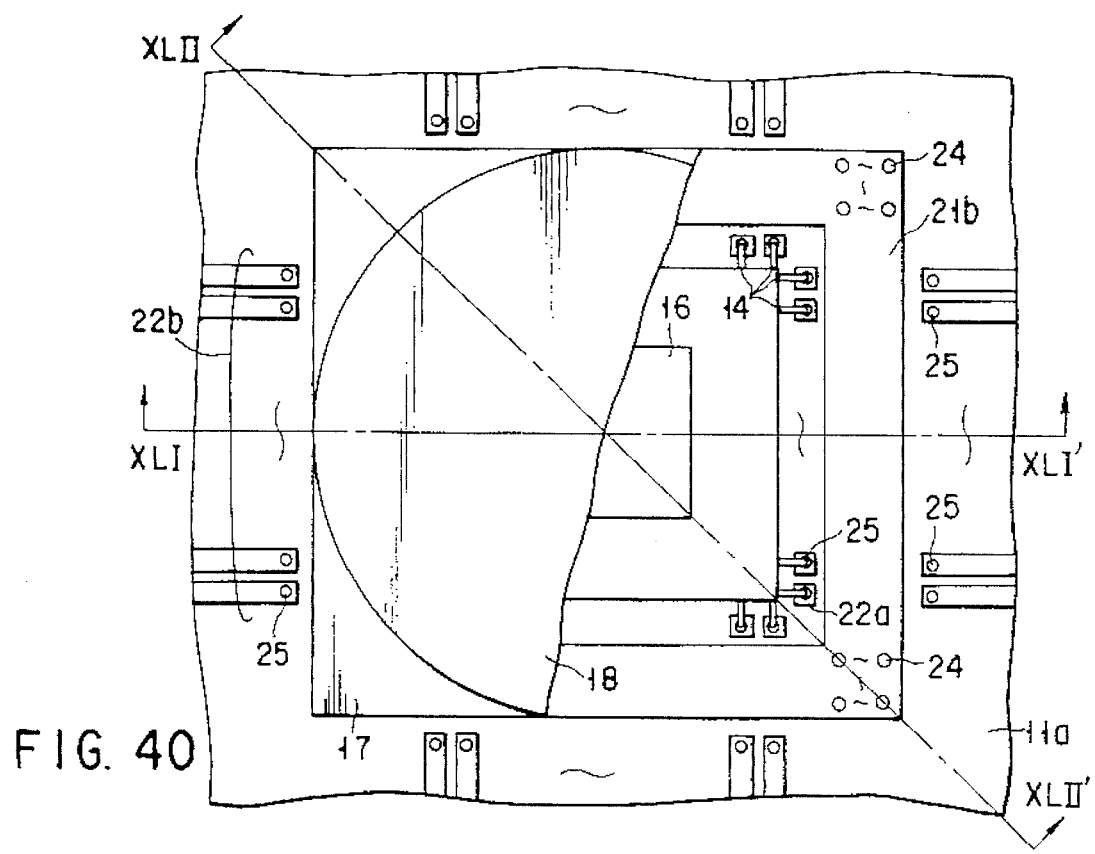
FIG. 40 is a plan view showing a semiconductor device according to the fifth embodiment of the present invention.
Figure 41:
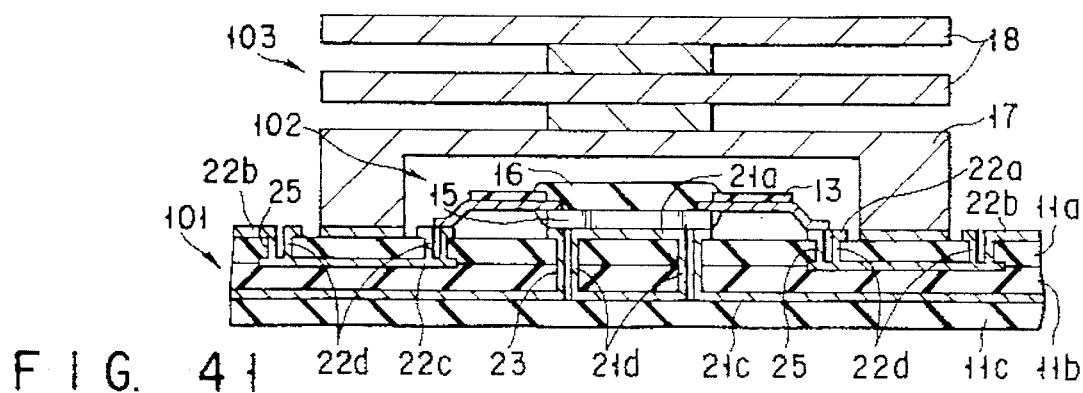
FIG. 41 is a sectional view of the semiconductor device along the line XLI—XLI in FIG. 40.
Figure 42:
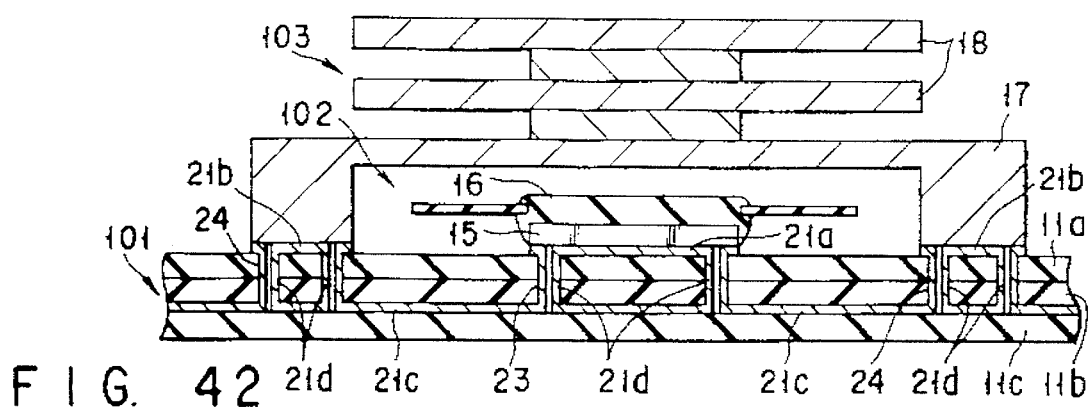
FIG. 42 is a sectional view of the semiconductor device along the line XLII—XLII in FIG. 40.

FIGS. 40 to 42 show the semiconductor device using the multilayered printed circuit board according to the fifth embodiment of the present invention. FIG. 40 is a plan view of the semiconductor device, FIG. 41 is a sectional view thereof along the line XLI—XLI in FIG. 40, and FIG. 42 is a sectional view thereof along the line XLII—XLII in FIG. 40.

A multilayered printed circuit board 101 comprises a plurality (e.g., three) of insulating boards (e.g., epoxy glass) 11a to 11c, first to fourth thermal conductive members 21a to 21d, wiring patterns 22a to 22d, and through holes 23 to 25.

The first thermal conductive member 21a is formed on one major surface of the insulating board 11a. The first thermal conductive member 21a consists of a material having a high thermal conductivity, such as copper (thickness: about 35 μm).

A semiconductor chip 15 of a TCP 102 is mounted on the first thermal conductive member 21a. The first thermal conductive member 21a conforms to the shape of the semiconductor chip 15 to have a shape of a square having one side of about 12 mm when viewed from one major surface of the insulating board 11a.

The annular second thermal conductive member 21b is formed around the first thermal conductive member 21a on one major surface of the insulating board 11a. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to be a frame-like shape so as to facilitate mounting of the heat sink 103. The second thermal conductive member 21b is formed to have a width of about 5 mm when viewed from one major surface of the insulating board 11a.

The plurality of wiring patterns 22a and 22b to surround the four sides of the first thermal conductive member 21a are formed on one major surface of the insulating board 11a. The wiring patterns 22a are located inside the frame-like second thermal conductive member 21b, and the wiring patterns 22b are located outside the frame-like second thermal conductive member 21b.

The plurality of wiring patterns 22c are formed on the other major surface of the insulating board 11a. The through holes 25 are formed in the insulating board 11a between the wiring patterns 22a and 22b and the wiring patterns 22c.

Each through hole 25 is formed to have a diameter of, e.g., about 200 μm. The wiring pattern 22d is formed on the side surface of each through hole 25. The wiring pattern 22d consists of, e.g., copper (thickness: about 35 μm).

The other major surface of the insulating board 11a and one major surface of the insulating board 11b are coupled to each other.

The third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 μm are formed in the insulating boards 11a and 11b. The fourth thermal conductive member 21d is formed on the side surface of each through hole 23. The fourth thermal conductive member 21d consists of a material having a high thermal conductivity, such as copper (thickness: about 35 μm).

Similarly, at least one through hole 24 is formed in the insulating boards 11a and 11b between the corners of the second thermal conductive member 21b and the third thermal conductive member 21c. Forty-nine (7 columns×7 rows) through holes 24 each having a diameter of about 200 μm are formed in the insulating boards 11a and 11b. The fourth thermal conductive member 21d is formed on the side surface of each through hole 24. The fourth thermal conductive member 21d consists of a material having a high thermal conductivity, such as copper (thickness: about 35 μm).

The other major surface of the insulating board 11b and one major surface of the insulating board 11c are coupled to each other. Each of the insulating boards 11a to 11c is formed to have a thickness of about 0.8 mm.

According to the multilayered printed circuit board having the above arrangement and the semiconductor device using the same, the semiconductor chip 15 is mounted on the first thermal conductive member 21a, and the heat sink 103 is mounted on the second thermal conductive member 21b. Therefore, a heat sink need not be directly mounted on the semiconductor chip 15, and leads 14 of a package and the like will not be damaged by the weight of the heat sink.

Heat generated by the semiconductor chip 15 is conducted from the first thermal conductive member 21a to the heat sink 103 through the fourth thermal conductive members 21d, the third thermal conductive members 21c, the fourth thermal conductive members 21d, and the second thermal conductive member 21b. Therefore, the heat generated by the semiconductor chip 15 can be efficiently dissipated.

[F] Next, a printed circuit board according to the sixth embodiment of the present invention and a semiconductor device using the same will be described below.

Figure 43:
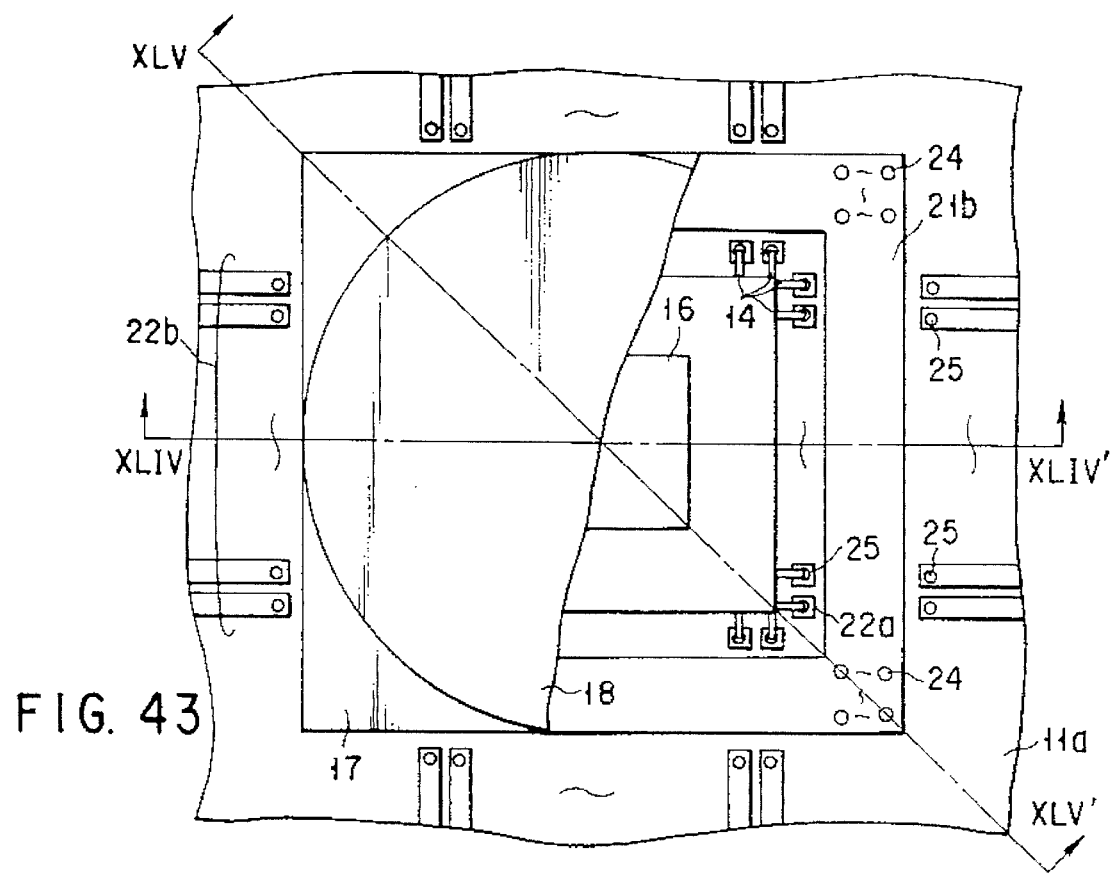
FIG. 43 is a plan view showing a semiconductor device according to the sixth embodiment of the present invention.
Figure 44:
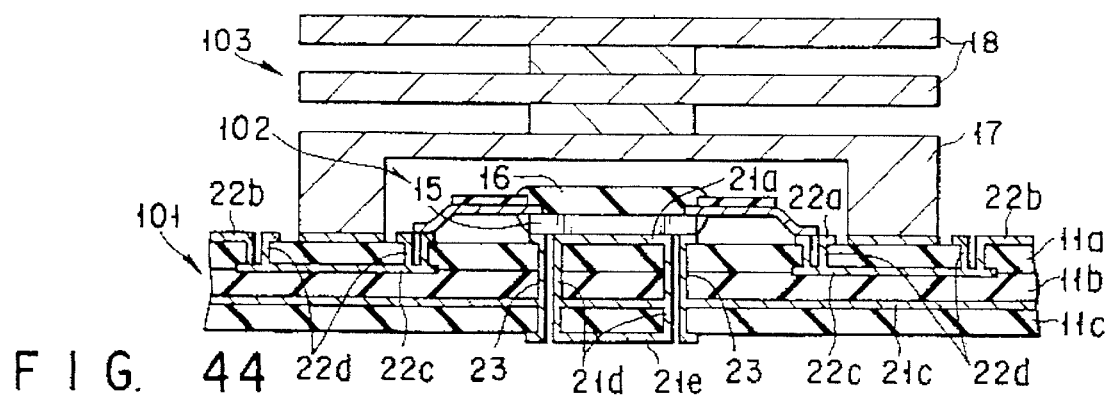
FIG. 44 is a sectional view of the semiconductor device along the line XLIV—XLIV in FIG. 43.
Figure 45:
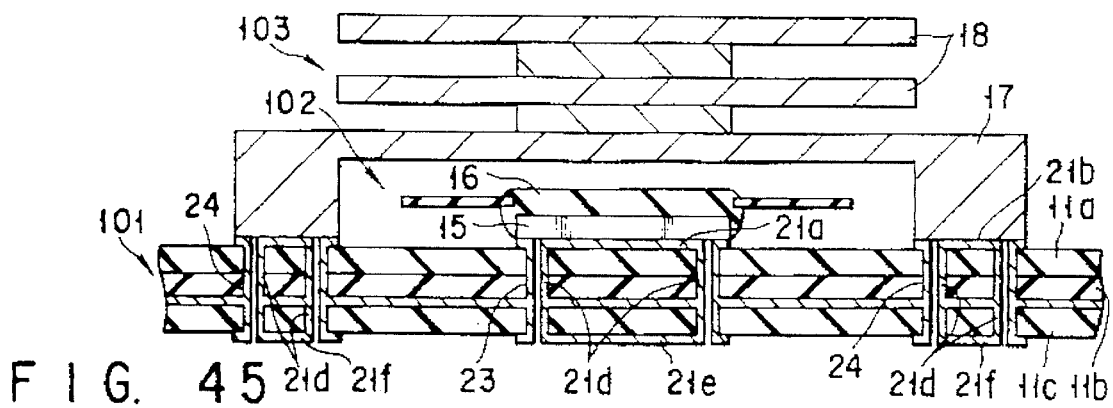
FIG. 45 is a sectional view of the semiconductor device along the line XLV—XLV in FIG. 43.

FIGS. 43 to 45 show the semiconductor device using the multilayered printed circuit board according to the sixth embodiment of the present invention. FIG. 43 is a plan view of the semiconductor device, FIG. 44 is a sectional view thereof along the line XLIV—XLIV in FIG. 43, and FIG. 45 is a sectional view thereof along the line XLV—XLV in FIG. 43.

A multilayered printed circuit board 101 comprises a plurality (e.g., three) of insulating boards (e.g., epoxy glass) 11a to 11c, first to sixth thermal conductive members 21a to 21f, wiring patterns 22a to 22c, and through holes 23 to 25.

That is, the multilayered printed circuit board 101 of this embodiment is different from that of the above fifth embodiment in that the through holes 23 and 24 extend from one major surface of the insulating board 11a to the other major surface of the insulating board 11c, and the fifth and sixth thermal conductive members 21e and 21f are formed on the other major surface of the insulating board 11c.

The fifth conductive member 21e has the same pattern as, e.g., that of the first thermal conductive member 21a, and the sixth conductive member 21f has the same pattern as, e.g., that of the second thermal conductive member 21b.

According to the multilayered printed circuit board having the above arrangement and the semiconductor device using the same, a semiconductor chip 15 is mounted on the first thermal conductive member 21a, and a heat sink 103 is mounted on the second thermal conductive member 21b. Therefore, a heat sink need not be directly mounted on the semiconductor chip 15, and leads 14 of a package and the like will not be damaged by the weight of the heat sink.

Heat generated by the semiconductor chip 15 is conducted from the first thermal conductive member 21a to the heat sink 103 through the fourth thermal conductive members 21d, the third thermal conductive members 21c, the fourth thermal conductive members 21d, and the second thermal conductive member 21b. Therefore, the heat generated by the semiconductor chip 15 can be efficiently dissipated.

[G] Next, a printed circuit board according to the seventh embodiment of the present invention and a semiconductor device using the same will be described below.

Figure 46:
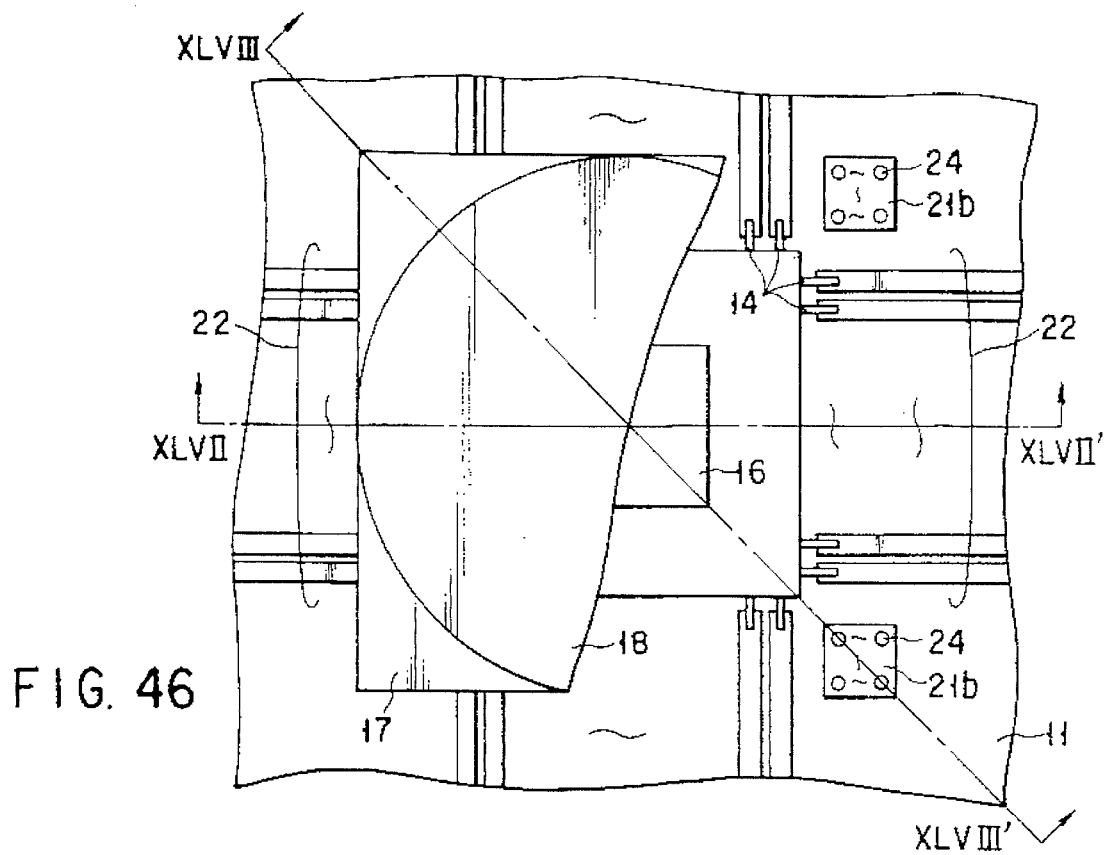
FIG. 46 is a plan view showing a semiconductor device according to the seventh embodiment of the present invention.
Figure 47:
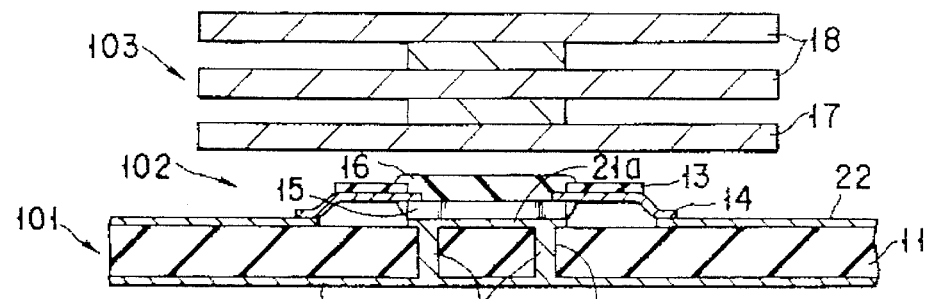
FIG. 47 is a sectional view of the semiconductor device along the line XLVII—XLVII in FIG. 46.
Figure 48:
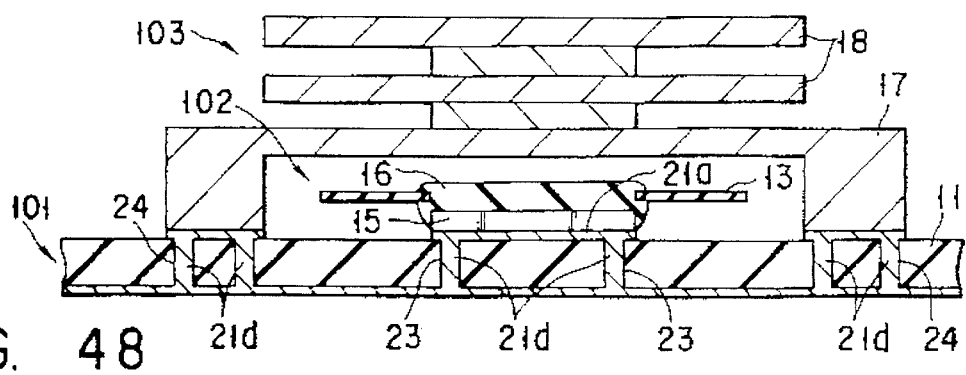
FIG. 48 is a sectional view of the semiconductor device along the line XLVIII—XLVIII in FIG. 46.

FIGS. 46 to 48 show the semiconductor device according to the seventh embodiment of the present invention. FIG. 46 is a plan view of the semiconductor device, FIG. 47 is a sectional view thereof along the line XLVII—XLVII in FIG. 46, and FIG. 48 is a sectional view thereof along the line XLVIII—XLVIII in FIG. 46.

A printed circuit board 101 comprises an insulating board (e.g., epoxy glass) 11, first to fourth thermal conductive members 21a to 21d, wiring patterns 22, and through holes 23 and 24.

The first thermal conductive member 21a is formed on one major surface of the insulating board 11. The first thermal conductive member 21a consists of a material having a high thermal conductivity, such as copper (thickness: about 35 μm).

For example, a semiconductor chip 15 of a TCP 102 is to be mounted on the first thermal conductive member 21a. The first thermal conductive member 21a conforms to the shape of the semiconductor chip. The shape of the first thermal conductive member 21a is formed to be, e.g., a square having one side of about 12 mm when viewed from one major surface of the insulating board 11.

The plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 μm).

A heat sink 103 is to be mounted on the second thermal conductive members 21b. For this reason, the second thermal conductive members 21b are formed to facilitate mounting of the heat sink 103. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11.

The fourth thermal conductive member 21d is filled in each through hole 23. The fourth thermal conductive member 21d consists of a material having a high thermal conductivity, such as copper (thickness: about 35 μm).

Note that the fourth thermal conductive member 21d may be formed only on the side surface of each through hole 23, and each through hole 23 may be filled with a paste containing aluminum nitride or high-heat conductive particles (e.g., a metal).

Similarly, at least one through hole 24 is formed in the insulating board 11 between the second and third thermal conductive members 21b and 21c. Forty-nine (7 columns×7 rows) through holes 24 each having a diameter of about 200 μm are formed in the insulating board 11.

The fourth thermal conductive member 21d is filled in each through hole 24. The fourth thermal conductive member 21d consists of a material having a high thermal conductivity, such as copper (thickness: about 35 μm).

Note that the fourth thermal conductive member 21d may be formed only on the side surface of each through hole 24, and each through hole 24 may be filled with a paste containing aluminum nitride or high-heat conductive particles (e.g., a metal).

According to the printed circuit board having the above arrangement and the semiconductor device using the same, the semiconductor chip of the TCP 102 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

In addition, since the through holes 23 and 24 are filled with a material having a high thermal conductivity, the heat generated by the semiconductor chip 15 can be efficiently dissipated.

[H] Next, a printed circuit board according to the eighth embodiment of the present invention and a semiconductor device using the same will be described below.

Figure 49:
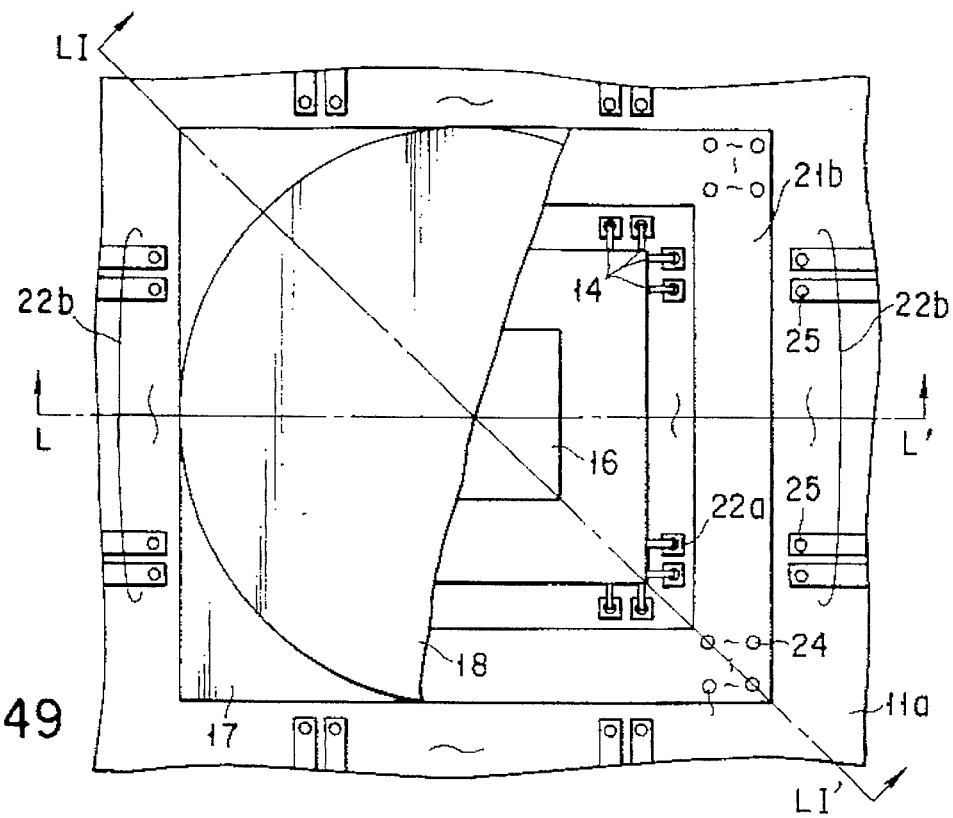
FIG. 49 is a plan view showing a semiconductor device according to the eighth embodiment of the present invention.
Figure 50:
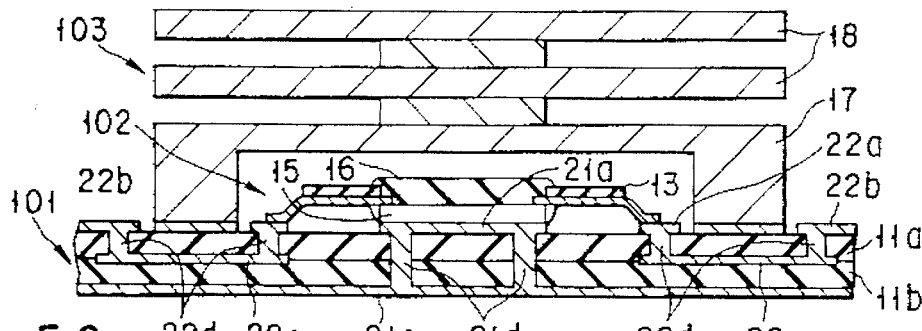
FIG. 50 is a sectional view of the semiconductor device along the line L—L in FIG. 49.
Figure 51:
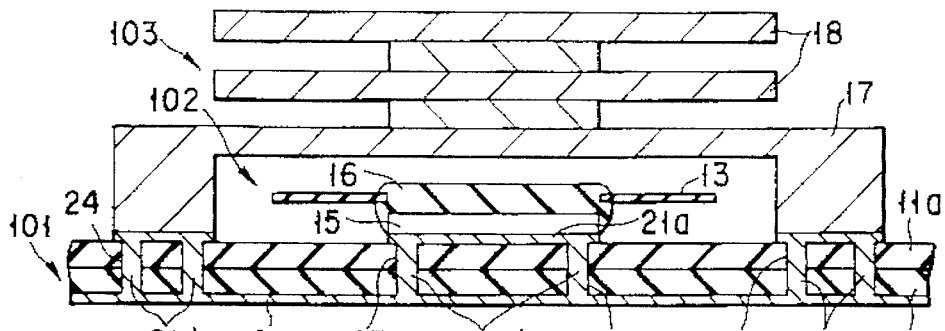
FIG. 51 is a sectional view of the semiconductor device along the line LI—LI in FIG. 49.

FIGS. 49 to 51 show the semiconductor device according to the eighth embodiment of the present invention. FIG. 49 is a plan view of the semiconductor device, FIG. 50 is a sectional view thereof along the line L—L in FIG. 49, and FIG. 51 is a sectional view thereof along the line LI—LI in FIG. 49.

A multilayered printed circuit board 101 comprises a plurality (e.g., two) of insulating boards (e.g., epoxy glass) 11a and 11b, first to fourth thermal conductive members 21a to 21d, wiring patterns 22a to 22d, and through holes 23 to 25.

The first thermal conductive member 21a is formed on one major surface of the insulating board 11a. The first thermal conductive member 21a consists of a material having a high thermal conductivity, such as copper (thickness: about 35 µm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11a.

The annular second thermal conductive member 21b is formed around the first thermal conductive member 21a on one major surface of the insulating board 11a. The second thermal conductive member 21b consists of a material having a high thermal conductivity, such as copper (thickness: about 35 µm).

A heat sink 103 is to be mounted on the second thermal conductive member 21b. For this reason, the second thermal conductive member 21b is formed to facilitate mounting of the heat sink 103. For example, the second thermal conductive member 21b is formed to be a frame-like square shape having a width of about 5 mm when viewed from one major surface of the insulating board 11a.

The plurality of wiring patterns 22a and 22b to surround the four sides of the first thermal conductive member 21a are formed on one major surface of the insulating board 11a. The wiring patterns 22a are located inside the frame-like second thermal conductive member 21b, and the wiring patterns 22b are located outside the frame-like second thermal conductive member 21b.

The plurality of wiring patterns 22c are formed on the other major surface of the insulating board 11a. The through holes 25 are formed in the insulating board 11a between the wiring patterns 22a and 22b and the wiring patterns 22c.

Each through hole 25 is formed to have a diameter of, e.g., about 200 µm. The leads 22d are buried in the through holes 25. The wiring pattern (leads) 22d consists of, e.g., copper (thickness: about 35 µm). The wiring patterns 21d may be formed only on the side surfaces of the through holes 25, and each through hole 25 may be filled with a paste containing aluminum nitride or high-heat conductive particles (e.g., a metal).

The other major surface of the insulating board 11a and one major surface of the insulating board 11b are coupled to each other.

The third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 µm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 µm are formed in the insulating boards 11a and 11b.

The fourth thermal conductive member 21d is filled in each through hole 23. The fourth thermal conductive member 21d consists of a material having a high thermal conductivity, such as copper (thickness: about 35 µm).

Note that the fourth thermal conductive member 21d may be formed only on the side surface of each through hole 23, and each through hole 23 may be filled with a paste containing aluminum nitride or high-heat conductive particles (e.g., a metal).

Similarly, at least one through hole 24 is formed in the insulating boards 11a and 11b between the corners of the second thermal conductive member 21b and the third thermal conductive member 21c. Forty-nine (7 columns×7 rows) through holes 24 each having a diameter of about 200 µm are formed in the insulating boards 11a and 11b.

The fourth thermal conductive member 21d is filled in each through hole 24. The fourth thermal conductive member 21d consists of a material having a high thermal conductivity, such as copper (thickness: about 35 µm).

Note that the fourth thermal conductive member 21d may be formed only on the side surface of each through hole 24, and each through hole 24 may be filled with a paste containing aluminum nitride or high-heat conductive particles (e.g., a metal).

According to the multilayered printed circuit board having the above arrangement and the semiconductor device using the same, the semiconductor chip is mounted on the first thermal conductive member 21a, and the heat sink is mounted on the second thermal conductive member 21b. Therefore, a heat sink need not be directly mounted on the semiconductor chip, and the leads of a package and the like will not be damaged by the weight of the heat sink.

Heat generated by the semiconductor chip is conducted from the first thermal conductive member 21a to the heat sink through the fourth thermal conductive members 21d, the third thermal conductive members 21c, the fourth thermal conductive members 21d, and the second thermal conductive member 21b.

In addition, since the through holes 23 to 25 are filled with a material having a high thermal conductivity, the heat generated by the semiconductor chip can be efficiently dissipated.

[I] Next, a printed circuit board according to the ninth embodiment of the present invention and a semiconductor device using the same will be described below.

Figure 52:
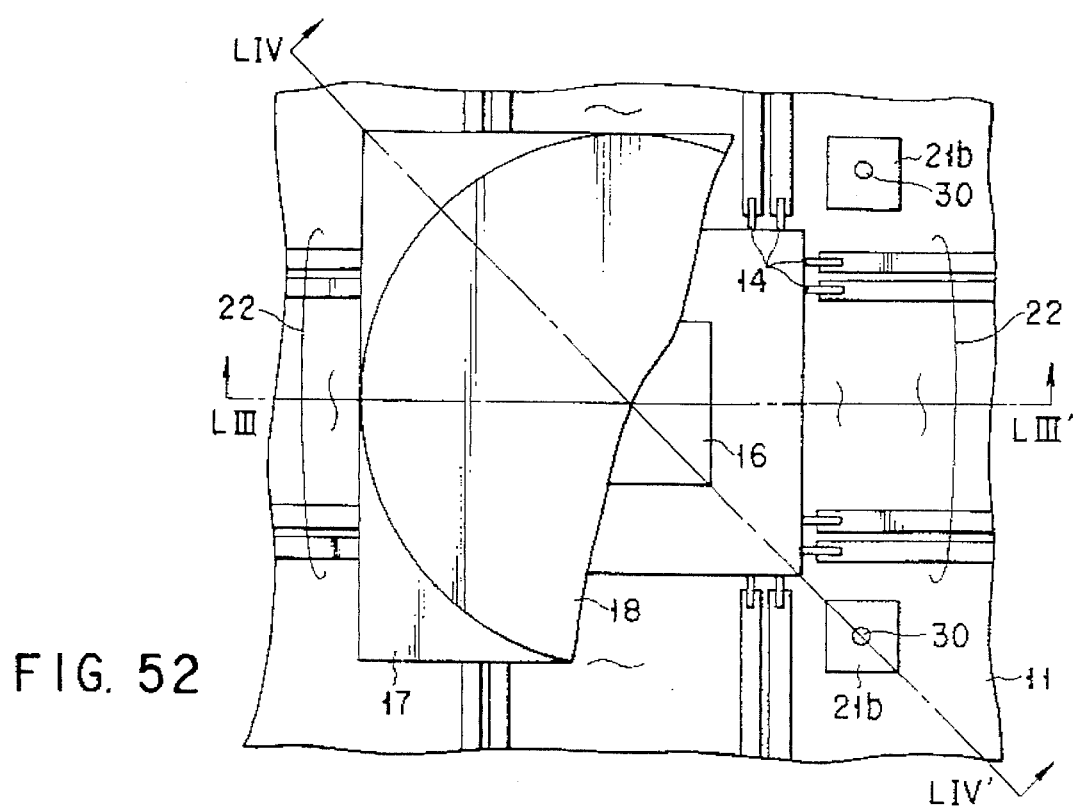
FIG. 52 is a plan view showing a semiconductor device according to the ninth embodiment of the present invention.
Figure 53:
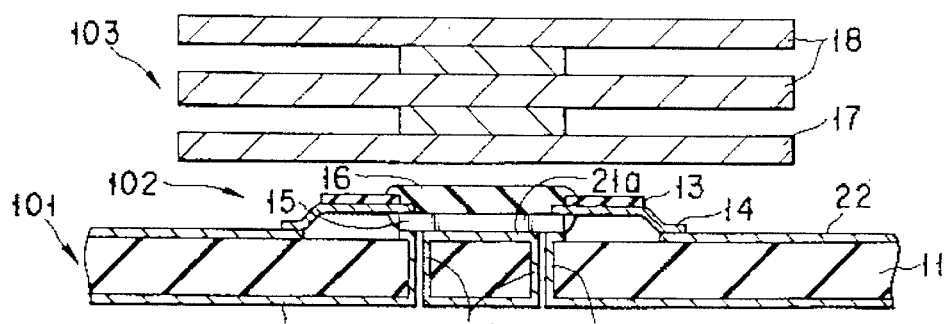
FIG. 53 is a sectional view of the semiconductor device along the line LIII—LIII in FIG. 52.
Figure 54:
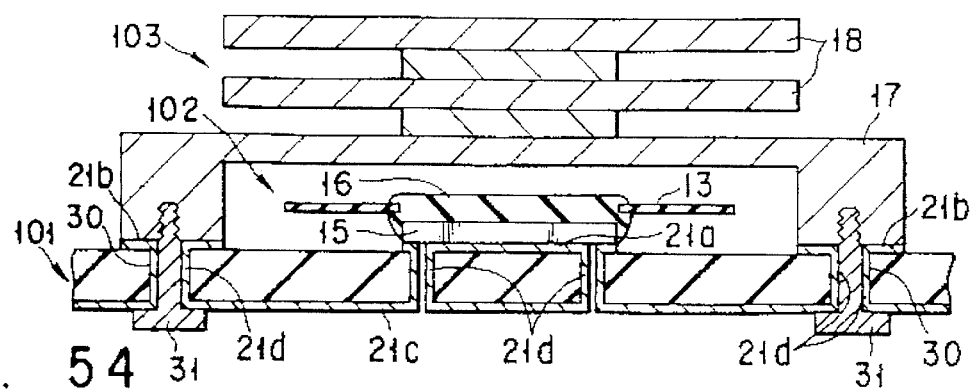
FIG. 54 is a sectional view of the semiconductor device along the line LIV—LIV in FIG. 52.

FIGS. 52 to 54 show the printed circuit board according to the ninth embodiment of the present invention. FIG. 52 is a plan view of the semiconductor device, FIG. 53 is a sectional view thereof along the line LIII—LIII in FIG. 52, and FIG. 54 is a sectional view thereof along the line LIV—LIV in FIG. 52.

A printed circuit board 101 comprises an insulating board (e.g., epoxy glass) 11, first to fourth thermal conductive members 21a to 21d, wiring patterns 22, through holes 23, threaded holes 30, and screws 31.

The first thermal conductive member 21a is formed on one major surface of the insulating board 11. The first thermal conductive member 21a consists of a material having a high thermal conductivity, such as copper (thickness: about 35 μm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11.

The plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 μm).

A heat sink 103 is to be mounted on the second thermal conductive members 21b. For this reason, the second thermal conductive members 21b are formed to facilitate mounting of the heat sink 103. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11.

The fourth thermal conductive member 21d is formed on the side surface of each through hole 23. The fourth thermal conductive member 21d consists of a material having a high thermal conductivity, such as copper (thickness: about 35 μm).

Each threaded hole 30 is formed in the insulating board 11 between the corresponding second thermal conductive member 21b and the third thermal conductive member 21c. The fourth thermal conductive member 21d is formed on the side surface of each threaded hole 30. The fourth thermal conductive member 21d consists of a material having a high thermal conductivity, such as copper (thickness: about 35 μm).

Threaded holes are also formed in a lid portion 17 of the heat sink. For example, the threaded holes of the lid portion 17 are formed in the bottom portions of the projecting portion of the lid portion 17.

Each threaded hole of the insulating board 11 and the corresponding threaded hole of the heat sink 103 are positioned to overlap each other. By fitting the screws 31 into the corresponding threaded holes, the heat sink 103 is firmly fixed on the insulating board 11.

According to the printed circuit board having the above arrangement and the semiconductor device using the same, the semiconductor chip of the TCP 102 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

In addition, since the heat sink 103 is firmly fixed on the insulating board 11 using the screws 31, a larger heat sink can be mounted on the insulating board 11, and the heat generated by the semiconductor chip 15 can be efficiently dissipated.

If the screw 31 consists of a material having a high thermal conductivity, and the diameter of each threaded hole 30 is maximized, the heat generated by the semiconductor chip 15 can be more efficiently dissipated.

As compared with a case using a large number of through holes, this embodiment employs only one threaded hole in each thermal conductive member to decrease the manufacturing steps and the manufacturing cost.

[J] Next, a printed circuit board according to the 10th embodiment of the present invention and a semiconductor device using the same will be described below.

Figure 55:
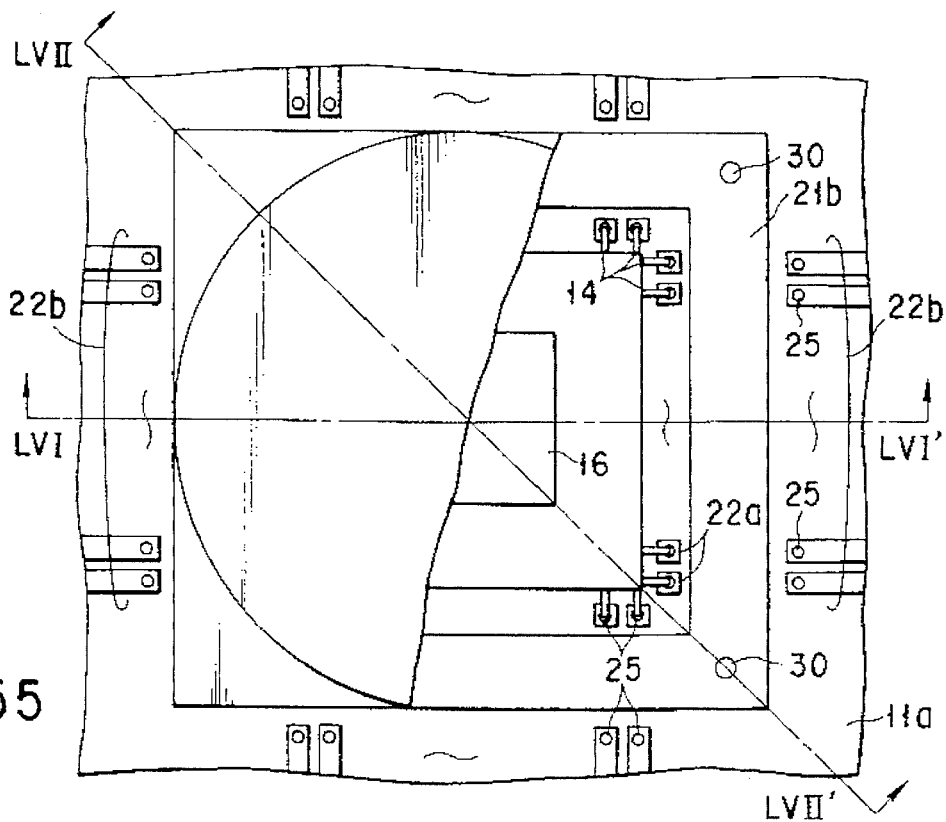
FIG. 55 is a plan view showing a semiconductor device according to the 10th embodiment of the present invention.
Figure 56:
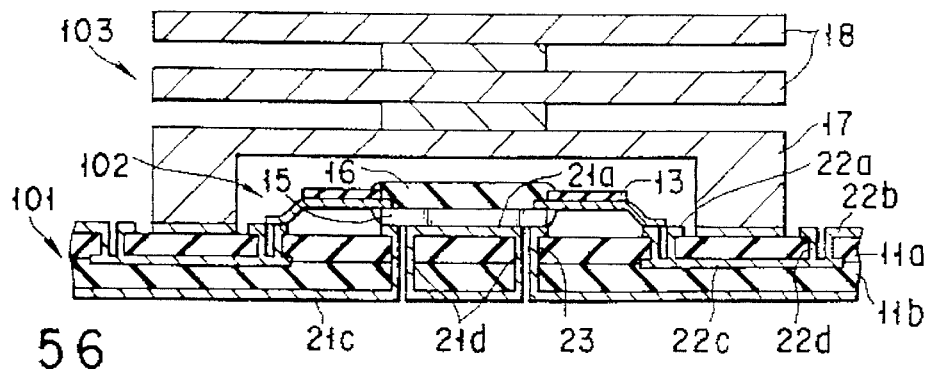
FIG. 56 is a sectional view of the semiconductor device along the line LVI—LVI in FIG. 55.
Figure 57:
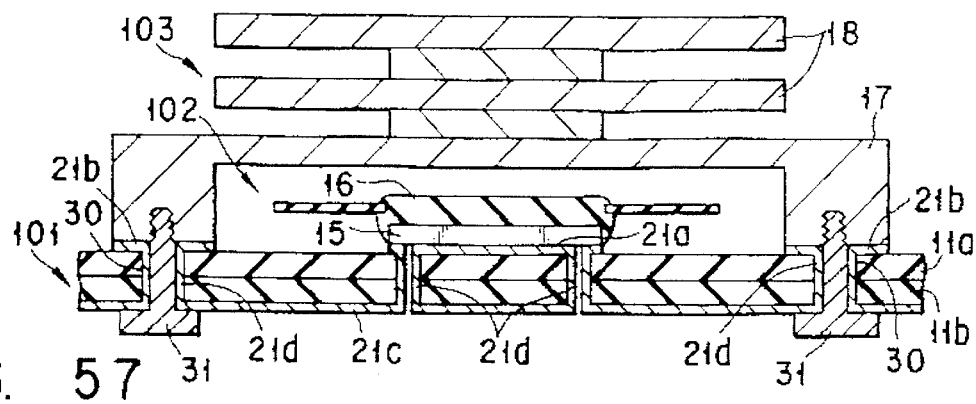
FIG. 57 is a sectional view of the semiconductor device along the line LVII—LVII in FIG. 55.

FIGS. 55 to 57 show the semiconductor device according to the 10th embodiment of the present invention. FIG. 55 is a plan view of the semiconductor device, FIG. 56 is a sectional view thereof along the line LVI—LVI in FIG. 55, and FIG. 57 is a sectional view thereof along the line LVII—LVII in FIG. 55.

A multilayered printed circuit board 101 comprises a plurality (e.g., two) of insulating boards (e.g., epoxy glass) 11a and 11b, first to fourth thermal conductive members 21a to 21d, wiring patterns 22a to 22d, through holes 23 and 25, threaded holes 30, and screws 31.

The first thermal conductive member 21a is formed on one major surface of the insulating board 11a. The first thermal conductive member 21a consists of a material having a high thermal conductivity, such as copper (thickness: about 35 μm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11a.

The annular second thermal conductive member 21b is formed around the first thermal conductive member 21a on one major surface of the insulating board 11a. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the second thermal conductive member 21b is formed to be a frame-like square shape having a width of about 5 mm when viewed from one major surface of the insulating board 11a.

The plurality of wiring patterns 22a and 22b to surround the four sides of the first thermal conductive member 21a are formed on one major surface of the insulating board 11a. The wiring patterns 22a are located inside the frame-like second thermal conductive member 21b, and the leads 22b are located outside the frame-like second thermal conductive member 21b.

The plurality of wiring patterns 22c are formed on the other major surface of the insulating board 11a. The through holes 25 are formed in the insulating board 11a between the wiring patterns 22a and 22b and the wiring patterns 22c.

Each through hole 25 is formed to have a diameter of, e.g., about 200 μm. The leads 22d are buried in the through holes 25. The wiring pattern (leads) 22d consists of, e.g., copper (thickness: about 35 μm). The wiring patterns 22d may be formed on the side surfaces of the through holes 25, and each through hole 25 may be filled with a paste containing aluminum nitride or high-heat conductive particles (e.g., a metal).

The other major surface of the insulating board 11a and one major surface of the insulating board 11b are coupled to each other.

The third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 μm are formed in the insulating boards 11a and 11b.

The fourth thermal conductive member 21d is formed on the side surface of each through hole 23. The fourth thermal conductive member 21d consists of a material having a high thermal conductivity, such as copper (thickness: about 35 μm).

Each threaded hole 30 is formed in the insulating boards 11a and 11b between the corresponding corner of the second thermal conductive member 21b and the third thermal conductive member 21c. The fourth thermal conductive member 21d is formed on the side surface of each threaded hole 30. The fourth thermal conductive member 21d consists of a material having a high thermal conductivity, such as copper (thickness: about 35 μm).

Threaded holes are also formed in a lid portion 17 of the heat sink. For example, the threaded holes of the lid portion 17 are formed in the bottom portion of the projecting portion of the lid portion 17.

Each threaded hole of the insulating board 11 and the corresponding threaded hole of the heat sink 103 are positioned to overlap each other. By fitting the screws 31 into the corresponding threaded holes, the heat sink 103 is firmly fixed on the insulating board 11.

According to the printed circuit board having the above arrangement and the semiconductor device using the same, the semiconductor chip of the TCP 102 is mounted on the first thermal conductive member 21a of the insulating board 11, and the heat sink 103 is mounted on the second thermal conductive member 21b of the insulating board 11. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

In addition, since the heat sink 103 is firmly fixed on the insulating board 11 using the screws 31, a larger heat sink can be mounted on the insulating board 11, and the heat generated by the semiconductor chip 15 can be efficiently dissipated.

If the screw 31 consists of a material having a high thermal conductivity, and the diameter of each threaded hole 30 is maximized, the heat generated by the semiconductor chip 15 can be more efficiently dissipated.

As compared with a case using a large number of through holes, this embodiment employs only one threaded hole in each thermal conductive member to decrease the manufacturing steps and the manufacturing cost.

[K] Next, a printed circuit board according to the 11th embodiment of the present invention and a semiconductor device using the same will be described below.

FIGS. 58 to 60 show the semiconductor device according to the 11th embodiment of the present invention. FIG. 58 is a plan view of the semiconductor device, FIG. 59 is a sectional view thereof along the line LIX—LIX in FIG. 58, and FIG. 60 is a sectional view thereof along the line LX—LX in FIG. 58.

A printed circuit board 101 comprises an insulating board (e.g., epoxy glass) 11, first to fourth thermal conductive members 21a to 21d, wiring patterns 22, through holes 23 and 24, and a low-heat resistive plate 32.

The first thermal conductive member 21a is formed on one major surface of the insulating board 11. The first thermal conductive member 21a consists of a material having a high thermal conductivity, such as copper (thickness: about 35 µm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11.

The plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 µm).

A heat sink 103 is to be mounted on the second thermal conductive members 21b. For this reason, the second thermal conductive members 21b are formed to facilitate mounting of the heat sink 103. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 µm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 µm are formed in the insulating board 11.

The fourth thermal conductive member 21d is formed on the side surface of each through hole 23. The fourth thermal conductive member 21d consists of a material having a high thermal conductivity, such as copper (thickness: about 35 µm).

Moreover, at least one through hole 24 is formed in the insulating board 11 between the second and third thermal conductive members 21b and 21c. Forty-nine (7 columns×7 rows) through holes 24 each having a diameter of about 200 µm are formed in the insulating board 11.

The fourth thermal conductive member 21d is formed on the side surface of each through hole 24. The fourth thermal conductive member 21d consists of a material having a high thermal conductivity, such as copper (thickness: about 35 µm).

Note that, the fourth thermal conductive members 21d may be formed only on the side surfaces of the through holes 23 and 24, and each through hole 24 may be filled with a paste containing aluminum nitride or high-heat conductive particles (e.g., a metal).

The low-heat resistive plate 32 having a low heat resistance is mounted on the other major surface of the insulating board 11. The low-heat resistive plate 32 can consist of aluminum, copper, a ceramic, aluminum nitride, alumina, beryllia, silicon carbide, or the like.

Note that the low-heat resistive plate 32 can be adhered to the insulating board 11 with a solder, an adhesive having a low heat resistance, or the like.

According to the printed circuit board having the above arrangement and the semiconductor device using the same, the semiconductor chip of the TCP 102 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

Figure 100:
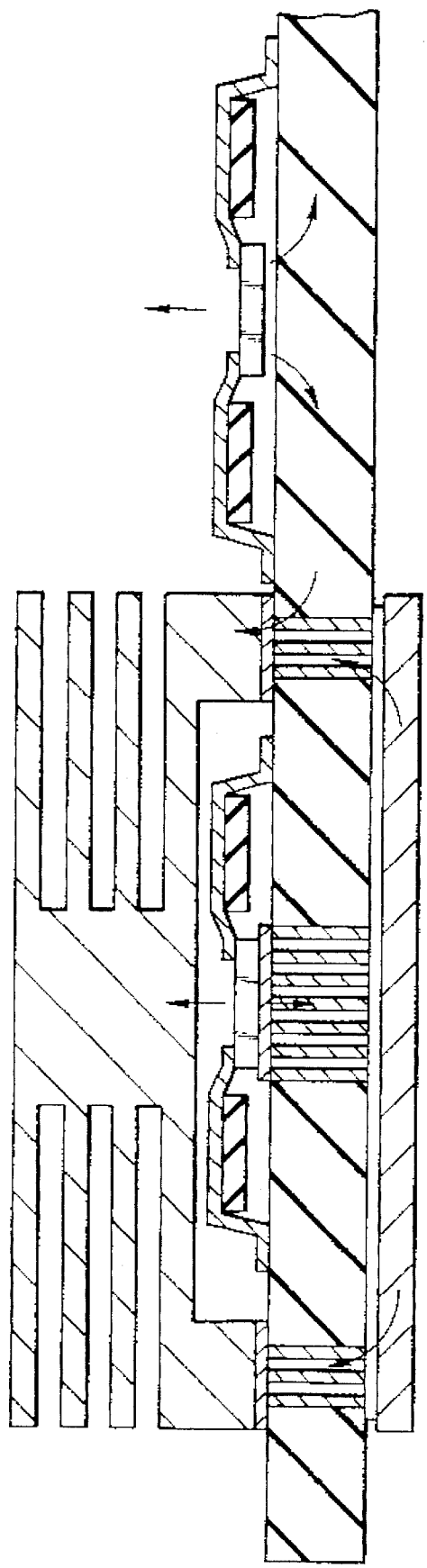
FIG. 100 is a sectional view showing dissipation paths of the semiconductor device in FIG. 58.

In addition, as shown in FIGS. 59, 60 and 100, since the low-heat resistive plate 32 is formed on the other major surface of the insulating board 11, the heat generated by the semiconductor chip 15 can be efficiently dissipated from the heat sink directly from or through the low-heat resistive plate 32. The semiconductor device is not adversely affected by heat generated by an adjacent semiconductor device.

[L] Next, a printed circuit board according to the 12th embodiment of the present invention and a semiconductor device using the same will be described below.

Figure 61:
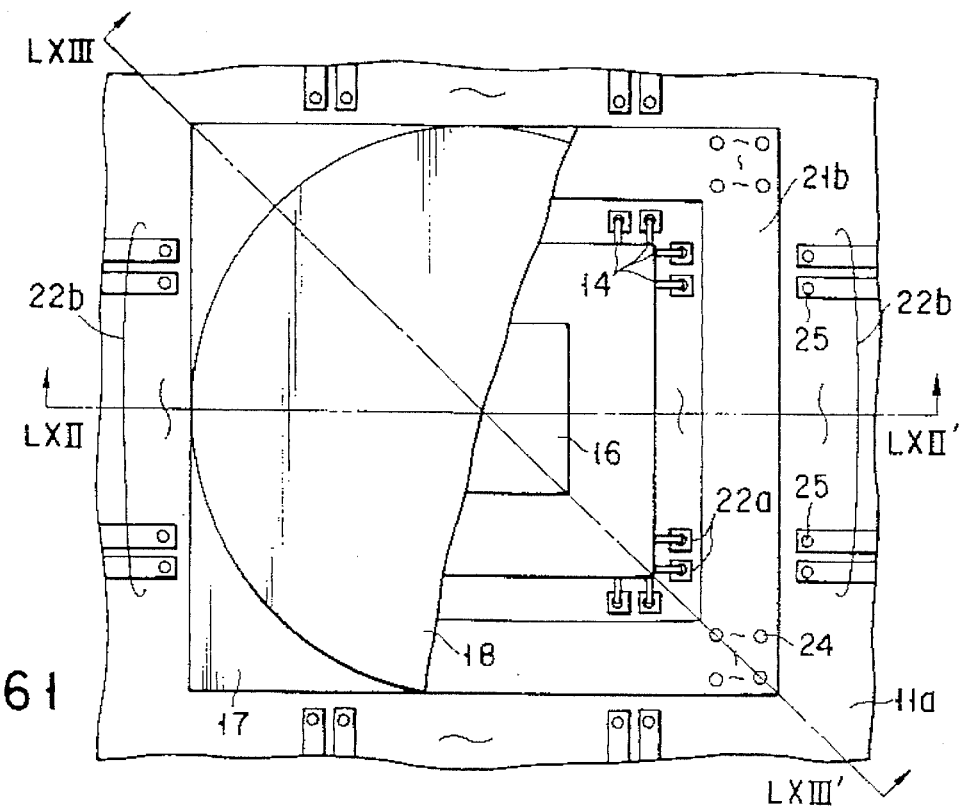
FIG. 61 is a plan view showing a semiconductor device according to the 12th embodiment of the present invention.
Figure 62:
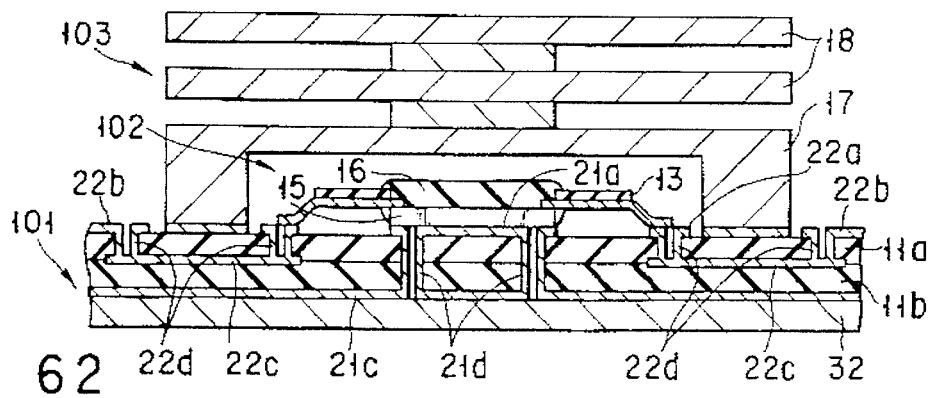
FIG. 62 is a sectional view of the semiconductor device along the line LXII—LXII in FIG. 61.
Figure 63:
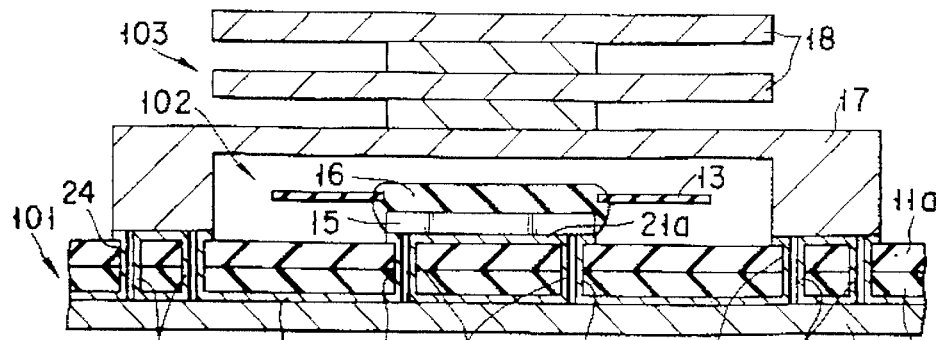
FIG. 63 is a sectional view of the semiconductor device along the line LXIII—LXIII in FIG. 61.

FIGS. 61 to 63 show the semiconductor device according to the 12th embodiment of the present invention. FIG. 61 is a plan view of the semiconductor device, FIG. 62 is a sectional view thereof along the line LXII—LXII in FIG. 61, and FIG. 63 is a sectional view thereof along the line LXIII—LXIII in FIG. 61.

A multilayered printed circuit board 101 comprises a plurality (e.g., two) of insulating boards (e.g., epoxy glass)

11a and 11b, first to fourth thermal conductive members 21a to 21d, wiring patterns 22a to 22d, through holes 23 to 25, and a low-heat resistive plate 32.

The first thermal conductive member 21a is formed on one major surface of the insulating board 11a. The first thermal conductive member 21a consists of a material having a high thermal conductivity, such as copper (thickness: about 35 μm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11a.

The annular second thermal conductive member 21b is formed around the first thermal conductive member 21a on one major surface of the insulating board 11a. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the second thermal conductive member 21b is formed to be a frame-like square shape having a width of about 5 mm when viewed from one major surface of the insulating board 11a.

The plurality of wiring patterns 22a and 22b to surround the four sides of the first thermal conductive member 21a are formed on one major surface of the insulating board 11a. The wiring patterns 22a are located inside the frame-like second thermal conductive member 21b, and the leads 22b are located outside the frame-like second thermal conductive member 21b.

The plurality of wiring patterns 22c are formed on the other major surface of the insulating board 11a. The through holes 25 are formed in the insulating board 11a between the wiring patterns 22a and 22b and the wiring patterns 22c.

Each through hole 25 is formed to have a diameter of, e.g., about 200 μm. The wiring patterns 22d are formed on the side surfaces of the through holes 25. Each wiring pattern 22d consists of, e.g., copper (thickness: about 35 μm). The wiring patterns 22d may be formed only on the side surfaces of the through holes 25, and each through hole 25 may be filled with a paste containing aluminum nitride or high-heat conductive particles (e.g., a metal).

The other major surface of the insulating board 11a and one major surface of the insulating board 11b are coupled to each other.

The third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 μm are formed in the insulating boards 11a and 11b.

The fourth thermal conductive member 21d is formed on the side surface of each through hole 23. The fourth thermal conductive member 21d consists of a material having a high thermal conductivity, such as copper (thickness: about 35 μm).

Moreover, at least one through hole 24 is formed in the insulating boards 11a and 11b between the second and third thermal conductive members 21b and 21c. Forty-nine (7 columns×7 rows) through holes 24 each having a diameter of about 200 μm are formed in the insulating boards 11a and 11b.

The fourth thermal conductive member 21d is formed on the side surface of each through hole 24. The fourth thermal conductive member 21d consists of a material having a high thermal conductivity, such as copper (thickness: about 35 μm).

Note that the fourth thermal conductive members 21d may be formed only on the side surfaces of the through holes 23 and 24, and each through hole 24 may be filled with a paste containing aluminum nitride or high-heat conductive particles (e.g., a metal).

The low-heat resistive plate 32 having a low heat resistance is mounted on the other major surface of the insulating board 11. The low-heat resistive plate 32 can consist of aluminum, copper, a ceramic, aluminum nitride, alumina, beryllia, silicon carbide, or the like.

Note that the low-heat resistive plate 32 can be adhered to the insulating board 11 with a solder, an adhesive having a low heat resistance, or the like.

According to the printed circuit board having the above arrangement and the semiconductor device using the same, the semiconductor chip of the TCP 102 is mounted on the first thermal conductive member 21a of the insulating boards 11a and 11b, and the heat sink 103 is mounted on the second thermal conductive member 21b of the insulating boards 11a and 11b. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

In addition, since the low-heat resistive plate 32 is formed on the other major surface of the insulating board 11b, the heat generated by the semiconductor chip 15 can be efficiently dissipated from the heat sink directly from or through the low-heat resistive plate 32. The semiconductor device is not adversely affected by heat generated by an adjacent semiconductor device.

[M] Next, a printed circuit board according to the 13th embodiment of the present invention and a semiconductor device using the same will be described below.

Figure 64:
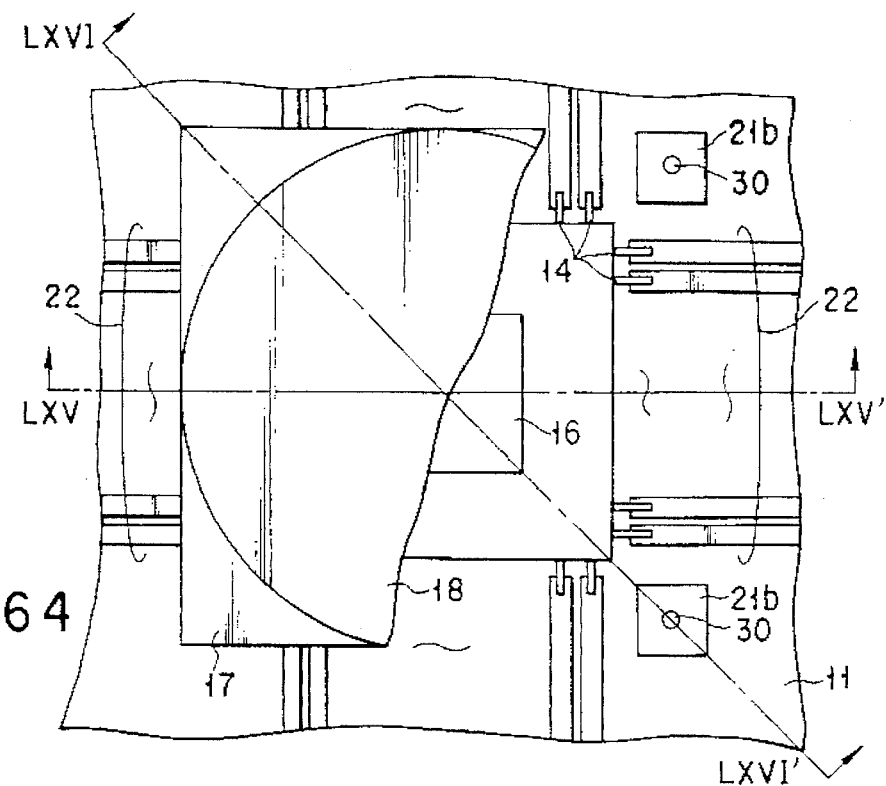
FIG. 64 is a plan view showing a semiconductor device according to the 13th embodiment of the present invention.
Figure 65:
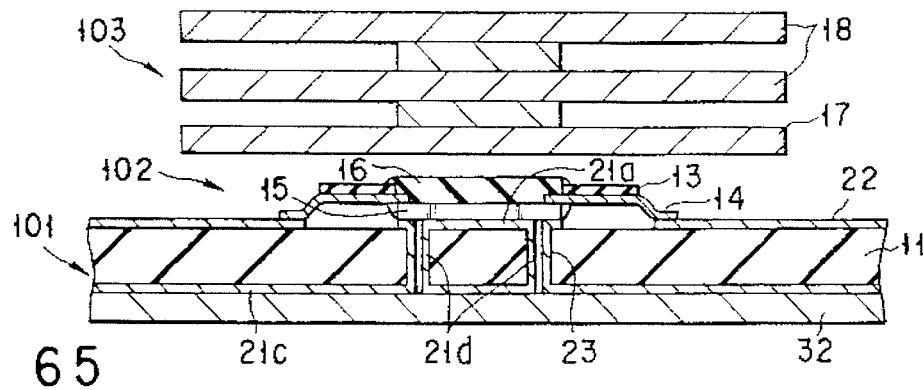
FIG. 65 is a sectional view of the semiconductor device along the line LXV—LXV in FIG. 64.
Figure 66:
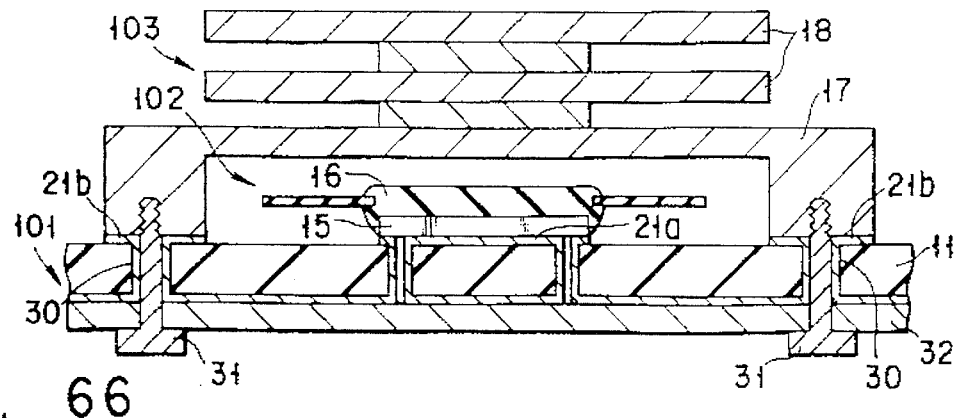
FIG. 66 is a sectional view of the semiconductor device along the line LXVI—LXVI in FIG. 64.

FIGS. 64 to 66 show the printed circuit board according to the 13th embodiment of the present invention. FIG. 64 is a plan view of the semiconductor device, FIG. 65 is a sectional view thereof along the line LXV—LXV in FIG. 64, and FIG. 66 is a sectional view thereof along the line LXVI—LXVI in FIG. 64.

A printed circuit board 101 comprises an insulating board (e.g., epoxy glass) 11, first to fourth thermal conductive members 21a to 21d, wiring patterns 22, through holes 23, threaded holes 30, screws 31, and a low-heat resistive plate 32.

The first thermal conductive member 21a is formed on one major surface of the insulating board 11. The first thermal conductive member 21a consists of a material having a high thermal conductivity, such as copper (thickness: about 35 µm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11.

The plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 µm).

A heat sink 103 is to be mounted on the second thermal conductive members 21b. For this reason, the second thermal conductive members 21b are formed to facilitate mounting of the heat sink 103. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 µm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

A low-heat resistive plate 32 having a low heat resistance is mounted on the other major surface of the insulating board 11. The low-heat resistive plate 32 can consist of aluminum, copper, a ceramic, aluminum nitride, alumina, beryllia, silicon carbide, or the like.

At least one through hole 23 is formed in the insulating board 11 between the first and third thermal conductive members 21a and 21c. For example, 121 (11 columns×11 rows) through holes 23 each having a diameter of, e.g., about 200 µm are formed in the insulating board 11.

The fourth thermal conductive member 21d is formed on the side surface of each through hole 23. The fourth thermal conductive member 21d consists of a material having a high thermal conductivity, such as copper (thickness: about 35 µm).

Each threaded hole 30 is formed in the insulating board 11 between the corresponding second thermal conductive member 21b and the third thermal conductive member and 21c. The fourth thermal conductive member 21d is formed on the side surface of each threaded hole 30. The fourth thermal conductive member 21d consists of a material having a high thermal conductivity, such as copper (thickness: about 35 µm).

Threaded holes are also formed in a lid portion 17 of the heat sink. For example, the threaded holes of the lid portion 17 are formed in the bottom portions of the projecting portion of the lid portion 17.

Further, threaded holes are formed in the low-heat resistive plate 32.

Each threaded hole of the insulating board 11, the corresponding threaded hole of the heat sink 103, and the corresponding threaded hole of the low-heat resistive plate 32 are positioned to overlap each other. By fitting the screws 31 into the corresponding threaded holes, the heat sink 103, the insulating board 11, and the low-heat resistive plate 32 are firmly fixed with each other.

According to the printed circuit board having the above arrangement and the semiconductor device using the same, the semiconductor chip of the TCP 102 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

In addition, since the heat sink 103 is firmly fixed on the insulating board 11 using the screws 31, a larger heat sink can be mounted on the insulating board 11, and the heat generated by the semiconductor chip 15 can be efficiently dissipated.

If the screw 31 consists of a material having a high thermal conductivity, and the diameter of each threaded hole 30 is maximized, the heat generated by the semiconductor chip 15 can be more efficiently dissipated.

As compared with a case using a large number of through holes, this embodiment employs only one threaded hole in each thermal conductive member to decrease the manufacturing steps and the manufacturing cost.

In addition, as shown in FIGS. 65 and 66, since the low-heat resistive plate 32 is formed on the other major surface of the insulating board 11, the heat generated by the semiconductor chip 15 can be efficiently dissipated from the heat sink directly from or through the low-heat resistive plate 32. The semiconductor device is not adversely affected by heat generated by an adjacent semiconductor device.

[N] Next, a printed circuit board according to the 14th embodiment of the present invention and a semiconductor device using the same will be described below.

Figure 67:
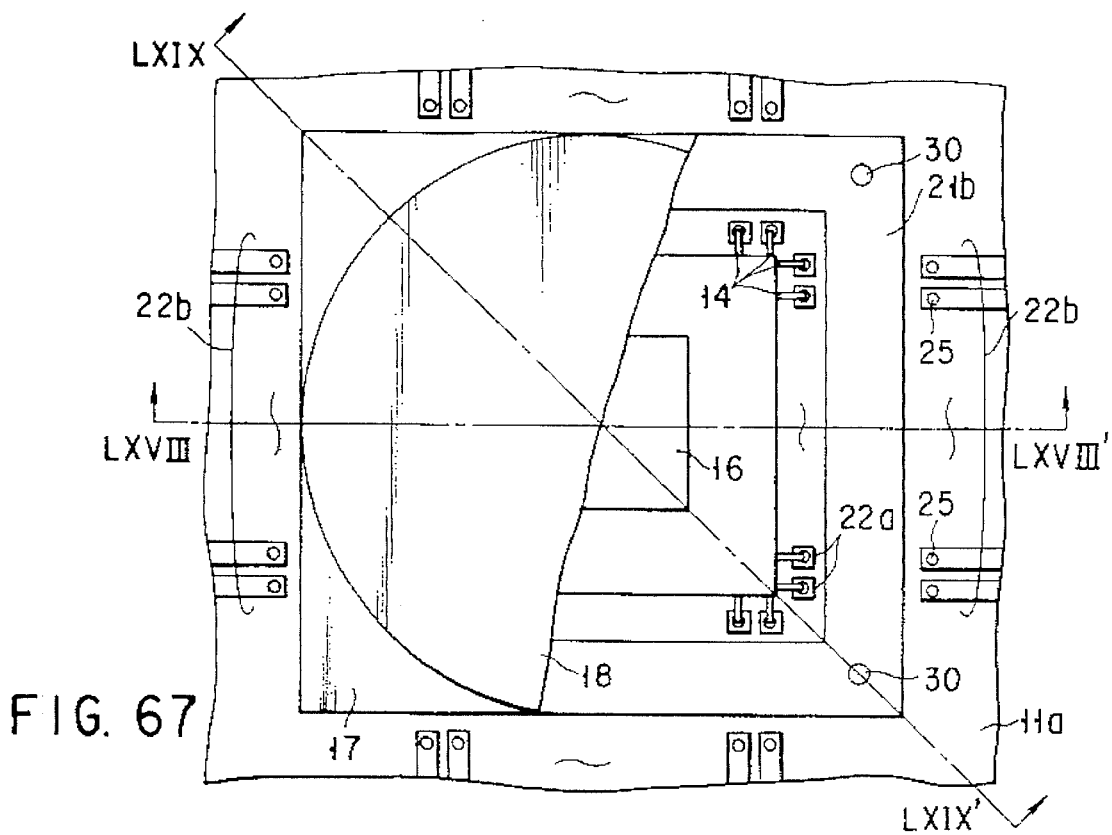
FIG. 67 is a plan view showing a semiconductor device according to the 14th embodiment of the present invention.
Figure 68:
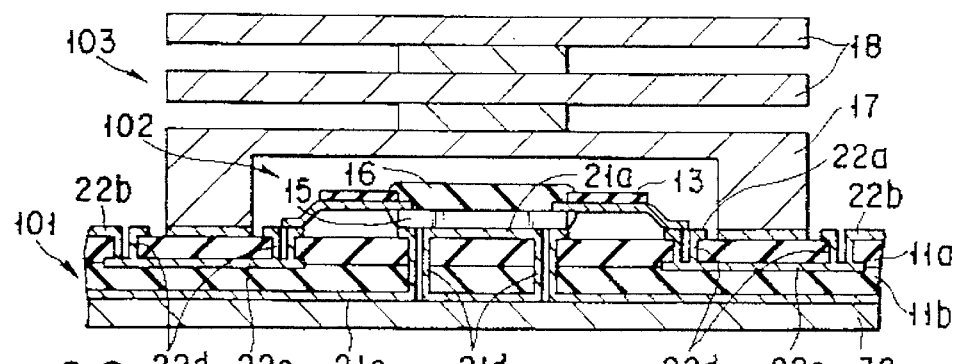
FIG. 68 is a sectional view of the semiconductor device along the line LXVIII—LXVIII in FIG. 67.
Figure 69:
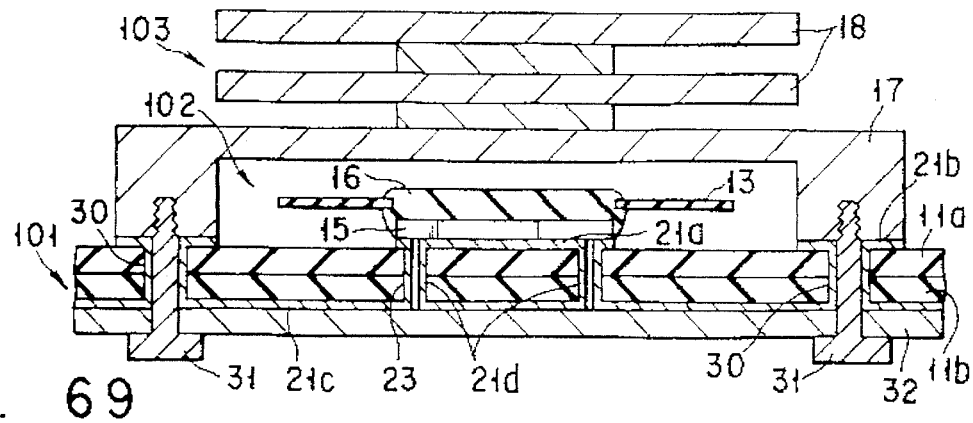
FIG. 69 is a sectional view of the semiconductor device along the line LXIX—LXIX in FIG. 67.

FIGS. 67 to 69 show the semiconductor device according to the 14th embodiment of the present invention. FIG. 67 is a plan view of the semiconductor device, FIG. 68 is a sectional view thereof along the line LXVIII—LXVIII in FIG. 67, and FIG. 69 is a sectional view thereof along the line LXIX—LXIX in FIG. 67.

A multilayered printed circuit board 101 comprises a plurality (e.g., two) of insulating boards (e.g., epoxy glass) 11a and 11b, first to fourth thermal conductive members 21a to 21d, wiring patterns 22a to 22d, through holes 23 and 25, threaded holes 30, and screws 31.

The first thermal conductive member 21a is formed on one major surface of the insulating board 11a. The first thermal conductive member 21a consists of a material having a high thermal conductivity, such as copper (thickness: about 35 μm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11a.

The annular second thermal conductive member 21b is formed around the first thermal conductive member 21a on one major surface of the insulating board 11a. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the second thermal conductive member 21b is formed to be a frame-like square shape having a width of about 5 mm when viewed from one major surface of the insulating board 11a.

The plurality of wiring patterns 22a and 22b to surround the four sides of the first thermal conductive member 21a are formed on owe major surface of the insulating board 11a. The wiring patterns 22a are located inside the frame-like second thermal conductive member 21b, and the leads 22b are located outside the frame-like second thermal conductive member 21b.

The plurality of wiring patterns 22c are formed on the other major surface of the insulating board 11a. The through holes 25 are formed in the insulating board 11a between the wiring patterns 22a and 22b and the wiring patterns 22c.

Each through hole 25 is formed to have a diameter of, e.g., about 200 μm. The leads 22d are buried in the through holes 25. The wiring pattern 22d consists of, e.g., copper (thickness: about 35 μm). The wiring patterns 22d may be formed only on the side surfaces of the through holes 25, and each through hole 25 may be filled with a paste containing aluminum nitride or high-heat conductive particles (e.g., a metal).

The other major surface of the insulating board 11a and one major surface of the insulating board 11b are coupled to each other.

The third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 μm are formed in the insulating boards 11a and 11b.

The fourth thermal conductive member 21d is formed on the side surface of each through hole 23. The fourth thermal conductive member 21d consists of a material having a high thermal conductivity, such as copper (thickness: about 35 μm).

A low-heat resistive plate 32 having a low heat resistance is mounted on the other major surface of the insulating board 11b. The low-heat resistive plate 32 can consist of aluminum, copper, a ceramic, aluminum nitride, alumina, beryllia, silicon carbide, or the like.

Each threaded hole 30 is formed in the insulating boards 11a and 11b between the corresponding portion of the second thermal conductive member 21b and the third thermal conductive member 21c. The fourth thermal conductive member 21d is formed on the side surface of each threaded hole 30. The fourth thermal conductive member 21d consists of a material having a high thermal conductivity, such as copper (thickness: about 35 μm).

Threaded holes are also formed in a lid portion 17 of the heat sink. For example, the threaded holes of the lid portion 17 are formed in the bottom portion of the projecting portion of the lid portion 17.

Further, threaded holes are formed in the low-heat resistive plate 32.

Each threaded hole of the insulating boards 11a and 11b, the corresponding threaded hole of the heat sink 103, and the corresponding threaded hole of the low-heat resistive plate 32 are positioned to overlap each other. By fitting the screws 31 into the corresponding threaded holes, the heat sink 103, the insulating board 11, and the low-heat resistive plate 32 are firmly fixed with each other.

According to the printed circuit board having the above arrangement and the semiconductor device using the same, the semiconductor chip of the TCP 102 is mounted on the first thermal conductive member 21a of the insulating board 11a, and the heat sink 103 is mounted on the second thermal conductive member 21b of the insulating board 11a. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

In addition, since the heat sink 103 is firmly fixed on the insulating board 11 using the screws 31, a larger heat sink can be mounted on the insulating board 11, and the heat generated by the semiconductor chip 15 can be efficiently dissipated.

If the screw 31 consists of a material having a high thermal conductivity, and the diameter of each threaded hole 30 is maximized, the heat generated by the semiconductor chip 15 can be more efficiently dissipated.

As compared with a case using a large number of through holes, this embodiment employs only one threaded hole in each thermal conductive member to decrease the manufacturing steps and the manufacturing cost.

In addition, since the low-heat resistive plate 32 is formed on the other major surface of the insulating board 11b, the heat generated by the semiconductor chip 15 can be efficiently dissipated from the heat sink directly from or through the low-heat resistive plate 32. The semiconductor device is not adversely affected by heat generated by an adjacent semiconductor device.

[O] Next, a printed circuit board according to the 15th embodiment of the present invention and a semiconductor device using the same will be described below.

FIGS. 70 to 72 show the semiconductor device according to the 15th embodiment of the present invention. FIG. 70 is a plan view of the semiconductor device, FIG. 71 is a sectional view thereof along the line LXXI—LXXI in FIG. 70, and FIG. 72 is a sectional view thereof along the line LXXII—LXXII in FIG. 70.

A first thermal conductive member 21a is formed on one major surface of an insulating board 11. The first thermal conductive member 21a consists of a material having a high thermal conductivity, such as copper (thickness: about 35 µm).

For example, a semiconductor chip 15 is to be directly mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11.

A plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 µm).

A heat sink 103 is to be mounted on the second thermal conductive members 21b. For this reason, the second thermal conductive members 21b are formed to facilitate mounting of the heat sink 103. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

Third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 µm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 µm are formed in the insulating board 11.

A fourth thermal conductive member 21d is formed on the side surface of each through hole 23. The fourth thermal conductive member 21d consists of a material having a high thermal conductivity, such as copper (thickness: about 35 µm).

Moreover, at least one through hole 24 is formed in the insulating board 11 between the second and third thermal conductive members 21b and 21c. Forty-nine (7 columns×7 rows) through holes 24 each having a diameter of about 200 µm are formed in the insulating board 11.

The fourth thermal conductive member 21d is formed on the side surface of each through hole 24. The fourth thermal conductive member 21d consists of a material having a high thermal conductivity, such as copper (thickness: about 35 µm).

Note that the fourth thermal conductive members 21d may be formed only on the side surfaces of the through holes 23 and 24, and each through hole 24 may be filled with a paste containing aluminum nitride or high-heat conductive particles (e..g., a metal).

The semiconductor chip 15 is adhered to the first thermal conductive member 21a with an adhesive (e.g., a conductive paste containing silver) having a high thermal conductivity. The semiconductor chip 15 and the wiring patterns 22 on the insulating board 11 are electrically connected to each other through bonding wires 34.

The semiconductor chip 15 and the bonding wires 34 are covered with a resin 33.

The heat sink 103 is mounted on the second thermal conductive members 21b.

According to the printed circuit board having the above arrangement and the semiconductor device using the same, the semiconductor chip 15 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

The semiconductor chip 15 can be protected by the heat sink 103.

[P] Next, a printed circuit board according to the 16th embodiment of the present invention and a semiconductor device using the same will be described below.

Figure 73:
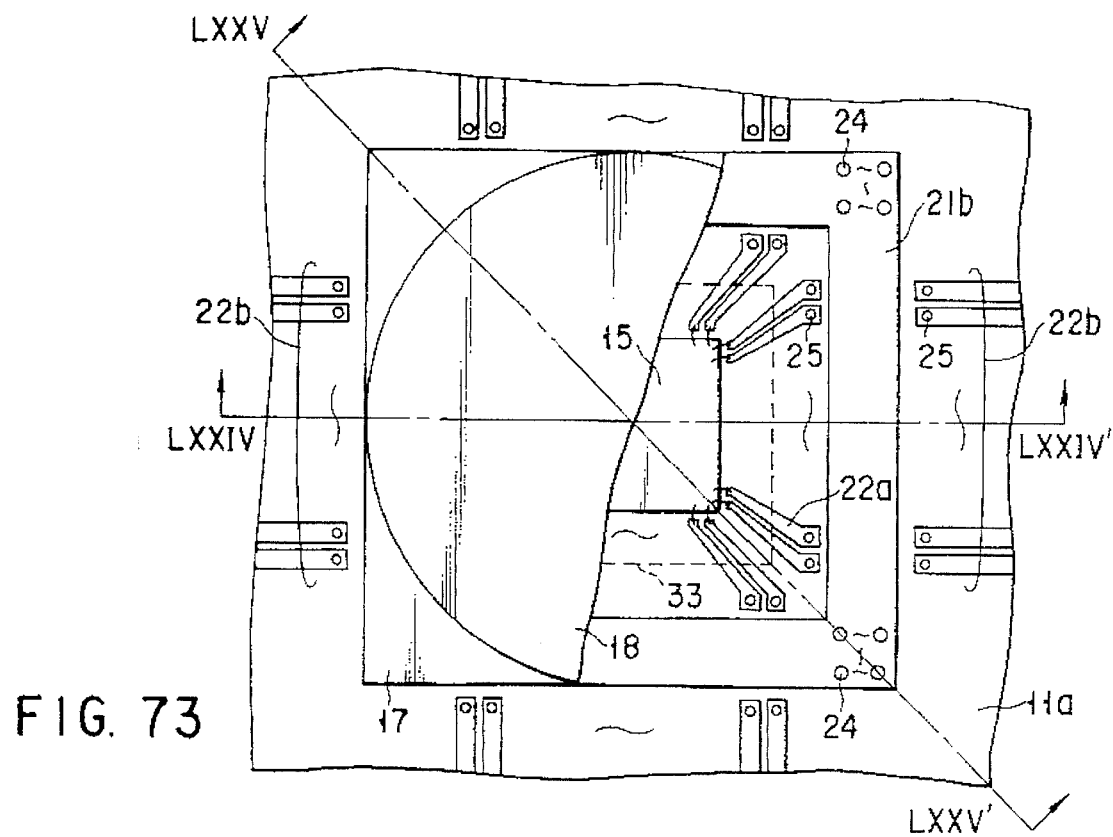
FIG. 73 is a plan view showing a semiconductor device according to the 16th embodiment of the present invention.
Figure 74:
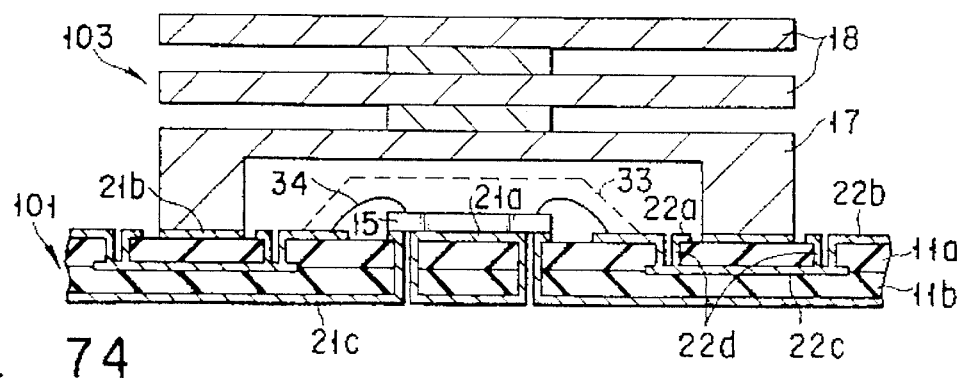
FIG. 74 is a sectional view of the semiconductor device along the line LXXIV—LXXIV in FIG. 73.
Figure 75:
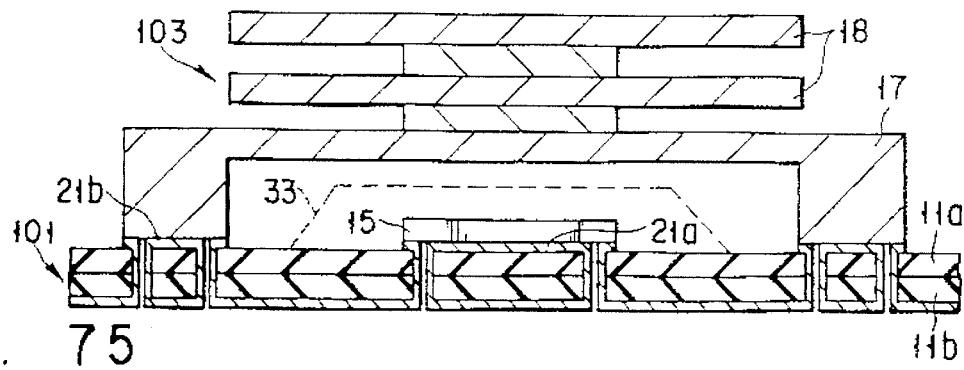
FIG. 75 is a sectional view of the semiconductor device along the line LXXV—LXXV in FIG. 73.

FIGS. 73 to 75 show the semiconductor device according to the 16th embodiment of the present invention. FIG. 73 is a plan view of the semiconductor device, FIG. 74 is a sectional view thereof along the line LXXIV—LXXIV in FIG. 73, and FIG. 75 is a sectional view thereof along the line LXXV—LXXV in FIG. 73.

A first thermal conductive member 21a is formed on one major surface of an insulating board 11a. The first thermal conductive member 21a consists of a material having a high thermal conductivity, such as copper (thickness: about 35 μm).

For example, a semiconductor chip 15 is to be mounted on the first thermal conductive member 21a. The first thermal conductive member 21a conforms to the shape of the semiconductor chip. The shape of the first thermal conductive member 21a is formed to be, e.g., a square having one side of about 12 mm when viewed from one major surface of the insulating board 11a.

An annular second thermal conductive member 21b is formed around the first thermal conductive member 21a on one major surface of the insulating board 11a. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the second thermal conductive member 21b is formed to be a frame-like square shape having a width of about 5 mm when viewed from one major surface of the insulating board 11a.

A plurality of wiring patterns 22a and 22b to surround the four sides of the first thermal conductive member 21a are formed on one major surface of the insulating board 11a. The wiring patterns 22a are located inside the frame-like second thermal conductive member 21b, and the leads 22b are located outside the frame-like second thermal conductive member 21b.

A plurality of wiring patterns 22c are formed on the other major surface of the insulating board 11a. Through holes 25 are formed in the insulating board 11a between the wiring patterns 22a and 22b and the wiring patterns 22c.

Each through hole 25 is formed to have a diameter of, e.g., about 200 μm. Wiring patterns 22d are formed on the side surfaces of the through holes 25. Each wiring pattern 22d consists of, e.g., copper (thickness: about 35 μm). The wiring patterns 22d may be formed only on the side surfaces of the through holes 25, and each through hole 25 may be filled with a paste containing aluminum nitride or high-heat conductive particles (e.g., a metal).

The other major surface of the insulating board 11a and one major surface of an insulating board 11b are coupled to each other.

Third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 μm are formed in the insulating boards 11a and 11b.

A fourth thermal conductive member 21d is formed on the side surface of each through hole 23. The fourth thermal conductive member 21d consists of a material having a high thermal conductivity, such as copper (thickness: about 35 μm).

Moreover, at least one through hole 24 is formed in the insulating boards 11a and 11b between the second and third thermal conductive members 21b and 21c. Forty-nine (7 columns×7 rows) through holes 24 each having a diameter of about 200 μm are formed in the insulating boards 11a and 11b.

The fourth thermal conductive member 21d is formed on the side surface of each through hole 24. The fourth thermal conductive member 21d consists of a material having a high thermal conductivity, such as copper (thickness: about 35 μm).

Note that the fourth thermal conductive members 21d may be formed only on the side surfaces of the through holes 23 and 24, and each through hole 24 may be filled with a paste containing aluminum nitride or high-heat conductive particles (e.g., a metal).

The semiconductor chip 15 is adhered to the first thermal conductive member 21a with an adhesive (e.g., a conductive paste containing silver) having a high thermal conductivity. The semiconductor chip 15 and wiring patterns 22 on the insulating boards 11a and 11b are electrically connected to each other through bonding wires 34.

The semiconductor chip 15 and the bonding wires 34 are covered with a resin 33.

The heat sink 103 is mounted on the second thermal conductive member 21b.

According to the printed circuit board having the above arrangement and the semiconductor device using the same, the semiconductor chip 15 is mounted on the first thermal conductive member 21a of the insulating boards 11a and 11b, and the heat sink 103 is mounted on the second thermal conductive member 21b of the insulating boards 11a and 11b. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

The semiconductor chip 15 can be protected by the heat sink 103.

[Q] Next, a printed circuit board according to the 17th embodiment of the present invention and a semiconductor device using the same will be described below.

FIGS. 76 to 78 show the semiconductor device according to the 17th embodiment of the present invention. FIG. 76 is a plan view of the semiconductor device, FIG. 77 is a sectional view thereof along the line LXXVII—LXXVII in FIG. 76, and FIG. 78 is a sectional view thereof along the line LXXVIII—LXXVIII in FIG. 76.

A first thermal conductive member 21a is formed on one major surface of an insulating board 11. The first thermal conductive member 21a consists of a material having a high thermal conductivity, such as copper (thickness: about 35 μm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11.

A plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 μm).

A heat sink 103 is to be mounted on the second thermal conductive members 21b. For this reason, the second thermal conductive members 21b are formed to facilitate mounting of the heat sink 103. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

Third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11.

A fourth thermal conductive member 21d is formed on the side surface of each through hole 23. The fourth thermal conductive member 21d consists of a material having a high thermal conductivity, such as copper (thickness: about 35 μm).

Moreover, at least one through hole 24 is formed in the insulating board 11 between the second and third thermal conductive members 21b and 21c. Forty-nine (7 columns×7 rows) through holes 24 each having a diameter of about 200 μm are formed in the insulating board 11.

The fourth thermal conductive member 21d is formed on the side surface of each through hole 24. The fourth thermal conductive member 21d consists of a material having a high thermal conductivity, such as copper (thickness: about 35 μm).

Note that the fourth thermal conductive members 21d may be formed only on the side surfaces of the through holes 23 and 24, and each through hole 24 may be filled with a paste containing aluminum nitride or high-heat conductive particles (e.g., a metal).

The TCP 102 is adhered to the first thermal conductive member 21a with an adhesive (e.g., a conductive paste containing silver) having a high thermal conductivity. The lower surface of the semiconductor chip 15 faces the heat sink 103 side.

Figure 82:
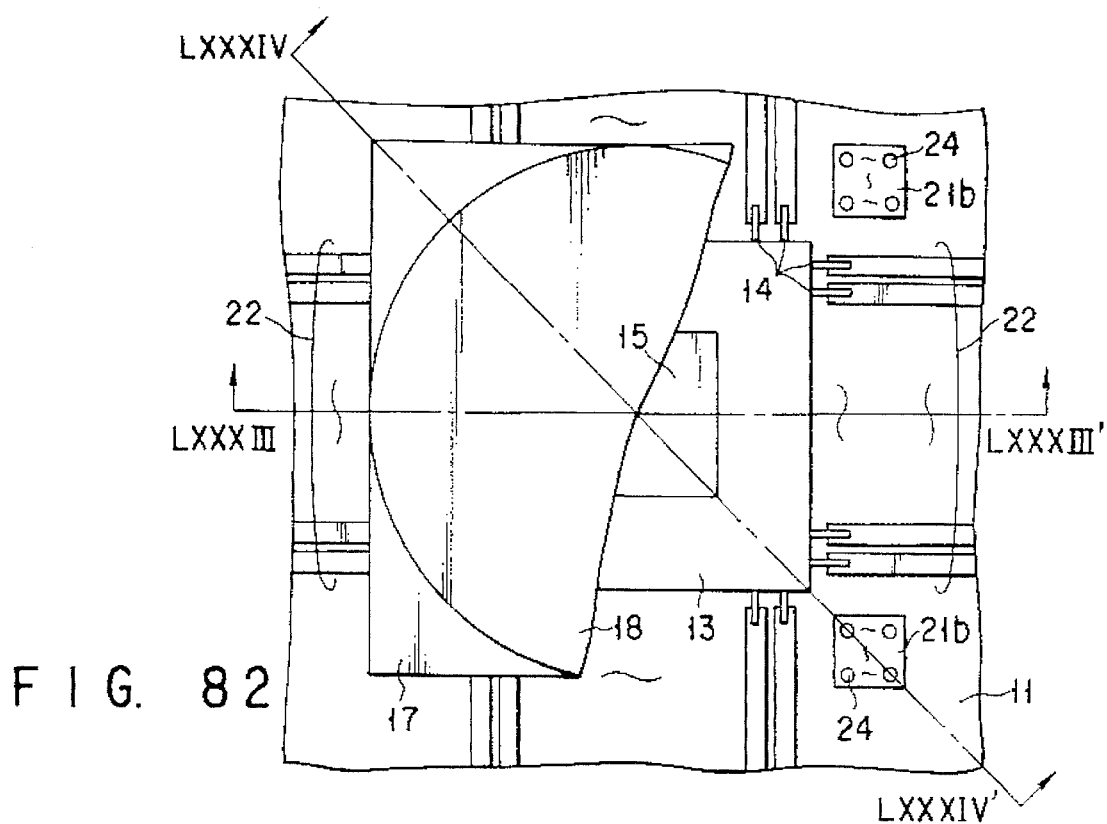
FIG. 82 is a plan view showing the semiconductor device according to the 17th embodiment of the present invention.
Figure 83:
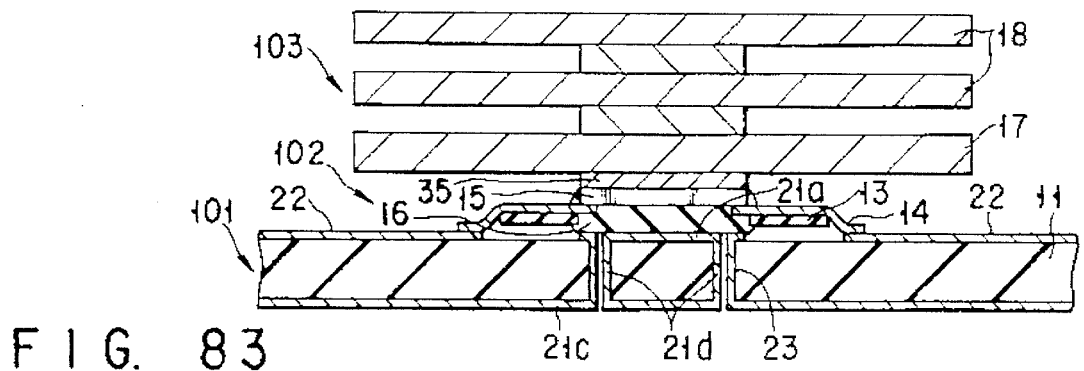
FIG. 83 is a sectional view of the semiconductor device along the line LXXXIII—LXXXIII in FIG. 82.
Figure 84:
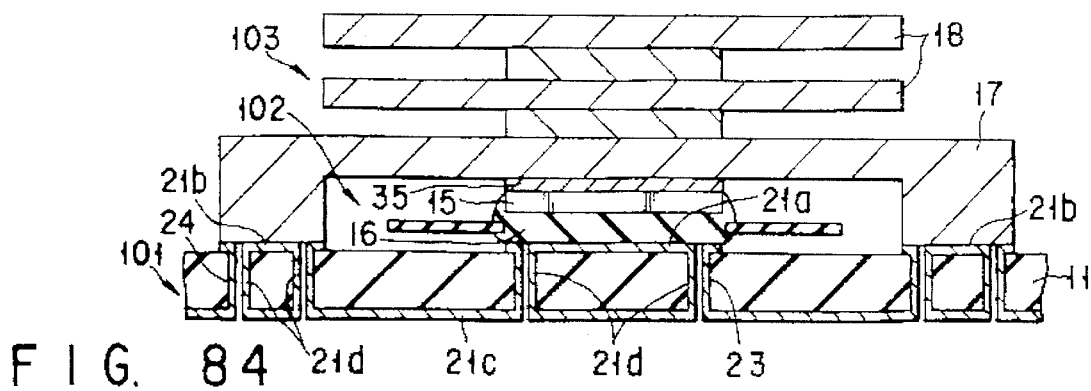
FIG. 84 is a sectional view of the semiconductor device along the line LXXXIV—LXXXIV in FIG. 82.

As shown in FIGS. 82 to 84, the lower surface of a semiconductor chip 15 and a heat sink may be adhered to each other with an adhesive (e.g., a conductive paste containing silver) 35 having a high thermal conductivity.

Leads 14 of the TCP 102 and the wiring patterns 22 of the insulating board 11 are electrically connected to each other.

The heat sink 103 is mounted on the second thermal conductive members 21b.

According to the printed circuit board having the above arrangement and the semiconductor device using the same, the semiconductor chip of the TCP 102 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

[R] Next, a printed circuit board according to the 18th embodiment of the present invention and a semiconductor device using the same will be described below.

Figure 79:
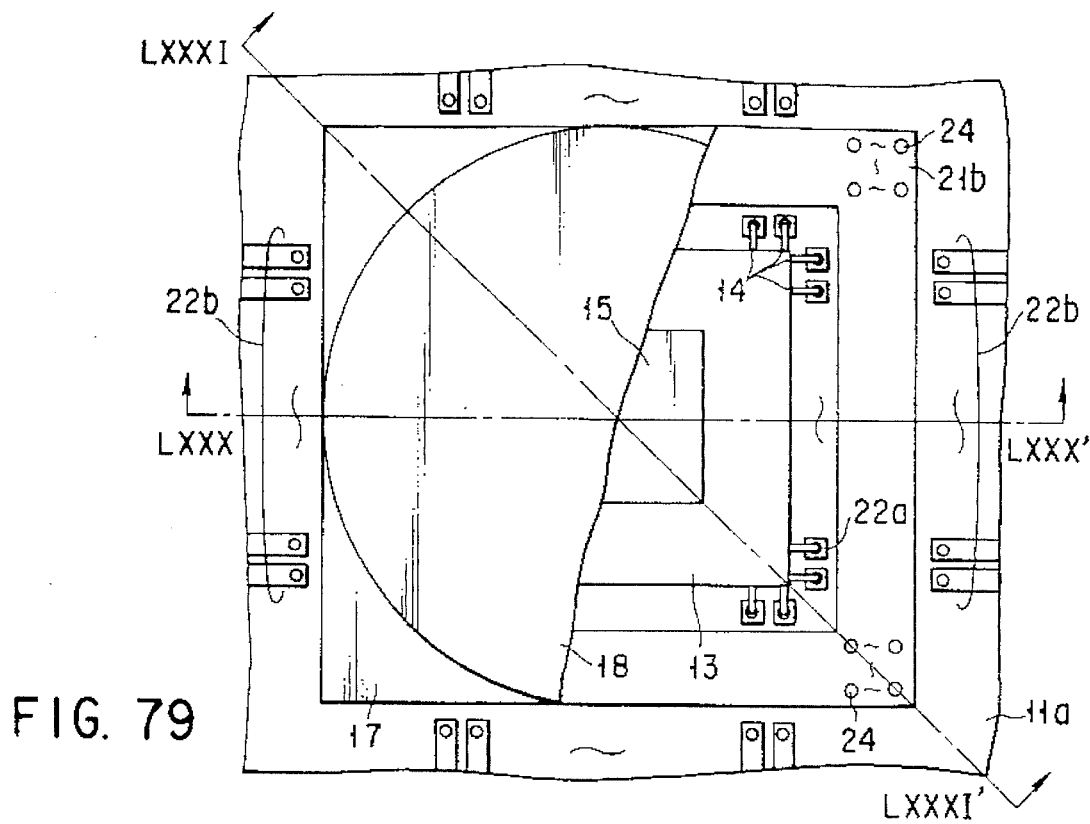
FIG. 79 is a plan view showing a semiconductor device according to the 18th embodiment of the present invention.
Figure 80:
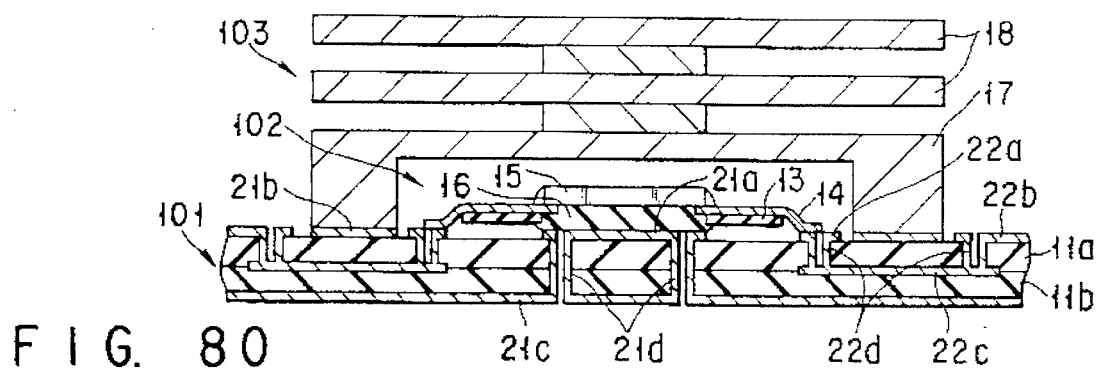
FIG. 80 is a sectional view of the semiconductor device along the line LXXX—LXXX in FIG. 79.
Figure 81:
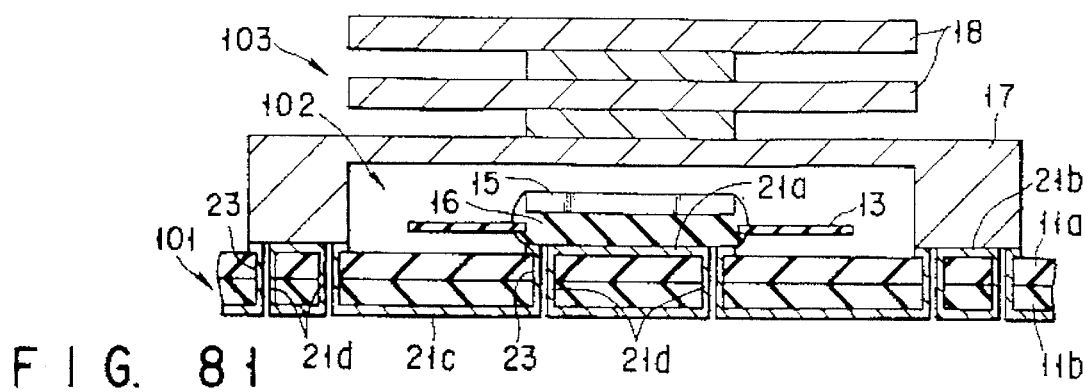
FIG. 81 is a sectional view of the semiconductor device along the line LXXXI—LXXXI in FIG. 79.

FIGS. 79 to 81 show the semiconductor device according to the 18th embodiment of the present invention. FIG. 79 is a plan view of the semiconductor device, FIG. 80 is a sectional view thereof along the line LXXX—LXXX in FIG. 79, and FIG. 81 is a sectional view thereof along the line LXXXI—LXXXI in FIG. 79.

A first thermal conductive member 21a is formed on one major surface of an insulating board 11a. The first thermal conductive member 21a consists of a material having a high thermal conductivity, such as copper (thickness: about 35 μm).

For example, a semiconductor chip 15 of a TCP 102 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11a.

An annular second thermal conductive member 21b is formed around the first thermal conductive member 21a on one major surface of the insulating board 11a. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the second thermal conductive member 21b is formed to be a frame-like square shape having a width of about 5 mm when viewed from one major surface of the insulating board 11a.

A plurality of wiring patterns 22a and 22b to surround the four sides of the first thermal conductive member 21a are formed on one major surface of the insulating board 11a. The wiring patterns 22a are located inside the frame-like second thermal conductive member 21b, and the leads 22b are located outside the frame-like second thermal conductive member 21b.

A plurality of wiring patterns 22c are formed on the other major surface of the insulating board 11a. Through holes 25 are formed in the insulating board 11a between the wiring patterns 22a and 22b and the wiring patterns 22c.

Each through hole 25 is formed to have a diameter of, e.g., about 200 µm. Wiring patterns 22d are formed on the side surfaces of the through holes 25. Each wiring pattern 22d consists of, e.g., copper (thickness: about 35 µm). The wiring patterns 22d may be formed only on the side surfaces of the through holes 25, and each through hole 25 may be filled with a paste containing aluminum nitride or high-heat conductive particles (e.g., a metal).

The other major surface of the insulating board 11a and one major surface of an insulating board 11b are coupled to each other.

Third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 µm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 µm are formed in the insulating boards 11a and 11b.

A fourth thermal conductive member 21d is formed on the side surface of each through hole 23. The fourth thermal conductive member 21d consists of a material having a high thermal conductivity, such as copper (thickness: about 35 µm).

Moreover, at least one through hole 24 is formed in the insulating boards 11a and 11b between the second and third thermal conductive members 21b and 21c. Forty-nine (7 columns×7 rows) through holes 24 each having a diameter of about 200 µm are formed in the insulating boards 11a and 11b.

The fourth thermal conductive member 21d is formed on the side surface of each through hole 24. The fourth thermal conductive member 21d consists of a material having a high thermal conductivity, such as copper (thickness: about 35 µm).

Note that the fourth thermal conductive members 21d may be formed only on the side surfaces of the through holes 23 and 24, and each through hole 24 may be filled with a paste containing aluminum nitride or high-heat conductive particles (e.g., a metal).

The TCP 102 is adhered to the first thermal conductive member 21a with an adhesive (e.g., a conductive paste containing silver) having a high thermal conductivity. The lower surface of the semiconductor chip 15 faces the heat sink 103 side.

Figure 85:
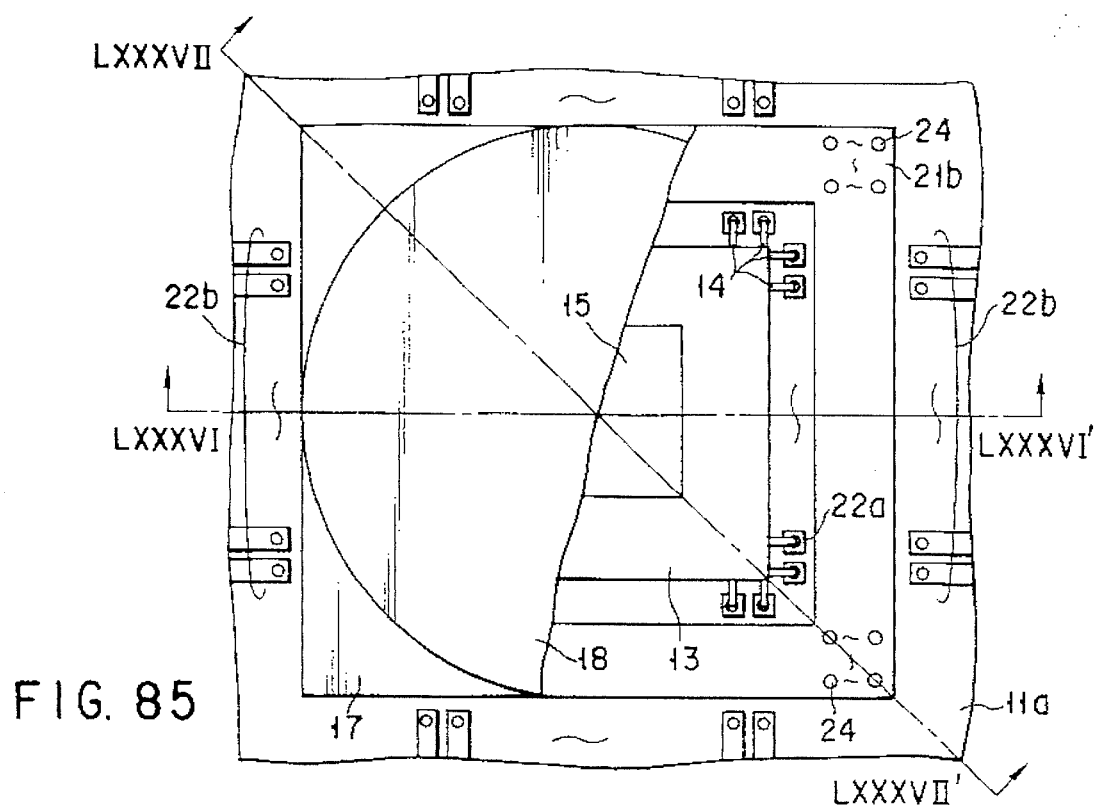
FIG. 85 is a plan view showing the semiconductor device according to the 18th embodiment of the present invention.
Figure 86:
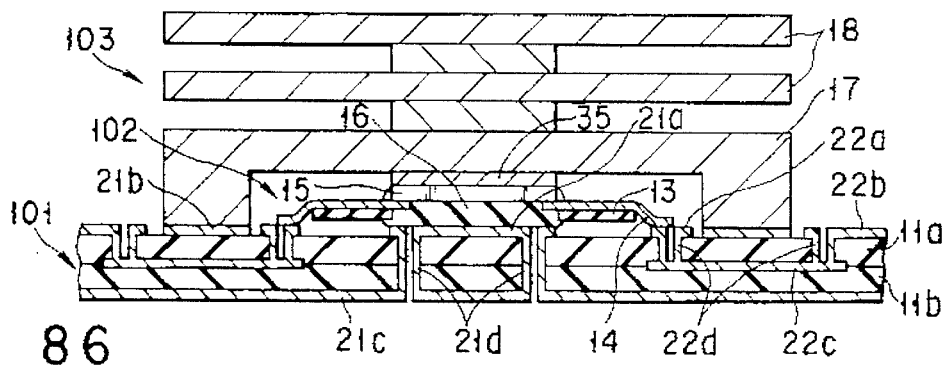
FIG. 86 is a sectional view of the semiconductor device along the line LXXXVI—LXXXVI in FIG. 85.
Figure 87:
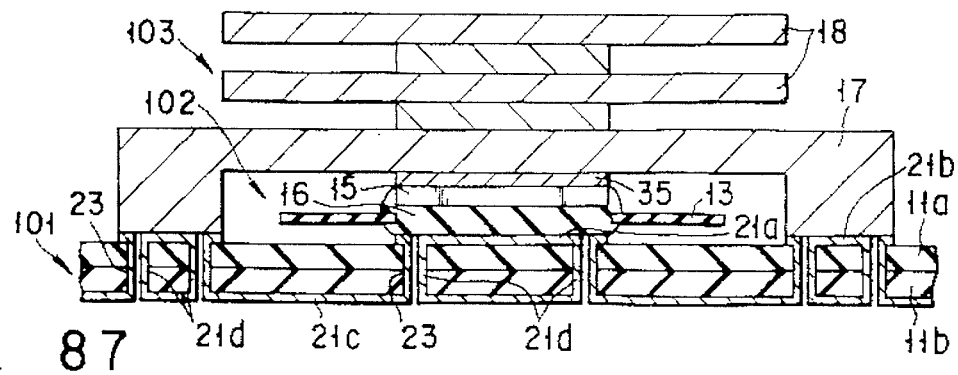
FIG. 87 is a sectional view of the semiconductor device along the line LXXXVII—LXXXVII in FIG. 85.

As shown in FIGS. 85 to 87, the lower surface of a semiconductor chip 15 and a heat sink may be adhered to each other with an adhesive (e.g., a conductive paste containing silver) 35 having a high thermal conductivity.

Leads 14 of the TCP 102 and wiring patterns 22 of the insulating boards 11a and 11b are electrically connected to each other.

The heat sink 103 is mounted on the second thermal conductive member 21b.

According to the printed circuit board having the above arrangement and the semiconductor device using the same, the semiconductor chip of the TCP 102 is mounted on the first thermal conductive member 21a of the insulating boards 11a and 11b, and the heat sink 103 is mounted on the second thermal conductive member 21b of the insulating boards 11a and 11b. Therefore, a heat sink need not be directly mounted on the semiconductor chip 15, and the leads of the TCP 102 and the like will not be damaged by the weight of the heat sink.

Heat generated by the semiconductor chip 15 of the TCP 102 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

[S] Next, a printed circuit board according to the 19th embodiment of the present invention and a semiconductor device using the same will be described below.

FIGS. 88 to 90 show the semiconductor device according to the 19th embodiment of the present invention. FIG. 88 is a plan view of the semiconductor device, FIG. 89 is a sectional view thereof along the line LXXXIX—LXXXIX in FIG. 88, and FIG. 90 is a sectional view thereof along the line XC—XC in FIG. 88.

A first thermal conductive member 21a is formed on one major surface of an insulating board 11. The first thermal conductive member 21a consists of a material having a high thermal conductivity, such as copper (thickness: about 35 µm).

For example, a semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11.

A plurality of wiring patterns 22 to surround the four sides of the first thermal conductive member 21a are formed on one major surface of the insulating board 11.

At least one second thermal conductive member 21b is formed around the first thermal conductive member 21a on one major surface of the insulating board 11. The second thermal conductive member 21b consists of a material having a high thermal conductivity, such as copper (thickness: about 35 µm).

A heat sink 103 is to be mounted on the second thermal conductive members 21b. For this reason, the second thermal conductive members 21b are formed to facilitate mounting of the heat sink 103. For example, each second thermal conductive member 21b is located on a line extending from the diagonal line of the first thermal conductive member 21a. In this embodiment, the four second thermal conductive members 21b are formed around the first thermal conductive member 21a. The shape of each second thermal conductive member 21b is formed to be a square having each side of about 5 mm when viewed from one major surface of the insulating board 11.

Third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11.

A fourth thermal conductive member 21d is formed on the side surface of each through hole 23. The fourth thermal conductive member 21d consists of a material having a high thermal conductivity, such as copper (thickness: about 35 μm).

Moreover, at least one through hole 24 is formed in the insulating board 11 between the second and third thermal conductive members 21b and 21c. Forty-nine (7 columns×7 rows) through holes 24 each having a diameter of about 200 μm are formed in the insulating board 11.

The fourth thermal conductive member 21d is formed on the side surface of each through hole 24. The fourth thermal conductive member 21d consists of a material having a high thermal conductivity, such as copper (thickness: about 35 μm).

Note that the fourth thermal conductive members 21d may be formed only on the side surfaces of the through holes 23 and 24, and each through hole 24 may be filled With a paste containing aluminum nitride or high-heat conductive particles (e.g., a metal).

The semiconductor chip 15 is located on the first thermal conductive member 21a through a resin 33. The semiconductor chip 15 and the wiring patterns 22 of the insulating board 11 are electrically connected to each other through bumps 36.

Figure 94:
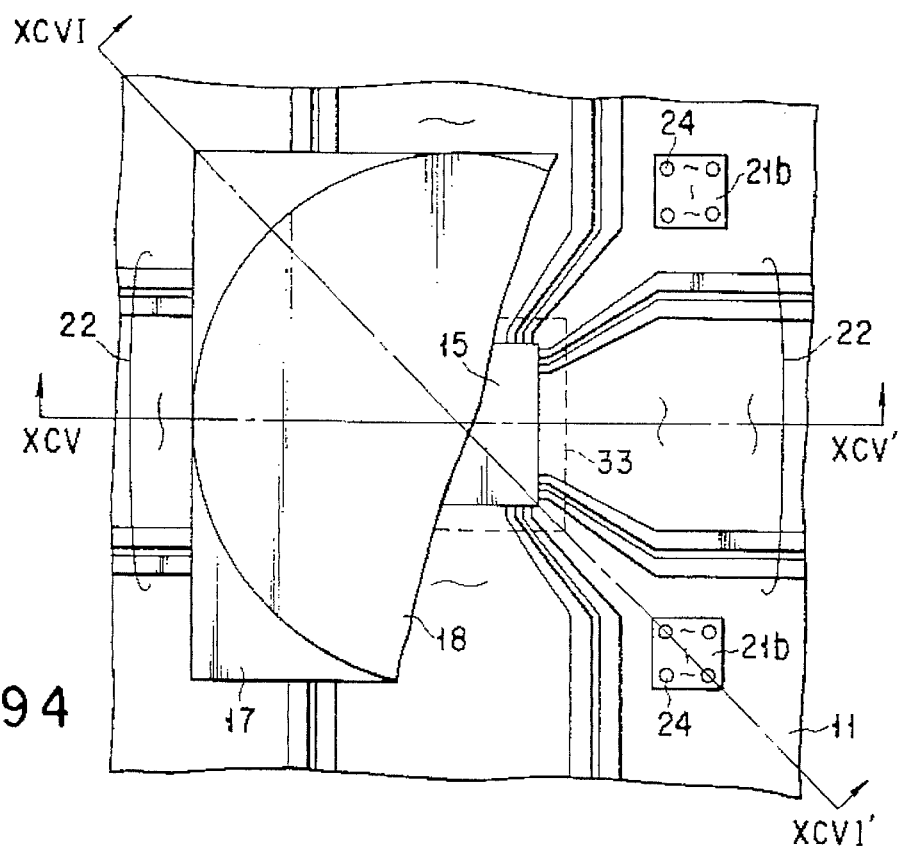
FIG. 94 is a plan view showing the semiconductor device according to the 19th embodiment of the present invention.
Figure 95:
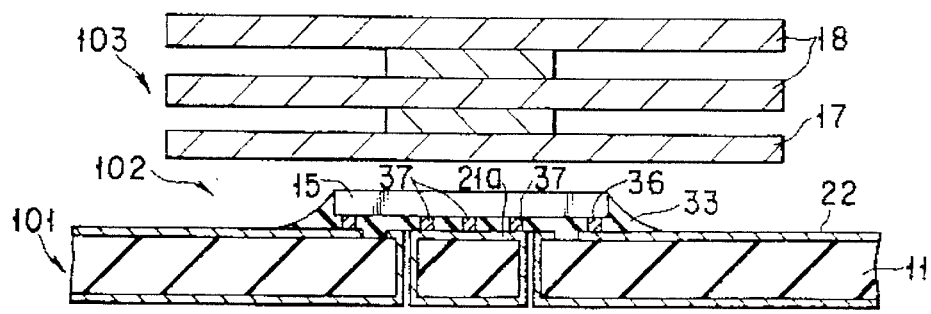
FIG. 95 is a sectional view of the semiconductor device along the line XCV—XCV in FIG. 94.
Figure 96:
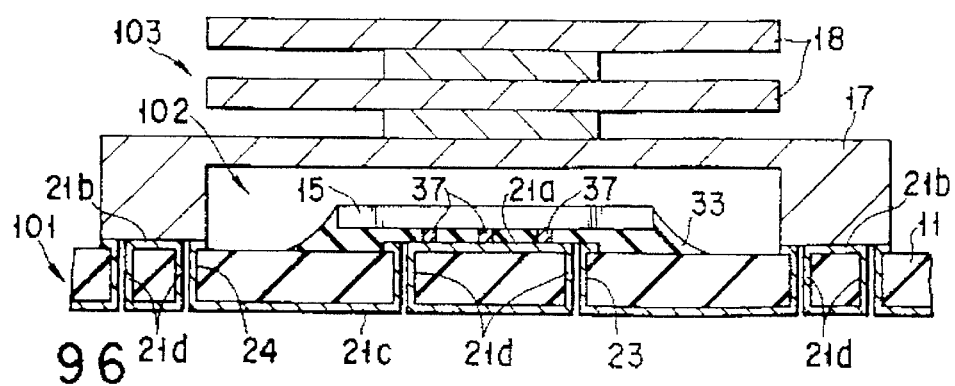
FIG. 96 is a sectional view of the semiconductor device along the line XCVI—XCVI in FIG. 94.

As shown in FIGS. 94 to 96, the semiconductor chip 15 and the first thermal conductive member 21a may be connected to each other through low-heat resistive bumps 37.

The heat sink 103 is mounted on the second thermal conductive members 21b.

According to the printed circuit board having the above arrangement and the semiconductor device using the same, the semiconductor chip 15 is mounted on the first thermal conductive member 21a of the insulating board 11, and the heat sink 103 is mounted on the second thermal conductive members 21b of the insulating board 11. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

The semiconductor chip 15 itself can be protected by the heat sink 103.

[T] Next, a printed circuit board according to the 20th embodiment of the present invention and a semiconductor device using the same will be described below.

Figure 91:
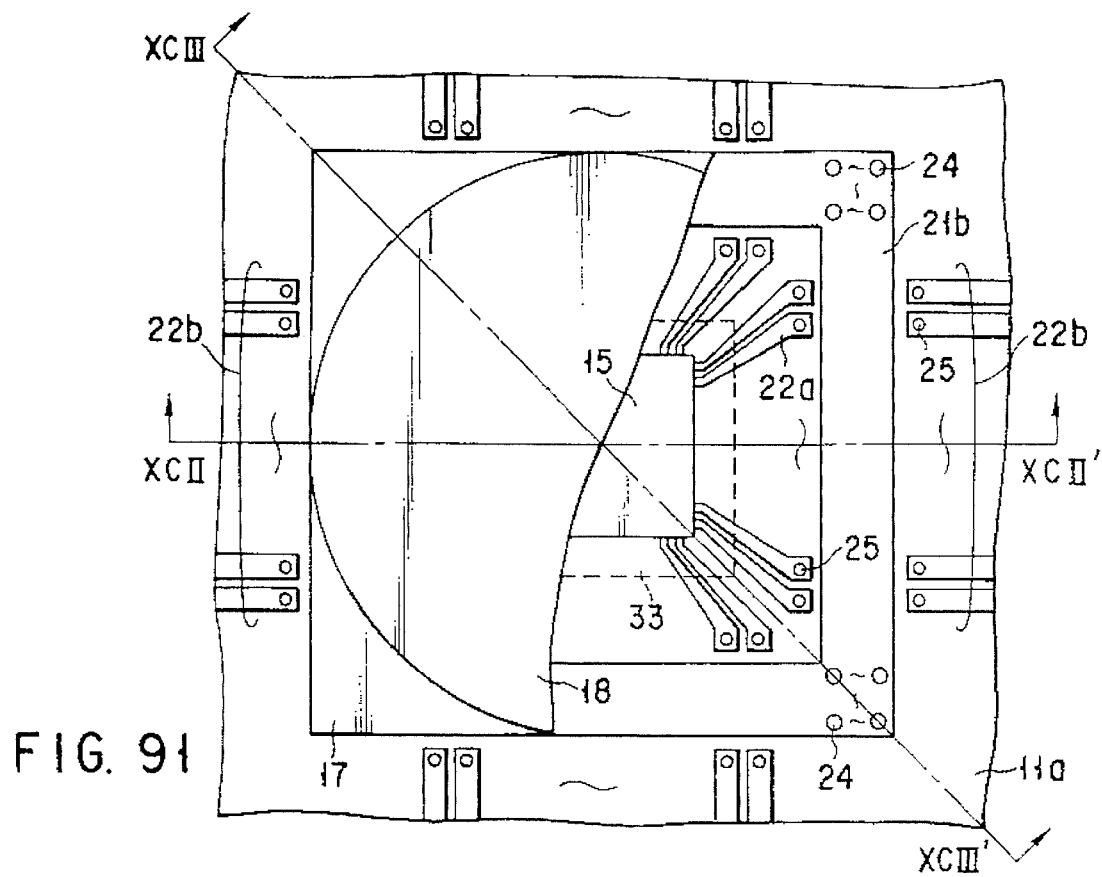
FIG. 91 is a plan view showing a semiconductor device according to the 20th embodiment of the present invention.
Figure 92:
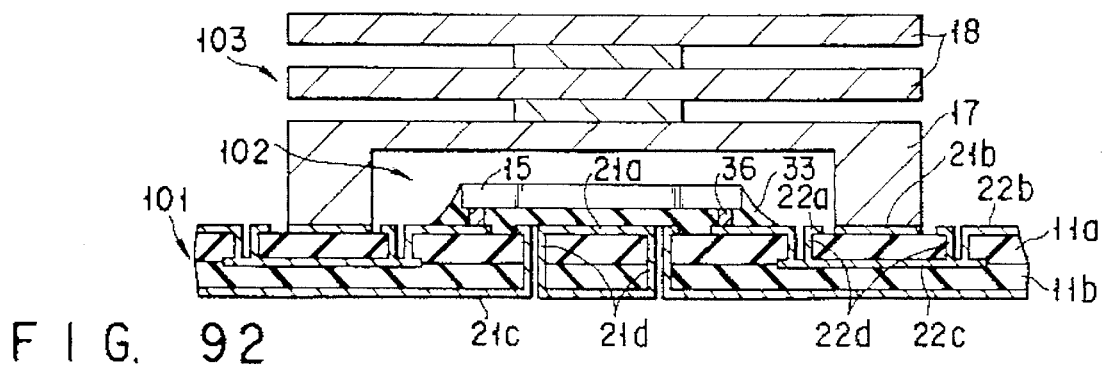
FIG. 92 is a sectional view of the semiconductor device along the line XCII—XCII in FIG. 91.
Figure 93:
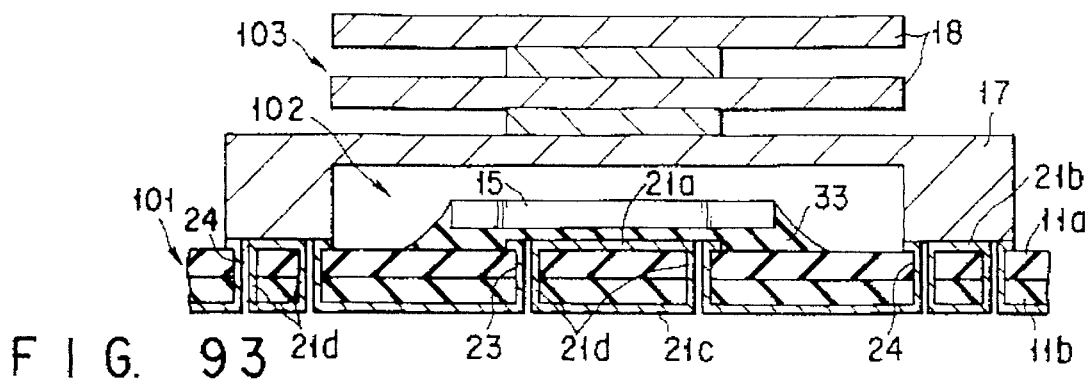
FIG. 93 is a sectional view of the semiconductor device along the line XCIII—XCIII in FIG. 91.

FIGS. 91 to 93 show the semiconductor device according to the 20th embodiment of the present invention. FIG. 91 is a plan view of the semiconductor device, FIG. 92 is a sectional view thereof along the line XCII—XCII in FIG. 91, and FIG. 93 is a sectional view thereof along the line XCIII—XCIII in FIG. 91.

A first thermal conductive member 21a is formed on one major surface of an insulating board 11a. The first thermal conductive member 21a consists of a material having a high thermal conductivity, such as copper (thickness: about 35 μm).

For example, a semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the insulating board 11a.

An annular second thermal conductive member 21b is formed around the first thermal conductive member 21a on one major surface of the insulating board 11a. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the second thermal conductive member 21b is formed to be a frame-like square shape having a width of about 5 mm when viewed from one major surface of the insulating board 11a.

A plurality of wiring patterns 22a and 22b to surround the four sides of the first thermal conductive member 21a are formed on one major surface of the insulating board 11a. The wiring patterns 22a are located inside the frame-like second thermal conductive member 21b, and the leads 22b are located outside the frame-like second thermal conductive member 21b.

A plurality of wiring patterns 22c are formed on the other major surface of the insulating board 11a. Through holes 25 are formed in the insulating board 11a between the wiring patterns 22a and 22b and the wiring patterns 22c.

Each through hole 25 is formed to have a diameter of, e.g., about 200 μm. Wiring patterns 22d are formed on the side surfaces of the through holes 25. Each wiring pattern 22d consists of, e.g., copper (thickness: about 35 μm). The wiring patterns 22d may be formed on the side surfaces of the through holes 25, and each through hole 25 may be filled with a paste containing aluminum nitride or high-heat conductive particles (e.g., a metal).

The other major surface of the insulating board 11a and one major surface of an insulating board 11b are coupled to each other.

Third thermal conductive members 21c are formed on the other major surface of the insulating board 11b at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11b. For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11b.

At least one through hole 23 is formed in the insulating boards 11a and 11b between the first and third thermal conductive members 21a and 21c. For example, 121 (11 columns×11 rows) through holes 23 each having a diameter of, e.g., about 200 μm are formed in the insulating boards 11a and 11b.

A fourth thermal conductive member 21d is formed on the side surface of each through hole 23. The fourth thermal conductive member 21d consists of a material having a high thermal conductivity, such as copper (thickness: about 35 μm).

Moreover, at least one through hole 24 is formed in the insulating boards 11a and 11b between the second and third thermal conductive members 21b and 21c. Forty-nine (7 columns×7 rows) through holes 24 each having a diameter of about 200 μm are formed in the insulating boards 11a and 11b.

The fourth thermal conductive member 21d is formed on the side surface of each through hole 24. The fourth thermal conductive member 21d consists of a material having a high thermal conductivity, such as copper (thickness: about 35 μm).

Note that the fourth thermal conductive members 21d may be formed only on the side surfaces of the through holes 23 and 24, and each through hole 24 may be filled with a paste containing aluminum nitride or high-heat conductive particles (e.g., a metal).

The semiconductor chip 15 is located on the first thermal conductive member 21a through a resin 33. The semiconductor chip 15 and the wiring patterns 22a of the insulating boards 11a and 11b are electrically connected to each other through bumps 36.

Figure 97:
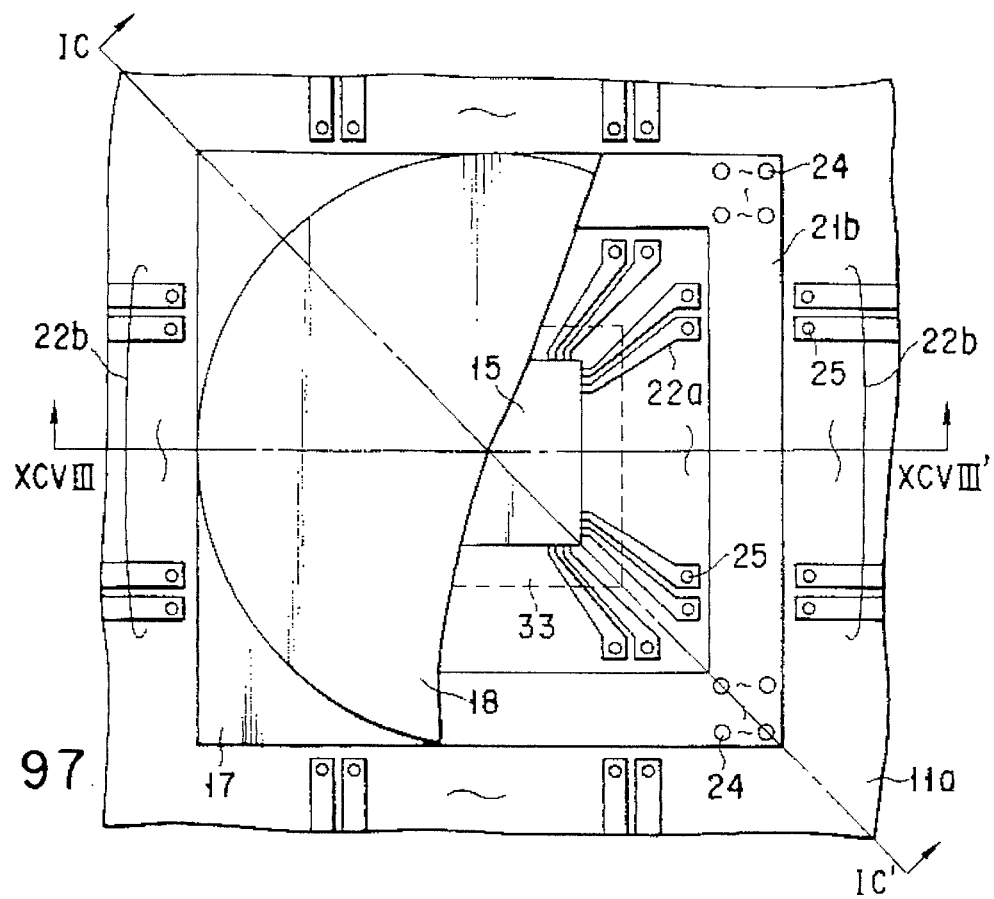
FIG. 97 is a plan view showing the semiconductor device according to the 20th embodiment of the present invention.
Figure 98:
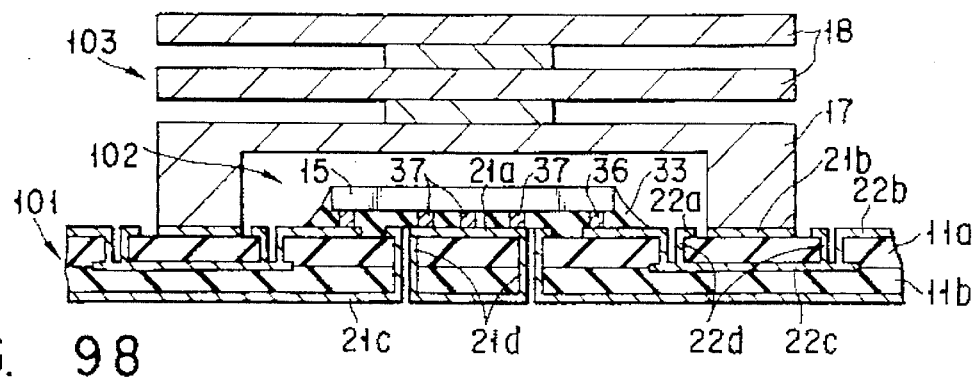
FIG. 98 is a sectional view of the semiconductor device along the line XCVIII—XCVIII in FIG. 97.
Figure 99:
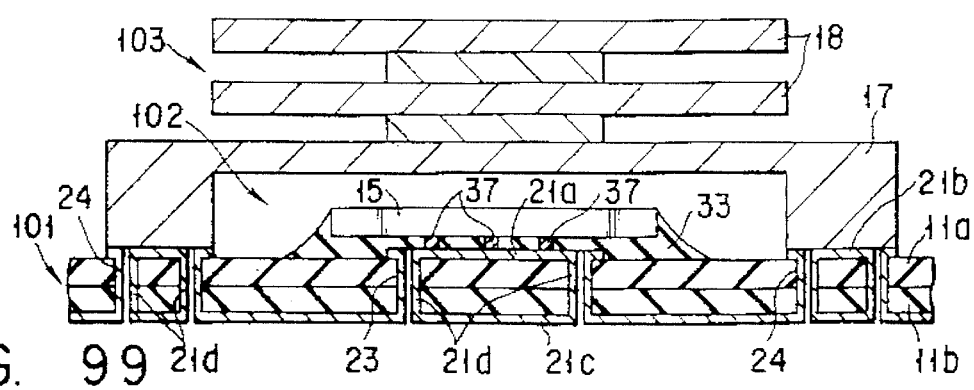
FIG. 99 is a sectional view of the semiconductor device a the line IC—IC in FIG. 97.

As shown in FIGS. 97 to 99, the semiconductor chip 15 and the first thermal conductive member 21a may be connected to each other through low-heat resistive bumps 37.

The heat sink 103 is mounted on the second thermal conductive member 21b.

According to the printed circuit board having the above arrangement and the semiconductor device using the same, the semiconductor chip 15 is mounted on the first thermal conductive member 21a of the insulating boards 11a and 11b, and the heat sink 103 is mounted on the second thermal conductive member 21b of the insulating boards 11a and 11b. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

The semiconductor chip 15 can be protected by the heat sink 103.

[U] First of all, a printed circuit board according to the 21st embodiment of the present invention and a semiconductor device using the same will be described below.

(a) FIGS. 101 and 102 show the printed circuit board according to the 21st embodiment of the present invention. FIG. 101 is a plan view of the printed circuit board, and FIG. 102 is a sectional view thereof along the line CII—CII in FIG. 101.

A printed circuit board 101 comprises an insulating board (e.g., epoxy glass) 11, first to fourth thermal conductive members 21a to 21d, wiring patterns 22, and through holes 23 and 24.

The four first thermal conductive members 21a are formed on one major surface of the insulating board 11. Each first thermal conductive member 21a consists of a material having a high thermal conductivity, such as copper (thickness: about 35 μm).

For example, a semiconductor chip of a TCP is to be mounted on each first thermal conductive member 21a. Each first thermal conductive member 21a conforms to the shape of the semiconductor chip. The shape of each first thermal conductive member 21a is formed to be, e.g., a square having one side of about 12 mm when viewed from one major surface of the insulating board 11.

The plurality of wiring patterns 22 to surround the four sides of each first thermal conductive member 21a are formed on one major surface of the insulating board 11.

One second thermal conductive member 21b is formed on one major surface of the insulating board 11 at a position with an equal distance from the first thermal conductive members 21a. The second thermal conductive member 21b consists of a material having a high thermal conductivity, such as copper (thickness: about 35 μm).

A heat sink to be commonly used by the four TCPs is to be mounted on the second thermal conductive member 21b. For this reason, the second thermal conductive member 21b is formed to facilitate mounting of the heat sink. For example, the shape of the second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11.

For example, when the third thermal conductive members 21c are formed only immediately below the first and second thermal conductive members 21a and 21b, the shape of each third thermal conductive member 21c is formed to be a square having one side of about 50 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11. The fourth thermal conductive member 21d is formed on the side surface of each through hole 23. The fourth thermal conductive member 21d consists of a material having a high thermal conductivity, such as copper (thickness: about 35 μm).

Similarly, at least one through hole 24 is formed in the insulating board 11 between the second and third thermal conductive members 21b and 21c. Forty-nine (7 columns×7 rows) through holes 24 each having a diameter of about 200 µm are formed in the insulating board 11. The fourth thermal conductive member 21*d* is formed on the side surface of each through hole 24. The fourth thermal conductive member 21*d* consists of a material having a high thermal conductivity, such as copper (thickness: about 35 µm).

According to the printed circuit board having the above arrangement, the semiconductor chips are mounted on the corresponding first thermal conductive members 21*a*, and a heat sink is mounted on the second thermal conductive member 21*b*. Therefore, the leads of a package and the like will not be damaged by the weight of the heat sink because the heat sink need not be directly mounted on the semiconductor chips.

Heat generated by the semiconductor chips is conducted from the first thermal conductive members 21*a* to the heat sink through the fourth thermal conductive members 21*d*, the third thermal conductive members 21*c*, the fourth thermal conductive members 21*d*, and the second thermal conductive member 21*b*. Therefore, the heat generated by the semiconductor chips can be efficiently dissipated.

Figure 103:
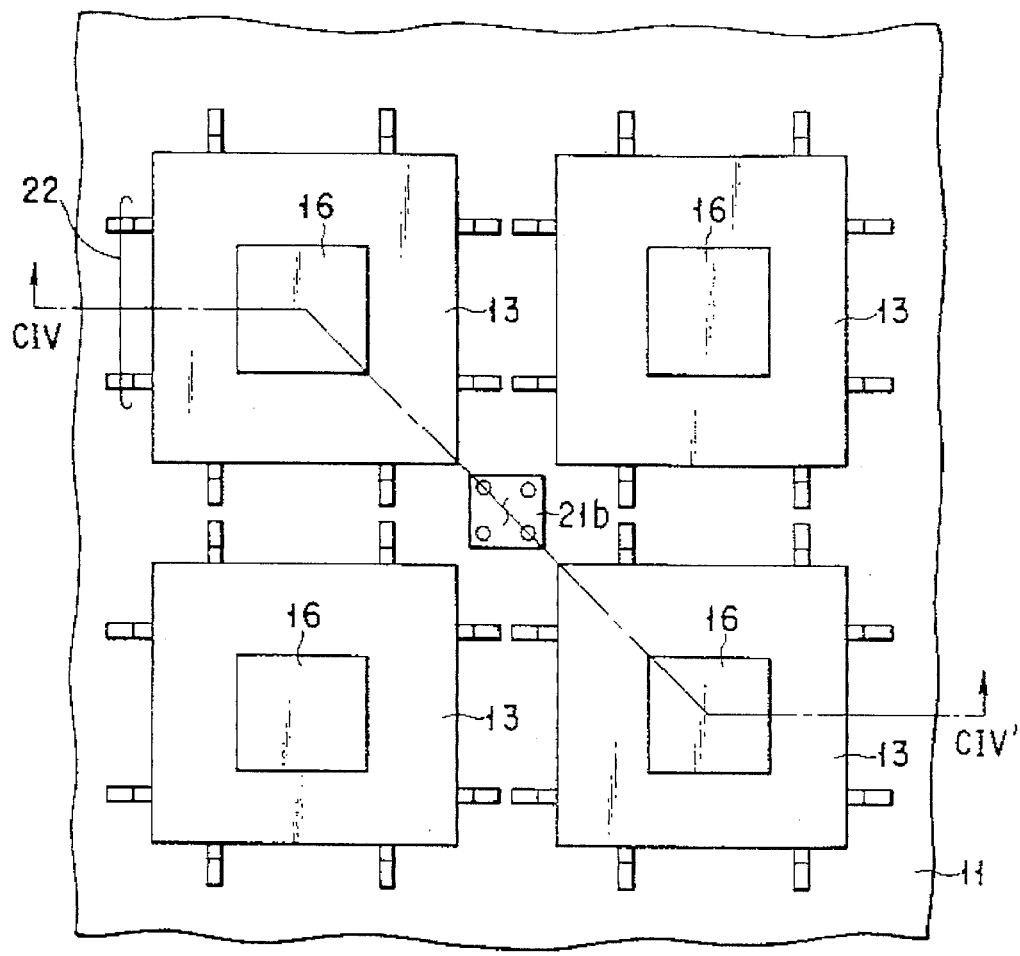
FIG. 103 is a plan view showing the semiconductor device according to the 21st embodiment of the present invention.
Figure 104:
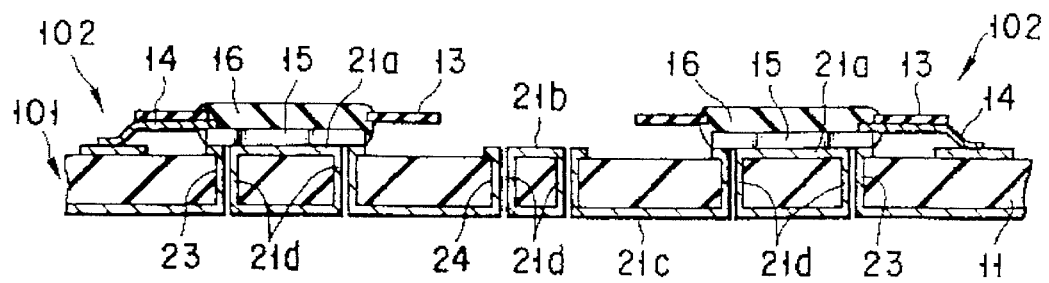
FIG. 104 is a sectional view of the semiconductor device along the line CIV—CIV in FIG. 103.

(b) FIGS. 103 and 104 show a state in which TCPs are mounted on the printed circuit board shown in FIGS. 101 and 102. FIG. 103 is a plan view of the printed circuit board, and FIG. 104 is a sectional view thereof along the line CIV—CIV in FIG. 103.

Each TCP 102 comprises a TAB tape constituted by a polyimide tape 13 and leads 14, a semiconductor chip 15 connected to one end of each of the leads 14, and a potting resin 16 which covers the semiconductor chip 15.

The lower surface (i.e., a surface on which a semiconductor element is not formed) of the semiconductor chip 15 of each TCP 102 is adhered to the corresponding first thermal conductive member 21*a* with an adhesive. If this adhesive consists of a material having a high thermal conductivity (e.g., a conductive paste containing silver), the heat resistance from the semiconductor chip 15 to the corresponding first thermal conductive member 21*a* can be reduced.

The leads 14 of each TCP 102 are connected to the corresponding wiring patterns 22 on the insulating board 11 by a solder or the like.

Note that, although each TCP 102 is mounted on the insulating board 11 such that the lower surface of the semiconductor chip 15 is adhered to the corresponding first thermal conductive member 21*a*, the upper surface (i.e., a surface on which a semiconductor element is formed) of the semiconductor chip may face the first thermal conductive member 21*a* side. In this case, an adhesive should not chemically corrode the polyimide tape 13.

Figure 105:
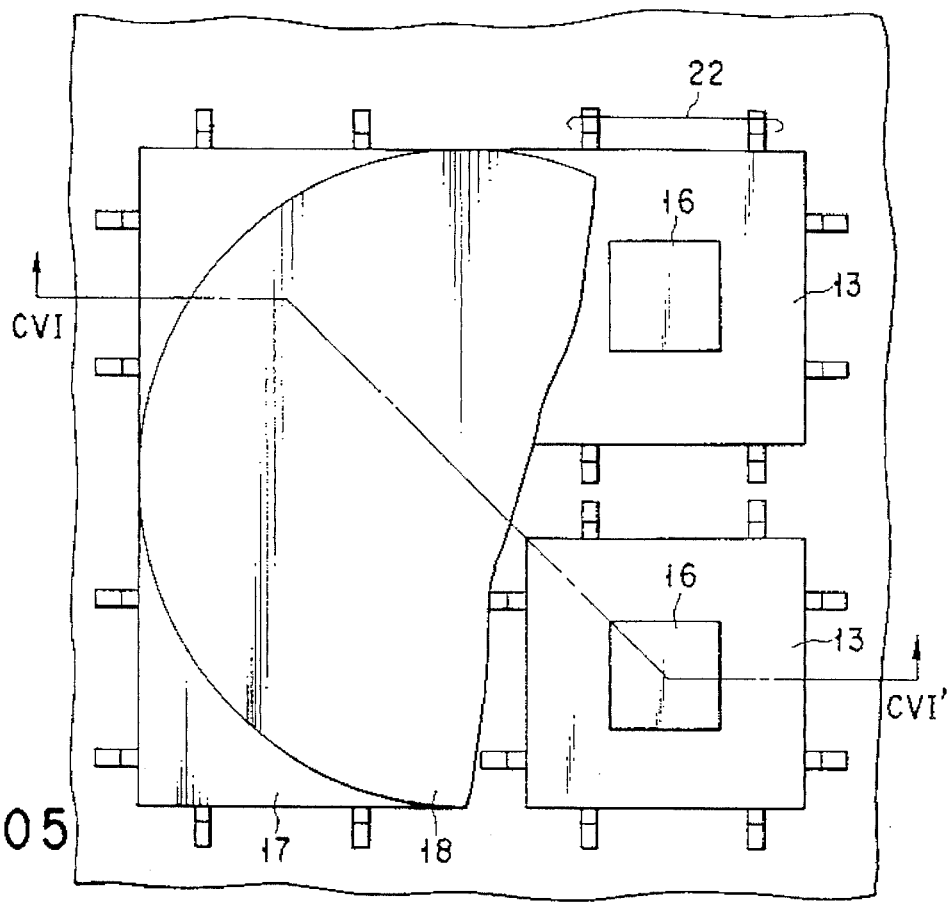
FIG. 105 is a plan view showing the semiconductor device according to the 21st embodiment of the present invention.
Figure 106:
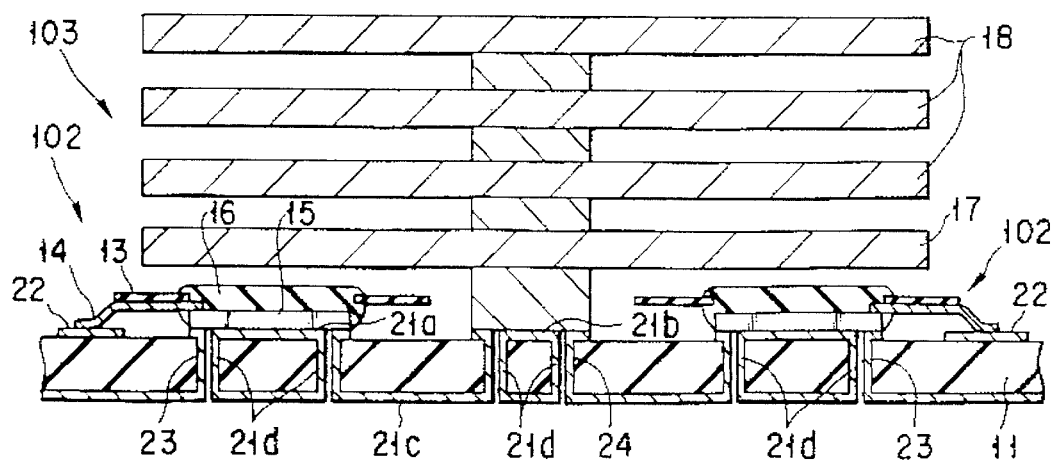
FIG. 106 is a sectional view of the semiconductor device along the line CVI—CVI in FIG. 105.

(c) FIGS. 105 and 106 show a semiconductor device in a state wherein a heat sink is mounted on the semiconductor device shown in FIGS. 103 and 104. FIG. 105 is a plan view of the semiconductor device, and FIG. 106 is a sectional view thereof along the line CVI—CVI in FIG. 105.

A heat sink 103 comprises a lid portion 17 and fin portions 18.

This lid portion 17 is mounted on the insulating board 11 so as to cover the TCPs 102. More specifically, the lid portion 17 comprises a square plate portion having one side of about 50 mm and a projecting portion formed at the central portion of the plate portion. The projecting portion of the lid portion 17 comprises a prism having one side of about 5 mm. The lid portion 17 consists of a material having a high thermal conductivity, such as aluminum.

The projecting portion of the lid portion 17 is adhered to the second thermal conductive member 21*b* of the insulating board 11 with an adhesive. If this adhesive consists of a material having a high thermal conductivity (e.g., a conductive paste containing silver), the heat resistance from the second thermal conductive member 21*b* to the heat sink can be reduced.

The lid portion 17 may be or need not be in contact with the TCPs 102. However, if they are in contact with each other, heat generated by the semiconductor chips of the TCPs 102 can be efficiently dissipated.

The fin portions 18 are mounted on the plate portion of the lid portion 17. The total surface area of the fin portions 18 must be maximized to facilitate heat diffusion. The fin portions 18 consist of a material having a high thermal conductivity, such as aluminum.

The lid portion 17 and the fin portions 18 of the heat sink may be integrally formed using one material. Alternatively, the lid portion 17 and the fin portions 18 of the heat sink may be independently formed. In this case, the material of the lid portion 17 may be the same as or different from that of the fin portions 18. The projecting portion of the lid portion 17 may be constituted by independent projecting portions, and the plate portion of the lid portion 17 and the fin portions 18 may be integrally formed.

According to the semiconductor device having the above arrangement, the semiconductor chips of the TCPs 102 are mounted on the corresponding first thermal conductive members 21*a* of the insulating board 11, and the heat sink 103 is mounted on the second thermal conductive member 21*b* of the insulating board 11. Therefore, a heat sink need not be directly mounted on the semiconductor chips 15, and the leads of the TCPs 102 and the like will not be damaged by the weight of the heat sink.

Heat generated by the semiconductor chips 15 of the TCPs 102 is directly conducted to the heat sink 103 and at the same time from the first thermal conductive members 21*a* to the heat sink 103 through the fourth thermal conductive members 21*d*, the third thermal conductive members 21*c*, the fourth thermal conductive members 21*d*, and the second thermal conductive member 21*b*. Therefore, the heat generated by the semiconductor chips 15 can be efficiently dissipated.

Since almost all the heat generated by the semiconductor chips 15 can be absorbed by the heat sink 103, the semiconductor chips 15 will not adversely affect adjacent chips.

Since one heat sink is shared by the four TCPs, an interval between adjacent heat sinks required when one heat sink is used for one TCP need not be set, increasing an efficiency in heat dissipation.

[V] First of all, a printed circuit board according to the 22nd embodiment of the present invention and a semiconductor device using the same will be described below.

Figure 108:
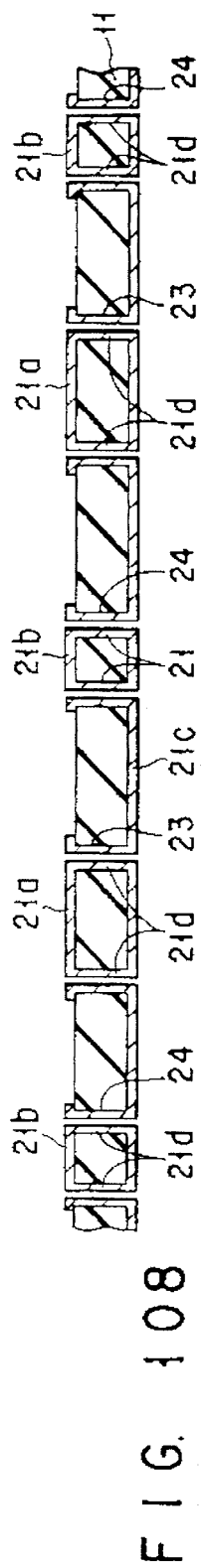
FIG. 108 is a sectional view of the semiconductor device along the line CVIII—CVIII in FIG. 107.

(a) FIGS. 107 and 108 show the printed circuit board according to the 22nd embodiment of the present invention. FIG. 107 is a plan view of the printed circuit board, and FIG. 108 is a sectional view thereof along the line CVIII—CVIII in FIG. 107.

A printed circuit board 101 comprises an insulating board (e.g., epoxy glass) 11, first to fourth thermal conductive members 21*a* to 21*d*, wiring patterns 22, and through holes 23 and 24.

The four first thermal conductive members 21*a* are formed on one major surface of the insulating board 11. Each first thermal conductive member 21*a* consists of a material having a high thermal conductivity, such as copper (thickness: about 35 µm).

For example, a semiconductor chip of a TCP is to be mounted on each first thermal conductive member 21*a*. Each first thermal conductive member 21a conforms to the shape of the semiconductor chip. The shape of each first thermal conductive member 21a is formed to be, e.g., a square having one side of about 12 mm when viewed from one major surface of the insulating board 11.

The plurality of wiring patterns 22 to surround the four sides of each first thermal conductive member 21a are formed on one major surface of the insulating board 11.

The four second thermal conductive members 21b to surround the first thermal conductive members 21a are formed on one major surface of the insulating board 11. One second thermal conductive member 21b is formed at a position with an equal distance from the first thermal conductive members 21a. That is, the five second thermal conductive members 21b are formed on one major surface of the insulating board 11.

Each second thermal conductive member 21b consists of a material having a high thermal conductivity, such as copper (thickness: about 35 μm).

One heat sink to be commonly used by the four TCPs is to be mounted on the second thermal conductive members 21b. For this reason, each second thermal conductive member 21b is formed to facilitate mounting of the heat sink. For example, the shape of each second thermal conductive member 21b is formed to be a square having each side of about 5 mm when viewed from one major surface of the insulating board 11.

When the number of second thermal conductive members 21b is increased, the heat sink can be stably mounted on the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11.

For example, when the third thermal conductive members 21c are formed only immediately below the first and second thermal conductive members 21a and 21b, the shape of each third thermal conductive member 21c is formed to be a square having one side of about 100 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11. The fourth thermal conductive member 21d is formed on the side surface of each through hole 23. The fourth thermal conductive member 21d consists of a material having a high thermal conductivity, such as copper (thickness: about 35 μm).

Similarly, at least one through hole 24 is formed in the insulating board 11 between the second and third thermal conductive members 21b and 21c. Forty-nine (7 columns×7 rows) through holes 24 each having a diameter of about 200 μm are formed in the insulating board 11. The fourth thermal conductive member 21d is formed on the side surface of each through hole 24. The fourth thermal conductive member 21d consists of a material having a high thermal conductivity, such as copper (thickness: about 35 μm).

According to the printed circuit board having the above arrangement, the semiconductor chips are mounted on the corresponding first thermal conductive members 21a, and a heat sink is mounted on the second thermal conductive members 21b. Therefore, the leads of a package and the like will not be damaged by the weight of the heat sink because the heat sink need not be directly mounted on the semiconductor chips.

Heat generated by the semiconductor chips is conducted from the first thermal conductive members 21a to the heat sink through the fourth thermal conductive members 21d, the third thermal conductive members 21c, the fourth thermal conductive members 21d, and the second thermal conductive members 21b. Therefore, the heat generated by the semiconductor chips can be efficiently dissipated.

Figure 110:
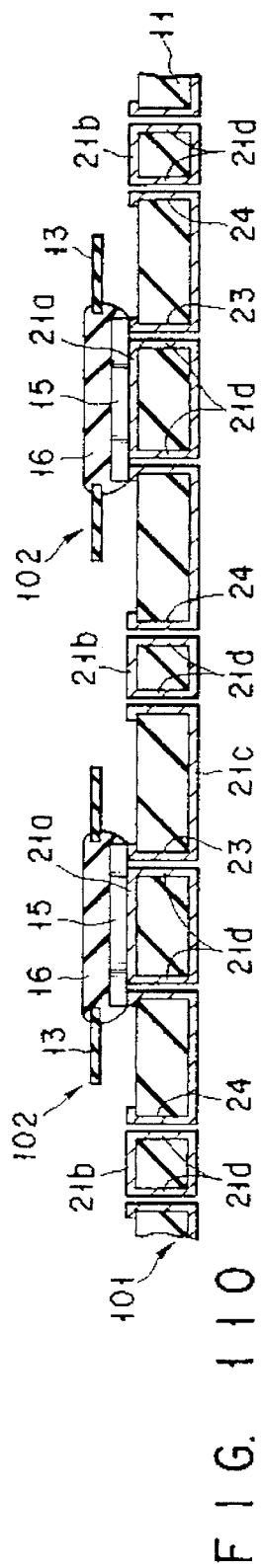
FIG. 110 is a sectional view of the semiconductor device along the line CX—CX in FIG. 109.

(b) FIGS. 109 and 110 show a state in which TCPs are mounted on the printed circuit board shown in FIGS. 107 and 108. FIG. 109 is a plan view of the printed circuit board, and FIG. 110 is a sectional view thereof along the line CX—CX in FIG. 109.

Each TCP 102 comprises a TAB tape constituted by a polyimide tape 13 and leads 14, a semiconductor chip 15 connected to one end of each of the leads 14, and a potting resin 16 which covers the semiconductor chip 15.

The lower surface (i.e., a surface on which a semiconductor element is not formed) of the semiconductor chip 15 of each TCP 102 is adhered to the corresponding first thermal conductive member 21a with an adhesive. If this adhesive consists of a material having a high thermal conductivity (e.g., a conductive paste containing silver), the heat resistance from the semiconductor chip 15 to the corresponding first thermal conductive member 21a can be reduced.

The leads 14 of each TCP 102 are connected to the corresponding wiring patterns 22 on the insulating board 11 by a solder or the like.

Note that, although each TCP 102 is mounted on the insulating board 11 such that the lower surface of the semiconductor chip 15 is adhered to the corresponding first thermal conductive member 21a, the upper surface (i.e., a surface on which a semiconductor element is formed) of the semiconductor chip may face the first thermal conductive member 21a side. In this case, an adhesive should not chemically corrode the polyimide tape 13.

Figure 112:
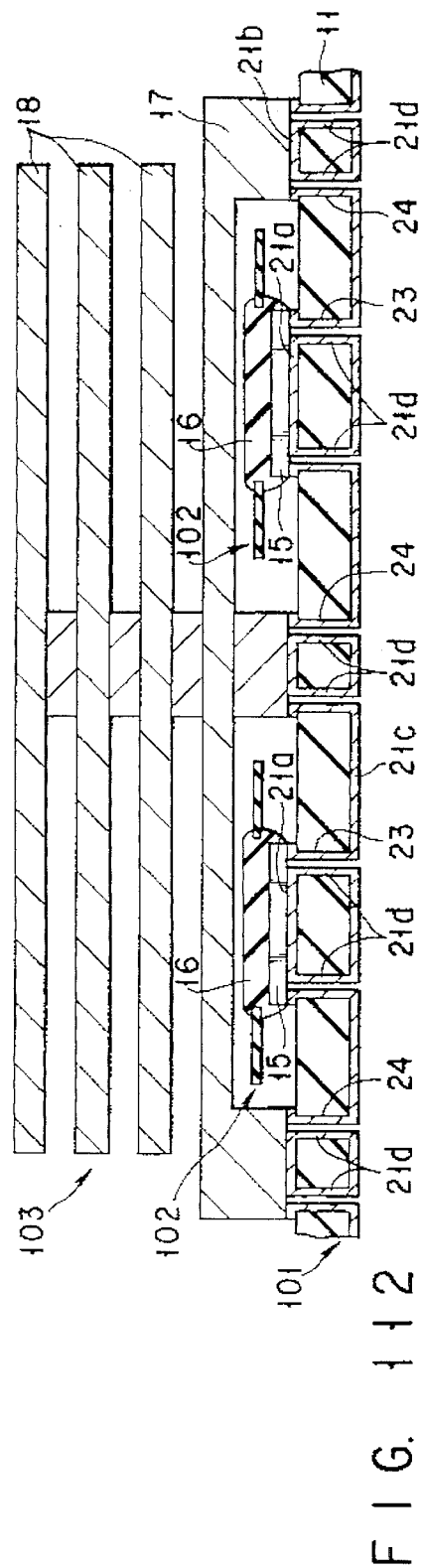
FIG. 112 is a sectional view of the semiconductor device along the line CXII—CXII in FIG. 111.
Figure 111:
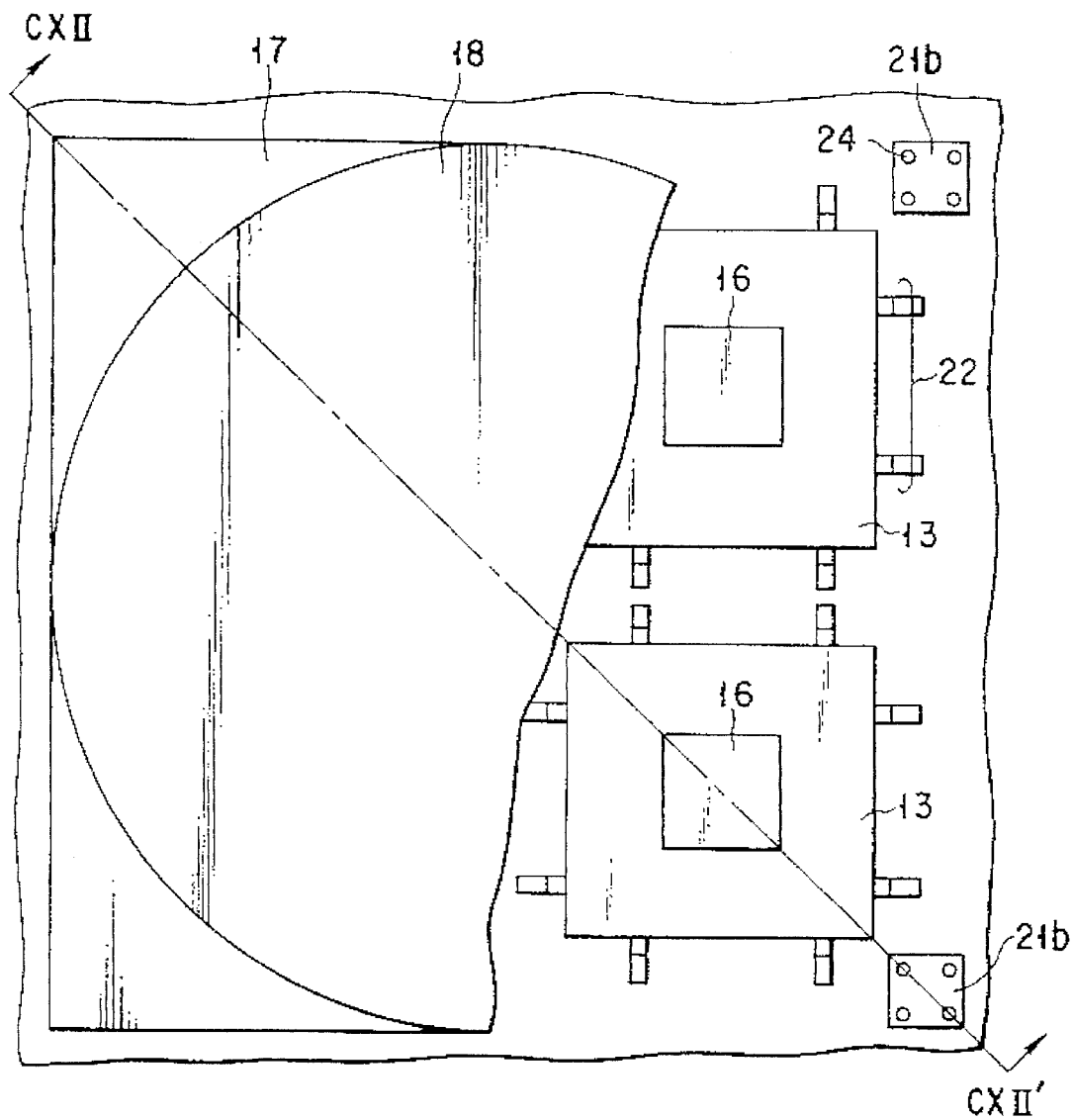
FIG. 111 is a plan view showing the semiconductor device according to the 22nd embodiment of the present invention.

(c) FIGS. 111 and 112 show a semiconductor device in a state wherein a heat sink is mounted on the semiconductor device shown in FIGS. 109 and 110. FIG. 111 is a plan view of the semiconductor device, and FIG. 112 is a sectional view thereof along the line CXII—CXII in FIG. 111.

A heat sink 103 comprises a lid portion 17 and fin portions 18.

The lid portion 17 is mounted on the insulating board 11 so as to cover the TCPs 102. More specifically, the lid portion 17 comprises a square plate portion having one side of about 100 mm and a projecting portion formed at the central portion of the plate portion. The projecting portion of the lid portion 17 comprises a prism having one side of about 5 mm. The lid portion 17 consists of a material having a high thermal conductivity, such as aluminum.

The projecting portion of the lid portion 17 is adhered to the five second thermal conductive members 21b of the insulating board 11 with an adhesive. If this adhesive consists of a material having a high thermal conductivity (e.g., a conductive paste containing silver), the heat resistance from the second thermal conductive members 21b to the heat sink can be reduced.

The lid portion 17 may be or need not be in contact with the TCPs 102. However, if they are in contact with each other, heat generated by the semiconductor chips of the TCPs 102 can be efficiently dissipated.

The fin portions 18 are mounted on the plate portion of the lid portion 17. The total surface area of the fin portions 18 must be maximized to facilitate heat diffusion. The fin portions 18 consist of a material having a high thermal conductivity, such as aluminum.

The lid portion 17 and the fin portions 18 of the heat sink may be integrally formed using one material. Alternatively, the lid portion 17 and the fin portions 18 of the heat sink may be independently formed. In this case, the material of the lid portion 17 may be the same as or different from that of the fin portions 18. The projecting portion 17*b* of the lid portion 17 may be independently formed, and the plate portion of the lid portion 17 and the fin portions 18 may be integrally formed.

According to the semiconductor device having the above arrangement, the semiconductor chips of the TCPs 102 are mounted on the corresponding first thermal conductive members 21*a* of the insulating board 11, and the heat sink 103 is mounted on the second thermal conductive members 21*b* of the insulating board 11. Therefore, a heat sink need not be directly mounted on the semiconductor chips 15, and the leads of the TCPs 102 and the like will not be damaged by the weight of the heat sink.

Heat generated by the semiconductor chips 15 of the TCPs 102 is directly conducted to the heat sink 103 and at the same time from the first thermal conductive members 21*a* to the heat sink 103 through the fourth thermal conductive members 21*d*, the third thermal conductive members 21*c*, the fourth thermal conductive members 21*d*, and the second thermal conductive members 21*b*. Therefore, the heat generated by the semiconductor chips 15 can be efficiently dissipated.

Since almost all the heat generated by the semiconductor chips 15 can be absorbed by the heat sink 103, the semiconductor chips 15 will not adversely affect adjacent chips.

Since one heat sink is commonly used by the four TCPs, an interval between adjacent heat sinks required when one heat sink is used for one TCP need not be set, increasing an efficiency in heat dissipation.

[W] Next, a printed circuit board according to the 23rd embodiment of the present invention and a semiconductor device using the same will be described below.

Figure 113:
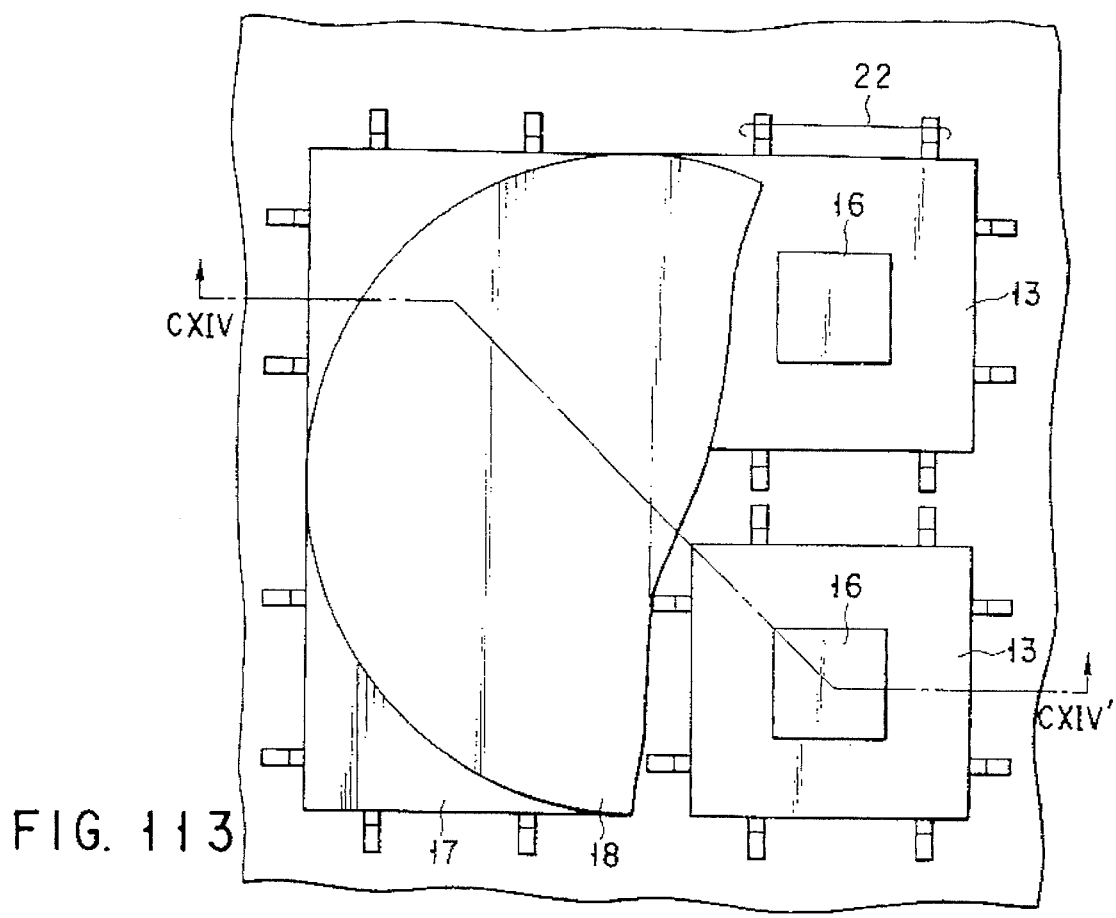
FIG. 113 is a plan view showing a semiconductor device according to the 23rd embodiment of the present invention.
Figure 114:
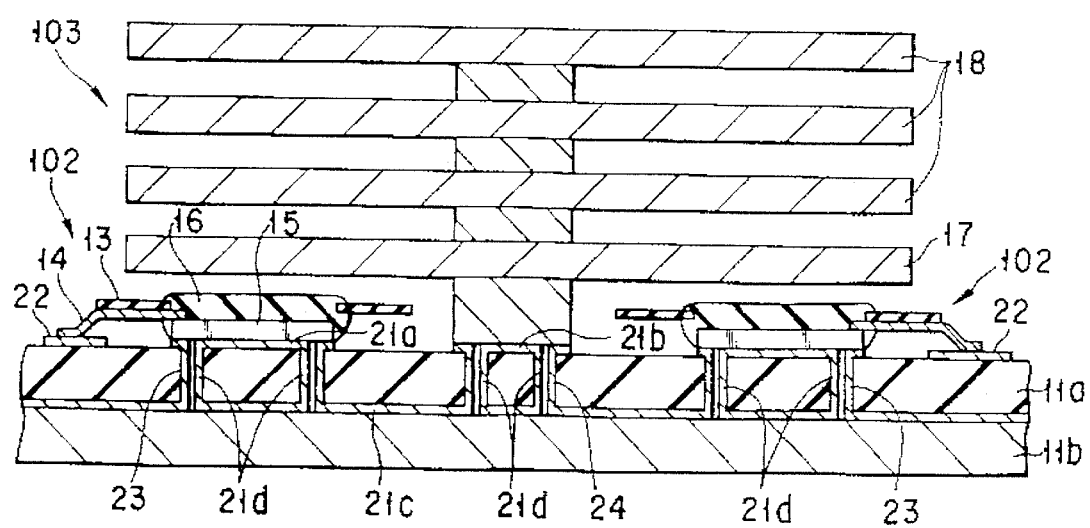
FIG. 114 is a sectional view of the semiconductor device along the line CXIV—CXIV in FIG. 113.
Figure 115:
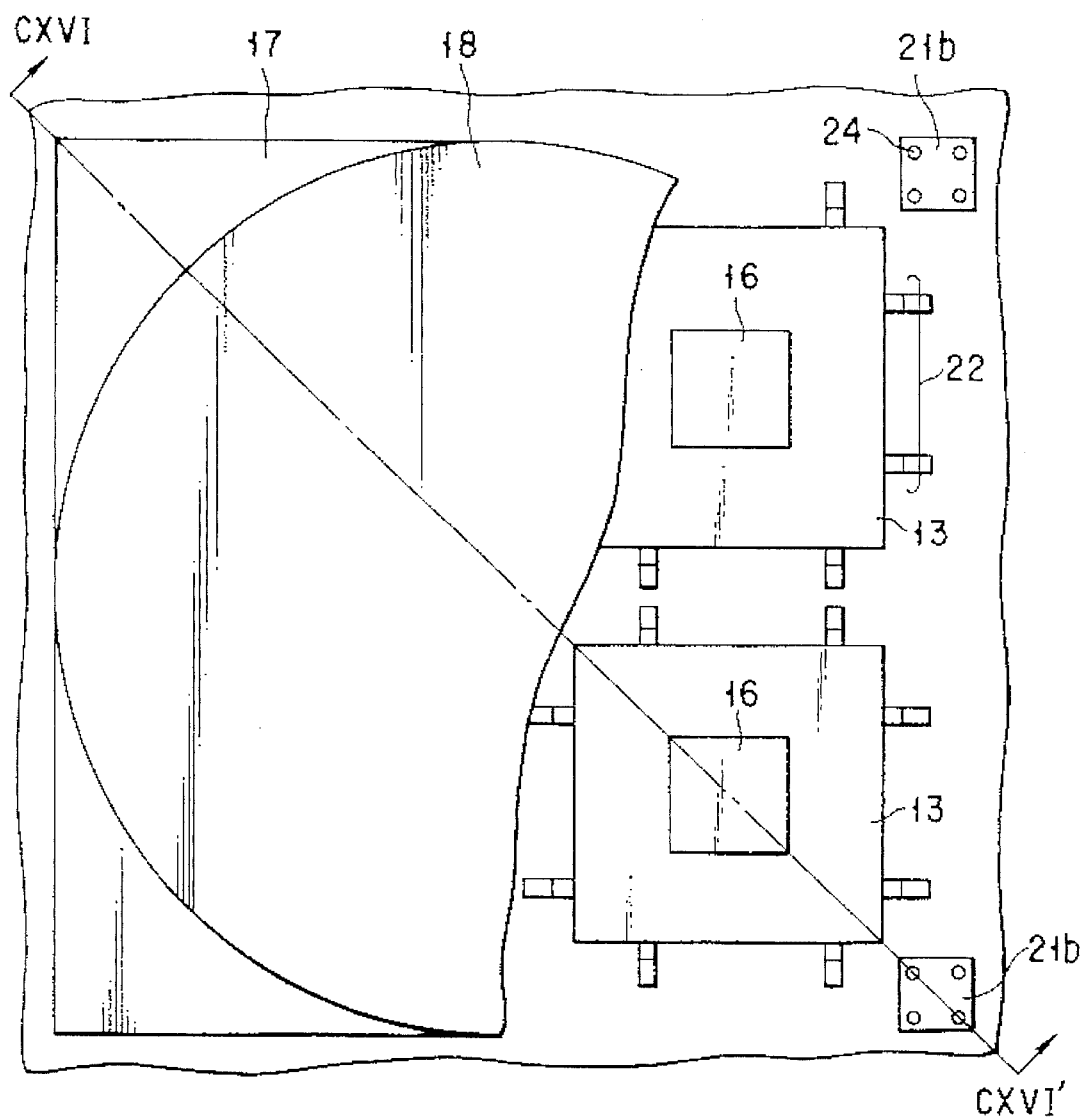
FIG. 115 is a plan view showing the semiconductor device according to the 23rd embodiment of the present invention.

FIGS. 113 to 116 show semiconductor devices using multilayered printed circuit boards according to the 23rd embodiment of the present invention. FIGS. 113 and 115 are plan views of semiconductor devices, FIG. 114 is a sectional view thereof along the line CXIV—CXIV in FIG. 113, and FIG. 116 is a sectional view thereof along the line CXVI—CXVI in FIG. 115.

A multilayered printed circuit board 101 comprises a plurality (e.g., two) of insulating boards (e.g., epoxy glass) 11*a* and 11*b*, first to fourth thermal conductive members 21*a* to 21*d*, wiring patterns 22, and through holes 23 and 24.

The first thermal conductive members 21*a* are formed on one major surface of the insulating board 11*a*. Each first thermal conductive member 21*a* consists of a material having a high thermal conductivity, such as copper (thickness: about 35 μm).

A semiconductor chip 15 of each of TCPs 102 is mounted on the corresponding first thermal conductive member 21*a*. Each first thermal conductive member 21*a* conforms to the shape of the semiconductor chip 15 to have a shape of a square having one side of about 12 mm when viewed from one major surface of the insulating board 11*a*.

One or the plurality of second thermal conductive members 21*b* are formed on one major surface of the insulating board 11*a*. The second thermal conductive member 21*b* consists of a material having a high thermal conductivity, such as copper (thickness: about 35 μm).

A heat sink 103 is to be mounted on one or the plurality of second thermal conductive members 21*b*. For this reason, one or the plurality of second thermal conductive members 21*b* are located at predetermined positions to facilitate mounting of the heat sink 103. The second thermal conductive member 21*b* is formed to be a square having a width of about 5 mm when viewed from one major surface of the insulating board 11*a*.

The plurality of wiring patterns 22 to surround the four sides of each first thermal conductive member 21*a* are formed on one major surface of the insulating board 11*a*.

The third thermal conductive members 21*c* are formed on the other major surface of the insulating board 11*a* at positions including at least portions immediately below the first and second thermal conductive members 21*a* and 21*b*. Each third thermal conductive member 21*c* consists of a material having a high thermal conductivity, such as copper (thickness: about 35 μm).

The third thermal conductive members 21*c* may be formed immediately below the first and second thermal conductive members 21*a* and 21*b* or one third thermal conductive member 21*c* may be formed entirely on the other major surface of the insulating board 11*b*. For example, when the third thermal conductive members 21*c* are formed only immediately below the first and second thermal conductive members 21*a* and 21*b*, the shape of each third thermal conductive member 21*c* is formed to be a square having one side of about 100 mm when viewed from the other major surface of the insulating board 11*b*.

At least one through hole 23 is formed in the insulating board 11*a* between the first and third thermal conductive members 21*a* and 21*c*. For example, 121 (11 columns×11 rows) through holes 23 each having a diameter of, e.g., about 200 μm are formed in the insulating board 11*a*. The fourth thermal conductive member 21*d* is formed on the side surface of each through hole 23. The fourth thermal conductive member 21*d* consists of a material having a high thermal conductivity, such as copper (thickness: about 35 μm).

Similarly, at least one through hole 24 is formed in the insulating board 11*a* between the second and third thermal conductive members 21*b* and 21*c*. Forty-nine (7 columns×7 rows) through holes 24 each having a diameter of about 200 μm are formed in the insulating board 11*a*. The fourth thermal conductive member 21*d* is formed on the side surface of each through hole 24. The fourth thermal conductive member 21*d* consists of a material having a high thermal conductivity, such as copper (thickness: about 35 μm).

The other major surface of the insulating board 11*a* and one major surface of the insulating board 11*b* are coupled to each other. Each of the insulating boards 11*a* and 11*b* is formed to have a thickness of about 0.8 mm.

According to the multilayered printed circuit board having the above arrangement and the semiconductor device using the same, the semiconductor chips 15 are mounted on the first thermal conductive members 21*a*, and the heat sink 103 is mounted on one or the plurality of second thermal conductive members 21*b*. Therefore, a heat sink need not be directly mounted on the semiconductor chips 15, and leads 14 of a package and the like will not be damaged by the weight of the heat sink.

Heat generated by the semiconductor chips 15 is conducted from the first thermal conductive members 21a to the heat sink 103 through the fourth thermal conductive members 21d, the third thermal conductive members 21c, the fourth thermal conductive members 21d, and one or the plurality of second thermal conductive members 21b. Therefore, the heat generated by the semiconductor chips 15 can be efficiently dissipated.

[X] Next, a printed circuit board according to the 24th embodiment of the present invention and a semiconductor device using the same will be described below.

Figure 117:
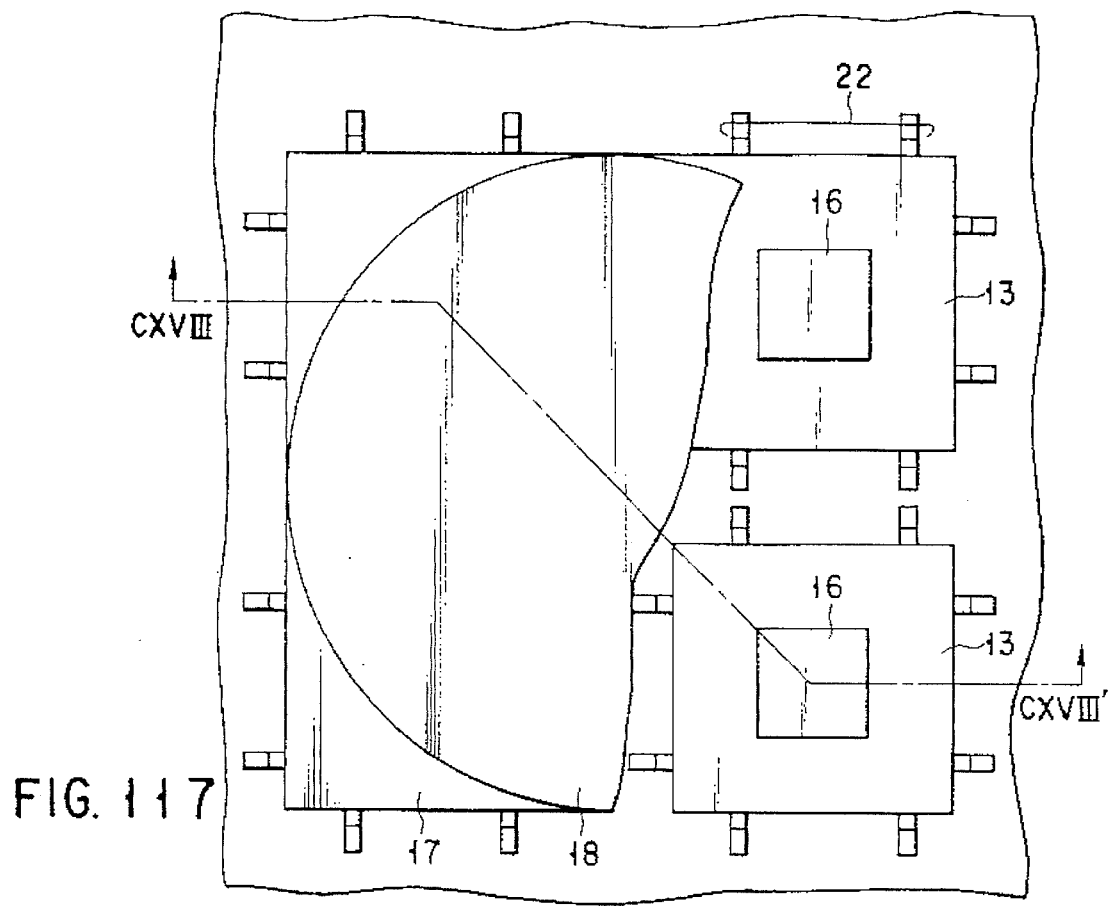
FIG. 117 is a plan view showing a semiconductor device according to the 24th embodiment of the present invention.
Figure 118:
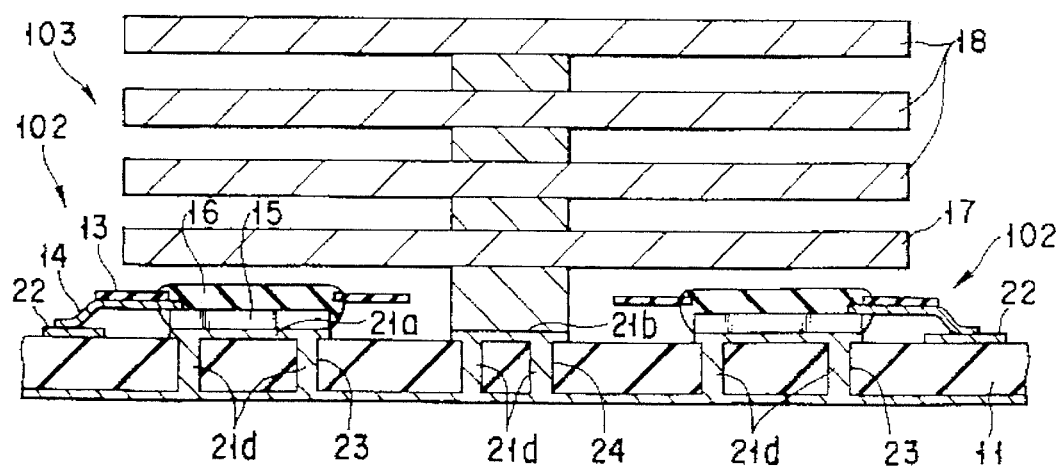
FIG. 118 is a sectional view of the semiconductor device along the line CXVIII—CXVIII in FIG. 117.

FIGS. 117 to 120 show printed circuit boards according to the 24th embodiment of the present invention. FIGS. 117 and 119 are plan views of semiconductor devices, FIG. 118 is a sectional view thereof along the line CXVIII—CXVIII in FIG. 117, and FIG. 120 is a sectional view thereof along the line CXX—CXX in FIG. 119.

A printed circuit board 101 comprises an insulating board (e.g., epoxy glass) 11, first to fourth thermal conductive members 21a to 21d, wiring patterns 22, and through holes 23 and 24.

The first thermal conductive members 21a are formed on one major surface of the insulating board 11. Each first thermal conductive member 21a consists of a material having a high thermal conductivity, such as copper (thickness: about 35 μm).

For example, a semiconductor chip 15 of each TCP 102 is to be mounted on the corresponding first thermal conductive member 21a. Each first thermal conductive member 21a conforms to the shape of the semiconductor chip 15. The shape of each first thermal conductive member 21a is formed to be, e.g., a square having one side of about 12 mm when viewed from one major surface of the insulating board 11.

The plurality of wiring patterns 22 to surround the four sides of each first thermal conductive member 21a are formed on one major surface of the insulating board 11.

One or the plurality of second thermal conductive members 21b are formed on one major surface of the insulating board 11. The second thermal conductive member 21b consists of a material having a high thermal conductivity, such as copper (thickness: about 35 μm).

A heat sink 103 is to be mounted on one or the plurality of second thermal conductive members 21b. For this reason, the second thermal conductive member 21b is formed to facilitate mounting of the heat sink 103. The shape of the second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm or about 100 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11.

The fourth thermal conductive member 21d is filled in each through hole 23. The fourth thermal conductive member 21d consists of a material having a high thermal conductivity, such as copper (thickness: about 35 μm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the insulating board 11 between the second and third thermal conductive members 21b and 21c. Forty-nine (7 columns×7 rows) through holes 24 each having a diameter of about 200 μm are formed in the insulating board 11.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

According to the printed circuit board having the above arrangement and the semiconductor device using the same, the semiconductor chips of the TCPs 102 are mounted on the corresponding first thermal conductive members 21a of the insulating board 11, and the heat sink 103 is mounted on one or the plurality of second thermal conductive members 21b of the insulating board 11. Therefore, the leads of the TCPs 102 and the like will not be damaged by the weight of the heat sink because a heat sink need not be directly mounted on the semiconductor chips.

Heat generated by the semiconductor chips 15 of the TCPs 102 is directly conducted to the heat sink 103 and at the same time from the first thermal conductive members 21a to the heat sink 103 through the fourth thermal conductive members 21d, the third thermal conductive members 21c, the fourth thermal conductive members 21d, and one or the plurality of second thermal conductive members 21b.

Since the through holes 23 and 24 are filled with a material having a high thermal conductivity, the heat generated by the semiconductor chips can be more efficiently dissipated.

[Y] Next, a printed circuit board according to the 25th embodiment of the present invention and a semiconductor device using the same will be described below.

Figure 121:
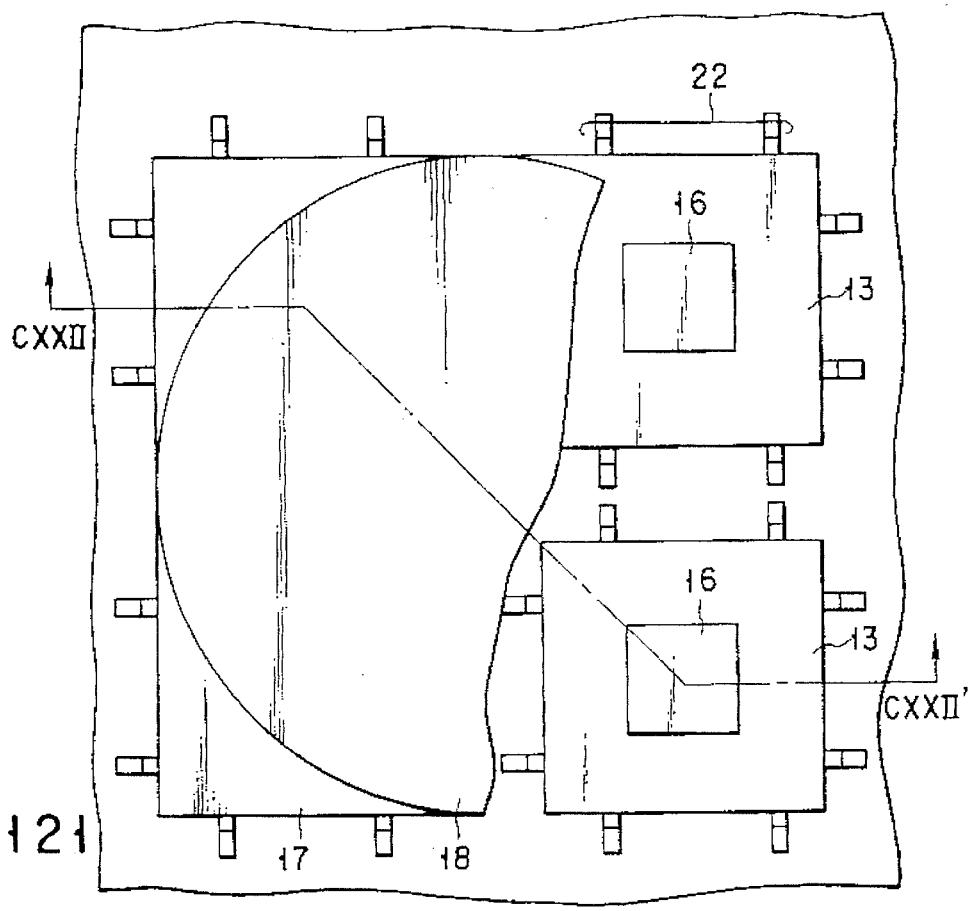
Figure 122:
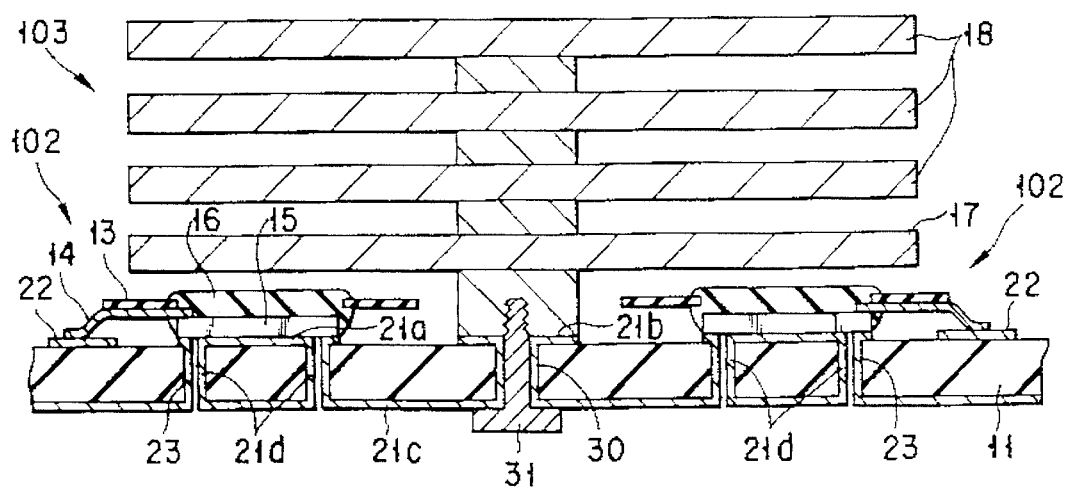
Figure 124:
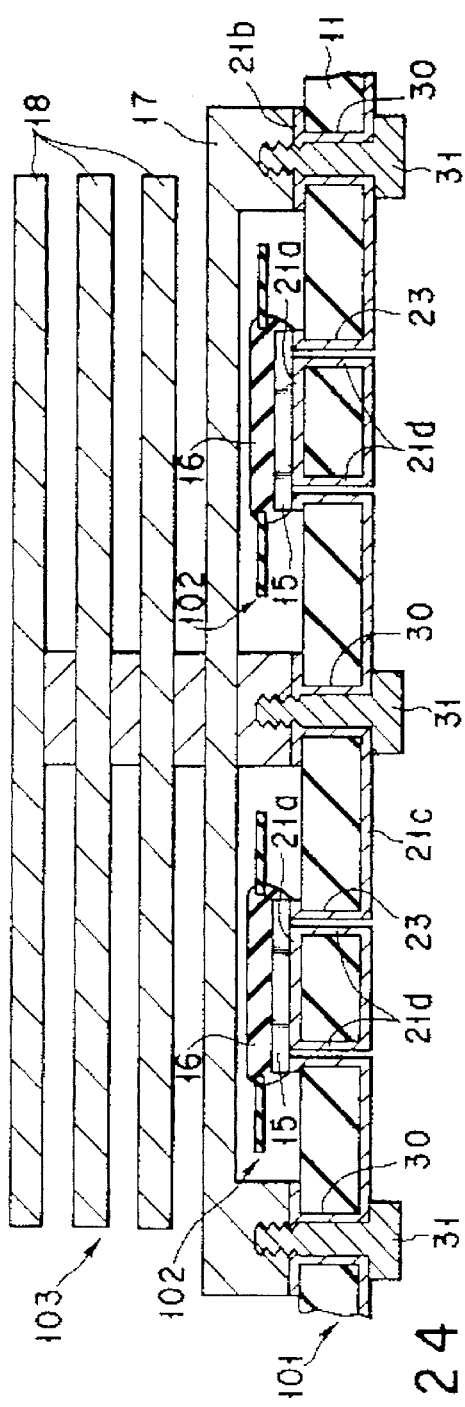

FIGS. 121 to 124 show printed circuit boards according to the 25th embodiment of the present invention. FIGS. 121 and 123 are plan views of semiconductor devices, FIG. 122 is a sectional view thereof along the line CXXII—CXXII in FIG. 121, and FIG. 124 is a sectional view thereof along the line CXXIV—CXXIV in FIG. 123.

A printed circuit board 101 comprises an insulating board (e.g., epoxy glass) 11, first to fourth thermal conductive members 21a to 21d, wiring patterns 22, through holes 23, one or a plurality of threaded holes 30, and one or a plurality of screws 31.

The first thermal conductive members 21a are formed on one major surface of the insulating board 11. Each first thermal conductive member 21a consists of a material having a high thermal conductivity, such as copper (thickness: about 35 μm).

For example, a semiconductor chip 15 of each TCP 102 is to be mounted on the corresponding first thermal conductive member 21a. Each first thermal conductive member 21a conforms to the shape of the semiconductor chip 15. The shape of the first thermal conductive member 21a is formed to be, e.g., a square having one side of about 12 mm when viewed from one major surface of the insulating board 11.

The plurality of wiring patterns 22 to surround the four sides of each first thermal conductive member 21a are formed on one major surface of the insulating board 11.

At least one second thermal conductive member 21b is formed on one major surface of the insulating board 11. The second thermal conductive member 21b consists of a material having a high thermal conductivity, such as copper (thickness: about 35 μm).

A heat sink 103 is to be mounted on one or the plurality of second thermal conductive members 21b. For this reason, the second thermal conductive member 21b is formed to facilitate mounting of the heat sink 103. The shape of the second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm or about 100 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11.

The fourth thermal conductive member 21d is formed on the side surface of each through hole 23. The fourth thermal conductive member 21d consists of a material having a high thermal conductivity, such as copper (thickness: about 35 μm).

One or the plurality of threaded holes 30 are formed in the insulating board 11 between the second and third thermal conductive members 21b and 21c. The fourth thermal conductive member 21d is formed on the side surface of the threaded hole 30. The fourth thermal conductive member 21d consists of a material having a high thermal conductivity, such as copper (thickness: about 35 μm).

One or a plurality of threaded holes are also formed in a lid portion 17 of the heat sink. For example, one or the plurality of threaded holes of the lid portion 17 are formed in the bottom portion of the projecting portion of the lid portion 17.

One or the plurality of threaded holes of the insulating board 11 and one or the plurality of corresponding threaded holes of the heat sink 103 are positioned to overlap each other. By fitting one or the plurality of screws 31 into the corresponding threaded holes, the heat sink 103 is firmly fixed on the insulating board 11.

According to the printed circuit board having the above arrangement and the semiconductor device using the same, the semiconductor chips of the TCPs 102 are mounted on the corresponding first thermal conductive members 21a of the insulating board 11, and the heat sink 103 is mounted on one or the plurality of second thermal conductive members 21b of the insulating board 11. Therefore, a heat sink need not be directly mounted on the semiconductor chips 15, and the leads of the TCP 102 and the like will not be damaged by the weight of the heat sink.

Heat generated by the semiconductor chips 15 of the TCPs 102 is directly conducted to the heat sink 103 and at the same time from the first thermal conductive members 21a to the heat sink 103 through the fourth thermal conductive members 21d, the third thermal conductive members 21c, the fourth thermal conductive members 21d, and one or the plurality of second thermal conductive members 21b.

In addition, since the heat sink 103 is firmly fixed on the insulating board 11 using one or the plurality of screws 31, a larger heat sink can be mounted on the insulating board 11, and the heat generated by the semiconductor chips 15 can be efficiently dissipated.

If the screw 31 consists of a material having a high thermal conductivity, and the diameter of the threaded hole 30 is maximized, the heat generated by the semiconductor chips 15 can be more efficiently dissipated.

As compared with a case using a large number of through holes, this embodiment employs only one threaded hole in each thermal conductive member to decrease the manufacturing steps and the manufacturing cost.

[Z] Next, a printed circuit board according to the 26th embodiment of the present invention and a semiconductor device using the same will be described below.

Figure 128:
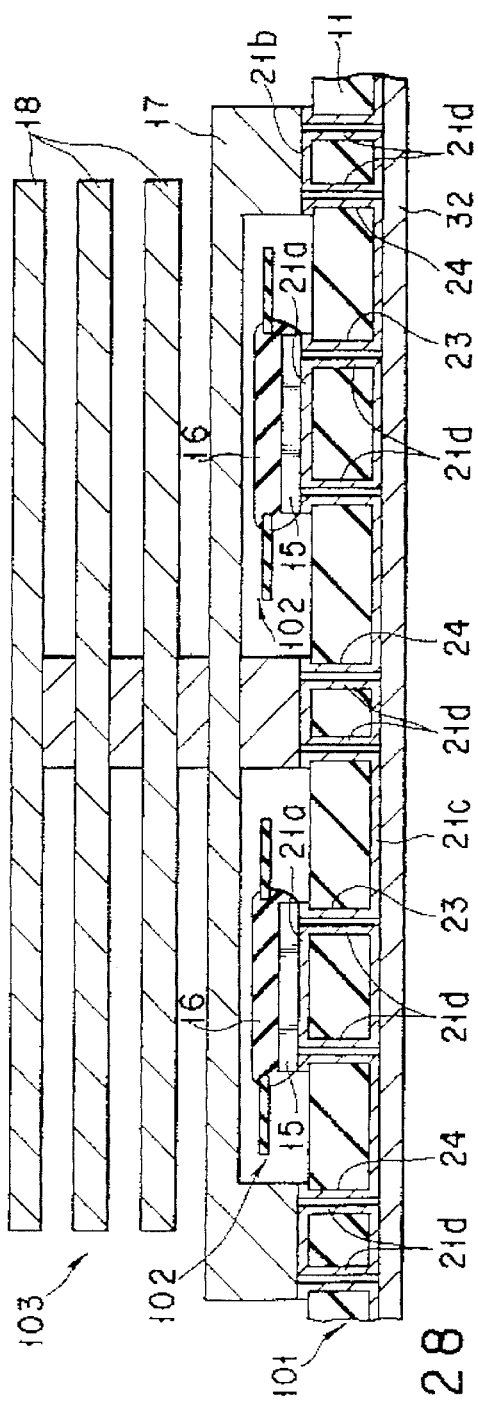
Figure 125:
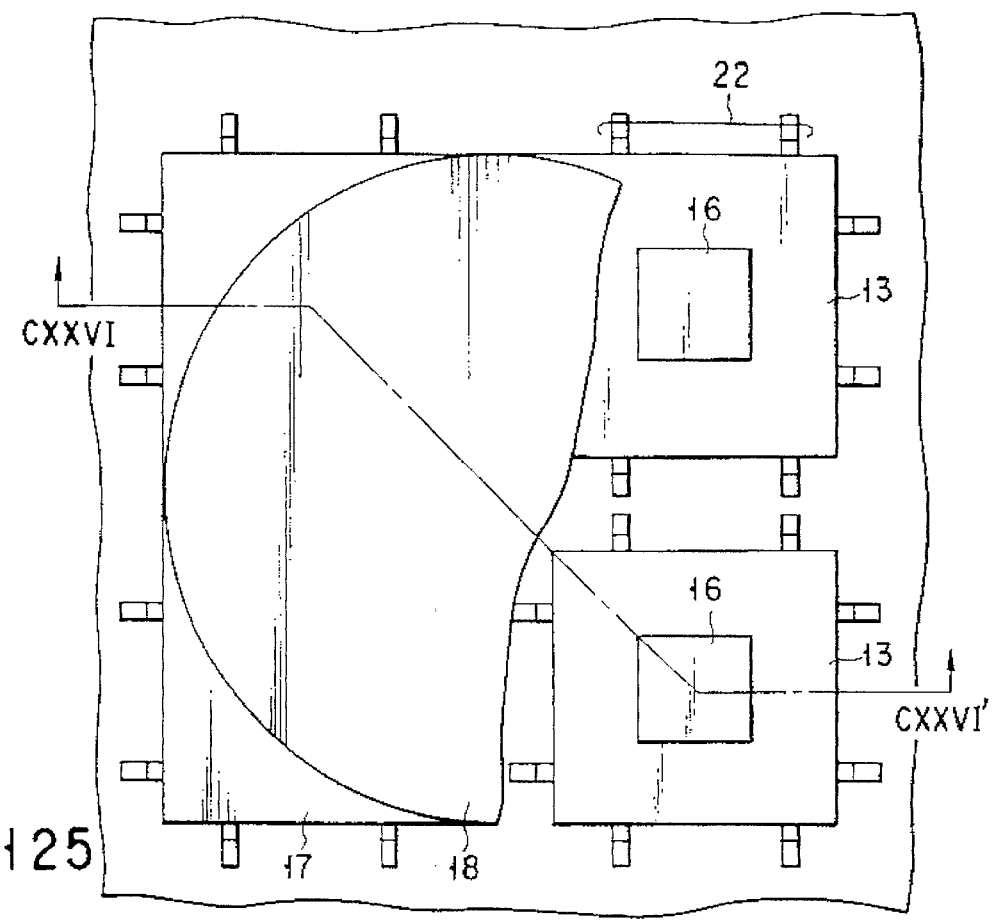
Figure 126:
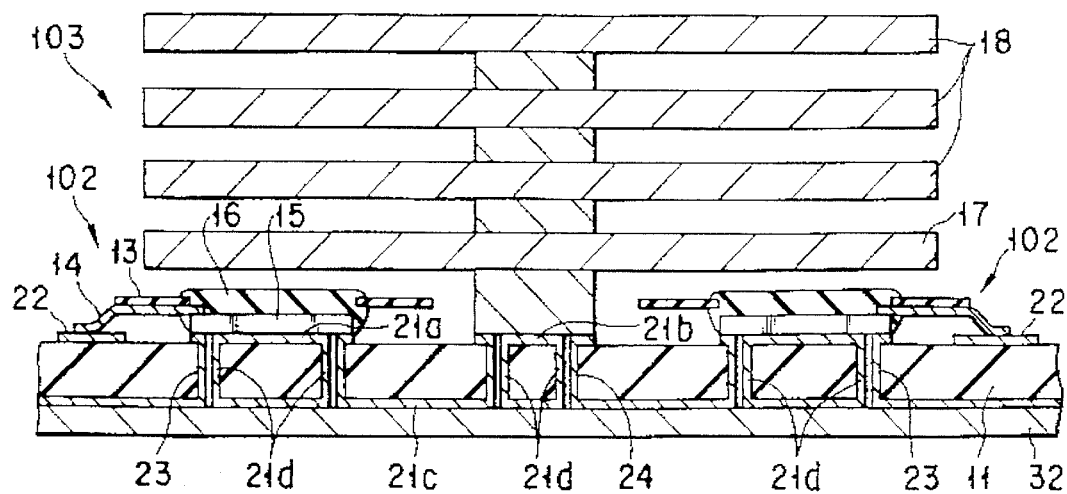

FIGS. 125 to 128 show printed circuit boards according to the 26th embodiment of the present invention. FIGS. 125 and 127 are plan views of semiconductor devices, FIG. 126 is a sectional view thereof along the line CXXVI—CXXVI in FIG. 125, and FIG. 128 is a sectional view thereof along the line CXXVIII—CXXVIII in FIG. 127.

A printed circuit board 101 comprises an insulating board (e.g., epoxy glass) 11, first to fourth thermal conductive members 21a to 21d, wiring patterns 22, through holes 23 and 24, and a low-heat resistive plate 32.

The first thermal conductive members 21a are formed on one major surface of the insulating board 11. Each first thermal conductive member 21a consists of a material having a high thermal conductivity, such as copper (thickness: about 35 μm).

For example, a semiconductor chip 15 of each TCP 102 is to be mounted on the corresponding first thermal conductive member 21a. Each first thermal conductive member 21a conforms to the shape of the semiconductor chip 15. The shape of each first thermal conductive member 21a is formed to be, e.g., a square having one side of about 12 mm when viewed from one major surface of the insulating board 11.

The plurality of wiring patterns 22 to surround the four sides of each first thermal conductive member 21a are formed on one major surface of the insulating board 11.

At least one second thermal conductive member 21b is formed on one major surface of the insulating board 11. The second thermal conductive member 21b consists of a material having a high thermal conductivity, such as copper (thickness: about 35 μm).

A heat sink 103 is to be mounted on one or the plurality of second thermal conductive members 21b. For this reason, the second thermal conductive member 21b is formed to facilitate mounting of the heat sink 103. The shape of the second thermal conductive member 21b is formed to be a square having each side of about 5 mm when viewed from one major surface of the insulating board 11.

The third thermal conductive members 21c are formed on the other major surface of the insulating board 11 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on the other major surface of the insulating board 11. For example, when the third thermal conductive members 21c are formed only immediately below the first and second thermal conductive members 21a and 21b, the shape of each third thermal conductive member 21c is formed to be a square having one side of about 50 mm or about 100 mm when viewed from the other major surface of the insulating board 11.

At least one through hole 23 is formed in the insulating board 11 between the first and third thermal conductive members 21a and 21c. For example, 121 (11 columns×11 rows) through holes 23 each having a diameter of, e.g., about 200 μm are formed in the insulating board 11.

The fourth thermal conductive member 21d is formed on the side surface of each through hole 23. The fourth thermal conductive member 21d consists of a material having a high thermal conductivity, such as copper (thickness: about 35 μm).

Moreover, at least one through hole 24 is formed in the insulating board 11 between the second and third thermal conductive members 21b and 21c. Forty-nine (7 columns×7 rows) through holes 24 each having a diameter of about 200 μm are formed in the insulating board 11.

The fourth thermal conductive member 21d is formed on the side surface of each through hole 24. The fourth thermal conductive member 21d consists of a material having a high thermal conductivity, such as copper (thickness: about 35 μm).

Note that the fourth thermal conductive members 21d may be formed only on the side surfaces of the through holes 23 and 24, and each through hole 24 may be filled with a paste containing aluminum nitride or high-heat conductive particles (e.g., a metal).

The low-heat resistive plate 32 having a low heat resistance is mounted on the other major surface of the insulating board 11. The low-heat resistive plate 32 can consist of aluminum, copper, a ceramic, aluminum nitride, alumina, beryllia, or silicon carbide.

Note that the low-heat resistive plate 32 can be adhered to the insulating board 11 with a solder, an adhesive having a low heat resistance, or the like.

According to the printed circuit board having the above arrangement and the semiconductor device using the same, the semiconductor chips of the TCPs 102 are mounted on the corresponding first thermal conductive members 21a of the insulating board 11, and the heat sink 103 is mounted on one or the plurality of second thermal conductive members 21b of the insulating board 11. Therefore, a heat sink need not be directly mounted on the semiconductor chips 15, and the leads of the TCP 102 and the like will not be damaged by the weight of the heat sink.

Heat generated by the semiconductor chips 15 of the TCPs 102 is directly conducted to the heat sink 103 and at the same time from the first thermal conductive members 21a to the heat sink 103 through the fourth thermal conductive members 21d, the third thermal conductive members 21c, the fourth thermal conductive members 21d, and one or the plurality of second thermal conductive members 21b.

In addition, since the low-heat resistive plate 32 is formed on the other major surface of the insulating board 11, the heat generated by the semiconductor chips can be efficiently dissipated from the heat sink directly from or through the low-heat resistive plate 32. The semiconductor device is not adversely affected by heat generated by an adjacent semiconductor device.

[AA] Next, a printed circuit board according to the 27th embodiment of the present invention and a semiconductor device using the same will be described below.

Figure 129:
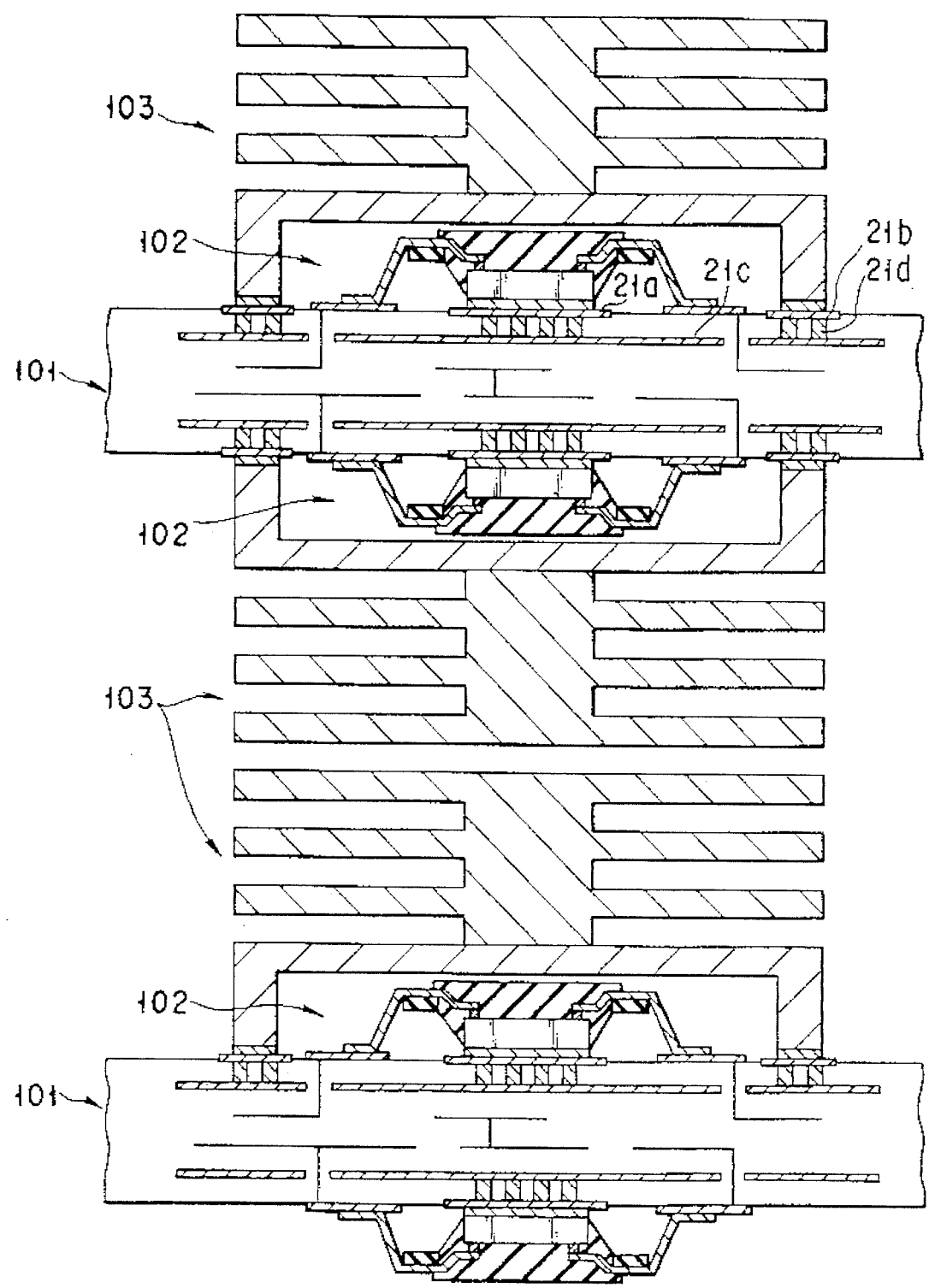

FIG. 129 shows a semiconductor device using multilayered printed circuit boards according to the 27th embodiment of the present invention.

Each multilayered printed circuit board 101 comprises insulating boards (e.g., epoxy glass), first to fourth thermal conductive members, wiring patterns, and through holes.

TCPs 102 and heat sinks 103 can be mounted on the two surfaces of each printed circuit board 101.

For this reason, this structure can contribute to the high-density assembly of a semiconductor package.

Note that, as shown in FIG. 130, a TCP 102 may be mounted on one surface of a printed circuit board 101, and a heat sink 103 may be mounted on the other surface thereof. In this case, however, TCPs 102 cannot be mounted on the two surfaces of the printed circuit board 101.

[BB] Next, a printed circuit board according to the 28th embodiment of the present invention and a semiconductor device using the same will be described below.

FIG. 131 shows a semiconductor device using multilayered printed circuit boards according to the 28th embodiment of the present invention.

In this semiconductor device, a TCP 102 and heat sinks 103 are mounted on one surface of each printed circuit board 101.

With this structure, when the TCPs 102 and flat packages 104 are to be mounted together on the plurality of printed circuit boards 101, the heat sink 103 on each TCP 102 has almost the same level as that on each flat package 104, and a wasteful space is not formed, realizing a high-density assembly.

As shown in FIG. 132, assume that a TCP 102 is mounted on one surface of each printed circuit board 101, and a heat sink 103 is mounted on the other surface thereof. If the TCPs 102 and flat packages 104 are mounted together, a wasteful space is undesirably formed to fail a high-density assembly.

[CC] Next, a BGA package according to the 29th embodiment of the present invention will be described below.

FIGS. 133 to 135 show the BGA package using a multilayered wiring board according to the 29th embodiment of the present invention. FIG. 133 is a plan view of the BGA package, FIG. 134 is a sectional view thereof along the line CXXXIV—CXXXIV in FIG. 133, and FIG. 135 is a sectional view thereof along the line CXXXV—CXXXV in FIG. 133.

A first thermal conductive member 21a is formed on one major surface of a wiring board 41. The first thermal conductive member 21a consists of a material having a high thermal conductivity, such as copper (thickness: about 35 μm).

A semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the wiring board 41.

A plurality of wiring patterns 22 to surround the four sides of the first thermal conductive member 21a are formed on one major surface of the wiring board 41.

Second thermal conductive members 21b are formed on one major surface of the wiring board 41. Each second thermal conductive member 21b consists of a material having a high thermal conductivity, such as copper (thickness: about 35 µm).

A heat sink 103 is to be mounted on the second thermal conductive members 21b. For this reason, the second thermal conductive members 21b are formed to facilitate mounting of the heat sink 103. For example, each second thermal conductive member 21b is formed at corresponding one of the four corners of the wiring board 41.

The shape of each second thermal conductive member 21b is formed to be a square having each side of about 5 mm when viewed from one major surface of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 µm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 µm are formed in the wiring board 41.

A fourth thermal conductive member 21d is filled in each through hole 23. The fourth thermal conductive member 21d consists of a material having a high thermal conductivity, such as copper (thickness: about 35 µm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 µm are formed in the wiring board 41.

The fourth thermal conductive member 21d is filled in each through hole 24. The fourth thermal conductive member 21d consists of a material having a high thermal conductivity, such as copper (thickness: about 35 µm).

Note that the fourth thermal conductive members 21d may be formed only on the side surfaces of the through holes 24, and each through hole 24 may be filled with a paste containing aluminum nitride or high-heat conductive particles (e.g., a metal).

A plurality of spherical solders (terminals) 40 are arranged on the other major surface of the wiring board 41 in an array. The spherical solders 40 are electrically connected to the semiconductor chip 15 on the first thermal conductive member 21a through the multilayered wiring board 41.

The semiconductor chip 15 is electrically connected to the wiring patterns 22 on the wiring board 41 through bonding wires 34. The semiconductor chip 15 and the bonding wires 34 are covered with a resin 33.

Since the semiconductor chip 15 and the bonding wires 34 are protected by the heat sink 103, they need not be covered with the resin 33.

According to the BGA package having the above arrangement, the semiconductor chip 15 is mounted on the first thermal conductive member 21a of the wiring board 41, and the heat sink 103 is mounted on the second thermal conductive members 21b of the wiring board 41. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

With this structure, the strong BGA package with excellent heat dissipation and a simple arrangement can be provided.

[DD] Next, a BGA package according to the 30th embodiment of the present invention will be described below.

FIGS. 136 and 137 show the BGA package using a multilayered wiring board according to the 30th embodiment of the present invention. FIG. 136 is a plan view of the BGA package, and FIG. 137 is a sectional view thereof along the line CXXXVII—CXXXVII in FIG. 136.

A first thermal conductive member 21a is formed on one major surface of a wiring board 41. The first thermal conductive member 21a consists of a material having a high thermal conductivity, such as copper (thickness: about 35 µm).

A semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the wiring board 41.

A plurality of wiring patterns 22 to surround the four sides of the first thermal conductive member 21a are formed on one major surface of the wiring board 41.

A second thermal conductive member 21b is formed on one major surface of the wiring board 41. The second thermal conductive member 21b consists of a material having a high thermal conductivity, such as copper (thickness: about 35 µm).

A heat sink 103 is to be mounted on the second thermal conductive member 21b. For this reason, the second thermal conductive member 21b is formed to facilitate mounting of the heat sink 103. For example, the ring-like second thermal conductive member 21b is formed in the peripheral portion of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 μm are formed in the wiring board 41.

A fourth thermal conductive member 21d is filled in each through hole 23. The fourth thermal conductive member 21d consists of a material having a high thermal conductivity, such as copper (thickness: about 35 μm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 μm are formed in the wiring board 41.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

A plurality of spherical solder members (terminals) 40 are arranged on the other major surface of the wiring board 41 in an array. The spherical solder members 40 are electrically connected to the semiconductor chip 15 on the first thermal conductive member 21a through the multilayered wiring board 41.

The semiconductor chip 15 is electrically connected to the wiring patterns 22 on the wiring board 41 through bonding wires 34. The semiconductor chip 15 and the bonding wires 34 are covered with a resin 33.

Since the semiconductor chip 15 and the bonding wires 34 are protected by the heat sink 103, they need not be covered with the resin 33.

According to the BGA package having the above arrangement, the semiconductor chip 15 is mounted on the first thermal conductive member 21a of the wiring board 41, and the heat sink 103 is mounted on the second thermal conductive member 21b of the wiring board 41. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

With this structure, the strong BGA package with excellent heat dissipation and a simple arrangement can be provided.

[EE] Next, a BGA package according to the 31st embodiment of the present invention will be described below.

FIGS. 138 to 140 show the BGA package using a multilayered wiring board according to the 31st embodiment of the present invention. FIG. 138 is a plan view of the BGA package, FIG. 139 is a sectional view thereof along the line CXXXIX—CXXXIX in FIG. 138, and FIG. 140 is a sectional view thereof along the line CXL—CXL in FIG. 138.

A first thermal conductive member 21a is formed on one major surface of a wiring board 41. The first thermal conductive member 21a consists of a material having a high thermal conductivity, such as copper (thickness: about 35 μm).

A semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the wiring board 41.

A plurality of wiring patterns 22 to surround the four sides of the first thermal conductive member 21a are formed on one major surface of the wiring board 41.

Second thermal conductive members 21b are formed on one major surface of the wiring board 41. Each second thermal conductive member 21b consists of a material having a high thermal conductivity, such as copper (thickness: about 35 μm).

A heat sink 103 is to be mounted on the second thermal conductive members 21b. For this reason, the second thermal conductive members 21b are formed to facilitate mounting of the heat sink 103. For example, each second thermal conductive member 21b is formed at corresponding one of the four corners of the wiring board 41.

The shape of each second thermal conductive member 21b is formed to be a square having each side of about 5 mm when viewed from one major surface of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 μm are formed in the wiring board 41.

A fourth thermal conductive member 21d is filled in each through hole 23. The fourth thermal conductive member 21d consists of a material having a high thermal conductivity, such as copper (thickness: about 35 μm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 μm are formed in the wiring board 41.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

A TCP 102 is mounted on the first thermal conductive member 21a. A plurality of spherical solder members 40 (terminals) are arranged on the other major surface of the wiring board 41 in an array. The spherical solder members 40 are electrically connected to the semiconductor chip 15 of the TCP 102 on the first thermal conductive member 21a through the multilayered wiring board 41.

Leads 14 of the TCP are electrically connected to the wiring patterns 22 on the wiring board 41 through the solder members. The TCP 102 is protected by the heat sink 103. The semiconductor chip 15 may be covered with a potting resin.

According to the BGA package having the above arrangement, the semiconductor chip 15 of the TCP is mounted on the first thermal conductive member 21a of the wiring board 41, and the heat sink 103 is mounted on the second thermal conductive members 21b of the wiring board 41. Therefore, a heat sink need not be directly mounted on the TCP 102.

Heat generated by the semiconductor chip 15 of the TCP is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

With this structure, the strong BGA package with excellent heat dissipation and a simple arrangement can be provided.

[FF] Next, a BGA package according to the 32nd embodiment of the present invention will be described below.

FIGS. 141 and 142 show the BGA package using a multilayered wiring board according to the 32nd embodiment of the present invention. FIG. 141 is a plan view of the BGA package, and FIG. 142 is a sectional view thereof along the line CXLII—CXLII in FIG. 141.

A first thermal conductive member 21a is formed on one major surface of a wiring board 41. The first thermal conductive member 21a consists of a material having a high thermal conductivity, such as copper (thickness: about 35 μm).

A semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the wiring board 41.

A plurality of wiring patterns 22 to surround the four sides of the first thermal conductive member 21a are formed on one major surface of the wiring board 41.

A second thermal conductive member 21b is formed on one major surface of the wiring board 41. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the ring-like second thermal conductive member 21b is formed in the peripheral portion of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 μm are formed in the wiring board 41.

A fourth thermal conductive member 21d is filled in each through hole 23. The fourth thermal conductive member 21d consists of a material having a high thermal conductivity, such as copper (thickness: about 35 μm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 μm are formed in the wiring board 41.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

A TCP 102 is mounted on the first thermal conductive member 21a. A plurality of spherical solder members (terminals) 40 are arranged on the other major surface of the wiring board 41 in an array. The spherical solder members 40 are electrically connected to the semiconductor chip 15 on the first thermal conductive member 21a through the multilayered wiring board 41.

Leads 14 of the TCP are electrically connected to the wiring patterns 22 on the wiring board 41 through the solder members. The TCP 102 is protected by the heat sink 103. The semiconductor chip 15 of the TCP 102 may be covered with a resin.

According to the BGA package having the above arrangement, the TCP 102 is mounted on the first thermal conductive member 21a of the wiring board 41, and the heat sink 103 is mounted on the second thermal conductive member 21b of the wiring board 41. Therefore, a heat sink need not be directly mounted on the TCP 102.

Heat generated by the semiconductor chip 15 of the TCP is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

With this structure, the strong BGA package with excellent heat dissipation and a simple arrangement can be provided.

[GG] Next, a BGA package according to the 33rd embodiment of the present invention will be described below.

FIGS. 143 to 145 show the BGA package using a multilayered wiring board according to the 33rd embodiment of the present invention. FIG. 143 is a plan view of the BGA package, FIG. 144 is a sectional view thereof along the line CXLIV—CXLIV in FIG. 143, and FIG. 145 is a sectional view thereof along the line CXLV—CXLV in FIG. 143.

A first thermal conductive member 21a is formed on one major surface of a wiring board 41. The first thermal conductive member 21a consists of a material having a high thermal conductivity, such as copper (thickness: about 35 μm).

A semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the wiring board 41.

A plurality of wiring patterns 22 to surround the four sides of the first thermal conductive member 21a are formed on one major surface of the wiring board 41.

Second thermal conductive members 21b are formed on one major surface of the wiring board 41. Each second thermal conductive member 21b consists of a material having a high thermal conductivity, such as copper (thickness: about 35 μm).

A heat sink 103 is to be mounted on the second thermal conductive members 21b. For this reason, the second thermal conductive members 21b are formed to facilitate mounting of the heat sink 103. For example, each second thermal conductive member 21b is formed at corresponding one of the four corners of the wiring board 41.

The shape of each second thermal conductive member 21b is formed to be a square having each side of about 5 mm when viewed from one major surface of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 μm are formed in the wiring board 41.

A fourth thermal conductive member 21d is filled in each through hole 23. The fourth thermal conductive member 21d consists of a material having a high thermal conductivity, such as copper (thickness: about 35 μm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 μm are formed in the wiring board 41.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

A TCP 102 is mounted on the first thermal conductive member 21a. The upper surface (i.e., a surface on which an element is formed) of the semiconductor chip 15 of the TCP 102 faces the first thermal conductive member 21a side. A resin 16 is filled between the first thermal conductive member 21a and the semiconductor chip 15. The lower surface (i.e., a surface on which an element is not formed) of the semiconductor chip 15 of the TCP 102 may be adhered to the heat sink 103 with a low-heat resistive adhesive.

A plurality of spherical solder members (terminals) 40 are arranged on the other major surface of the wiring board 41 in an array. The spherical solder members 40 are electrically connected to the semiconductor chip 15 of the TCP 102 on the first thermal conductive member 21a through the multilayered wiring board 41.

Leads 14 of the TCP are electrically connected to the wiring patterns 22 on the wiring board 41 through the solder members. The TCP 102 is protected by the heat sink 103. In this embodiment, although a TAB tape of the TCP 102 is removed, the TAB tape may remain.

According to the BGA package having the above arrangement, the semiconductor chip 15 of the TCP is mounted on the first thermal conductive member 21a of the wiring board 41, and the heat sink 103 is mounted on the second thermal conductive members 21b of the wiring board 41. Therefore, a heat sink need not be directly mounted on the TCP 102.

Heat generated by the semiconductor chip 15 of the TCP is directly conducted to the heat sink 103 and at the same time from the first thermal conductive member 21a to the heat sink 103 through the fourth thermal conductive members 21*d*, the third thermal conductive members 21*c*, the fourth thermal conductive members 21*d*, and the second thermal conductive members 21*b*.

With this structure, the strong BGA package with excellent heat dissipation and a simple arrangement can be provided.

[HH] Next, a BGA package according to the 34th embodiment of the present invention will be described below.

FIGS. 146 and 147 show the BGA package using a multilayered wiring board according to the 34th embodiment of the present invention. FIG. 146 is a plan view of the BGA package, and FIG. 147 is a sectional view thereof along the line CXLVII—CXLVII in FIG. 146.

A first thermal conductive member 21*a* is formed on one major surface of a wiring board 41. The first thermal conductive member 21*a* consists of a material having a high thermal conductivity, such as copper (thickness: about 35 μm).

A semiconductor chip 15 is to be mounted on the first thermal conductive member 21*a*. The first thermal conductive member 21*a* conforms to the shape of the semiconductor chip 15. The shape of the first thermal conductive member 21*a* is formed to be, e.g., a square having one side of about 12 mm when viewed from one major surface of the wiring board 41.

A plurality of wiring patterns 22 to surround the four sides of the first thermal conductive member 21*a* are formed on one major surface of the wiring board 41.

A second thermal conductive member 21*b* is formed on one major surface of the wiring board 41. The second thermal conductive member 21*b* consists of a material having a high thermal conductivity, such as copper (thickness: about 35 μm).

A heat sink 103 is to be mounted on the second thermal conductive member 21*b*. For this reason, the second thermal conductive member 21*b* is formed to facilitate mounting of the heat sink 103. For example, the ring-like second thermal conductive member 21*b* is formed in the peripheral portion of the wiring board 41.

Third thermal conductive members 21*c* are formed on one of layers of the wiring board 41 at positions including at least portions immediately below the first and second thermal conductive members 21*a* and 21*b*. Each third thermal conductive member 21*c* consists of a material having a high thermal conductivity, such as copper (thickness: about 35 μm).

The third thermal conductive members 21*c* may be formed immediately below the first and second thermal conductive members 21*a* and 21*b* or one third thermal conductive member 21*c* may be formed entirely on one of the layers of the wiring board 41. For example, when the third thermal conductive members 21*c* are formed only immediately below the first and second thermal conductive members 21*a* and 21*b*, the shape of each third thermal conductive member 21*c* is formed to be a square having one side of about 50 mm when viewed from the other major surface of the wiring board 41.

At least one through hole 23 is formed in the wiring board 41 between the first and third thermal conductive members 21*a* and 21*c*. For example, 121 (11 columns×11 rows) through holes 23 each having a diameter of, e.g., about 200 μm are formed in the wiring board 41.

A fourth thermal conductive member 21*d* is filled in each through hole 23. The fourth thermal conductive member 21*d* consists of a material having a high thermal conductivity, such as copper (thickness: about 35 μm).

Note that the fourth thermal conductive members 21*d* may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21*b* and 21*c*. Forty-nine (7 columns×7 rows) through holes 24 each having a diameter of about 200 μm are formed in the wiring board 41.

The fourth thermal conductive member 21*d* is filled in each through hole 24. The fourth thermal conductive member 21*d* consists of a material having a high thermal conductivity, such as copper (thickness: about 35 μm).

Note that the fourth thermal conductive members 21*d* may be formed only on the side surfaces of the through holes 24, and each through hole 24 may be filled with a paste containing aluminum nitride or high-heat conductive particles (e.g., a metal).

A TCP 102 is mounted on the first thermal conductive member 21*a*. The upper surface (i.e., a surface on which an element is formed) of the semiconductor chip 15 of the TCP 102 faces the first thermal conductive member 21*a* side. A resin 16 is filled between the first thermal conductive member 21*a* and the semiconductor chip 15.

As shown in FIG. 148, the lower surface (i.e., a surface on which an element is not formed) of the semiconductor chip 15 of the TCP 102 may be adhered to the heat sink 103 with a low-heat resistive adhesive 35.

A plurality of spherical solder members (terminals) 40 are arranged on the other major surface of the wiring board 41 in an array. The spherical solder members 40 are electrically connected to the semiconductor chip 15 on the first thermal conductive member 21*a* through the multilayered wiring board 41.

Leads 14 of the TCP are electrically connected to the wiring patterns 22 on the wiring board 41 through the solder members. The TCP 102 is protected by the heat sink 103.

In this embodiment, although a TAB tape of the TCP 102 is removed, the TAB tape may remain.

According to the BGA package having the above arrangement, the TCP 102 is mounted on the first thermal conductive member 21*a* of the wiring board 41, and the heat sink 103 is mounted on the second thermal conductive member 21*b* of the wiring board 41. Therefore, a heat sink need not be directly mounted on the TCP 102.

Heat generated by the semiconductor chip 15 of the TCP 102 is directly conducted to the heat sink 103 and at the same time from the first thermal conductive member 21*a* to the heat sink 103 through the fourth thermal conductive members 21*d*, the third thermal conductive members 21*c*, the fourth thermal conductive members 21*d*, and the second thermal conductive member 21*b*.

With this structure, the strong BGA package with excellent heat dissipation and a simple arrangement can be provided.

[II] Next, a BGA package according to the 35th embodiment of the present invention will be described below.

FIGS. 149 to 151 show the BGA package using a multilayered wiring board according to the 35th embodiment of the present invention. FIG. 149 is a plan view of the BGA package, FIG. 150 is a sectional view thereof along the line CL—CL in FIG. 149, and FIG. 151 is a sectional view thereof along the line CLI—CLI in FIG. 149.

A first thermal conductive member 21*a* is formed on one major surface of a wiring board 41. The first thermal conductive member 21*a* consists of a material having a high thermal conductivity, such as copper (thickness: about 35 μm).

A semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the wiring board 41.

A plurality of wiring patterns 22 to surround the four sides of the first thermal conductive member 21a are formed on one major surface of the wiring board 41.

Second thermal conductive members 21b are formed on one major surface of the wiring board 41. Each second thermal conductive member 21b consists of a material having a high thermal conductivity, such as copper (thickness: about 35 μm).

A heat sink 103 is to be mounted on the second thermal conductive members 21b. For this reason, the second thermal conductive members 21b are formed to facilitate mounting of the heat sink 103. For example, each second thermal conductive member 21b is formed at corresponding one of the four corners of the wiring board 41.

The shape of each second thermal conductive member 21b is formed to be a square having each side of about 5 mm when viewed from one major surface of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 μm are formed in the wiring board 41.

A fourth thermal conductive member 21d is filled in each through hole 23. The fourth thermal conductive member 21d consists of a material having a high thermal conductivity, such as copper (thickness: about 35 μm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 μm are formed in the wiring board 41.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

A plurality of spherical solder members (terminals) 40 are arranged on the other major surface of the wiring board 41 in an array. The spherical solder members 40 are electrically connected to the semiconductor chip 15 on the first thermal conductive member 21a through the multilayered wiring board 41.

The semiconductor chip 15 is electrically connected to the wiring patterns 22 on the wiring board 41 through bumps 36. A resin 33 is filled in portions immediately below and near the semiconductor chip 15.

According to the BGA package having the above arrangement, the semiconductor chip 15 is mounted on the first thermal conductive member 21a of the wiring board 41, and the heat sink 103 is mounted on the second thermal conductive members 21b of the wiring board 41. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive members 21b.

With this structure, the strong BGA package with excellent heat dissipation and a simple arrangement can be provided.

[JJ] Next, a BGA package according to the 36th embodiment of the present invention will be described below.

FIGS. 152 and 153 show the BGA package using a multilayered wiring board according to the 36th embodiment of the present invention. FIG. 152 is a plan view of the BGA package, and FIG. 153 is a sectional view thereof along the line CLIII—CLIII in FIG. 152.

A first thermal conductive member 21a is formed on one major surface of a wiring board 41. The first thermal conductive member 21a consists of a material having a high thermal conductivity, such as copper (thickness: about 35 μm).

A semiconductor chip 15 is to be mounted on the first thermal conductive member 21a. The first thermal conductive member 21a conforms to the shape of the semiconductor chip 15. The shape of the first thermal conductive member 21a is formed to be, e.g., a square having one side of about 12 mm when viewed from one major surface of the wiring board 41.

A plurality of wiring patterns 22 to surround the four sides of the first thermal conductive member 21a are formed on one major surface of the wiring board 41.

A second thermal conductive member 21b is formed on one major surface of the wiring board 41. The second thermal conductive member 21b consists of a material having a high thermal conductivity, such as copper (thickness: about 35 μm).

A heat sink 103 is to be mounted on the second thermal conductive member 21b. For this reason, the second thermal conductive member 21b is formed to facilitate mounting of the heat sink 103. For example, the ring-like second thermal conductive member 21b is formed in the peripheral portion of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 μm are formed in the wiring board 41.

A fourth thermal conductive member 21d is filled in each through hole 23. The fourth thermal conductive member 21d consists of a material having a high thermal conductivity, such as copper (thickness: about 35 μm).

Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 μm are formed in the wiring board 41.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

A plurality of spherical solder members (terminals) 40 are arranged on the other major surface of the wiring board 41 in an array. The spherical solder members 40 are electrically connected to the semiconductor chip 15 on the first thermal conductive member 21a through the multilayered wiring board 41.

The semiconductor chip 15 is electrically connected to the wiring patterns 22 on the wiring board 41 through bumps 36. A resin 33 is filled in portions immediately below and near the semiconductor chip 15.

As shown in FIG. 154, a plurality of bumps 37 for heat dissipation may be formed between the first thermal conductive member 21a and the semiconductor device 15 to conduct heat generated by the semiconductor chip 15 to the first thermal conductive member 21a.

According to the BGA package having the above arrangement, the semiconductor chip 15 is mounted on the first thermal conductive member 21a of the wiring board 41, and the heat sink 103 is mounted on the second thermal conductive member 21b of the wiring board 41. Therefore, a heat sink need not be directly mounted on the semiconductor chip 15.

Heat generated by the semiconductor chip 15 is directly conducted to the heat sink 103 and at the same time from the first thermal conductive member 21a to the heat sink 103 through the fourth thermal conductive members 21d, the third thermal conductive members 21c, the fourth thermal conductive members 21d, and the second thermal conductive member 21b.

With this structure, the strong BGA package with excellent heat dissipation and a simple arrangement can be provided.

[KK] Next, a BGA package according to the 37th embodiment of the present invention will be described below.

FIGS. 155 and 156 show a multi-chip BGA package using a multilayered wiring board according to the 37th embodiment of the present invention. FIG. 155 is a plan view of the BGA package, and FIG. 156 is a sectional view thereof along the line CLVI—CLVI in FIG. 155.

A plurality (e.g., four) of first thermal conductive members 21a are formed on one major surface of a wiring board 41. Each first thermal conductive member 21a consists of a material having a high thermal conductivity, such as copper (thickness: about 35 μm).

A semiconductor chip 15 is to be mounted on each first thermal conductive member 21a. Each first thermal conductive member 21a conforms to the shape of the semiconductor chip 15. The shape of each first thermal conductive member 21a is formed to be, e.g., a square having one side of about 12 mm when viewed from one major surface of the wiring board 41.

A plurality of wiring patterns 22 to surround the four sides of each first thermal conductive member 21a are formed on one major surface of the wiring board 41.

Second thermal conductive members 21b are formed on one major surface of the wiring board 41. Each second thermal conductive member 21b consists of a material having a high thermal conductivity, such as copper (thickness: about 35 μm).

A heat sink 103 is to be mounted on the second thermal conductive members 21b. For this reason, the second thermal conductive members 21b are formed to facilitate mounting of the heat sink 103. For example, each second thermal conductive member 21b is formed at corresponding one of the four corners of the wiring board 41.

The shape of each second thermal conductive member 21b is formed to be a square having each side of about 5 mm when viewed from one major surface of the wiring board 41.

Third thermal conductive members 21c are formed on one of layers of the wiring board 41 at positions including at least portions immediately below the first and second thermal conductive members 21a and 21b. Each third thermal conductive member 21c consists of a material having a high thermal conductivity, such as copper (thickness: about 35 μm).

The third thermal conductive members 21c may be formed immediately below the first and second thermal conductive members 21a and 21b or one third thermal conductive member 21c may be formed entirely on one of the layers of the wiring board 41. For example, when the third thermal conductive members 21c are formed only immediately below the first and second thermal conductive members 21a and 21b, the shape of each third thermal conductive member 21c is formed to be a square having one side of about 50 mm when viewed from the other major surface of the wiring board 41.

At least one through hole 23 is formed in the wiring board 41 between the first and third thermal conductive members 21a and 21c. For example, 121 (11 columns×11 rows) through holes 23 each having a diameter of, e.g., about 200 μm are formed in the wiring board 41.

A fourth thermal conductive member 21d is filled in each through hole 23. The fourth thermal conductive member 21d consists of a material having a high thermal conductivity, such as copper (thickness: about 35 μm). Note that the fourth thermal conductive members 21d may be formed only on the side surfaces of the through holes 23, and each through hole 23 may be filled with a paste containing aluminum nitride or high-heat conductive particles (e.g., a metal).

Similarly, at least one through hole 24 is formed in the wiring board 41 between the second and third thermal conductive members 21b and 21c. Forty-nine (7 columns×7 rows) through holes 24 each having a diameter of about 200 μm are formed in the wiring board 41.

The fourth thermal conductive member 21d is filled in each through hole 24. The fourth thermal conductive member 21d consists of a material having a high thermal conductivity, such as copper (thickness: about 35 μm).

Note that the fourth thermal conductive members 21d may be formed only on the side surfaces of the through holes 24, and each through hole 24 may be filled with a paste containing aluminum nitride or high-heat conductive particles (e.g., a metal).

A TCP 102 is mounted on each first thermal conductive member 21a. A plurality of spherical solder members (terminals) 40 are arranged on the other major surface of the wiring board 41 in an array. The spherical solder members 40 are electrically connected to the semiconductor chip 15 of the TCP 102 on each first thermal conductive member 21a through the multilayered wiring board 41.

Leads 14 of the TCP are electrically connected to the wiring patterns 22 on the wiring board 41 through the solder members. The TCPs 102 are protected by the heat sink 103. The semiconductor chips 15 of the TCPs 102 are covered with a potting resin.

According to the BGA package having the above arrangement, the TCPs 102 are mounted on the four first thermal conductive members 21a of the wiring board 41, and the heat sink 103 is mounted on the second thermal conductive members 21b of the wiring board 41. Therefore, a heat sink need not be directly mounted on the TCPs 102.

Heat generated by the semiconductor chips 15 of the four TCPs is directly conducted to the heat sink 103 and at the same time from the first thermal conductive members 21a to the heat sink 103 through the fourth thermal conductive members 21d, the third thermal conductive members 21c, the fourth thermal conductive members 21d, and the second thermal conductive members 21b.

With this structure, the strong BGA package with excellent heat dissipation and a simple arrangement can be provided.

As has been described above, the printed circuit board and the semiconductor device using the same according to the present invention have the following effects.

The TCP and the semiconductor chip are mounted on one major surface of the insulating board, and the heat sink is mounted on the second thermal conductive member. Therefore, a heat sink need not be directly mounted on the TCP or the semiconductor device, and the leads of the TCP are not damaged.

Heat generated by the semiconductor chip is directly conducted to the heat sink and at the same time from the first thermal conductive member to the heat sink through the fourth thermal conductive members in the through holes, the third thermal conductive members on the other major surface of the insulating board, and the second thermal conductive member. Therefore, the semiconductor device with excellent heat dissipation and a simple arrangement can be provided.

When the present invention is applied to the BGA package, the semiconductor chip may be mounted on the first thermal conductive member on one major surface of the multilayered wiring board, the heat sink may be mounted on the second thermal conductive member, and the plurality of spherical solder members may be formed on the other major surface of the multilayered wiring board. With this structure, the strong BGA package with excellent heat dissipation and a simple arrangement can be provided.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

an insulating board having upper and lower surfaces;

a first thermal conductive member formed on said upper surface of said insulating board;

a plurality of second thermal conductive members formed around said first thermal conductive member on said upper surface of said insulating board;

a third thermal conductive member formed on said lower surface of said insulating board in a region including at least regions in which said third thermal conductive member overlaps said first and second thermal conductive members;

at least one first through hole formed in said insulating board between said first and third thermal conductive members;

at least one second through hole formed in said insulating board between each of said second thermal conductive members and said third thermal conductive member;

fourth thermal conductive members, formed in the first and second through holes, for connecting said first thermal conductive member to said third thermal conductive member, and each of said second thermal conductive members to said third thermal conductive member;

a semiconductor chip located on said first thermal conductive member; and a heat sink having support members at positions opposite to said second thermal conductive members and mounted on said second thermal conductive members so as to cover said semiconductor chip.

2. A semiconductor device comprising:

a multilayered insulating board having upper and lower surfaces;

a first thermal conductive member formed on said upper surface of said insulating board;

a plurality of second thermal conductive members formed around said first thermal conductive member on said upper surface of said insulating board;

a third thermal conductive member formed on said lower surface or between adjacent layers of said insulating board in a region including at least regions in which said third thermal conductive member overlaps said first and second thermal conductive members;

at least one first through hole formed in said insulating board between said first and third thermal conductive members;

at least one second through hole formed in said insulating board between each of said second thermal conductive members and said third thermal conductive member;

fourth thermal conductive members, formed in the first and second through holes, for connecting said first thermal conductive member to said third thermal conductive member, and each of said second thermal conductive members to said third thermal conductive member;

a semiconductor chip located on said first thermal conductive member; and a heat sink having support members at positions opposite to said second thermal conductive members and mounted on said second thermal conductive members so as to cover said semiconductor chip.

3. A device according to any one of claims 1 and 2, wherein said second thermal conductive members are formed at an equal interval, and further comprising a plurality of wiring patterns formed between said second thermal conductive members on said upper surface of said insulating board.

4. A device according to claim 2, wherein, when said third thermal conductive member is formed between said adjacent layers of said insulating board, the first and second through holes extend from said upper surface to said lower surface of said insulating board, and further comprising a fifth thermal conductive member formed on and near the first through hole on said lower surface of said insulating board, and sixth thermal conductive members formed on and near the second through hole on said lower surface of said insulating board.

5. A device according to any one of claims 1 and 2, wherein said heat sink is constituted by a lid portion having said support members and a fin portion, said support members of said lid portion being constituted by projections formed integrally with said lid portion, and said fin portion being mounted on said lid portion.

6. A semiconductor device comprising:

a multilayered insulating board having upper and lower surfaces;

a first thermal conductive member formed on said upper surface of said insulating board;

a ring-like second thermal conductive member formed on said upper surface of said insulating board so as to surround said first thermal conductive member;

a third thermal conductive member formed on said lower surface or between adjacent layers of said insulating board in a region including at least regions in which said third thermal conductive member overlaps said first and second thermal conductive members;

at least one first through hole formed in said insulating board between said first and third thermal conductive members;

at least one second through hole formed in said insulating board between said second and third thermal conductive members;

fourth thermal conductive members, formed in the first and second through holes, for connecting said first thermal conductive member to said third thermal conductive member, and said second thermal conductive member to said third thermal conductive member;

a semiconductor chip located on said first thermal conductive member;

a heat sink having a support member at a position opposite to said second thermal conductive member and mounted on said second thermal conductive member so as to cover said semiconductor chip;

a plurality of first wiring patterns formed inside said second thermal conductive member on said upper surface of said insulating board;

a plurality of second wiring patterns formed outside said second thermal conductive member on said upper surface of said insulating board;

a plurality of third wiring patterns formed between said adjacent layers of said insulating board;

third through holes formed in said insulating board between said first and third wiring patterns and between said second and third wiring patterns; and fourth wiring patterns, formed in the third through holes, for connecting said first wiring patterns to said third wiring patterns, and said second wiring patterns to said third wiring patterns.

7. A device according to claim 6, wherein, when said third thermal conductive member is formed between said adjacent layers of said insulating board, the first and second through holes extend from said upper surface to said lower surface of said insulating board, and further comprising a fifth thermal conductive member formed on and near the first through hole on said lower surface of said insulating board, and a sixth thermal conductive member formed on and near the second through hole on said lower surface of said insulating board.

8. A device according to claim 6, wherein said heat sink is constituted by a lid portion having said support member and a fin portion, said support member of said lid portion being constituted by a ring-like projection formed integrally with said lid portion, and said fin portion being mounted on said lid portion.

9. A device according to any one of claims 1, 2, and 6, wherein said fourth thermal conductive members are formed only on side surfaces of the first and second through holes.

10. A device according to any one of claims 1, 2, and 6, wherein said fourth thermal conductive members are formed only on side surfaces of the first and second through holes, and further comprising a material with a high heat conductivity for filling the first and second through holes.

11. A device according to any one of claims 1, 2, and 6, wherein said fourth thermal conductive members are filled in the first and second through holes.

12. A semiconductor device comprising:

an insulating board having upper and lower surfaces;

a first thermal conductive member formed on said upper surface of said insulating board;

a plurality of second thermal conductive members formed around said first thermal conductive member on said upper surface of said insulating board;

a third thermal conductive member formed on said lower surface of said insulating board in a region including at least regions in which said third thermal conductive member overlaps said first and second thermal conductive members;

at least one first through hole formed in said insulating board between said first and third thermal conductive members;

a threaded hole formed in said insulating board between each of said second thermal conductive members and said third thermal conductive member;

a fourth thermal conductive member, formed in the first through hole, for connecting said first thermal conductive member to said third thermal conductive member;

a semiconductor chip located on said first thermal conductive member;

a heat sink having support members at positions opposite to said second thermal conductive members and mounted on said second thermal conductive members so as to cover said semiconductor chip, said heat sink having a threaded hole formed in each of said support members; and a screw, inserted in the threaded holes of said insulating board and said heat sink, for fixing said heat sink on said insulating board.

13. A semiconductor device comprising:

a multilayered insulating board having upper and lower surfaces;

a first thermal conductive member formed on said upper surface of said insulating board;

a plurality of second thermal conductive members formed around said first thermal conductive member on said upper surface of said insulating board;

a third thermal conductive member formed on said lower surface or between adjacent layers of said insulating board in a region including at least regions in which said third thermal conductive member overlaps said first and second thermal conductive members;

at least one first through hole formed in said insulating board between said first and third thermal conductive members;

a threaded hole formed in said insulating board between each of said second thermal conductive members and said third thermal conductive members;

a fourth thermal conductive member, formed in the first through hole, for connecting said first thermal conductive member to said third thermal conductive member;

a semiconductor chip located on said first thermal conductive member;

a heat sink having support members at positions opposite to said second thermal conductive members and mounted on said second thermal conductive members so as to cover said semiconductor chip, said heat sink having a threaded hole formed in each of said support members; and a screw, inserted in the threaded holes of said insulating board and said heat sink, for fixing said heat sink on said insulating board.

14. A semiconductor device comprising:

a multilayered insulating board having upper and lower surfaces;

a first thermal conductive member formed on said upper surface of said insulating board;

a ring-like second thermal conductive member formed on said upper surface of said insulating board so as to surround said first thermal conductive member;

a third thermal conductive member formed on said lower surface or between adjacent layers of said insulating board in a region including at least regions in which said third thermal conductive member overlaps said first and second thermal conductive members;

at least one first through hole formed in said insulating board between said first and third thermal conductive members;

threaded holes formed in said insulating board between said second and third thermal conductive members;

a fourth thermal conductive member, formed in the first through hole, for connecting said first thermal conductive member to said third thermal conductive member;

a semiconductor chip located on said first thermal conductive member;

a heat sink having a support member at a position opposite to said second thermal conductive member and mounted on said second thermal conductive member so as to cover said semiconductor chip, said heat sink having threaded holes formed in said respective support members;

screws, inserted in the threaded holes of said insulating board and said heat sink, for fixing said heat sink on said insulating board;

a plurality of first wiring patterns formed inside said second thermal conductive member on said upper surface of said insulating board;

a plurality of second wiring patterns formed outside said second thermal conductive member on said upper surface of said insulating board;

a plurality of third wiring patterns formed between said adjacent layers of said insulating board;

third through holes formed in said insulating board between said first and third wiring patterns and said second and third wiring patterns; and fourth wiring patterns, formed in the third through holes, for connecting said first wiring patterns to said third wiring patterns, and said second wiring patterns to said third wiring patterns.

15. A device according to claim 1, further comprising a highly thermal conductive member having a high thermal conductivity to be mounted on said third thermal conductive member.

16. A device according to any one of claims 2 and 6, further comprising a highly thermal conductive member having a high thermal conductivity to be mounted on said third thermal conductive member when said third thermal conductive member is formed on said lower surface of said insulating board.

17. A semiconductor device comprising:

an insulating board having upper and lower surfaces;

a first thermal conductive member formed on said upper surface of said insulating board;

a plurality of second thermal conductive members formed around said first thermal conductive member on said upper surface of said insulating board;

a third thermal conductive member formed on said lower surface of said insulating board in a region including at least regions in which said third thermal conductive member overlaps said first and second thermal conductive members;

at least one first through hole formed in said insulating board between said first and third thermal conductive members;

a threaded hole formed in said insulating board between each of said second thermal conductive members and said third thermal conductive member;

a fourth thermal conductive member, formed in the first through hole, for connecting said first thermal conductive member to said third thermal conductive member;

a semiconductor chip located on said first thermal conductive member;

a heat sink having support members at positions opposite to said second thermal conductive members and mounted on said second thermal conductive members so as to cover said semiconductor chip, said heat sink having a threaded hole formed in each of said support members;

a highly thermal conductive member with a high thermal conductivity mounted on said third thermal conductive member and having a threaded hole; and a screw, inserted in the threaded holes of said insulating board, said heat sink, and said highly thermal conductive member, for fixing said heat sink and said highly thermal conductive member on said insulating board.

18. A semiconductor device comprising:

a multilayered insulating board having upper and lower surfaces;

a first thermal conductive member formed on said upper surface of said insulating board;

a plurality of second thermal conductive members formed around said first thermal conductive member on said upper surface of said insulating board;

a third thermal conductive member formed on said lower surface of said insulating board in a region including at least regions in which said third thermal conductive member overlaps said first and second thermal conductive members;

at least one first through hole formed in said insulating board between said first and third thermal conductive members;

a threaded hole formed in said insulating board between each of said second thermal conductive members and said third thermal conductive member;

a fourth thermal conductive member, formed in the first through hole, for connecting said first thermal conductive member to said third thermal conductive member;

a semiconductor chip located on said first thermal conductive member;

a heat sink having support members at positions opposite to said second thermal conductive members and mounted on said second thermal conductive members so as to cover said semiconductor chip, said heat sink having a threaded hole formed in each of said support members;

a highly thermal conductive member with a high thermal conductivity mounted on said third thermal conductive member and having a threaded hole; and a screw, inserted in the threaded holes of said insulating board, said heat sink, and said highly thermal conductive member, for fixing said heat sink and said highly thermal conductive member on said insulating board.

19. A semiconductor device comprising:

a multilayered insulating board having upper and lower surfaces;

a first thermal conductive member formed on said upper surface of said insulating board;

a ring-like second thermal conductive member formed on said upper surface of said insulating board so as to surround said first thermal conductive member;

a third thermal conductive member formed on said lower surface of said insulating board in a region including at least regions in which said third thermal conductive member overlaps said first and second thermal conductive members;

at least one first through hole formed in said insulating board between said first and third thermal conductive members;

threaded holes formed in said insulating board between said second and third thermal conductive members;

a fourth thermal conductive member, formed in the first through hole, for connecting said first thermal conductive member to said third thermal conductive member;

a semiconductor chip located on said first thermal conductive member;

a heat sink having a support member at a position corresponding to said second thermal conductive member and mounted on said second thermal conductive member so as to cover said semiconductor chip, said heat sink having threaded holes formed in said respective support member;

a highly thermal conductive member with a high thermal conductivity mounted on said third thermal conductive member and having threaded holes; and screws, inserted in the threaded holes of said insulating board, said heat sink, and said highly thermal conductive member, for fixing said heat sink and said highly thermal conductive member on said insulating board.

20. A device according to claim 3, further comprising a TAB tape for mounting said semiconductor chip, and leads formed on said TAB tape, and wherein said semiconductor chip is directly located on said first thermal conductive member with an adhesive, and one end of each of said leads is connected to one end of a corresponding one of said wiring patterns.

21. A device according to claim 3, wherein said semiconductor chip is directly mounted on said first thermal conductive member with an adhesive, and further comprising a bonding wire for connecting said semiconductor chip to one end of a corresponding one of said wiring patterns.

22. A device according to claim 3, wherein said semiconductor chip is directly mounted on said first thermal conductive member with an adhesive, and further comprising a bonding wire for connecting said semiconductor chip to one end of a corresponding one of said wiring patterns, and a resin for covering at least said semiconductor chip and said bonding wire.

23. A device according to claim 3, further comprising a TAB tape for mounting said semiconductor chip, leads formed on said TAB tape, and a resin for covering at least one surface of said semiconductor chip, and wherein said semiconductor chip is directly arranged on said first thermal conductive member through said resin, and one end of each of said leads is connected to one end of a corresponding one of said wiring patterns.

24. A device according to claim 3, further comprising first bumps formed on one surface of said semiconductor chip, and a resin filled between one surface of said semiconductor chip and said first thermal conductive member, each of said first bumps being connected to one end of a corresponding one of said wiring patterns.

25. A device according to claim 6, further comprising a TAB tape for mounting said semiconductor chip, and leads formed on said TAB tape, and wherein said semiconductor chip is directly located on said first thermal conductive member with an adhesive, and one end of each of said leads is connected to one end of a corresponding one of said first wiring patterns.

26. A device according to claim 6, wherein said semiconductor chip is directly mounted on said first thermal conductive member with an adhesive, and further comprising a bonding wire for connecting said semiconductor chip to one end of a corresponding one of said first wiring patterns.

27. A device according to claim 6, wherein said semiconductor chip is directly mounted on said first thermal conductive member with an adhesive, and further comprising a bonding wire for connecting said semiconductor chip to one end of a corresponding one of said first wiring patterns, and a resin for covering at least said semiconductor chip and said bonding wires.

28. A device according to claim 6, further comprising a TAB tape for mounting said semiconductor chip, leads formed on said TAB tape, and a resin for covering at least one surface of said semiconductor chip, and wherein said semiconductor chip is directly located on said first thermal conductive member through said resin, and one end of each of said leads is connected to one end of a corresponding one of said first wiring patterns.

29. A device according to claim 6, further comprising first bumps formed on one surface of said semiconductor chip, and a resin filled between one surface of said semiconductor chip and said first thermal conductive member, each of said first bumps being connected to one end of a corresponding one of said wiring patterns.

30. A semiconductor device according to claim 23, wherein the other surface of said semiconductor chip is coupled to said heat sink with an adhesive.

31. A device according to claim 24, further comprising at least one second bump for connecting one surface of said semiconductor chip to said first thermal conductive member.

32. A semiconductor device comprising:

an insulating board having upper and lower surfaces;

a plurality of first thermal conductive members formed on said upper surface of said insulating board;

at least one second thermal conductive member formed on said upper surface of said insulating board;

a third thermal conductive member formed on said lower surface of said insulating board in a region including at least regions in which said third thermal conductive member overlaps said first and second thermal conductive members;

at least one first through hole formed in said insulating board between each of said first thermal conductive members and said third thermal conductive member;

at least one second through hole formed in said insulating board between said at least one second thermal conductive member and said third thermal conductive member;

fourth thermal conductive members, formed in the first and second through holes, for connecting each of said first thermal conductive members to said third thermal conductive member, and said second thermal conductive member to said third thermal conductive member;

a semiconductor chip mounted on each of said first thermal conductive members; and a heat sink having at least one support member at a position opposite to said second thermal conductive member and mounted on said second thermal conductive member so as to cover said semiconductor chip.

33. A semiconductor device comprising:

a multilayered insulating board having upper and lower surfaces;

a plurality of first thermal conductive members formed on said upper surface of said insulating board;

at least one second thermal conductive member formed on said upper surface of said insulating board;

a third thermal conductive member formed on said lower surface or between adjacent layers of said insulating board in a region including at least regions in which said third thermal conductive member overlaps said first and second thermal conductive members;

at least one first through hole formed in said insulating board between each of said first thermal conductive members and said third thermal conductive member;

at least one second through hole formed in said insulating board between said at least one second thermal conductive member and said third thermal conductive member;

fourth thermal conductive members, formed in the first and second through holes, for connecting each of said first thermal conductive members to said third thermal conductive member, and said at least one second thermal conductive member to said third thermal conductive member;

a semiconductor chip mounted on each of said first thermal conductive members; and a heat sink having a support member at a position opposite to said second thermal conductive member and mounted on said second thermal conductive member so as to cover said semiconductor chip.

34. A device according to any one of claims 32 and 33, wherein said second thermal conductive member is located at a position with an equal distance at least from said first thermal conductive members.

35. A semiconductor device comprising:

a multilayered insulating board having upper and lower surfaces;

a plurality of first thermal conductive members respectively formed on said upper and lower surfaces of said insulating board;

a plurality of second thermal conductive members formed around said plurality of first thermal conductive members;

a third thermal conductive member formed between adjacent layers of said insulating board in a region including at least regions in which said third thermal conductive member overlaps said first and second thermal conductive members;

at least one first through hole formed in said insulating board between each of said first thermal conductive members and said third thermal conductive member;

at least one second through hole formed in said insulating board between each of said second thermal conductive members and said third thermal conductive member;

fourth thermal conductive members, formed in the first and second through holes, for connecting each of said first thermal conductive members to said third thermal conductive member, and each of said second thermal conductive members to said third thermal conductive member;

a semiconductor chip mounted on each of said first thermal conductive members; and a heat sink having support members at positions opposite to said second thermal conductive members and mounted on said second thermal conductive members so as to cover said semiconductor chip.

36. A BGA package comprising:

a multilayered wiring board having upper and lower surfaces;

a first thermal conductive member formed on said upper surface of said wiring board;

a plurality of second thermal conductive members formed around said first thermal conductive member on said upper surface of said wiring board;

a third thermal conductive member formed between adjacent layers of said wiring board in a region including at least regions in which said third thermal conductive member overlaps said first and second thermal conductive members;

at least one first through hole formed in said wiring board between said first and third thermal conductive members;

at least one second through hole formed in said wiring board between each of said second thermal conductive members and said third thermal conductive member;

fourth thermal conductive members, formed in the first and second through holes, for connecting said first thermal conductive member to said third thermal conductive member, and each of said second thermal conductive members to said third thermal conductive member;

a semiconductor chip located on said first thermal conductive member;

a heat sink having support members at positions opposite to said second thermal conductive members and mounted on said second thermal conductive members so as to cover said semiconductor chip; and a plurality of spherical conductive members formed on said lower surface of said wiring board and electrically connected to said semiconductor chip.

37. A BGA package comprising:

a multilayered wiring board having upper and lower surfaces;

a first thermal conductive member formed on said upper surface of said wiring board;

a ring-like second thermal conductive member formed on said upper surface of said wiring board so as to surround said first thermal conductive member;

a third thermal conductive member formed between adjacent layers of said wiring board in a region including at least regions in which said third thermal conductive member overlaps said first and second thermal conductive members;

at least one first through hole formed in said wiring board between said first and third thermal conductive members;

at least one second through hole formed in said wiring board between said second and third thermal conductive members;

fourth thermal conductive members, formed in the first and second through holes, for connecting said first thermal conductive member to said third thermal conductive member, and said second thermal conductive member to said third thermal conductive member;

a semiconductor chip located on said first thermal conductive member;

a heat sink having a support member at a position opposite to said second thermal conductive member and mounted on said second thermal conductive member so as to cover said semiconductor chip; and a plurality of spherical conductive members formed on said lower surface of said wiring board and electrically connected to said semiconductor chip.

38. A package according to claim 36, wherein each of said second thermal conductive members is formed at one of corner portions of said wiring board, and further comprising a plurality of wiring patterns for electrically connecting said semiconductor chip to said plurality of spherical conductive members.

39. A package according to claim 37, wherein said second thermal conductive member is formed at an edge portion of said wiring board, and further comprising a plurality of wiring patterns for electrically connecting said semiconductor chip to said plurality of spherical conductive members.

40. A package according to claim 36, wherein said heat sink is constituted by a lid portion having said support members and a fin portion, each of said support members being constituted by a projecting portion formed integrally with said lid portion, and said fin portion being mounted on said lid portion.

41. A package according to claim 37, wherein said heat sink is constituted by a lid portion having said support member and a fin portion, said support member being constituted by a projecting portion formed integrally with said lid portion, and said fin portion being mounted on said lid portion.

42. A package according to any one of claims 36 and 37, wherein said fourth thermal conductive members are formed only on side surfaces of the first and second through holes.

43. A package according to any one of claims 36 and 37, wherein said fourth thermal conductive members are formed only on side surfaces of the first and second through holes, and further comprising a material with a high heat conductivity for filling the first and second through holes.

44. A package according to any one of claims 36 and 37, wherein said fourth thermal conductive members are filled in the first and second through holes.

45. A package according to claim 38, further comprising a TAB tape for mounting said semiconductor chip, and leads formed on said TAB tape, and wherein said semiconductor chip is directly located on said first thermal conductive member with an adhesive, and one end of each of said leads is connected to one end of a corresponding one of said wiring patterns.

46. A package according to claim 39, further comprising a TAB tape for mounting said semiconductor chip, and leads formed on said TAB tape, and wherein said semiconductor chip is directly located on said first thermal conductive member with an adhesive, and one end of each of said leads is connected to one end of a corresponding one of said wiring patterns.

47. A package according to claim 38, wherein said semiconductor chip is directly mounted on said first thermal conductive member with an adhesive, and further comprising a bonding wire for connecting said semiconductor chip to one end of a corresponding one of said wiring patterns.

48. A package according to claim 39, wherein said semiconductor chip is directly mounted on said first thermal conductive member with an adhesive, and further comprising a bonding wire for connecting said semiconductor chip to one end of a corresponding one of said wiring patterns.

49. A package according to claim 38, wherein said semiconductor chip is directly mounted on said first thermal conductive member with an adhesive, and further comprising a bonding wire for connecting said semiconductor chip to one end of a corresponding one of said wiring patterns, and a resin for covering at least said semiconductor chip and said bonding wire.

50. A package according to claim 39, wherein said semiconductor chip is directly mounted on said first thermal conductive member with an adhesive, and further comprising a bonding wire for connecting said semiconductor chip to one end of a corresponding one of said wiring patterns, and a resin for covering at least said semiconductor chip and said bonding wire.

51. A package according to claim 38, further comprising a TAB tape for mounting said semiconductor chip, leads formed on said TAB tape, and a resin for covering at least one surface of said semiconductor chip, said resin being arranged between said semiconductor chip and said first thermal conductive member, and one end of each of said leads being connected to one end of a corresponding one of said wiring patterns.

52. A package according to claim 39, further comprising a TAB tape for mounting said semiconductor chip, leads formed on said TAB tape, and a resin for covering at least one surface of said semiconductor chip, said resin being arranged between said semiconductor chip and said first thermal conductive member, and one end of each of said leads being connected to one end of a corresponding one of said wiring patterns.

53. A package according to claim 38, further comprising first bumps formed on one surface of said semiconductor chip, and a resin filled between one surface of said semiconductor chip and said first thermal conductive member, each of said first bumps being connected to one end of a corresponding one of said wiring patterns.

54. A package according to claim 39, further comprising first bumps formed on one surface of said semiconductor chip, and a resin filled between one surface of said semiconductor chip and said first thermal conductive member, each of said first bumps being connected to one end of a corresponding one of said wiring patterns.

55. A package according to claim 51, wherein the other surface of said semiconductor chip is coupled to said heat sink with an adhesive.

56. A package according to claim 52, wherein the other surface of said semiconductor chip is coupled to said heat sink with an adhesive.

57. A package according to claim 53, further comprising a second bump for connecting one surface of said semiconductor chip to said first thermal conductive member.

58. A package according to claim 54, further comprising a second bump for connecting one surface of said semiconductor chip to said first thermal conductive member.

59. A BGA package comprising:

a multilayered wiring board having upper and lower surfaces;

a plurality of first thermal conductive members formed on said upper surface of said wiring board;

at least one second thermal conductive member formed on said upper surface of said wiring board;

a third thermal conductive member formed between adjacent layers of said wiring board a region including at least regions in which said third thermal conductive member overlaps said first and second thermal conductive members;

at least one first through hole formed in said wiring board between each of said first thermal conductive members and said third thermal conductive member;

at least one second through hole formed in said wiring board between said at least one second thermal conductive member and said third thermal conductive member;

fourth thermal conductive members, formed in the first and second through holes, for connecting each of said first thermal conductive members to said third thermal conductive member, and said second thermal conductive member to said third thermal conductive member;

a semiconductor chip located on each of said first thermal conductive members;

a heat sink having a support member at a position opposite to said second thermal conductive member and mounted on said second thermal conductive member so as to cover said semiconductor chip; and a plurality of spherical conductive members formed on said lower surface of said wiring board and electrically connected to said semiconductor chip.

60. A package according to claim 59, wherein each of said second thermal conductive members is formed at one of corner portions of said wiring board.

61. A BGA package comprising:

a multilayered wiring board having upper and lower surfaces;

a plurality of first thermal conductive members respectively formed on said upper and lower surfaces of said wiring board;

a plurality of second thermal conductive members formed around said wiring board;

a third thermal conductive member formed between adjacent layers of said wiring board in a region including at least regions in which said third thermal conductive member overlaps said first and second thermal conductive members;

at least one first through hole formed in said wiring board between each of said first thermal conductive members and said third thermal conductive member;

at least one second through hole formed in said wiring board between each of said second thermal conductive members and said third thermal conductive member;

fourth thermal conductive members, formed in the first and second through holes, for connecting each of said first thermal conductive members to said third thermal conductive member, and each of said second thermal conductive members to said third thermal conductive member;

a semiconductor chip located on each of said first thermal conductive members;

a heat sink having support members at positions opposite to said second thermal conductive members and mounted on said second thermal conductive members so as to cover said semiconductor chip; and a plurality of spherical conductive members formed on said lower surface of said wiring board and electrically connected to said semiconductor chip.

62. A package according to claim 61, wherein each of said second thermal conductive members is formed at one of corner portions of said wiring board.

63. A semiconductor device according to claim 24, wherein the other surface of said semiconductor chip is coupled to said heat sink with an adhesive.

64. A semiconductor device according to claim 28, wherein the other surface of said semiconductor chip is coupled to said heat sink with an adhesive.

65. A semiconductor device according to claim 29, wherein the other surface of said semiconductor chip is coupled to said heat sink with an adhesive.

66. A device according to claim 29, further comprising at least one second bump for connecting one surface of said semiconductor chip to said first thermal conductive member.

* * * * *